US006821824B2

(12) United States Patent
Minato et al.

(10) Patent No.: US 6,821,824 B2
(45) Date of Patent: Nov. 23, 2004

(54) SEMICONDUCTOR DEVICE AND METHOD OF MANUFACTURING THE SAME

(75) Inventors: Tadaharu Minato, Hyogo (JP); Tetsuya Nitta, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 51 days.

(21) Appl. No.: 10/257,775

(22) PCT Filed: Feb. 21, 2001

(86) PCT No.: PCT/JP01/01278

§ 371 (c)(1), (2), (4) Date: Oct. 17, 2002

(87) PCT Pub. No.: WO02/067333

PCT Pub. Date: Aug. 29, 2002

(65) Prior Publication Data

US 2003/0132450 A1 Jul. 17, 2003

(51) Int. Cl.[7] ........................ H01L 21/332; H01L 29/74

(52) U.S. Cl. ....................... 438/138; 438/268; 438/420; 257/110; 257/341

(58) Field of Search ................................ 257/110, 135, 257/136, 328, 341; 438/135, 138, 268, 420

(56) References Cited

U.S. PATENT DOCUMENTS

| | | | | |
|---|---|---|---|---|
| 5,438,215 A | | 8/1995 | Tihanyi et al. | 257/341 |
| 6,037,632 A | * | 3/2000 | Omura et al. | 257/341 |
| 6,040,600 A | | 3/2000 | Uenishi et al. | 257/330 |
| 6,307,246 B1 | | 10/2001 | Nitta et al. | 438/268 |
| 6,518,144 B2 | | 2/2003 | Nitta et al. | 438/424 |
| 6,680,515 B1 | * | 1/2004 | Hsing | 257/138 |

FOREIGN PATENT DOCUMENTS

| | | |
|---|---|---|
| JP | 7-7154 | 1/1995 |
| JP | 10-223896 | 8/1998 |
| JP | 2000-183350 | 6/2000 |

(List continued on next page.)

OTHER PUBLICATIONS

"Junction Termination Technique for Super Junction Devices", Yuming BAI et al., ISPSD'2000, 5 pages.

"Which is cooler, Trench or Multi–Epitaxy", T. Minato et al., ISPSD'2000, 12 pages.

*Primary Examiner*—Chandra Chaudhari

(74) *Attorney, Agent, or Firm*—McDermott Will & Emery LLP

(57) ABSTRACT

A semiconductor device of the present invention has a pn-repeating structure that a structure in which a p-type impurity region (4) and an n-type drift region (3) are aligned side by side is repeated twice or more, and a low concentration region which is either p-type impurity region (4) or n-type drift region (3) located at the outermost portion of this pn-repeating structure has the lowest impurity concentration or has the least generally effective charge amount among all the p-type impurity regions (4) and n-type drift regions (3) forming the pn-repeating structure.

Thereby, the main withstand voltage of a power semiconductor device to which a three dimensional multi-RESURF principle is applied, wherein the element withstand voltage is specifically in the broad range of 20 to 6000 V, can be improved and the trade-off relationship between the main withstand voltage and the ON resistance can also be improved, so that an inexpensive semiconductor device of which the power loss is small and of which the size of the chip is small can be obtained.

In addition, a trench of a dotted line trench (DLT) structure and a manufacturing method corresponding to this can be used, so that a semiconductor device with a good yield can be obtained at low cost.

28 Claims, 147 Drawing Sheets

FOREIGN PATENT DOCUMENTS

| | | |
|---|---|---|
| JP | 2000-260984 | 9/2000 |
| JP | 2000-277726 | 10/2000 |
| JP | 2000-286417 | 10/2000 |
| JP | 2001-15752 | 1/2001 |
| JP | 2001-44424 | 2/2001 |
| JP | 2001-119022 | 4/2001 |

* cited by examiner

SEMICONDUCTOR DEVICE AND METHOD OF MANUFACTURING THE SAME

TECHNICAL FIELD

The present invention relates to a semiconductor device and a manufacturing method for the same, and more particularly to an improvement in performance and an increase in the yield of a power semiconductor device.

BACKGROUND ART

An element using a repeating microscopic structure of p-type and n-type layers wherein an electric field relaxation phenomenon called the RESURF (REduced SURFace Field) effect is applied in place of the uniform n-type drift layer of a conventional MOS-FET (Metal Oxide Semiconductor-Field Effect Transistor) has been proposed in, for example, U.S. Pat. No. 6,040,600. In this element a low ON resistance is obtained in the ON condition due to the n-type drift layer of which the impurity concentration is higher than the concentration of the uniform n drift layer in the conventional structure by approximately one order while in the OFF condition the entire electric field is relaxed due to a three-dimensional multiple RESURF effect of n/p layers. Thereby, a withstand voltage several times as large as the main withstand voltage conventionally obtained by a high concentration single n-type drift layer alone can be implemented and, in principle, an STM (Super Trench power MOS-FET) structure that can obtain a value lower than the Si limitation (Ron, sp=$5.93\times10^{-9}$ $BV^{2.5}$, wherein specific resistance is proportional to the main withstand voltage to the power of 2.5) wherein the relationship between the main withstand voltage and the specific ON resistance is limited can be obtained.

In an actual element, however, this repeating microscopic structure of p-type and n-type layers cannot be repeated infinitely in an edge portion of the chip and, therefore, there is a problem wherein a drop in the main withstand voltage is great in a "termination" portion of a termination structure where the repetition ends. In the following, a prior art and problem thereof are described from such a point of view.

FIG. 148 is a cross sectional view schematically showing the first configuration of a semiconductor device according to a prior art and shows a configuration that corresponds to a case where a MOS-FET is posited as a concrete active element structure. In reference to FIG. 148, an $n^-$ epitaxial layer 102 is formed on the first main surface side of an $n^+$ drain region 101 of the MOS-FET. A pn-repeating structure wherein n-type drift regions 103 and p-type impurity regions 104 are repeated in alternation is formed within this $n^-$ epitaxial layer 102.

Here, though the vicinity of the center of this element having the pn-repeating structure is omitted for the purpose of simplification of the description, conventionally a combination of several hundreds to several tens of thousands of repeated pairs of n-type drift regions 103 and p-type impurity regions 104 exists in this portion. The n-type impurity concentration of n-type drift region 103 and the p-type impurity concentration of p-type impurity region 104 in each pair are set at substantially the same level.

A p-type body region 105 is formed on the first main surface side of p-type impurity region 104. This p-type body region 105 is also located on, at least, a portion of n-type drift region 103 on the first main surface side so as to form a main pn junction with n-type drift region 103. An $n^+$ source region 106 of a MOS-FET and a $p^+$ contact region 107 for making a low resistance contact with p-type body region 105 are formed side by side in the first main surface within this p-type body region 105.

A gate electrode 109 is formed above the first main surface so as to face p-type body region 105 located between n-type drift region 103 and $n^+$ source region 106 via a gate insulating film 108. When a positive voltage is applied to this gate electrode 109, p-type body region 105, which faces gate electrode 109, is inverted to an n-type so that a channel region is formed.

A source electrode 110 made of a material including aluminum (Al), for example, is formed on the first main surface so as to be electrically connected to $n^+$ source region 106 and $p^+$ contact region 107.

A drain metal wire 111 is formed on the second main surface so as to contact $n^+$ drain region 101.

Here, in the actual element, the source electrode part is electrically connected to $n^+$ source region 106 and $p^+$ contact region 107 through a contact hole provided in an interlayer insulating film on the first main surface and via a barrier metal. In the present application, however, this portion is not important and, therefore, the source electrode part is simplified and expressed using solid lines throughout all of the drawings.

In addition, though $n^+$ drain region 101 is several times to several tens of times thicker than the effective element portion in the actual element, $n^+$ drain region 101 is expressed as thinner than the effective element portion in the drawings for the purpose of simplification. In addition to the above, scales, ratios of dimensions, and the like, are deformed in order to simplify the expression and, therefore, the respective dimensions in the drawings are not necessarily precise.

A multiple guard ring structure made of p-type impurity regions 115, for example, is provided as a termination structure of the pn-repeating structure.

In this configuration, n-type drift regions 103 and p-type impurity regions 104, respectively, have substantially the same impurity concentration in the center portion and edge portions of the pn-repeating structure.

FIG. 149 is a cross sectional view schematically showing the second configuration of the semiconductor device according to the prior art. In reference to FIG. 149, an $n^-$ epitaxial layer 102 has a buried multi-layer epitaxial structure and a p-type impurity region 104 is formed of a plurality of p-type regions 104*a* that are integrated in the depth direction of the semiconductor substrate in this configuration. In this configuration, p-type impurity regions 104, respectively, have the same impurity concentration in the center portion and edge portions of the pn-repeating structure.

Here, the concentration distribution in the upward and downward directions of each p-type impurity region 104 is an intrinsic structure and this is a concentration distribution due to the manufacturing method, which has no bearing on the concentration gradient in the part in the lateral direction discussed in the present invention. In addition, though in the drawing the concentration gradient in the upward and downward directions is depicted in only two stages for the purpose of simplification, in practice this concentration sequentially changes.

A manufacturing method according to this prior art is characterized in that $n^-$ epitaxial layer 102, having a comparatively high concentration to the extent that the concentration thereof is balanced with that of the p-type layers, is used for the purpose of simplifying the process of formation of the buried layers. A heat treatment is carried out after forming p-type buried diffusion layers 104*a* within $n^-$ epitaxial layer 102 in such a manner and, therefore, p-type impurity region 104 becomes of a form well-known in Japan as "round sweet balls of confectionary on a skewer."

FIG. 150 is a cross sectional view schematically showing the third configuration of the semiconductor device according to the prior art. In reference to FIG. 150, n-type drift regions 103 and p-type impurity regions 104 form pairs and a trench 123 filled in with a filling 124 is arranged between the members of each combined pn pair in this configuration.

FIG. 151 shows the appearance of electrical field concentration in the structure corresponding to this FIG. 150. The dark portion in this figure indicates a portion of high electrical field concentration and it is seen that an electrical field concentrates on portions (regions shown by arrows) wherein the pn-repeating structure ends.

Here, in this FIG. 151, an FP (Field Plate) structure is adopted for the termination structure portions instead of the multiple guard ring called an FLR (Field Limiting Ring) or an FFR (Floating Field Ring).

Here, the other parts of the above described configurations shown in FIGS. 149 and 150 are approximately the same as in the configuration shown in FIG. 148 and, therefore, the same symbols are attached to the same members, of which the descriptions are omitted.

As described above, according to the first to third prior arts there are structures wherein conventional termination structures such as a guard ring, an LFR, a JTE (Junction Termination Extension) and an FP are combined in the portions wherein pn-repeating structures end. By combining such termination structures, however, only a withstand voltage far lower than the high withstand voltage obtained within the cell in the center portion of the pn-repeating structures can be obtained in portions wherein the pn-repeating structure ends. Therefore, though the element operates, there is a problem wherein the trade-off relationship between the main withstand voltage and the ON resistance does not improve.

In addition, the content of the following Prior Art 1 has been announced as a method for preventing the loss of the high withstand voltage of the main cell portion by setting a specific concentration of the p-type layers and of the n-type layers outside of the portions wherein the pn-repeating structures ends. According to this technique, however, there is a problem wherein implementation is difficult due to the reasons described below.

The above described Prior Art 1 is described in "Junction Termination Technique for Super Junction Devices" that was announced in, for example, ISPSD 2000 (International Symposium on Power Semiconductor Devices & ICs) of CPES (Center for Power Electronics Systems), Virginia Polytechnic Institute and State University.

This Prior Art 1 shows improvement of the termination structure itself in the pn-repeating structure.

In addition, the structure shown in FIG. 152 is shown in the above described Prior Art 1. In reference to FIG. 152, a region of which the effective conductive type and concentration can be regarded as those of a low concentration $p^-$ region in a fan form of a quarter of a circle having a radius of R of the thickness (depth) of an n layer is formed from a portion wherein the repetition of p layers 204 and n layers 203 ends. However, a $p^-$ region cannot actually be formed to have such a concentration distribution. Therefore, it is necessary for the concentration distribution of the effective $p^-$ region to have an attenuation curve as shown in FIG. 153.

In order to implement this, a configuration is used wherein the concentration and the width of n-type regions 203 are constant while the concentration of p-type regions 204 is constant and the widths thereof are changed such as in the SJT (Super Junction Termination) structure shown in FIG. 154. Thereby, the same effects as of the changing of the effective concentration can be obtained according to the description of Prior Art 1.

In addition, the only requirements at this time are a form wherein the equipotential surfaces are aligned in fans at equal intervals as shown in FIG. 155 and a zigzag electrical field intensity distribution that is exposed to the surface wherein the peaks and the troughs have the same height and depth, respectively.

In addition, in this Prior Art 1 each of the concentrations of $p_i$ regions 204 and $n_i$ regions 203 are posited as being uniform within the single diffusion layer in the upward, downward, leftward and rightward directions. There is a problem, however, wherein the original effects of Prior Art 1 cannot easily be exercised when the formula for the relationship of the pn concentration ratio is not fulfilled in the case that the absolute values of the concentration greatly change or when the description of such a relationship becomes extremely complex so that the precision of proximity is reduced.

Concretely, there is a description that "along the SJT surface, . . . in the following calculation." in right column of page 2 to the left column of page 3 in the main body of Prior Art 1. In this description the volume represented by the concentration and the width of each portion may be set so as to satisfy equation (5) in Prior Art 1 so that the electrical field distribution closest to the surface does not reach to the critical breakdown electrical field.

In other words, this Prior Art 1 discloses the design of the entirety of the element in a form that includes the termination structure by literally extending the super junction structure of the repeating cell portions to the termination structure portions in some manner according to SJT, that is to say, "Super Junction Termination structure," wherein a repeating cell portion in the center and a termination structure have a one-to-one correspondence so as to be indivisible having a very limitative structure while "manner of connection" of a repeating cell portion to a general termination structure portion is described in the present invention, which is essentially different from the above.

In the case that the distribution required for the p-type acceptor concentration distribution in the moving radius direction in FIG. 153 is formed according to the repetition of pn layers, the electrical field distribution closest to the surface becomes of a zigzag form and, in the case that the peaks and troughs all have the same value, the maximum withstand voltage can be obtained. Therefore, in the case that the all of the concentrations of n and p regions 203 and 204 are made uniform so that the equipotential surfaces (lines) distribute in fan forms at equal intervals, as shown in FIG. 155, it is necessary to carry out an adjustment of the width of each of the regions 203 and 204.

In addition, SJT is considered to be impractical because it has the following two problems.

First, concentration regulation for forming an SJT structure is too complicated and it is necessary to apply an interval design that agrees with the concentration arrangement of the repeating cell portions that are different from the termination structure portions to the SJT part after examining the arrangement in detail before carrying out the actual design and, in addition, it is physically and mechanically difficult to fabricate a semiconductor chip structure to include terminal edges. On the other hand, the present invention has the advantage that both design and manufacturing method are simple because the relative concentrations in the vicinity of the terminal edges of the repeating cell portions may be adjusted using comparatively simple arithmetic.

Secondly, an SJT structure can only be implemented in the case of manufacture by means of a buried multi-layer epitaxial growth method and lacks versatility in that it cannot be actually manufactured in the case wherein a trench sidewall diffusion is used.

Furthermore, as described in the main body of Prior Art 1, there is a problem wherein this technique lacks versatility in that it is impossible to apply this technique in an element structure wherein a trench system is applied due to restrictions of the manufacturing technology even though the application to a multi-layer epitaxial structure is, in principle, possible.

Next, the technology disclosed in U.S. Pat. No. 5,438,215 is described as prior art 2 in FIG. 156.

In reference to FIG. 156, a vertical-type MOS-FET has inside region 301 that is doped so as to be a low level n-type. A base region 303 of the opposite conductive type (p) is provided in the upper side surface 302 of the semiconductor substrate. A source region 304 of the first conductive type (n) is buried within base region 303. A gate electrode 308 is arranged above surface 302 so as to be insulated from the surface. A drain region 307 that is highly doped so as to be of the same conductive type as inside region 301 is provided in the surface 306 on the opposite side.

Auxiliary semiconductor regions 311 and 312 are arranged in a range of the space-charge region that spreads at the time of reverse voltage application within the inside region 301. At least two regions 211 of a conductive type opposite to that of the inside region are provided. Auxiliary regions 312 having the same the same conductive type (n) as inside region 301 and being more highly doped than the inside region arranged between regions 311. The auxiliary regions are surrounded from all directions by a single region. This single region is of the same conductive type as the inside region, as well as regions 312, and is more highly doped than the inside region.

Though in this configuration a portion, wherein an active cell is formed, is buried in $n^-$ region 301, which has a low concentration, the impurity concentration of this outer peripheral portion is not specifically described and only the method of formation of a cell portion is discussed.

In addition, in general the impurity concentration of a portion wherein a pn-repeating structure is not formed in this Prior Art 2 is presumed to be set at the impurity concentration that is reverse calculated from a value obtained by adding a manufacturing margin to the element withstand voltage set for the power MOS-FET of a conventional structure (structure that does not have pn repetition). However, that leads the electrical field distribution in the termination structure portions in the pn-repeating structure to become triangular so as to differ from an electrical field distribution in a trapezoidal form that is implemented in the cell portion. Therefore, in the same manner as in the above described Prior Art 1, the difference in the electrical field distribution between the inside of repeating cells and the termination structure portions becomes greater so that there is a problem wherein a high withstand voltage, which is essentially obtained in a cell portion, cannot be implemented although the relationship between the main withstanding voltage and the ON resistance is improved in comparison with the conventional MOS-FET structure.

DISCLOSURE OF THE INVENTION

An object of the present invention is to provide a structure which improves the trade-off relationship between the main withstanding voltage and the ON resistance, and a manufacturing method capable of implementing such a structure in a semiconductor device based on a three-dimensional multiple RESURF effect.

A semiconductor device of the present invention is a semiconductor device having a repeating structure, wherein a structure where a first impurity region of a first conductive type and a second impurity region of a second conductive type are aligned side by side, is repeated twice or more in a semiconductor substrate of the first conductive type, characterized in that a low concentration region, which is either the first or the second impurity region located at the outermost portion in the repeating structure, has the lowest impurity concentration or has the least generally effective charge amount from among all of the first and second impurity regions forming the repeating structure.

According to the semiconductor device of the present invention a portion of the concentration of the outermost portion in the repeating structure is converted to have a concentration lower than the center portion and, thereby, the “mitigating region” that gradually mitigates the strong “three-dimensional multiple RESURF effect” used in the repeating cell portion in the center portion is provided so that the connection with a conventional so-called “termination structure” portion formed of a guard ring or a field plate is made easier and the main withstanding voltage drop caused by “mismatch” in the connection between the strong “three-dimensional multiple RESURF effect” portion and a so-called “termination structure” portion can be restricted.

In the above described semiconductor device the impurity concentration of the low concentration region is preferably no lower than 30% and no higher than 70% of the impurity concentration of the high concentration region that is either the first or second impurity region located closer to the center portion of the repeating structure than is the low concentration region.

By adjusting the impurity concentration in such a manner, it becomes possible to adjust the concentration gradient from the center portion of the pn-repeating structure to the first conductive region of the semiconductor substrate to be in a range that can be regarded as being continuous.

In the above described semiconductor device, the impurity concentration of the middle concentration region, which is of the above described first or second impurity region located between the low concentration region and the high concentration region, is higher than the impurity concentration of the low concentration region and is lower than the impurity concentration of the high concentration region.

Furthermore, by providing a the middle concentration region in such a manner, it becomes possible to continuously change the concentration gradient from the center portion of the pn-repeating structure to the first conductive region of the semiconductor substrate.

In the above described semiconductor device, the semiconductor substrate preferably has a first main surface and a second main surface facing each other wherein a third impurity region of the second conductive type is formed in, at least, a portion of at least one of the plurality of the first impurity regions on the first main surface side that forms the repeating structure so as to form a main pn junctions with the first impurity regions and a fourth impurity region of the first conductive type is formed on the second main surface side of the repeating structure.

Thus, the present invention can be applied to an element having a vertical-type structure.

In the above described semiconductor device, the third impurity region that forms the main pn junctions with the first impurity regions is preferably a body region of an insulating gate-type field effect transistor portion.

Thus, the present invention can be applied to an element having a MOS-FET.

In the above described semiconductor device, the low concentration regions located at the outermost portion in the repeating structure do not form active elements.

Thereby, the withstand voltage alone can be maintained in the low concentration regions having a concentration gradient that tends to be unstable at the time of switching operation without forming an element, such as a MOS-FET, so that stable switching operation can be obtained.

In the above described semiconductor device, a third impurity region of the second conductive type formed in, at least, a portion of the upper portion of the first impurity region close to an end that extends in one specific direction, a fourth impurity region of the first conductive type formed in, at least, a portion of the upper portion of the first impurity region close to an end in the direction opposite to the above described one specific direction, a first electrode electrically connected to the third impurity region and a second electrode electrically connected to a fourth impurity region are further provided, wherein the first and second electrodes are both formed on the first main surface.

Thus, the present invention can be applied to an element having a lateral-type structure.

In the above described semiconductor device, the semiconductor substrate preferably has a first main surface and a second main surface that face each other and has a plurality of trenches in the first main surface, wherein the repeating structure has a structure where a structure in which the first and second impurity regions are arranged side by side with a trench located in between is repeated twice or more.

Thus, the present invention can be applied to an element having a trench, for example, an ST (Super Trench) type element.

In the above described semiconductor device, the impurity concentration of the low concentration region is preferably no lower than 30% and no higher than 70% of the impurity concentration of the high concentration region, which is the first or second impurity region, that is located closer to the center portion of the repeating structure than is the low concentration region.

By adjusting the impurity concentration in an element having a trench in such a manner, it becomes possible to adjust the concentration gradient from the center portion of the pn-repeating structure to the first conductive type region of the semiconductor substrate to be in a range such that the concentration gradient can be regarded as being continuous.

In the above described semiconductor device, the impurity concentration of the middle concentration region, which is either the first or the second impurity region, located between the low concentration region and the high concentration region is preferably higher than the impurity concentration of the low concentration region and lower than the impurity concentration of the high concentration region.

Furthermore, by providing the middle concentration region in an element having a trench in the above described manner, it becomes possible to continuously change the concentration gradient from the center portion of the pn-repeating structure to the first conductive type region of the semiconductor substrate.

In the above described semiconductor device, a first impurity region is formed on one side of a mesa portion of a semiconductor device surrounded by a plurality of trenches and a second impurity region is formed in the surface of the other side and a third impurity region of the second conductive type is formed in, at least, a portion of the above described first main surface side of the first impurity region so that the first impurity region and the main pn junction are formed.

Thus, the present invention can be applied to an element having an ST-type mesa region.

In the above described semiconductor device, the third impurity region forming a pn junction primarily with the first impurity region is a body region of an insulating gate-type field effect transistor portion.

Thus, the present invention can be applied to an ST-type element having a MOS-FET, that is to say, to an STM (Super Trench power MOS-FET).

In the above described semiconductor device, the low concentration region located at the outermost portion of the repeating structure preferably does not form a passive element.

Thereby, withstand voltage alone can be maintained in the ST-type element without forming an element, such as a MOS-FET, in a low concentration region having a concentration gradient which easily becomes unstable at the time of switching operation so that a stable switching operation can be obtained.

In the above described semiconductor device, the trench positioned at the outermost part of the plurality of trenches is a first trench in a dotted line form having a surface pattern in a dotted line form wherein a plurality of first holes are arranged at intervals in a predetermined direction in the first main surface and the low concentration region is formed so as to be located along one of the sidewalls of the first trench of a dotted line form.

Thus, the present invention can be applied to an element having a trench in a dotted line form, that is to say, to an element having a DLT (Dotted Line Trench) so that the manufacturing process can be simplified.

The total of the length of the sidewalls on one side of the first main surface of a plurality of first holes forming the first trench of a dotted line form is preferably no lower than 30% and no more than 70% of the length of the sidewalls on one side in the first main surface of the trench continuously extending along a location closer to the center portion than the first trench of a dotted line form.

Thus, in an element having the DLT structure, the length and the intervals of the holes of the trench of the dotted line form are adjusted and, thereby, the impurity concentration of the low concentration region can be adjusted. Thereby, it becomes possible to adjust the concentration gradient from the center portion of the pn-repeating structure to the first conductive type region of the semiconductor substrate to be in a range that can be regarded as continuous.

In the above described semiconductor device, the trench located between the first trench of a dotted line form and the continuously extending trench is preferably a second trench of a dotted line form having a surface pattern in a dotted line form wherein a plurality of second holes are arranged at intervals in a predetermined direction in the first main surface and the sum of length of the sidewalls on one side in the first main surface of the plurality of second holes that form the second trench of a dotted line form is greater than the sum of length of the sidewalls on one side in the first main surface of the plurality of first holes that form the first trench of a dotted line form and is less than the length of the sidewall on one side in the first main surface of the continuously extending trench in the location closer to the center portion than the second trench of a dotted line form.

Thus, the trenches of dotted line forms are provided in a step-by-step manner in the element having the DLT structure and, thereby, the concentration gradient can be regarded as being continuous from the center portion of the pn-repeating structure to the first conductive type region of the semiconductor substrate.

In the above described semiconductor device, the first impurity region is preferably formed on one of the sides of the mesa portion of the semiconductor device surrounded by a plurality of trenches and the second impurity region is formed on the other of the sides and the third impurity region of the second conductive type is formed in, at least, a portion on the first main surface side of the first impurity region so as to form a main pn junction with the first impurity region.

Thus, the present invention can be applied to an element having a DLT structure and having an ST-type mesa region.

In the above described semiconductor device, the third impurity region, which forms the main pn junction with the first impurity region, is a body region of an insulating gate-type field effect transistor portion Thus, the present invention can be applied to an element having a MOS-FET in an ST-type type element having a DLT structure, that is to say, to an STM (Super Trench power MOS-FET).

In the above described semiconductor device, the low concentration region located at the outermost portion of the repeating structure preferably does not form an active element.

Thereby, the withstand voltage alone can be maintained without forming an element, such as a MOS-FET, in the low concentration region having a concentration gradient that tends to become unstable at the time of switching operation in an ST-type element having a DLT structure so that a stable switching operation can be obtained.

In the above described semiconductor device, the semiconductor substrate preferably has a first main surface and a second main surface facing each other and has a plurality of trenches including first and second trenches adjoining each other in the first main surface wherein a structure where a first impurity region is formed in each of the two sidewalls of the first trench and a second impurity region is formed in each of the two sidewalls of the second trench is repeated twice or more.

Thus, the present invention can be applied to an element having a twin trench structure.

In the above described semiconductor device, the impurity concentration of the low concentration region is no lower than 30% and no higher than 70% of the impurity concentration of the high concentration region that is either the first or second impurity region located closer to the center portion in the repeating structure than the low concentration region.

Thus, in an element having a twin trench structure, it becomes possible to adjust the impurity concentration of the low concentration region and, thereby, to adjust the concentration gradient from the center portion in the pn-repeating structure to the first conductive type region of the semiconductor substrate to be in a range that is regarded as being continuous.

In the above described semiconductor device, the impurity concentration of the middle concentration region, which is either the first or second impurity region, located between the low concentration region and the high concentration region is preferably higher than the impurity concentration of the low concentration region and is lower than the impurity concentration of the high concentration region.

Thus, trenches of dotted line forms are provided in a side by side manner in an element having a twin trench structure and, thereby, the concentration gradient from the center portion of the pn-repeating structure to the first conductive type region of the semiconductor substrate can be regarded as being continuous.

In the above described semiconductor device, a first impurity region is preferably formed on one side of the mesa portion of the semiconductor substrate surrounded by a plurality of trenches, a second impurity region is formed on the other side and a third impurity region of the second conductive type is formed on, at least, a portion of the first main surface side of the first impurity region so as to form a main pn junction with the first impurity region.

Thus, the present invention can be applied to an element having twin trench structure.

In the above described semiconductor device, the third impurity region forming the main pn junction with the first impurity region is preferably a body region of an insulating gate-type field effect transistor portion.

Thus, the present invention can be applied to an element having a MOS-FET in an element having a twin trench structure.

In the above described semiconductor device, the low concentration region located at the outermost portion of the repeating structure preferably does not form an active element.

Thereby, withstand voltage alone can be maintained without forming an element, such as a MOS-FET, in the low concentration region having a concentration gradient that tends to become unstable at the time of switching operation in an element having a twin trench structure so that a stable switching operation can be obtained.

In the above described semiconductor device, the trench located at the outermost portion of the plurality of trenches is the first trench of a dotted line form having a surface pattern of a dotted line form wherein a plurality of first holes are arranged at intervals in a predetermined direction in the first main surface and the low concentration region is formed so as to be located on one of the sidewalls of the first trench of a dotted line form.

Thus, the present invention can be applied to an element having a twin trench structure and having a DLT structure so that the manufacturing process can be simplified.

In the above described semiconductor device, the sum of the lengths of the sidewalls on one side in the first main surface of the plurality of first holes forming the first trench of a dotted line form is no greater than 30% and no less than 70% of the length of the sidewall on one side in the first main surface of the trench that extends continuously in a location closer to the center portion than the first trench of a dotted line form.

Thus, in an element having a twin trench structure and having a DLT structure, by adjusting the length and intervals of the holes of the trench of a dotted line form, the impurity concentration of the low concentration region can be adjusted. Thereby, it becomes possible to adjust the concentration gradient from the center portion of the pn-repeating structure to the first conductive region of the semiconductor device to be in a range that is regarded as being continuous.

In the above described semiconductor device, a trench located between the first trench of a dotted line form and the continuously extending trench is a second trench of a dotted line form having a surface pattern of a dotted line form wherein a plurality of second holes are arranged at intervals in a predetermined direction in the first main surface and the sum of the lengths of the sidewalls on one side of the plurality of second holes forming the second trench of a dotted line form in the first main surface is greater than the sum of the lengths of the sidewalls on one side of the plurality of first holes forming the first trench of a dotted line form and is smaller than the length of the sidewall on one side of the continuously extending trench that is closer to the center portion than the second trench of a dotted line form in the above described first main surface.

Thus, by providing trenches of a dotted line form in a step-by-step manner in the element having a twin trench structure and having a DLT structure, the concentration gradient from the center portion of the pn-repeating structure to the first conductive type region of the semiconductor substrate can be regarded as being continuous.

In the above described semiconductor device, a first impurity region is preferably formed on one side of the mesa portion of the semiconductor substrate surrounded by the plurality of trenches, a second impurity region is formed on the opposite side of the mesa portion and a third impurity region of the second conductive type is formed in, at least, a portion on the above described first main surface side of the first impurity region so as to form a main pn junction with the first impurity region.

Thus, the present invention has a twin trench structure and a DLT structure and can be applied to an element having an ST-type mesa region.

In the above described semiconductor device, the third impurity region forming a main pn junction with the first impurity region is preferably a body region of an insulating gate-type field effect transistor portion.

Thus, the present invention can be applied to an element having a MOS-FET in an element having a twin trench structure and a DLT structure.

In the above described semiconductor device, the low concentration region located at the outermost portion of the repeating structure preferably does not form an active element.

Thereby, the withstand voltage alone can be maintained without forming an element, such as a MOS-FET, in the low concentration region having a concentration gradient that tends to become unstable at the time of switching operation in an ST-type element having a twin trench structure and a DLT structure so that a stable switching operation can be obtained.

A manufacturing method for a semiconductor device of the present invention is characterized in that the low concentration region and other first and second impurity regions are formed by independently changing the concentration so that the low concentration region, which is either the first or second impurity region located at the outermost portion of the repeating structure, has the lowest impurity concentration or has the least generally effective charge amount from among all of the first and second impurity regions forming the repeating structure in a manufacturing method for a semiconductor device having a repeating structure wherein a structure where a first impurity region of a first conductive type and a second impurity region of a second conductive type are aligned side by side is repeated twice, or more, in a semiconductor substrate of the first conductive type According to the manufacturing method for a semiconductor device of the present invention, the outermost portion of the repeating structure has a concentration lower than that of the center portion and, thereby, the concentration of i layer of a pin diode formed of the repeating structure and the region of the first conductive type of the semiconductor substrate can be lowered. Thereby, it becomes possible to adjust the concentration of the i layer so that the withstand voltage obtained at the outermost portion of the repeating structure becomes greater than the withstand voltage obtained in the center portion. Therefore, an increase in the withstand voltage at a cell portion can be achieved, in contrast to the prior art.

In the above described manufacturing method for a semiconductor device, the low concentration region and other first and second impurity regions are preferably formed by means of ion implantation and heat treatment in order to independently control the concentration so as to form the low concentration region and other first and second impurity regions of which the concentrations have been independently changed.

Because of the formation using ion implantation in such a manner, the process can be simplified and the low concentration region can be formed under effective control. In addition, this method is suitable for a manufacturing method for a low withstand voltage element.

In the above described manufacturing method for a semiconductor device, the low concentration region and other first and second impurity regions are preferably formed by means of ion implantation and multi-stage epitaxial growth in order to independently control the concentration so as to form the low concentration region and other first and second impurity regions of which the concentrations have been independently changed.

Since multi-stage epitaxial growth is used, epitaxial layers can, in principle, be layered infinitely. Accordingly, this method is suitable for a manufacturing method for high withstand voltage element.

In the above described manufacturing method for a semiconductor device, the low concentration region and other first and second impurity regions are favorably formed by independently changing the concentrations and, therefore, the above described low concentration region and other first and second impurity regions have independently changed concentrations and are formed by means of ion implantation wherein implantation energy is changed according to multi-stages.

Since, a multi-stage ion implantation is used, the process can be simplified and the low concentration region can be formed under effective control. In addition, this method is suitable for a manufacturing method for a low withstand voltage element.

In the above described manufacturing method for a semiconductor device, impurity ions injected from the first openings in a mask for ion implantation preferably form the first and second impurity regions, other than the low concentration region, while impurity ions injected from the second openings, of which the total area of the openings is smaller than that of the first openings, form the low concentration region in order to independently change the concentrations at the time of the formation of the low concentration region and other first and second impurity regions.

Thus, openings, of which the areas of the openings differ, are used and, thereby, high concentration regions are low concentration regions can be formed at the same time through a single ion implantation process so that simplification of the process can be achieved.

In the above described manufacturing method for a semiconductor device, the second openings preferably have a configuration wherein a plurality of microscopic openings separated from each other are densely arranged so that impurity ions injected from each of the plurality of microscopic openings are integrated by applying a heat treatment so as to form a finished low concentration region of which the average impurity concentration is lower than that of the other first and second impurity regions.

Thus by using the configuration wherein a plurality of microscopic openings separated from each other are densely arranged, the openings, of which the areas of the openings differ, can easily be formed.

The above described manufacturing method for a semiconductor device preferably is further provided with the step of creating one, or more, trenches and a trench of a dotted line form having a surface pattern of a dotted line form in the first main surface at the same time by arranging the trench of a dotted line form so as to be located along the outside of the above one, or more, trenches wherein a plurality of first holes are arranged at intervals in a predetermined direction and the step of forming a low concentration region on the one sidewall of the trench of a dotted line form and the other first and second impurity regions on one of the sidewalls of the above one, or more, trenches at the same time by simultaneously implanting ions in the above one, or more, trenches and in one of sidewalls of respective trenches of a dotted line form.

Thus, the trenches of a dotted line form are used in the STM structure and, thereby, a high concentration region and a low concentration region can be simultaneously formed by means of a single ion implantation step so that simplification of the process can be achieved.

The above described manufacturing method for a semiconductor device preferably is further provided with the step of creating two, or more, trenches in the first main surface of the semiconductor substrate, the step of implantation of impurities in order to form the first and second impurity regions and the step of forming a low concentration region by substantially lowering the concentration of the impurities that have already been implanted through the ion implantation of impurities of a conductive type opposite to the already implanted impurities in the one sidewall of the trench located at the outermost portion.

Thus, in the STM structure the concentration of the impurity region at the outermost portion in the repeating structure can be lowered by means of counter doping.

The above described manufacturing method for a semiconductor device preferably is further provided with the step of creating one, or more, trenches in the first main surface of the semiconductor substrate, the step of ion implantation with a first implantation amount in order to form first or second impurity regions on one side of the respective sidewalls of the above one, or more, trenches, the step of creating a new trench at the outermost portion outside of the above one, or more, trenches in the condition wherein each of the above one, or more, trenches is filled in with a filling layer and the step of ion implantation with a second implantation amount smaller than the first implantation amount in order to form a low concentration region on one sidewall of the trench at the outermost portion.

Thus, the trenches in the center portion and at the outermost portion in the pn-repeating structure can be separately created and ion implantations can be separately implemented in the STM structure.

The above described manufacturing method for a semiconductor device preferably is further provided with the step of simultaneously creating two, or more, trenches including first and second trenches adjoining each other in the first main surface of the semiconductor substrate and a trench of a dotted line form that is located along the outside of the two, or more, trenches wherein the plurality of first holes are arranged at intervals in a predetermined direction and that, thereby, has a surface pattern of a dotted line form in the first main surface, the step of ion implantation of the first impurities in order to form the first impurity region in each of the two sidewalls of the first trench and the step of ion implantation of the second impurities in order to form the second impurity region in each of the two sidewalls of the second trench, wherein the low concentration region is formed on both sidewalls of the trench of a dotted line form by means of an implantation at the same time as the ion implantation of the first or second impurities.

Thus, a trench of a dotted line form is used in a twin trench structure and, thereby, a high concentration region and a low concentration region can be simultaneously formed by means of a single ion implantation step so that simplification of the process can be achieved.

The above described manufacturing method for a semiconductor device preferably is further provided with the step of creating a first group of trenches made of a plurality of first trenches in the first main surface of the semiconductor substrate, the step of ion implantation for forming the first impurity regions in the sidewalls on both sides of each of the first trenches, the step of creating a second group of trenches made of a plurality of second trenches in the first main surface so that the first trenches and the second trenches are located in an alternating manner, the step of ion implantation for forming the second impurity regions in the sidewalls on both sides of each of the second trenches and the step of the implantation of impurities of a conductive type opposite to that of the already implanted impurities into the sidewalls on both sides of the above described trench positioned at the outermost portion under the condition wherein the first and second trenches arranged in an alternating manner, except the trench located at the outermost portion, are filled in with a filling layer so as to substantially lower the concentration of the already implanted impurities so that the low concentration region is formed.

Thus, in the twin trench structure, the concentration of the impurities at the outermost portion of the repeating structure can be lowered by means of counter doping.

The above described manufacturing method for a semiconductor device is preferably provided with the step of creating a first trench group made of a plurality of first trenches in the first main surface of the above described semiconductor substrate, the step of ion implantation for forming the first impurity regions in the sidewalls on both sides of each of the first trenches, the step of creating a second group of trenches made of a plurality of second trenches in the first main surface under the condition wherein each of the first trenches is filled in with a filling layer so that the first trenches and the second trenches are located in an alternating manner, the step of ion implantation for forming the second impurity regions in the sidewalls on both sides of each of the second trenches, the step of creating a new trench at the outermost portion outside of the trench located at the outermost portion of the first and second trenches arranged in an alternating manner under the condition wherein each of the first and second trenches is filled in with a filling layer and the step of forming a low concentration region of which the impurity concentration is lower than that of the first or second impurity region by implanting impurity ions of the first or second conductive type.

Thus, in the twin trench structure, the trenches of the center portion and of the outermost portion in the repeating structure can be separately fabricated and ion implantations can also be separately carried out.

The above described manufacturing method for a semiconductor device preferably is further provided with the step of simultaneously creating a first group of trenches made of a plurality of first trenches and a second group of trenches made of a plurality of second trenches in the first main surface of the semiconductor substrate so that the first trenches and the second trenches are located in an alternating manner, the step of ion implantation for forming the first impurity regions in the sidewalls on both sides of each of the plurality of first trenches forming the first group of trenches under the condition wherein the second group of trenches is filled in with a first filling layer, the step of ion implantation for forming the second impurity regions in the sidewalls on both sides of each of the plurality of second trenches forming the second group of trenches under the condition wherein the first group of trenches is filled in with a second filling layer and the step of implanting impurity ions of a conductive type opposite to the already implanted impurities into the sidewalls on both sides of the trench at the outermost portion under the condition wherein all of the trenches of the plurality of first trenches forming the first group of trenches and plurality of second trenches forming the second group of trenches, except the trench at the outermost portion, located at the outermost portion, are filled in with a third filling layer so as to lower the concentration of the already implanted impurities so that the low concentration region is formed.

Thus, in the bi-pitch implantation, the concentration of the impurity region of the outermost portion in the repeating structure can be lowered by means of counter doping.

The above described manufacturing method for a semiconductor device is preferably provided with the step of simultaneously creating a first group of trenches made of a plurality of first trenches and a second group of trenches made of a plurality of second trenches in the first main surface to semiconductor substrate so that the first trenches and the second trenches are located in an alternating manner, the step of ion implantation for forming the first impurity regions in the sidewalls on both sides of each of the plurality of first trenches forming the first group of trenches under the condition wherein the second group of trenches is filled in with a first filling layer and the step of ion implantation for forming the second impurity regions in the sidewalls on both sides of each of the plurality of second trenches forming the second group of trenches under the condition wherein the first group of trenches is filled in with a second filling layer, wherein the trench at the outermost portion, located at the outermost portion, from among the trenches of the plurality of first trenches forming the first group of trenches and the plurality of second trenches forming the second group of trenches is a trench of a dotted line form having a surface pattern of a dotted line form wherein a plurality of holes are arranged at intervals in a predetermined direction in the first main surface.

Thus, in the case that a bi-pitch implantation is used, a high concentration region and a low concentration region can be simultaneously formed through a single ion implantation step by using a trench of a dotted line form and, thereby, simplification of the process can be achieved.

The above described manufacturing method for a semiconductor device is preferably provided with the step of forming two, or more, trenches in the first main surface of the semiconductor substrate, the step of ion implantation of impurities for forming the first or second impurity regions in the sidewalls on one side of the two, or more, trenches and the step of ion implantation of impurities of the same conductive type as that of the already implanted impurities into the sidewalls on one side of the trenches, other than the trench located at the outermost portion, under the condition wherein the trench located at the outermost portion, from among the two, or more, trenches, is filled in with a filling layer so as to substantially increase the concentration of the already implanted impurities and, thereby, the above described first or second impurity regions in the sidewalls of the trench located at the outermost portion becomes a region of a comparatively low concentration.

Thus, in the STM structure, ion implantation of impurities of the same conductive type is again carried out in the sidewalls of the trenches of the center portion and, thereby, the impurity concentration of the center portion is enhanced so that the concentration of the impurity regions at the outermost portion of the repeating structure can be made to be of a comparatively low concentration.

The above described manufacturing method for a semiconductor device is preferably further provided with the step of creating a first group of trenches made of a plurality of first trenches in the first main surface of the semiconductor substrate, the step of ion implantation for forming the first impurity regions in the sidewalls on both sides of each of the first trenches, the step of forming a second group of trenches made of a plurality of second trenches in first main surface so that the first trenches and the second trenches are located in an alternating manner, the step of ion implantation for forming the second impurity regions in the sidewalls on both sides of each of the second trenches and the step of implanting impurities of the same conductive type as the already implanted impurities in the sidewalls on both sides of the trenches, other than the trench located at the outermost portion, under the condition wherein the trench located at the outermost portion, from among the first and second trenches arranged in an alternating manner is filled in with a filling layer so as to substantially increase the concentration of the already implanted impurities so that the first or second impurity regions in the sidewalls of the trench located at the outermost portion becomes a region of a comparatively low concentration.

Thus, in the twin trench structure, ion implantation of impurities of the same conductive type is again carried out in the sidewalls of the center portion and, thereby, the impurity concentration of the center portion is enhanced so that the concentration of the impurity region at the outermost portion of the repeating structure can be lowered to have a comparatively low concentration.

The above described manufacturing method for a semiconductor device preferably is further provided with the step of simultaneously creating a first group of trenches made of a plurality of first trenches and a second group of trenches made of a plurality of second trenches in the first main surface of the semiconductor substrate so that the first trenches and second trenches are located in an alternating manner, the step of ion implantation for forming the first impurity regions in the sidewalls on both sides of each of the plurality of first trenches forming the first group of trenches under the condition wherein the second group of trenches is filled in with a first filling layer, the step of ion implantation for forming the second impurity regions in the sidewalls on both sides of each of the plurality of second trenches forming the second group of trenches under the condition wherein the first group of trenches is filled in with a second filling layer and the step of implanting impurity ions of the same conductive type as that of the already implanted impurities in the sidewalls on both sides of the trenches other than the trench at the outermost portion under the condition wherein the trench at the outermost portion, located at the outermost portion, from among the plurality of first trenches forming the first group of trenches and the plurality of second trenches forming the second group of trenches is filled in with a third filling layer so as to enhance the concentration of the already implanted impurities so that the first or second impurity regions in the sidewalls of the trench at the outermost portion become regions of a comparatively low concentration.

Thus, in the bi-pitch implantation, ion implantation of impurities of the same conductive type is again carried out in the sidewalls of the trenches in the center portion and, thereby, the impurity concentration of the center portion is enhanced so that the impurity region at the outermost portion of the repeating structure can be made to have a comparatively low concentration.

BEST MODE FOR CARRYING OUT THE INVENTION

Figure 1:
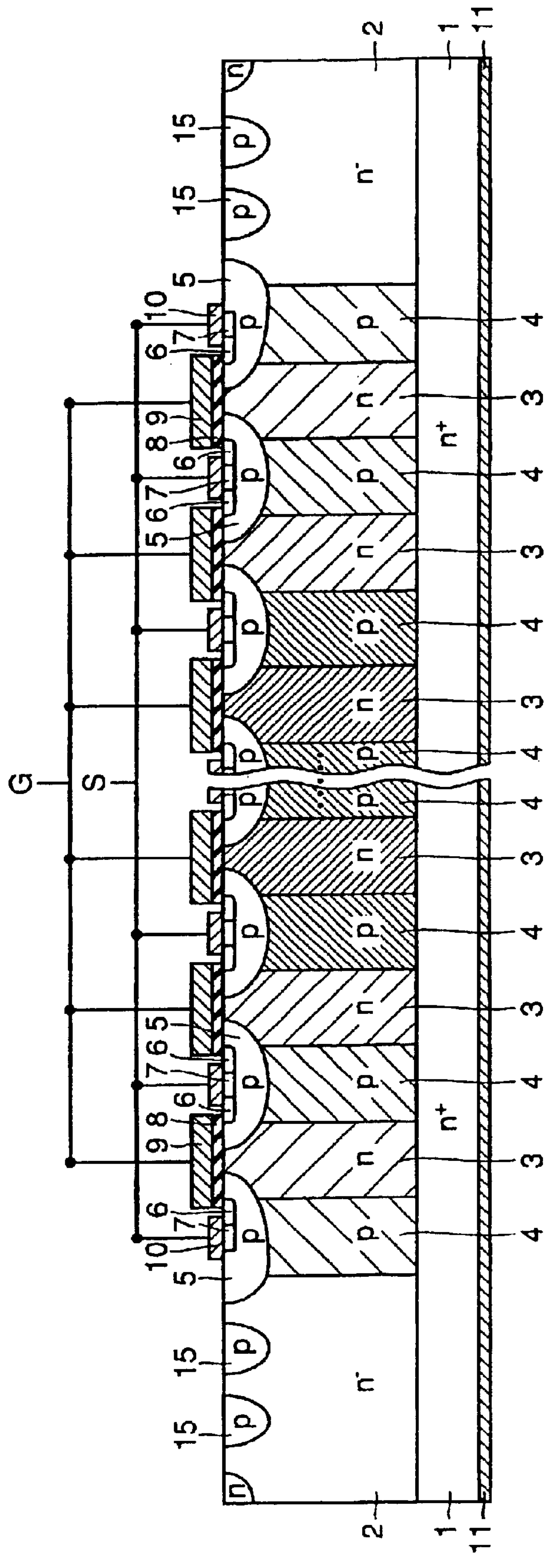
FIG. 1 is a cross sectional view schematically showing the configuration of a semiconductor device according to the first embodiment of the present invention.

In order to simplify the explanation, an example of the case wherein a vertical-type MOS-FET is formed as an embodiment is cited and described below. In the drawings, portions to which the same alphanumeric, or other, symbols are attached indicate the same regions or regions having the same operation or function and a portion to which the same number with an alphanumeric subscript is attached indicates a portion having a similar operation or function to a region having the same number without the alphanumeric subscript.

Analysis in the Embodiments of the Present Specification

Though no drawings corresponding to the analysis in the embodiments of the present specification are specifically described, this analysis is applied to all of the embodiments shown below.

That is to say, the impurity concentration of the impurity region located at the outermost portion of the pn-repeating structure of an n-type impurity region 3 and a p-type impurity region 4 is set at a low concentration to the extent that the structure can generally be regarded as a pin diode structure. Thereby, the impurity concentration of the impurity region located at the outermost portion of the pn-repeating structure has the lowest impurity concentration from among all of the impurity regions forming the pn-repeating structure.

In addition, the impurity concentration of $n^-$ epitaxial layer 2 is generally set at a concentration that is lower, by approximately one order, than a conventional element having the same grade of main withstanding voltage. Thereby, a pin diode can be formed so that an approximately trapezoidal electrical field intensity distribution form can be obtained, in contrast to the case of a $p^+/n^-$ junction alone having a triangular electrical field intensity distribution. Therefore, the thickness of $n^-$ epitaxial layer 2 can be made to be approximately half of that of a conventional element having the same grade of main withstanding voltage.

On the other hand, the withstand voltage of the cell portion differs from that of the case of a conventional MOS-FET structure and has a value obtained by the multiplication of $a \times 2 \times 10^5$ V/cm by the thickness of n epitaxial layer 1. Here, the constant a is a number that is experimentally found and is a number of from approximately 0.6 to 1.2.

First Embodiment

FIG. 1 shows a configuration that corresponds to the case wherein a MOS-FET is posited as a concrete active element structure. In reference to FIG. 1, an $n^-$ epitaxial layer 2 is formed on the first main surface side of an $n^+$ drain region 1 of the MOS-FET. A pn-repeating structure is formed within this $n^-$ epitaxial layer 2 wherein n-type drift regions 3 and p-type impurity regions 4 are repeated in alternation.

Here, the vicinity of the center of the element having this pn-repeating structure is omitted for simplification of explanation and the pitch of pn repetition is approximately 1 μm to 20 μm and, therefore, several hundreds to several tens of thousands of pairs of n-type drift regions 3 and p-type impurity regions 4 usually exist in the form of repeated combinations in this portion. The n-type impurity concentration of an n-type drift region 3 and the p-type impurity concentration of a p-type impurity region 4, which are combined in a pair, are set at substantially the same level.

A p-type body region 5 is formed on the first main surface side of a p-type impurity region 4. This p-type body region 5 is located in, at least, a portion of an n-type drift region 3 on the first main surface side so as to form a main pn junction with n-type drift region 3. An $n^+$ source region 6 of a MOS-FET and a $p^+$ contact region 7 for making a low resistance contact with this p-type body region 5 are formed side by side in the first main surface within this p-type body region 5.

A gate electrode 9 is formed above the first main surface so as to face p-type body region 5 located between n-type drift region 3 and $n^+$ source region 6 via a gate insulating film 8. When a positive voltage is applied to this gate electrode 9, p-type body region 5 facing gate electrode 9 is inverted to an n-type so that a channel region is formed. Gate insulating film 8 is made of, for example, a silicon oxide film and gate electrode 9 is made of, for example, a polycrystal silicon into which a high concentration of impurities is introduced.

A source electrode 10 made of a material including, for example, aluminum (Al) is formed on the first main surface so as to be electrically connected to $n^+$ source region 6 and $p^+$ contact region 7.

A drain metal wire 11 is formed on the second main surface so as to contact $n^+$ drain region 1.

Here, in an actual element, a source electrode part is electrically connected to an $n^+$ source region 6 and to a $p^+$ contact region 7 through a contact hole provided in the interlayer insulating film above the first main surface and via a barrier metal. In the present invention, however, this part is not important and, therefore, the source electrode part is simplified and is expressed using a solid line throughout the drawings.

In addition, though in an actual element, $n^+$ drain region 1 is several times to several tens of times thicker than the thickness of the effective element portion, $n^+$ drain region 1 is expressed as being thinner than the effective element portion in the drawings for the purpose of simplification. In addition to the above, scales, ratios of dimensions, and the like, are deformed in order to simplify the expression and, therefore, the respective dimensions in the drawings are not necessarily precise.

Though in the present embodiment a multiple guard ring structure made of p-type impurity regions 15 is provided as a termination structure of the pn-repeating structure, the structure of this portion is not particularly limited in the present invention and this guard ring structure may be replaced with another termination structure. Here, termination structures of the other embodiments described below can also be replaced in the same manner as in the above.

The structure of the present embodiment is characterized by the setting of the impurity concentration in the pn-repeating structure of n-type drift regions 3 and p-type impurity regions 4.

A pair made up of n-type impurity region 3 and p-type impurity region 4 located at the outermost portion, which is the termination portion of this pn-repeating structure, has the lowest impurity concentration (or the least general effective charge amount) from among all of the n-type impurity regions 3 and p-type impurity regions 4 forming the pn-repeating structure. That is to say, the closer to the center portion are n-type impurity regions 3 and p-type impurity regions 4 forming the pn-repeating structure, the higher are the impurity concentrations (or the greater are the general effective charge amounts) and the closer to the edge portion are n-type impurity regions 3 and p-type impurity regions 4 forming the pn-repeating structure, the lower are the impurity concentrations (or the smaller are the general effective charge amounts).

Here, though in the present embodiment, a configuration is shown wherein p-type impurity regions 4 are located at the outermost portions on both sides, left and right, of the pn-repeating structure, n-type drift region 3 may be located at the outermost portions on both sides, left and right, of the pn-repeating structure. In addition, a p-type impurity region 4 may be located at one outermost portion of the pn-repeating structure and n-type drift region 3 is located at the other outermost portion.

The pn-repeating structure has a concentration change of three stages (or change in general effective charge amount) in the present embodiment. n-type drift regions 3 and p-type impurity regions 4 in the center portion are a high concentration region, one pair made up of n-type drift region 3 and p-type impurity region 4 at the outermost portion is a low concentration region and one pair made up of n-type drift region 3 and p-type impurity region 4 located between the center portion and the outermost portion is a middle concentration region.

Here, the difference in these impurity concentrations is distinguished by the hatching in the drawings of the present specification. That is to say, the denser is the hatching, the higher is the concentration (or the greater is the general effective charge amount) and the less dense is the hatching, the lower is the concentration (or the smaller is the general effective charge amount) in the pn-repeating structure. Here, in some of the below described embodiments, regions without hatching are also illustrated and indicate regions of the lowest impurity concentration (or the smallest general effective charge amount) in the pn-repeating structure.

Concretely, in the case that the impurity concentration (or general effective charge amount) of high concentration regions 3 and 4 is posited as 100%, in general, the impurity concentration (or general effective charge amount) of middle concentration regions 3 and 4 is set at 67% and the impurity concentration (or general effective charge amount) of the low concentration regions 3 and 4 is set at 33% at the time of division into three. However, it is not always necessary to make a division into three equal parts based on the results of numerical simulations or experiments. In fact, the respective concentrations (or general effective charge amount) are allowed to have ranges and the impurity concentration (or general effective charge amount) of the middle concentration regions 3 and 4 may be approximately 60% to 80% while the impurity concentration (or general effective charge amount) of the low concentration regions 3 and 4 may be approximately 20% to 45%.

In the present embodiment, n-type drift region 3 and p-type impurity region 4 at the outermost portion of the pn-repeating structure have the lowest impurity concentration (or smallest general effective charge amount) from among all of the n-type drift regions 3 and p-type impurity regions 4 forming the pn-repeating structure. Therefore, a buffer region of middle concentration between the pin diode structure, which is in many cases formed at the outermost portion of the pn-repeating structure, and the repeating cell portion is formed so that the difference in the formation of the electrical field distribution occurring in the respective regions is eased and, therefore, the reduction of the main withstanding voltage in the connection portion can be restricted to a great extent in comparison with the case wherein the repeating cell portion and the conventional termination structure portion are directly connected.

Next, the difference between the present invention and the prior art is described.

As described above, the gist of Prior Art 1 indicates a guiding principle of a method for designing the entirety of an element in a form that includes the termination structure by somehow extending the super junction structure of the repeating cell portion to the termination structure portion. On the other hand, the gist of the present invention is "a structure, and manufacturing method for the same, wherein a buffer region of the electrical field between the insides of the cells of a high impurity concentration and the termination portion of a low impurity concentration at the time when a portion similar to the super junction effect described in Prior Art 1 wherein a three dimensional multiple RESURF effect is used and the termination structure portion having an electrical field distribution of a flat trapezoidal form such as of a pin diode having the conventional structure." Therefore, though Prior Art 1 and the present invention share the same purpose and effect that a high withstand voltage implemented in the same portion is not lost at the termination portion, they are formed from totally different points of view.

In addition, the structure of Prior Art 1 is a structure that includes a detailed regulation of the structure of the surface portion of a so-called termination structure portion and the presupposed condition differs from that of the present invention wherein the type of the so-called termination structure portion does not matter. On the other hand, according to the present invention, it is possible to adopt a combination of a variety of structures such as generally know multiple guard ring structures (FLR, FFR) or a field plate (FP) structure in addition to the above described "junction termination structure" in the termination structure so as to have a higher versatility.

Figure 148:
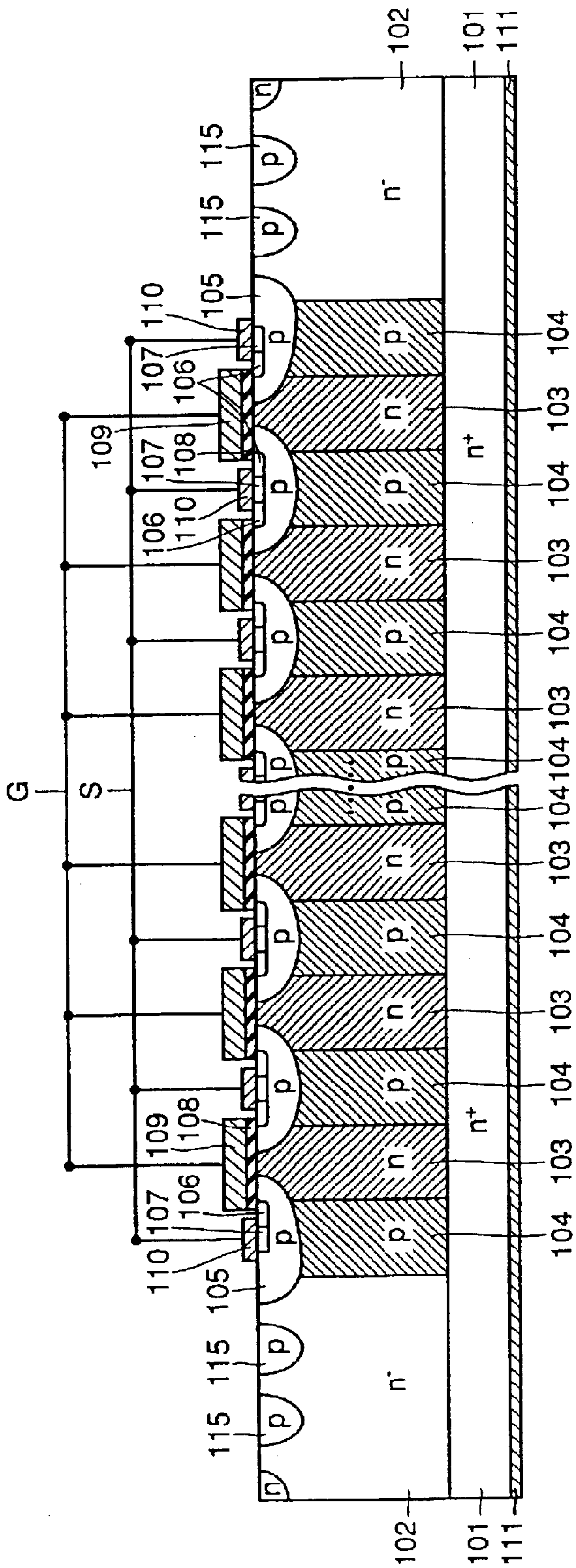
FIG. 148 is a cross sectional view schematically showing the first configuration of a semiconductor device according to a prior art.
Figure 149:
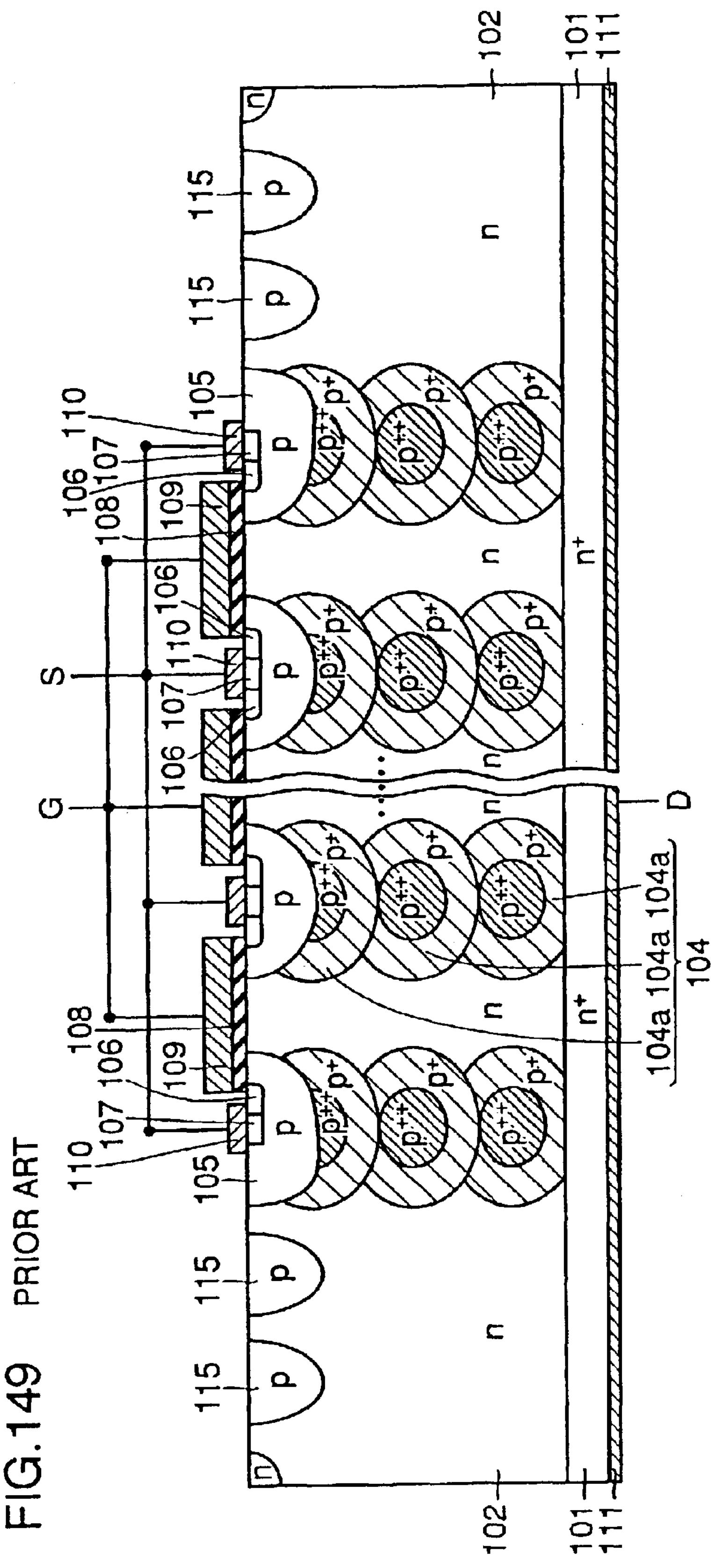
FIG. 149 is a cross sectional view schematically showing the second configuration of a semiconductor device according to a prior art.
Figure 150:
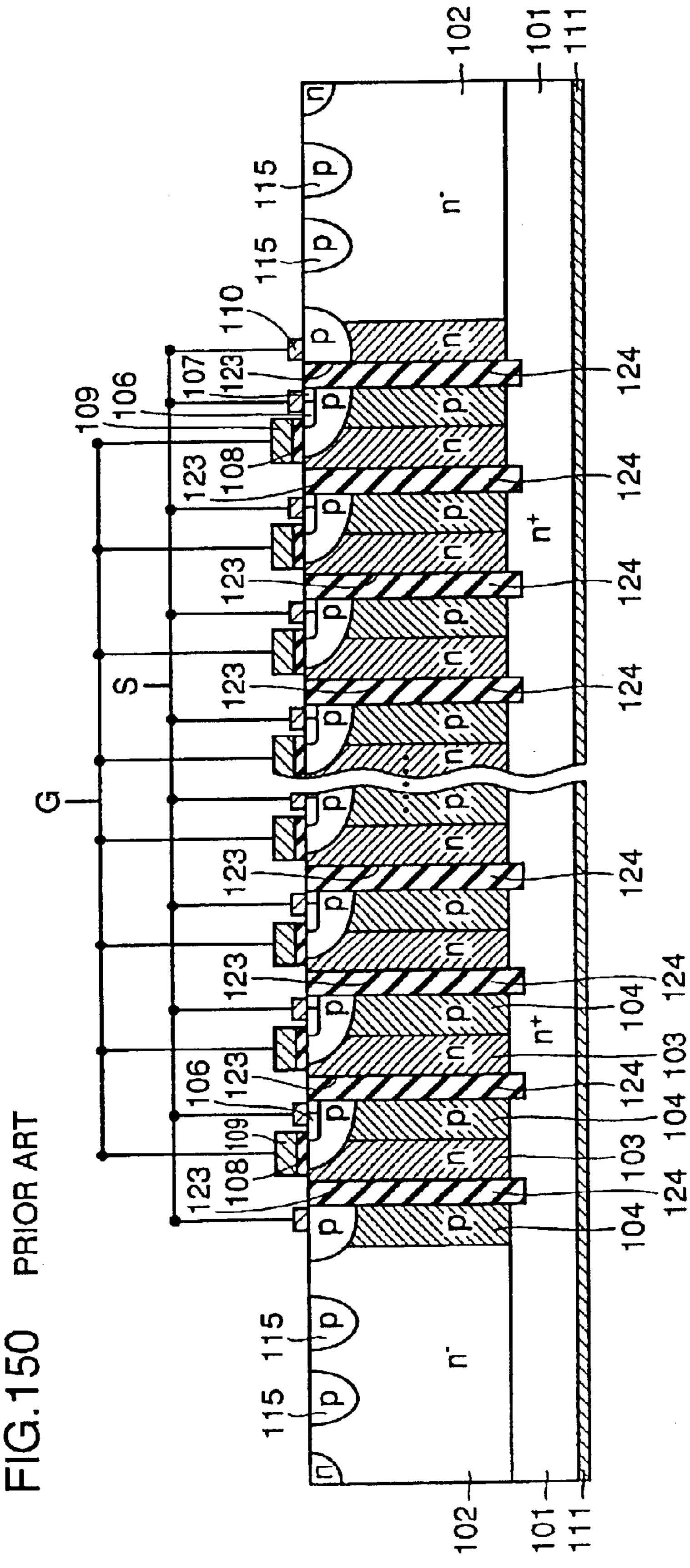
FIG. 150 is a cross sectional view schematically showing the third configuration of a semiconductor device according to a prior art.
Figure 151:
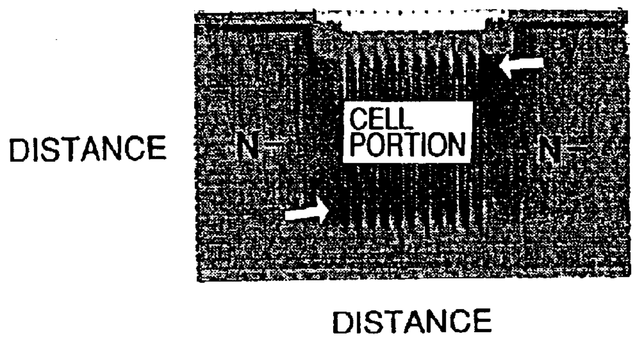
FIG. 151 is a view showing the appearance of electrical field concentration at the termination portions of the repetition according to a device simulation that corresponds to the prior art of FIG. 150.
Figure 152:
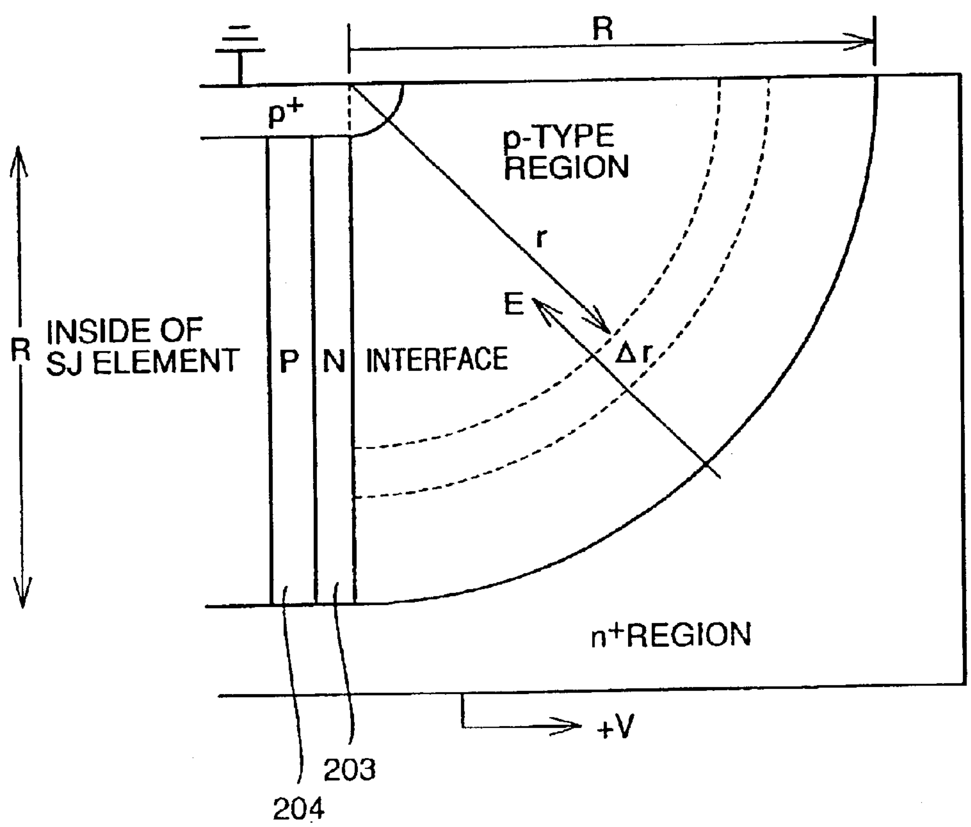
FIG. 152 is a cross sectional view schematically showing the configuration of the semiconductor device disclosed as Prior Art 1.
Figure 153:
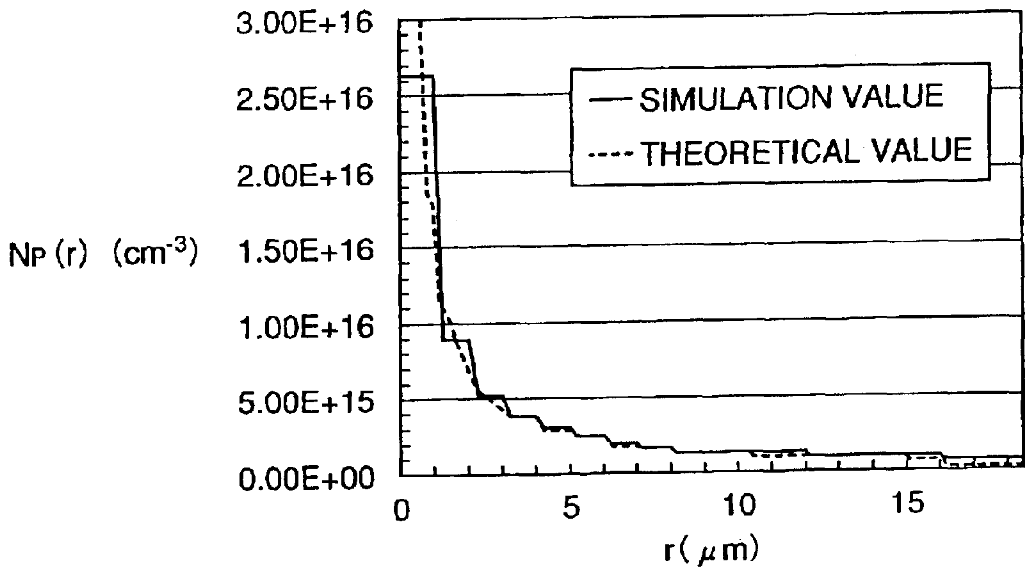
FIG. 153 is a graph showing the distribution of the p-type acceptor concentration of the moving radius of Prior Art 1.
Figure 154:
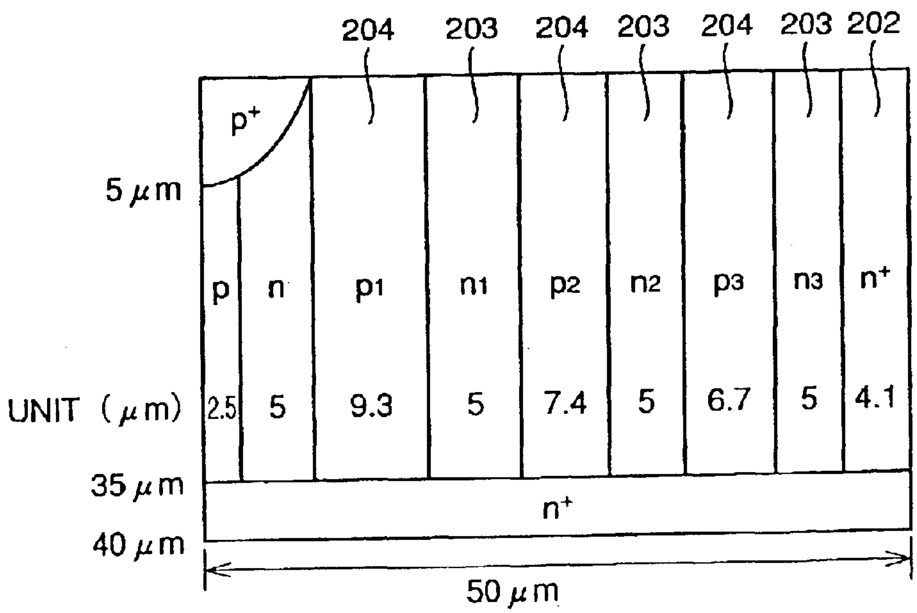
FIG. 154 is a cross sectional view schematically showing the pn-repeating structure of the semiconductor device disclosed as Prior Art 1.
Figure 155:
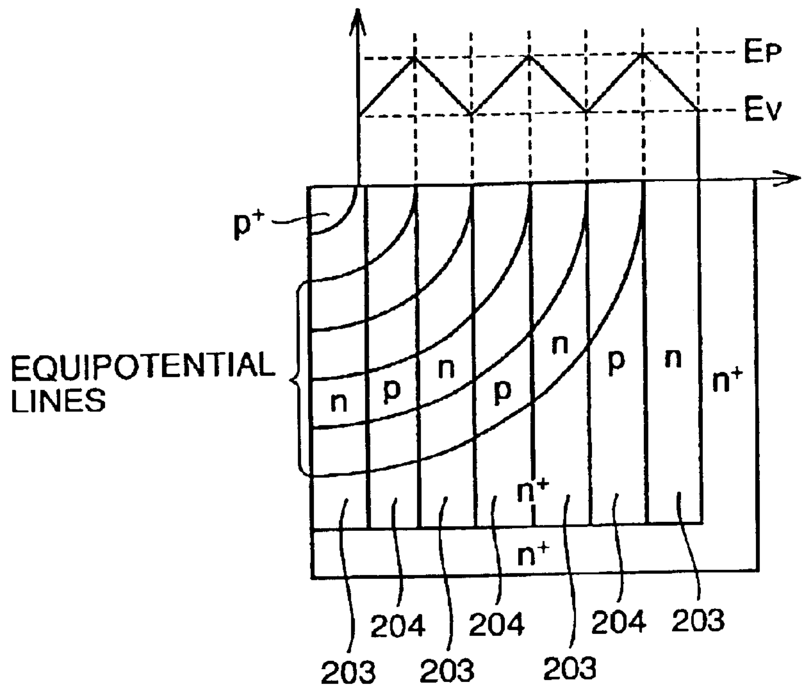
FIG. 155 is a cross sectional view showing the configuration, together with lines of potential, of the semiconductor device disclosed as Prior Art 1.
Figure 156:
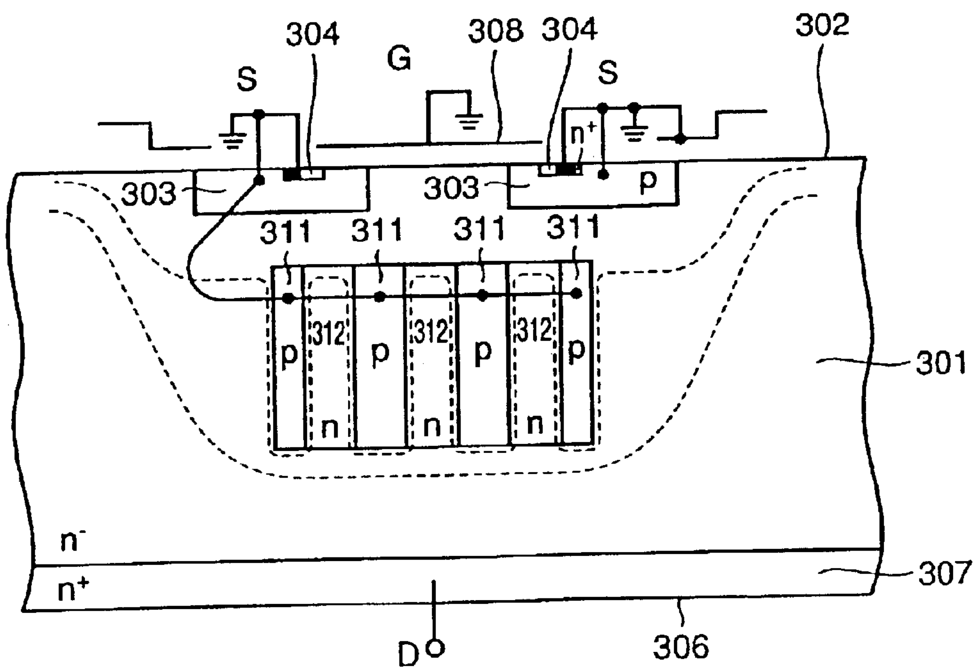
FIG. 156 is a cross sectional view schematically showing the configuration of a semiconductor device disclosed in U.S. Pat. No. 5,438,215.

Thus, the present invention presupposes that the concentration of the i layer of the pin diode portion including the termination structure formed of a conventional multiple guard ring or of a field plate is set at a low concentration so as to have a higher withstand voltage than that obtained in the pn-repeating structure and, therefore, a super junction structure is not applied in the termination structure portion, unlike the configuration shown in Prior Art 1. In addition, according to the present invention, a three dimensional multiple RESURF structure portion inside of the cell and a termination structure in a conventional structure are not simply combined as in a prior art or in Prior Art 2, shown by FIGS. 148 to 150, and a buffer layer of a middle concentration is provided so that the change in concentration does not become extreme.

Second Embodiment

Figure 2:
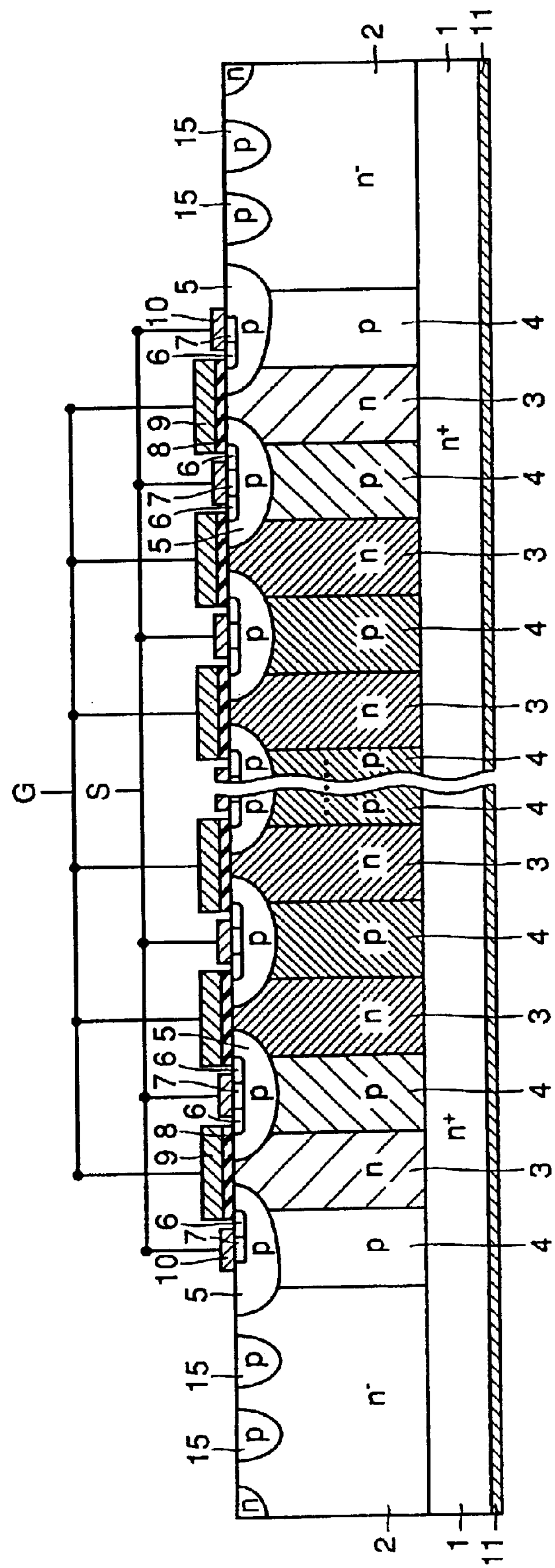
FIG. 2 is a cross sectional view schematically showing the configuration of a semiconductor device according to the second embodiment of the present invention.

In reference to FIG. 2, the configuration of the present invention differs from the configuration shown in FIG. 1 in the point that the present embodiment has a configuration wherein the concentrations of n-type drift regions 3 and p-type impurity regions 4 are independently lowered to get lesser in an alternating manner in the direction toward the edge portion side in four stages without using each combination of n-type drift region 3 and p-type impurity region 4 (hereinafter referred to as a pn combination) as one unit. That is to say, p-type impurity region 4 located at the outermost portion of the pn-repeating structure is a region of extremely low concentration having the lowest impurity concentration. n-type drift region 3 adjoining this p-type impurity region 4 at the outermost portion is a low concentration region having the next lowest impurity concentration. p-type impurity region 4 adjoining this n-type drift region 3 on the center portion side is a middle concentration region having an impurity concentration lower than the high concentration region of the center portion and higher than the low concentration region.

Here, the other parts of the configuration are approximately the same as of the above described configuration of the first embodiment and, therefore, the same symbols are attached to the same members, of which the descriptions are omitted.

In the present embodiment there is an advantage wherein the concentration is gradually reduced in multiple stages and, thereby, in practice, the change can be regarded as being continuous without discrete stages. There is an advantage wherein the area of a portion having a concentration gradient in the termination portion can be eliminated, even though the electrical field distribution form is slightly distorted in comparison with the configuration, wherein the concentration is reduced in four stages using a unit of a pn combination in the above described first embodiment.

Here, in the case that the total area of the element is sufficiently large, the area used for the structure of these terminal portions is sufficiently small so that the elimination of the area can be regarded as having no influence. Accordingly, in such a case, a more stable electrical field distribution form can be obtained by reducing the concentration using a unit of a pn combination as in the first embodiment.

Contrarily, in the case of a comparatively small element area of approximately 1 mm by 1 mm, the ratio of the area used for the structure of the termination portion to the entirety of the element becomes high when the pn combination is used as a unit and, thereby, there is a disadvantage wherein the on resistance increases (deteriorates). Accordingly, in such a case, the configuration wherein the concentrations of n-type drift regions 3 and p-type impurity regions 4, without using the pn combination as a unit, are independently lowered is effective, as in the present embodiment.

In addition, in the case that the impurity concentration of the high concentration regions 3 and 4 is posited as 100%, a concentration setting of each region in the case that the concentration gradient has four stages, as in the present embodiment, is ideal where the respective impurity concentrations of middle concentration region 4, low concentration region 3 and region of extremely low concentration 4 are equally divided so as to be 75%, 50% and 25%. As described in the first embodiment, however, the impurity concentrations need not be reduced in equal steps so that a certain range is allowed to each of the impurity concentrations.

Third Embodiment

Figure 3:
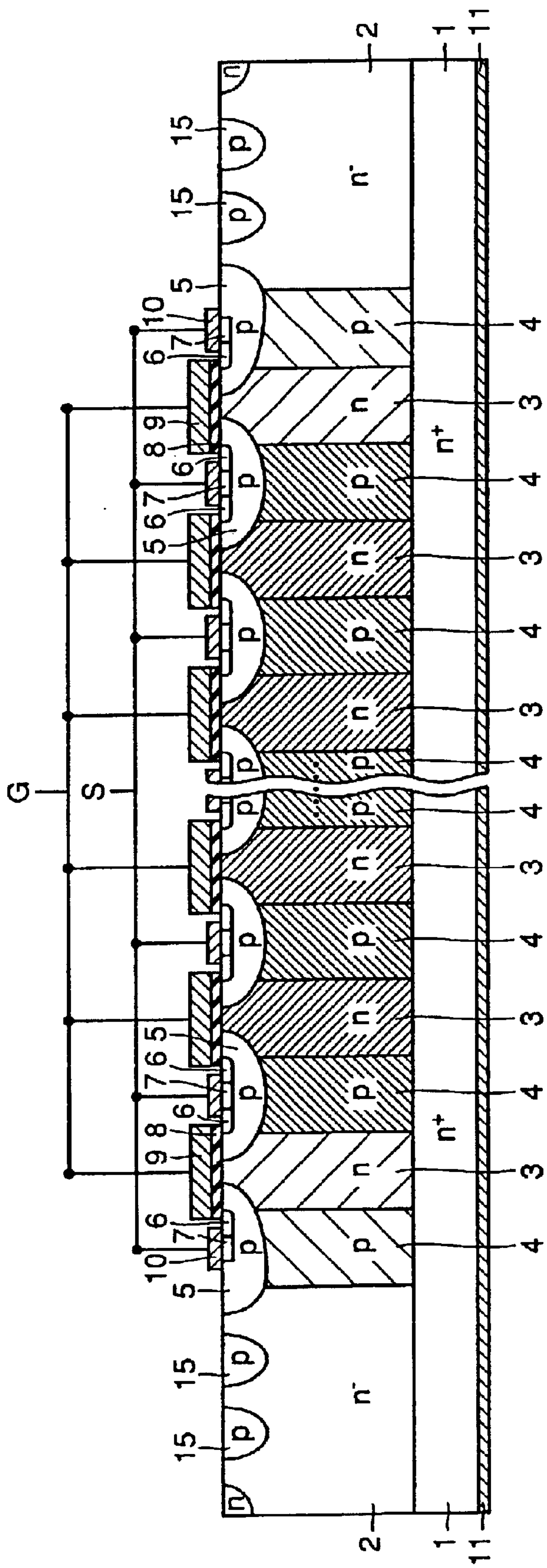
FIG. 3 is a cross sectional view schematically showing the configuration of a semiconductor device according to the third embodiment of the present invention.

In reference to FIG. 3, the configuration of the present embodiment differs from the configuration of the first embodiment in the point wherein the low concentration region at the outermost portion of the pn-repeating structure in the configuration of the present embodiment is formed of only one pair of the pn combination, which is one unit. That is to say, the pair formed of the pn combination 3 and 4 located at the outermost portion of the pn-repeating structure has the same impurity concentration and has an impurity concentration lower than that of the high concentration regions 3 and 4 in the center portion.

In addition, as for the concentration setting of the respective regions in the case that the concentration gradient has only one stage, as in the present embodiment, the impurity concentration of each of the low concentration regions 3 and 4 is preferably no less than 30% and no greater than 70% in the case that the impurity concentration of the high concentration regions 3 and 4 is posited as 100%.

Here, the other parts of the configuration are approximately the same as in the configuration of the above described first embodiment and, therefore, the same symbols are attached to the same members, of which the descriptions are omitted.

As described below, there are many cases wherein it is difficult to form low concentration regions because of manufacturing reasons and wherein an increase in the number of steps leads to an extension of the manufacturing period or an increase in costs. It is necessary to reduce the number of low concentration regions in order to avoid such defects related to manufacture.

Fourth Embodiment

Figure 4:
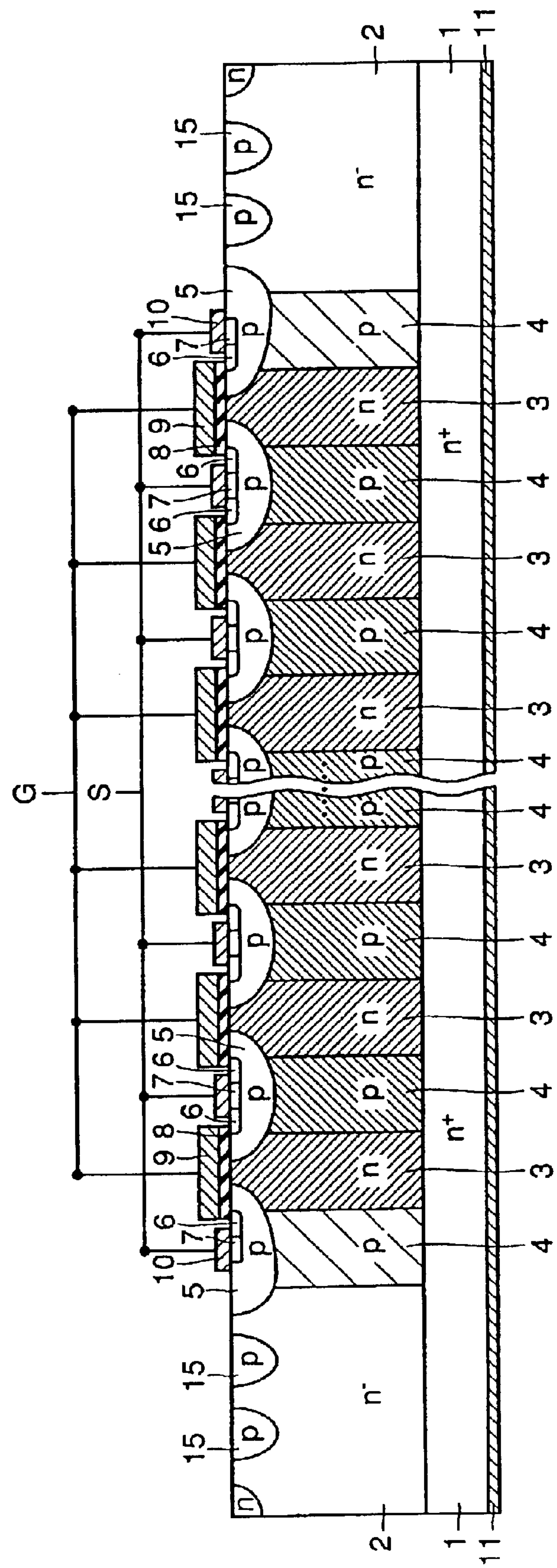
FIG. 4 is a cross sectional view schematically showing the configuration of a semiconductor device according to the fourth embodiment of the present invention.

In reference to FIG. 4, the configuration of the present embodiment differs from the configuration of the first embodiment in the point that the low concentration region at the outermost portion in the pn-repeating structure is solely p-type impurity region 4 in the present embodiment. That is to say, p-type impurity region 4 at the outermost portion of the pn-repeating structure is solely the low concentration region while other n-type drift regions 3 and p-type impurity regions 4 forming the pn-repeating structure are all high concentration regions.

Here, the other parts of the configuration are approximately the same as of the above described configuration of the first embodiment and, therefore, the same symbols are attached to the same members, of which the descriptions are omitted.

The present embodiment has a structure obtained by further simplifying the above described configuration of the third embodiment and, therefore, is effective in, particularly, an element having low voltage, low current and small element area and a manufacturing method for such an element can also be simplified.

Fifth Embodiment

Figure 5:
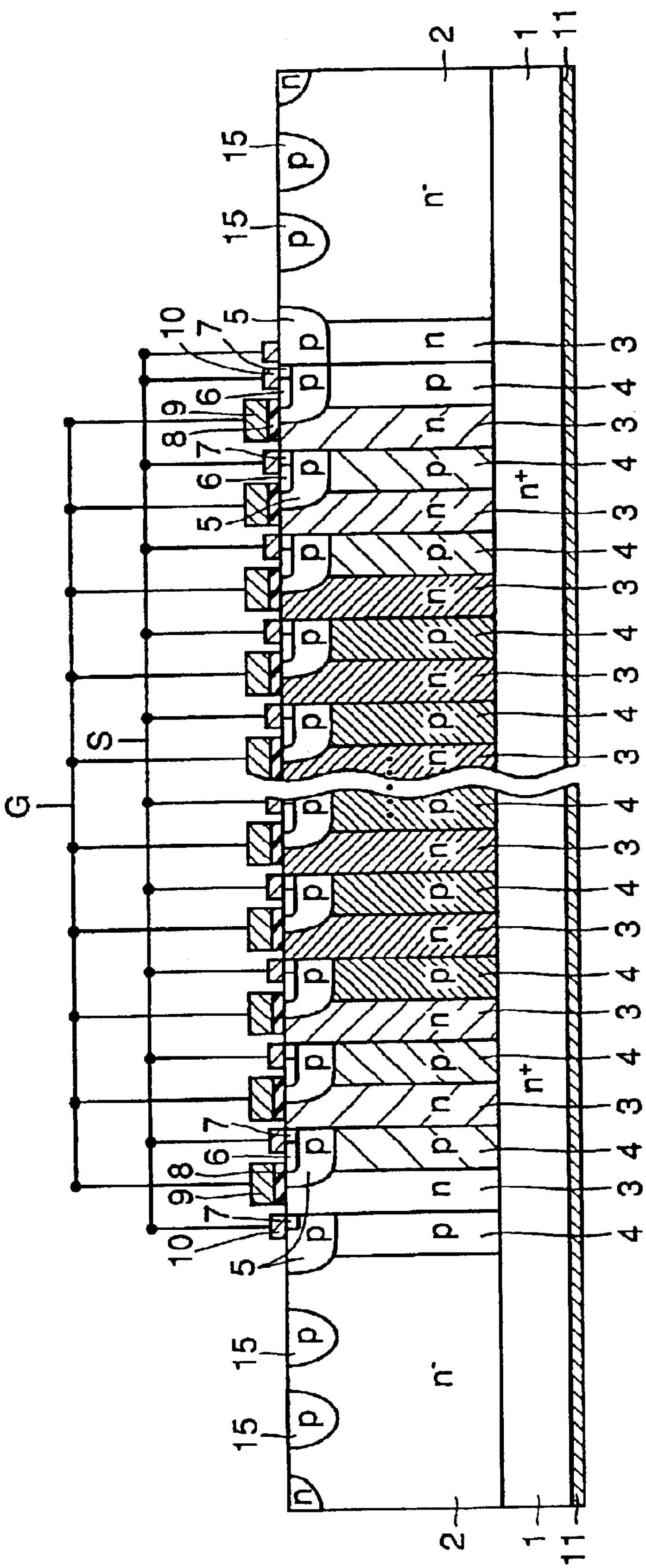
FIG. 5 is a cross sectional view schematically showing the configuration of a semiconductor device according to the fifth embodiment of the present invention.

In reference to FIG. 5, the configuration of the present Embodiment is an example wherein a technique of lowering the concentration in three stages as shown in FIG. 2 and a technique of concentration reduction using the pn combination shown in FIG. 1 as one unit are combined. That is to say, a pair made up of pn combination 3, 4 at the outermost portion in the pn-repeating structure is an extremely low concentration region having the lowest impurity concentration in the pn-repeating structure. A pair made up of pn combination 3, 4 adjoining this extremely low concentration region is a low concentration region having the next lowest impurity concentration. A pair made up of pn combination 3, 4 adjoining this low concentration region is a middle concentration region having the impurity concentration lower than that of the pn combination 3, 4 in the center portion and higher than that of the low concentration region.

The configuration of the present embodiment differs from the configurations of the first to fourth embodiments in the configuration of the MOS-FET portion. That is to say, though in the configurations of the first to fourth embodiments, MOS-FET structures are formed on both sides of n-type drift layer 3 in a symmetrical manner, a MOS-FET structure is formed on only one side of n-type drift layer 3 in the present embodiment.

Here, the other parts of the configuration are approximately the same as of the above described configuration of the first embodiment and, therefore, the same symbols are attached to the same members, of which the descriptions are omitted.

It is seen that the smaller is the cell repeating period, more effectively the three dimensional multiple RESURF effect works due to the pn-repeating structure. In addition, a small cell pitch is required from a point of view of making the previous RESURF effect effective.

In the present embodiment, the MOS-FET structure is formed on only one side of n-type drift region 3 and, therefore, the cell pitch can be scaled down. Therefore, though the total channel width (area) of the MOS-FET is somewhat sacrificed, the cell pitch can be reduced by up to half without changing the total channel width in comparison with the case (the first to fourth embodiments) wherein MOS-FETs are formed in a symmetrical manner and, thereby, an increase in the performance of the pn-repeating structure can be achieved.

Sixth Embodiment

Next, the structure wherein the present invention is applied to the structure having multiple epitaxial layers is described in the sixth to eighth embodiments.

Figure 6:
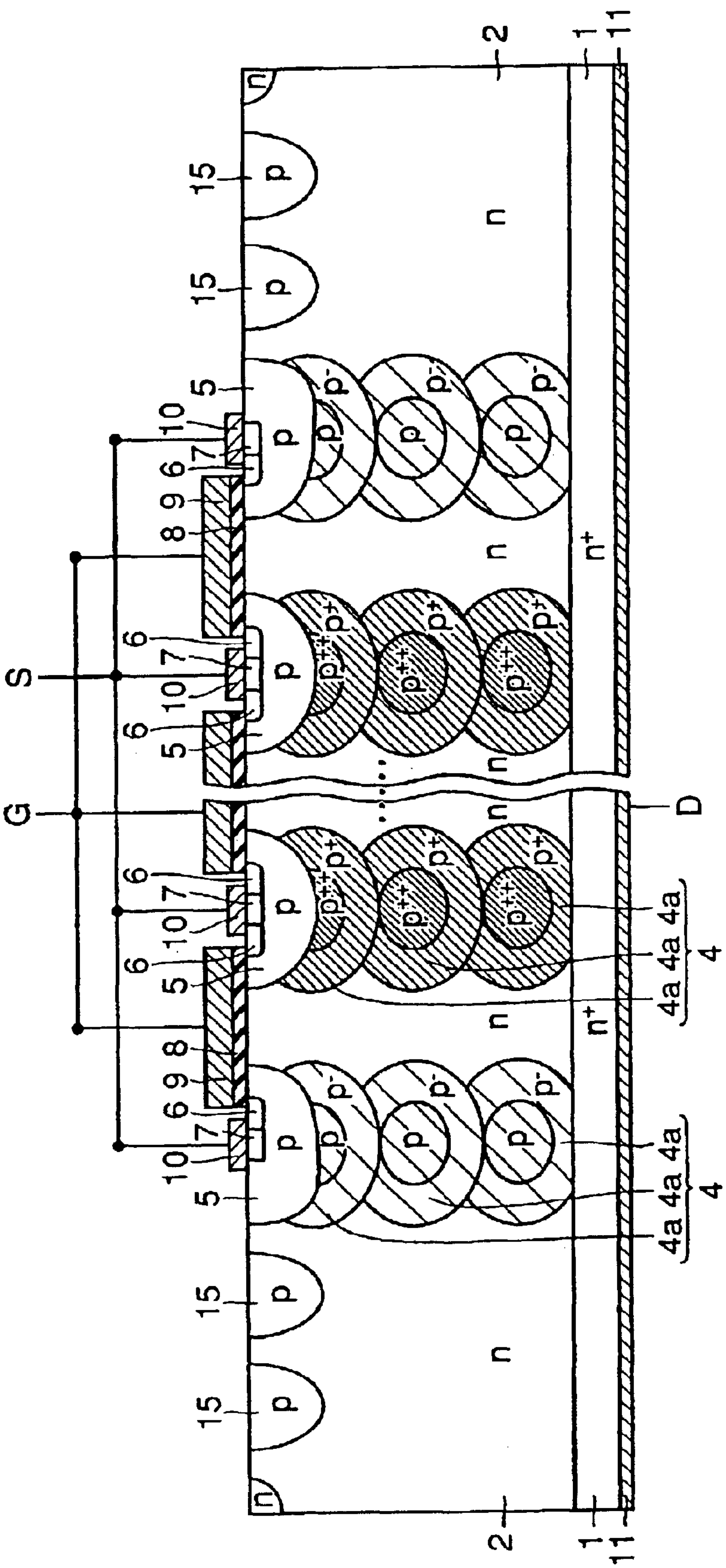
FIG. 6 is a cross sectional view schematically showing the configuration of a semiconductor device according to the sixth embodiment of the present invention.

In reference to FIG. 6, in the present embodiment, a plurality of (for example, three) p-type impurity regions 4*a* forming layers in the depth direction of the semiconductor substrate is integrated so as to form a p-type impurity region 4 making up the pn-repeating structure. p-type impurity region 4 located at the outermost portion of the pn-repeating structure from among a plurality of p-type impurity regions 4 has the lowest impurity concentration forming a low concentration region. In addition, each n-type region in an $n^-$ epitaxial layer 2 placed between each pair of the plurality of p-type impurity regions 4 forms an n-type impurity region making up the pn-repeating structure.

Here, the other parts of the configuration are approximately the same as of the above described configuration of the first embodiment and, therefore, the same symbols are attached to the same members, of which the descriptions are omitted.

In the present embodiment, p-type impurity region 4 at the outermost portion in the pn-repeating structure has the lowest impurity concentration in the same manner as in the first embodiment and, therefore, the withstand voltage obtained in this outermost portion becomes high so that an increase in the withstand voltage at the cell portion can be achieved.

Here, FIG. 6 shows, for the purpose of simplification of the drawing, a configuration wherein the concentration of only one stage respectively on both sides of the terminal portions is lowered. As shown in the first to fifth embodiments, however, the concentration gradient layers of the termination portions may have multiple stages. In the case of the multiple stages, though a withstand voltage higher than that in the case of one stage can be obtained, there is a disadvantage that the process becomes complex as shown in the description of the process flow in the following.

In addition, though p-type impurity region 4 has a structure including the concentration distribution in the depth direction of the semiconductor substrate as shown in FIG. 6, a symmetric concentration repeated in the lateral direction is discussed in broad perspective in the present invention and, therefore, a problem caused by such a concentration distribution in the depth direction can be ignored.

In addition, though only a two-stage concentration gradient of p-type impurity region 4 is depicted for the purpose of simplification in FIG. 6, the concentration of p-type impurity region 4 in actuality changes without discrete stages and in a continuous manner and changes periodically in the depth direction of the substrate.

The configuration (FIG. 6) in the present embodiment differs from the configurations of below described Embodiments 7 and 8 in the point that an $n^-$ epitaxial layer 2 is used as a substrate in this embodiment, wherein the concentration of the layer has been increased to the degree that the p-type impurity concentration of p-type impurity region 4 is balanced with that of this layer. As a result, in the present embodiment, the impurity distribution in a cross section of p-type impurity region 4 becomes of a form well-known in Japan as "round sweet balls of confectionary on a skewer."

Seventh and Eighth Embodiments

Figure 7:
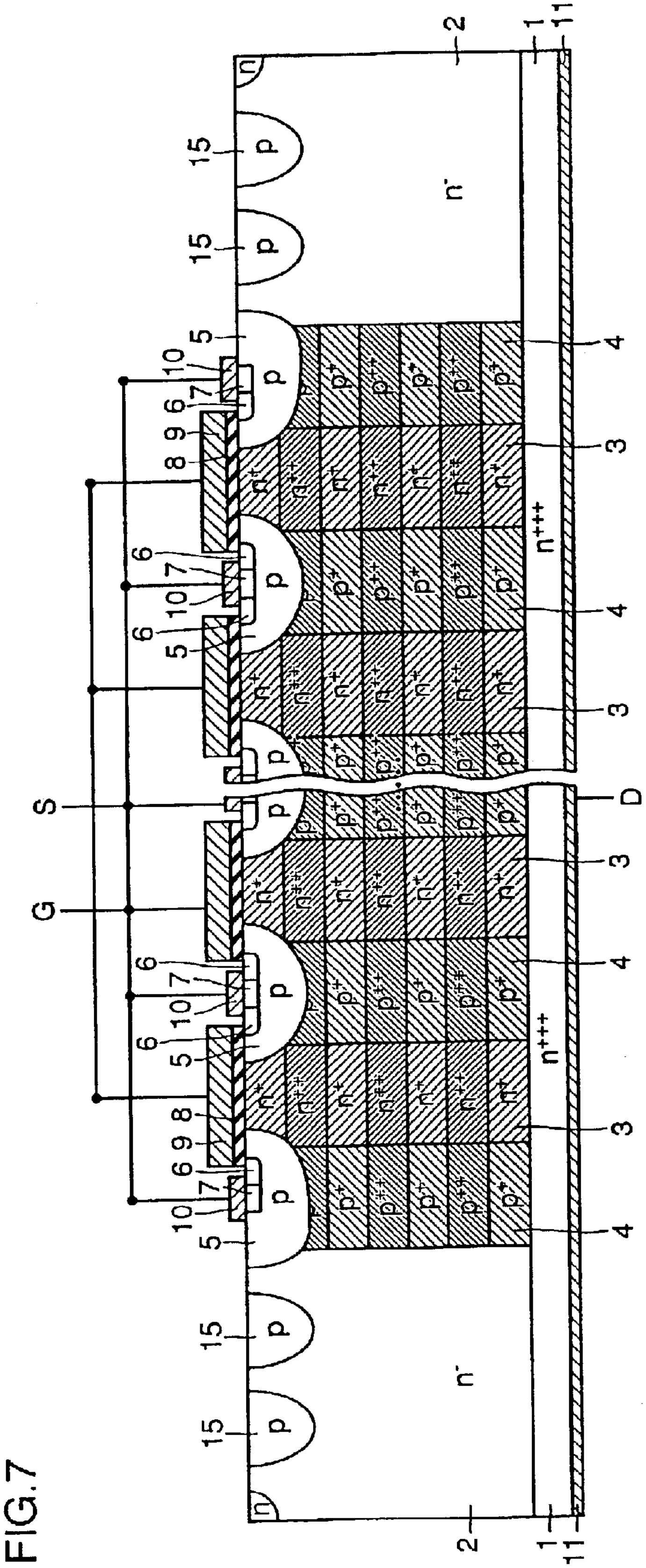
FIG. 7 is a cross sectional view schematically showing a buried multi-layer epitaxial structure according to a prior art.

In the pn-repeating structure in the buried multiple epitaxial layers described so far, a plurality of (for example, three) p-type impurity regions 4*a* that form layers in the depth direction of the semiconductor substrate is integrated as shown in FIG. 7 so as to form p-type impurity regions 4 making up the pn-repeating structure. In addition, a plurality of (for example, three) n-type impurity regions 3*a* that form layers in the depth direction of the semiconductor substrate is integrated so as to form n-type drift regions 3 making up the pn-repeating structure. Therefore, each of p-type impurity regions 4 and n-type impurity regions 3 has an impurity concentration distribution that periodically changes in the depth direction of the substrate.

An average impurity concentration of each of the plurality of p-type impurity regions 4 is substantially the same and an average impurity concentration of each of the plurality of n-type drift regions 3 is also substantially the same.

This configuration differs from the above described configuration of the sixth embodiment in the point that each of the p-type or n-type regions forming the pn-repeating structure as described above has a constant average concentration and that n-type drift regions 3 are formed through a plurality of 4implantation steps wherein the implantation energies are changed in the same manner as in p-type impurity regions 4 and, therefore, the concentration distribution in the depth direction of the semiconductor substrate is included in the structure.

Though in FIG. 7, the concentration gradients of n-type drift regions 3 and p-type impurity regions 4 in the depth direction of the semiconductor substrate are depicted as having only two stages for the purpose of simplification in the same manner as in FIG. 6, in actuality they change without discrete stages and in a continuous manner. In addition, as shown in FIG. 7 the configuration formed according to a method of diffusing both the p-type impurities and n-type impurities simultaneously so as to form the pn-repeating structure does not become of a form of "round sweet balls of confectionary on a skewer" as shown in FIG. 6.

Figure 8:
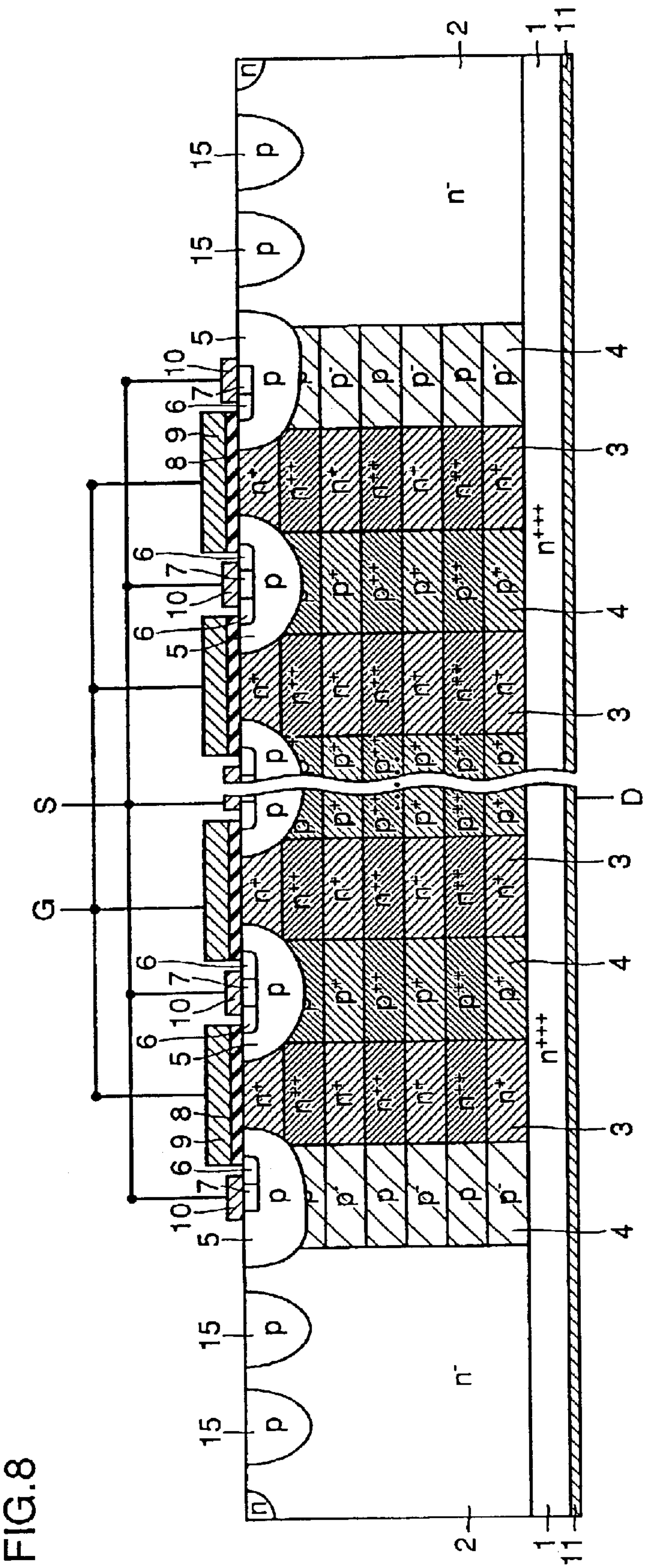
FIG. 8 is a cross sectional view schematically showing the configuration of a semiconductor device according to the seventh embodiment of the present invention.

In contrast to this, the configuration of the seventh embodiment shown in FIG. 8 differs from the conventional configuration of FIG. 7 in the point that the concentration of p-type impurity region 4 at the outermost portion of the pn-repeating structure in the buried multiple epitaxial layers has been lowered by one stage in the configuration of the seventh embodiment.

Figure 9:
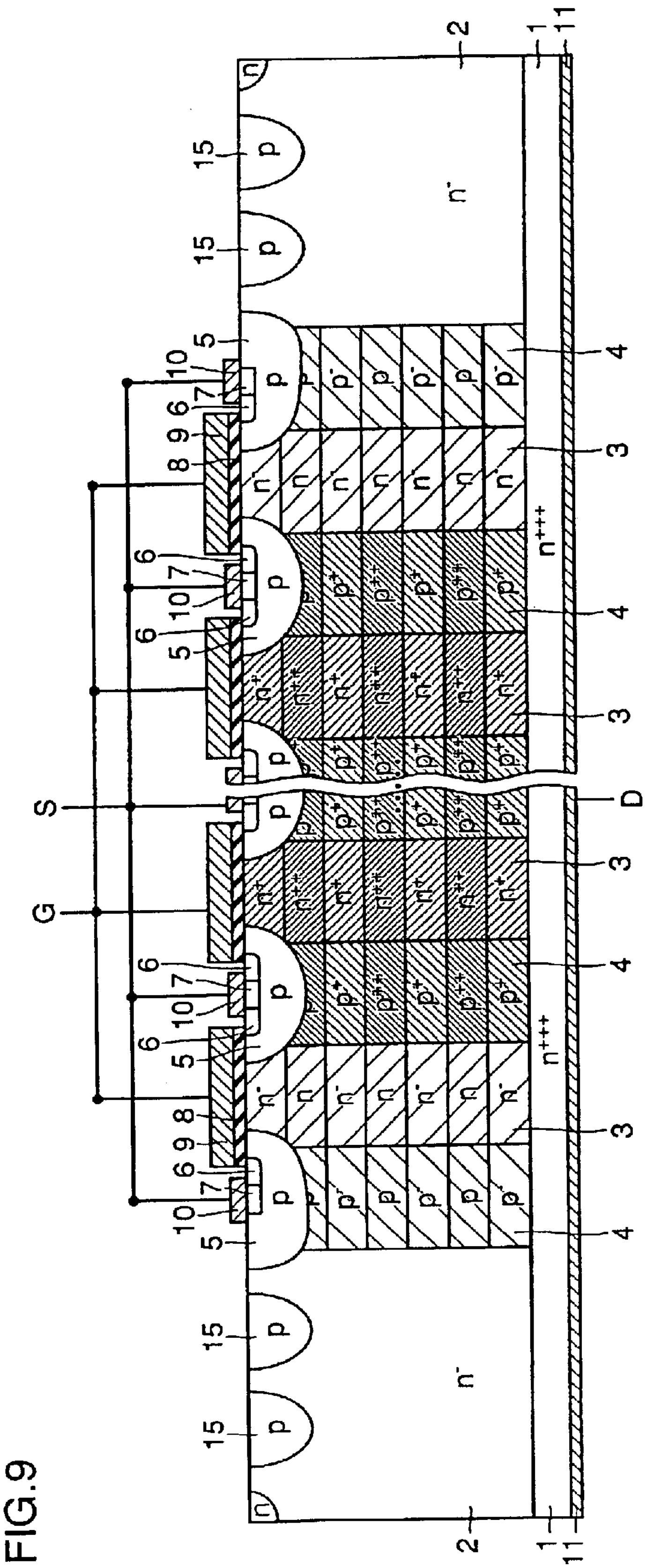
FIG. 9 is a cross sectional view schematically showing the configuration of a semiconductor device according to the eighth embodiment of the present invention.

In addition, the configuration of the eighth embodiment showing FIG. 9 differs from the conventional configuration of FIG. 7 in the point that the concentration of a pair made of the pn combination of p-type impurity region 4 and n-type drift layer 3 at the outermost portion of the pn-repeating structure in the buried multiple epitaxial layers is lowered by one stage in the configuration of the eighth embodiment.

Here, the other parts of the configurations of FIGS. 8 and 9 are approximately the same as in the configuration shown in FIG. 7 and, therefore, the same symbols are attached to the same members, of which the descriptions are omitted.

In the seventh and eighth embodiments, p-type impurity region 4 (and n-type drift layer 3) at the outermost portion in the pn-repeating structure has the lowest impurity concentration in the same manner as in the first embodiment and, therefore, the withstand voltage obtained at this outermost portion becomes high so that an increase in withstand voltage in the cell portion can be achieved.

Ninth to Twelfth Embodiments

Next, the structure wherein the present invention is applied to a diode instead of a MOS-FET is described in the ninth to twelfth embodiments.

Figure 10:
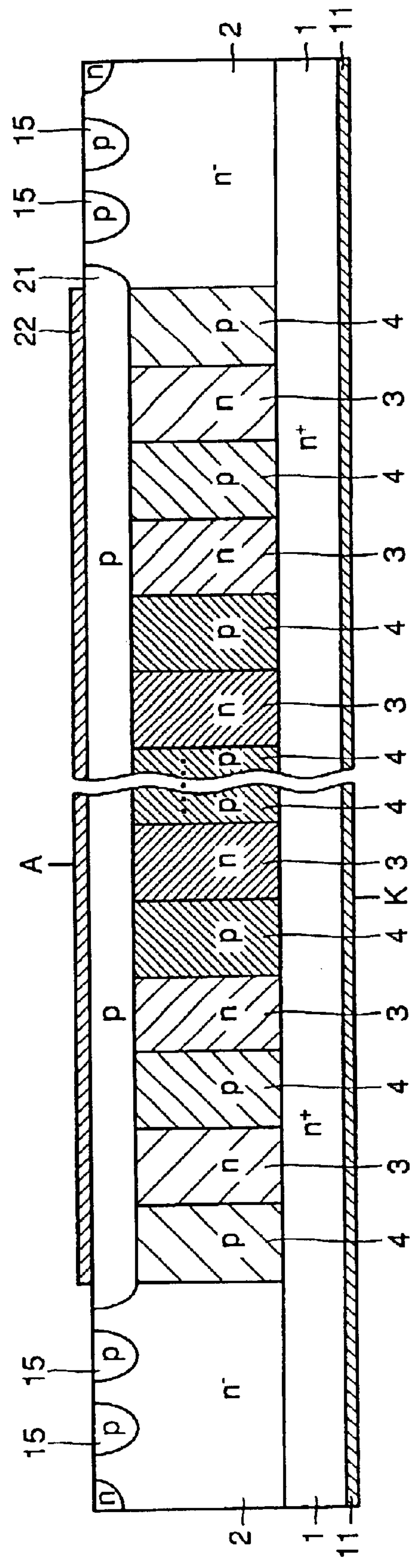
FIG. 10 is a cross sectional view schematically showing the configuration of a semiconductor device according to the ninth embodiment of the present invention.
Figure 11:
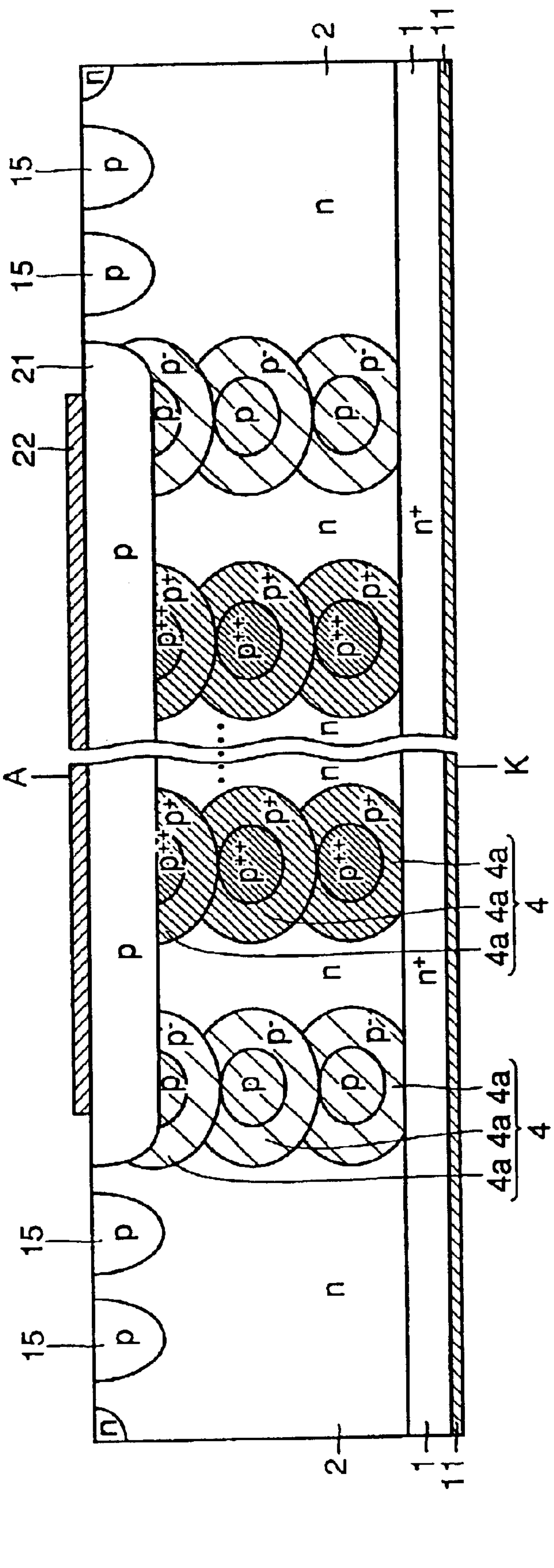
FIG. 11 is a cross sectional view schematically showing the configuration of a semiconductor device according to the tenth embodiment of the present invention.
Figure 12:
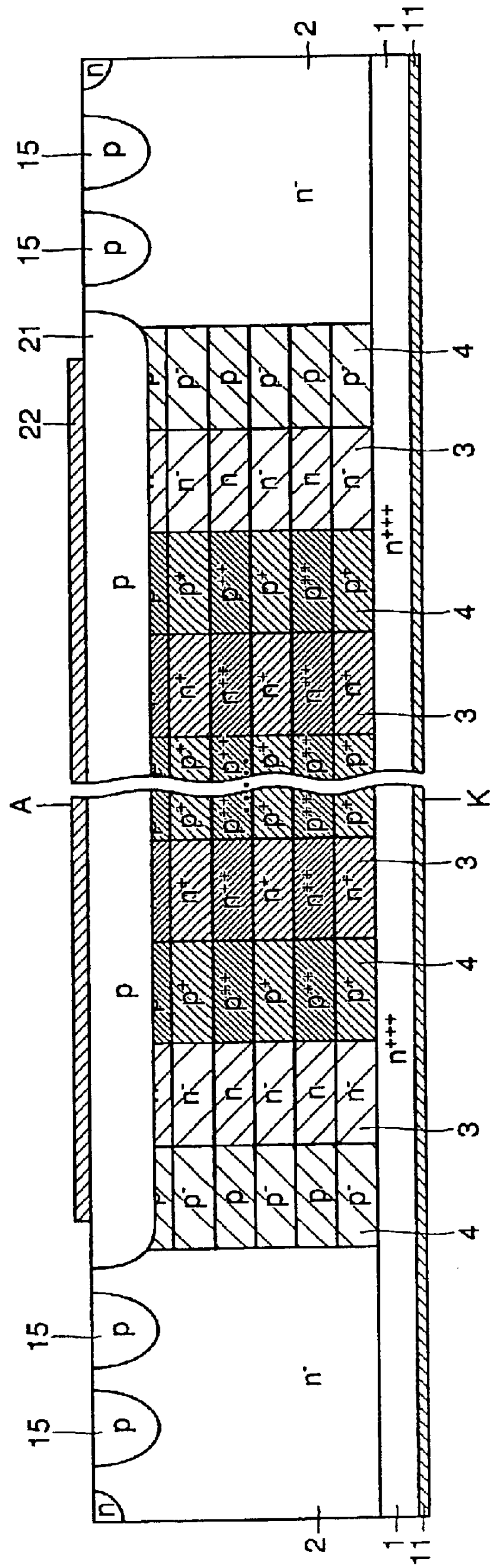
FIG. 12 is a cross sectional view schematically showing the configuration of a semiconductor device according to the eleventh embodiment of the present invention.

The configurations wherein the MOS-FETs in FIGS. 1, 6 and 9 are replaced with diodes are shown in FIGS. 10, 11 and 12 as the ninth, tenth and eleventh embodiments, respectively.

In reference to FIGS. 10 to 12, a p-type impurity region 21 is formed on the first main surface side of the entirety of the pn-repeating structure so as to be electrically connected to an anode electrode 22.

Here, the other parts of the configuration of FIG. 10 are approximately the same as in the configuration shown in FIG. 1, the other parts of the configuration of FIG. 11 are approximately the same as in the configuration shown in FIG. 6 and the other parts of the configuration of FIG. 12 are approximately the same as in the configuration shown in FIG. 9 and, therefore, the same symbols are attached to the same members, of which the descriptions are omitted.

Figure 13:
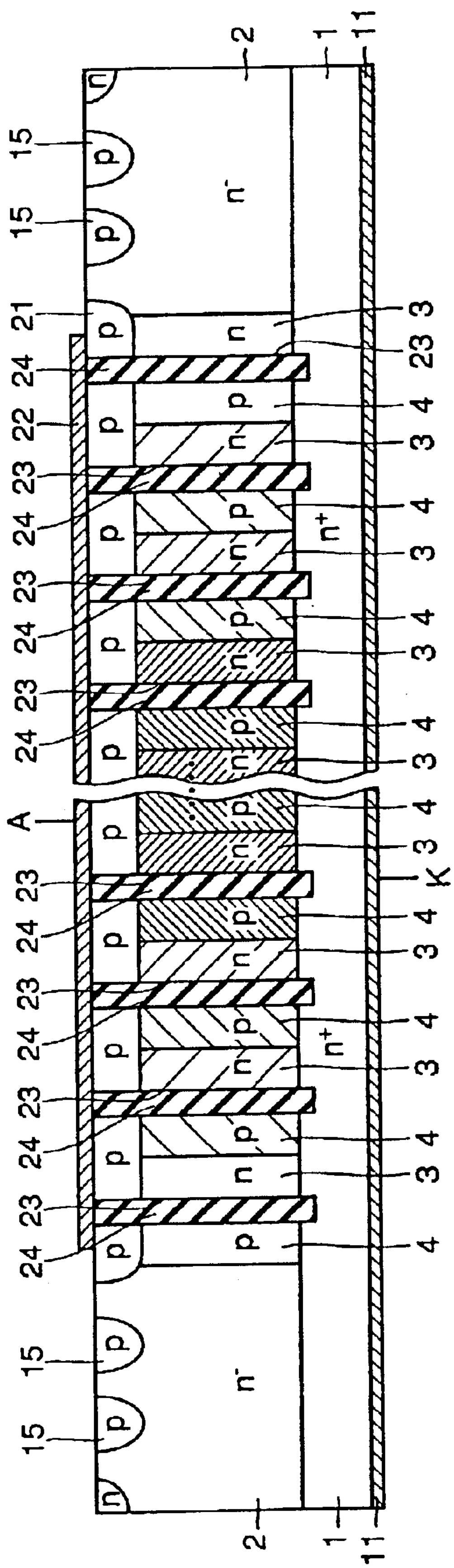
FIG. 13 is a cross sectional view schematically showing the configuration of a semiconductor device according to the twelfth embodiment of the present invention.

In addition, the configuration of the twelfth embodiment shown in FIG. 13 differs from the configuration shown in FIG. 5 in the points that a trench 24 is provided in each pn combination in the configuration of the twelfth embodiment and that the MOS-FETs in the configuration of FIG. 5 are replaced with diodes in the configuration of the twelfth embodiment. Here, in order to replace the MOS-FETs with diodes, a p-type impurity region 21 is formed on the first main surface side of the entirety of the pn-repeating structure so as to be electrically connected to an anode electrode 22.

In addition, as for the concentration setting in the pn-repeating structure, a technique of lowering the concentration in three stages is used in the terminal portions of the pn-repeating structure in the same manner as in the structure shown in FIG. 5.

The other parts of the configuration of FIG. 13 are approximately the same as in the configuration shown in FIG. 5 and, therefore, the same symbols are attached to the same members, of which the descriptions are omitted.

In the ninth to twelfth embodiments, p-type impurity region 4 (and n-type drift layer 3) at the outermost portion has the lowest impurity concentration in the pn-repeating structure in the same manner as in the first embodiment and, therefore, the withstand voltage obtained in this outermost portion becomes high and an increase in the withstand voltage in the cell portion of the diode can be achieved.

The configurations shown in the ninth to twelfth embodiments are configurations wherein, though the upper portion structures are not active elements, they function as elements that allow high speed switching at a low ON voltage.

Thirteenth to Sixteenth Embodiments

Next, the structure that is a diode structure, as the above, and wherein the present invention is applied to a diode of which the upper portion has a Schottky junction is described in the thirteenth to sixteenth embodiments.

The configurations wherein the diodes in FIGS. 10, 11, 12 and 13 are replaced with Schottky diodes are shown in FIGS. 14, 15, 16 and 17 as the thirteenth, fourteenth, fifteenth and sixteenth embodiments, respectively.

In reference to FIGS. 14 to 17, an anode electrode 22 made of metal is electrically connected to the first main surface of the semiconductor substrate and a metal silicide layer 2 la is formed on this connection portion.

Figure 14:
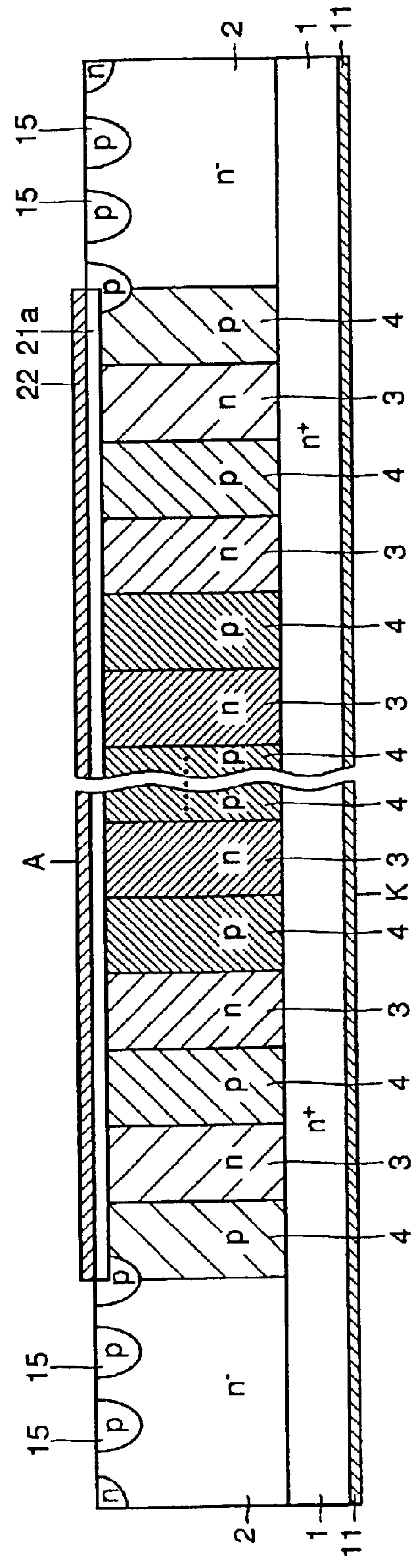
FIG. 14 is a cross sectional view schematically showing the configuration of a semiconductor device according to the thirteenth embodiment of the present invention.
Figure 15:
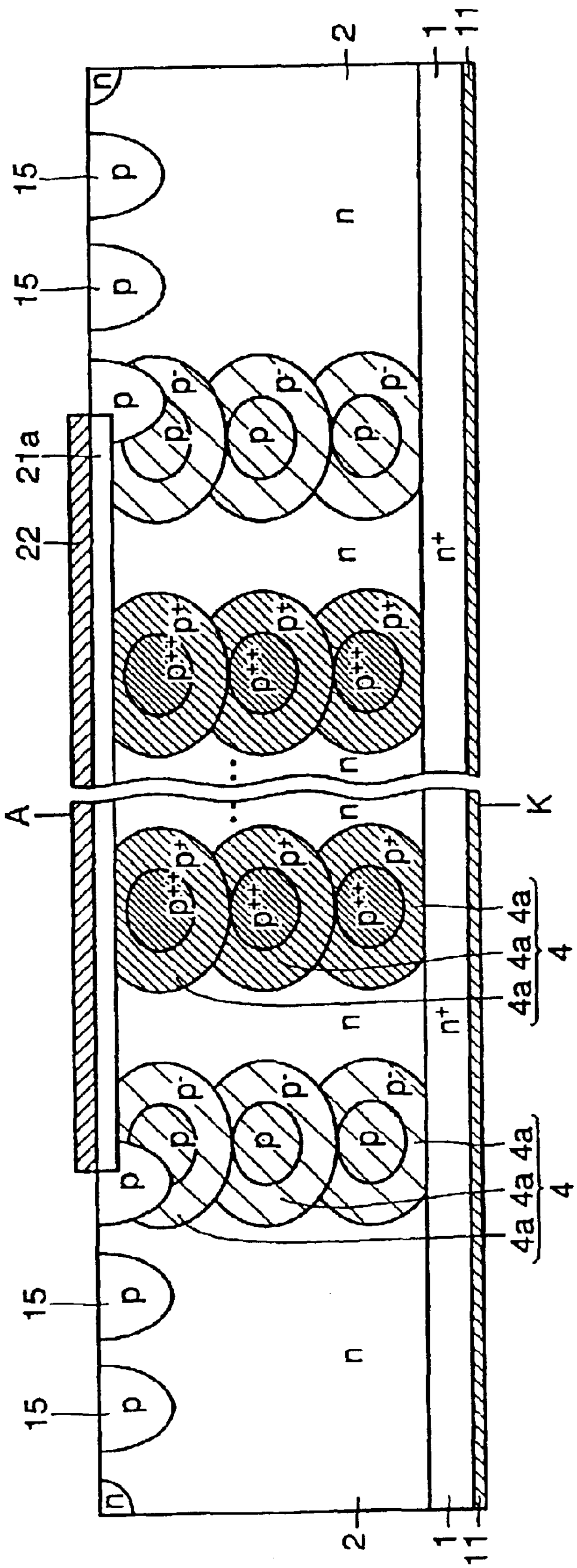
FIG. 15 is a cross sectional view schematically showing the configuration of a semiconductor device according to the fourteenth embodiment of the present invention.
Figure 16:
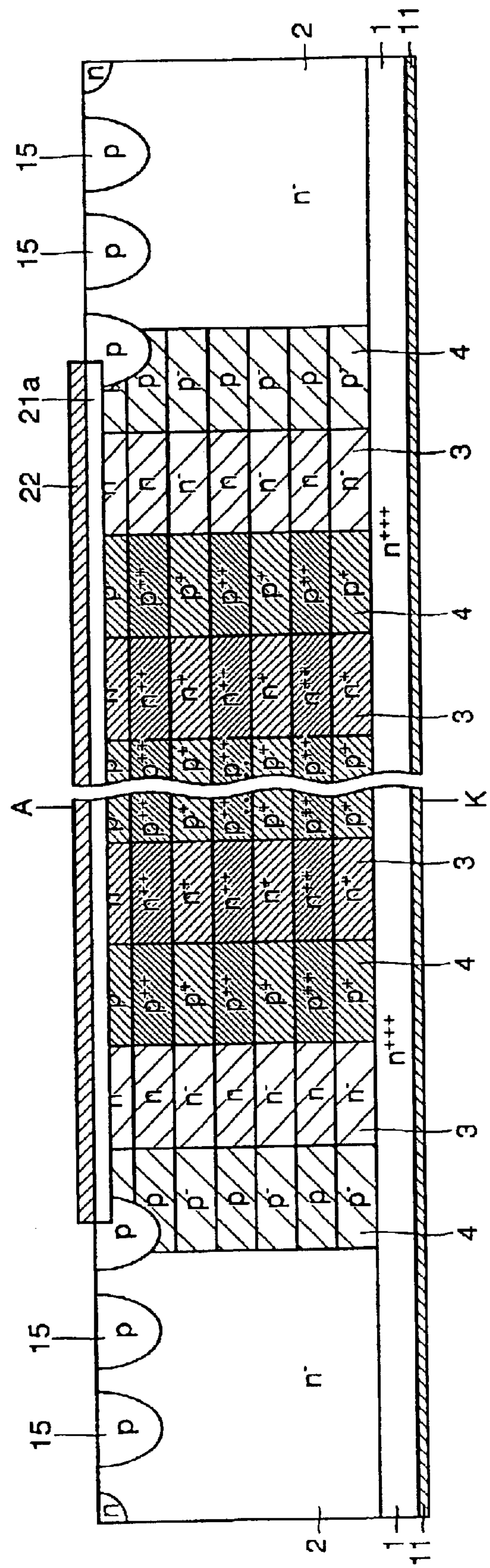
FIG. 16 is a cross sectional view schematically showing the configuration of a semiconductor device according to the fifteenth embodiment of the present invention.
Figure 17:
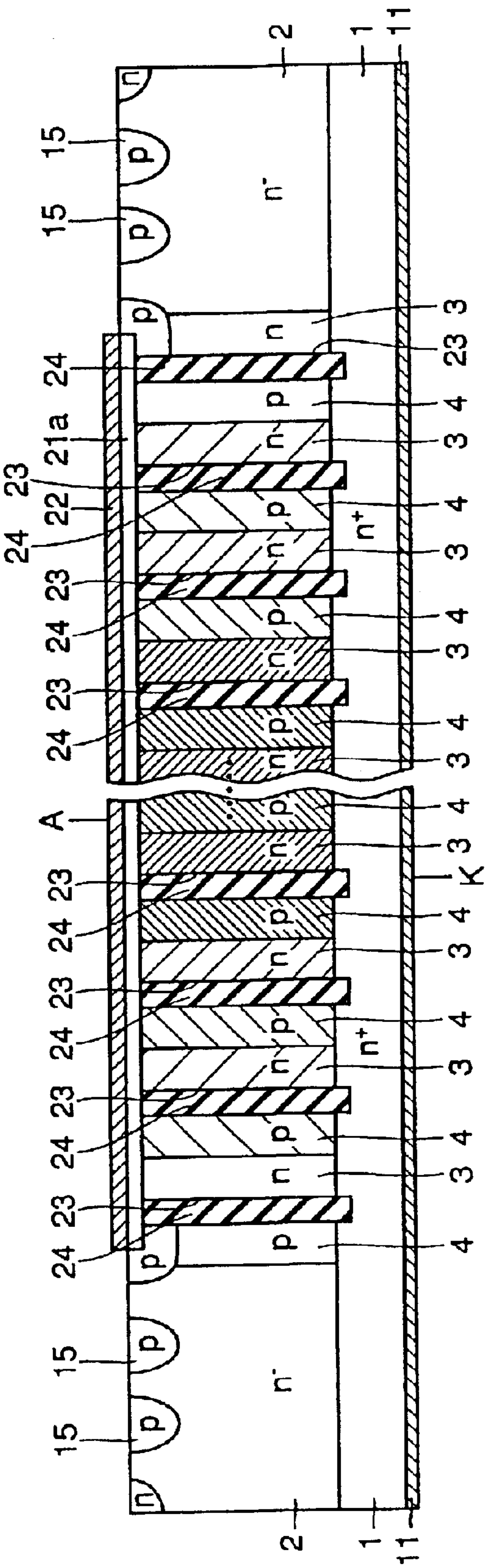
FIG. 17 is a cross sectional view schematically showing the configuration of a semiconductor device according to the sixteenth embodiment of the present invention.

Here, the other parts of the configuration of FIG. 14 are approximately the same as in the configuration shown in FIG. 10, the other parts of the configuration of FIG. 15 are approximately the same as in the configuration shown in FIG. 11, the other parts of the configuration of FIG. 16 are approximately the same as in the configuration shown in FIG. 12 and the other parts of the configuration of FIG. 17 are approximately the same as in the configuration shown in FIG. 13 and, therefore, the same symbols are attached to the same members, of which the descriptions are omitted.

In the thirteenth to sixteenth embodiments, p-type impurity region 4 (and n-type drift region 3) at the outermost portion has the lowest impurity concentration in the pn-repeating structure, in the same manner as in the first embodiment and, therefore, the withstand voltage obtained in this outermost portion becomes high so that an increase in the withstand voltage in the cell portion of the Schottky diode can be achieved.

Seventeenth Embodiment

In the present embodiment, an example of a manufacturing method for the configuration shown in FIG. 6 is described in reference to FIGS. 18 to 25.

Figure 18:
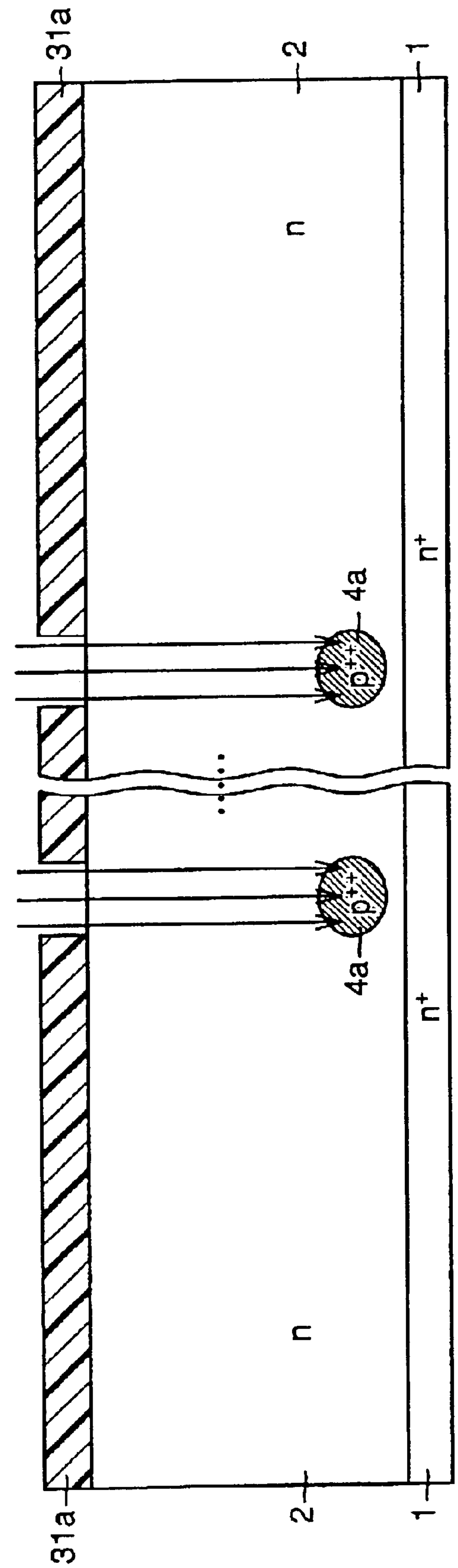
FIGS. 18 to 25 are schematic cross sectional views showing a manufacturing method for a semiconductor device in the order of the steps according to the seventeenth embodiment of the present invention.

In reference to FIG. 18, an $n^-$ epitaxial layer 2 is formed on an $n^+$ substrate 1 of a high concentration including arsenic or antimony by means of a conventional epitaxial method. This $n^-$ epitaxial layer 2 is formed of only one layer having a high and uniform impurity concentration in comparison with the n-type drift layer concentration that is utilized in a MOS-FET of a conventional structure that does not use a multiple RESURF effect.

After this, a resist pattern 31*a* having a predetermined pattern is formed on $n^-$ epitaxial layer 2 using photomechanical technology. Ion implantation of boron ions is carried out at a high energy level by using this resist pattern 31*a* as a mask and, thereby, boron ion implanted region 4*a* is formed at a deep location of the region that becomes the center portion of the pn-repeating structure.

Here, though FIG. 18 shows a case of direct photoresist application wherein a base silicon oxide film is not provided beneath resist pattern 31*a*, a base silicon oxide film may be provided if necessary.

Figure 19:
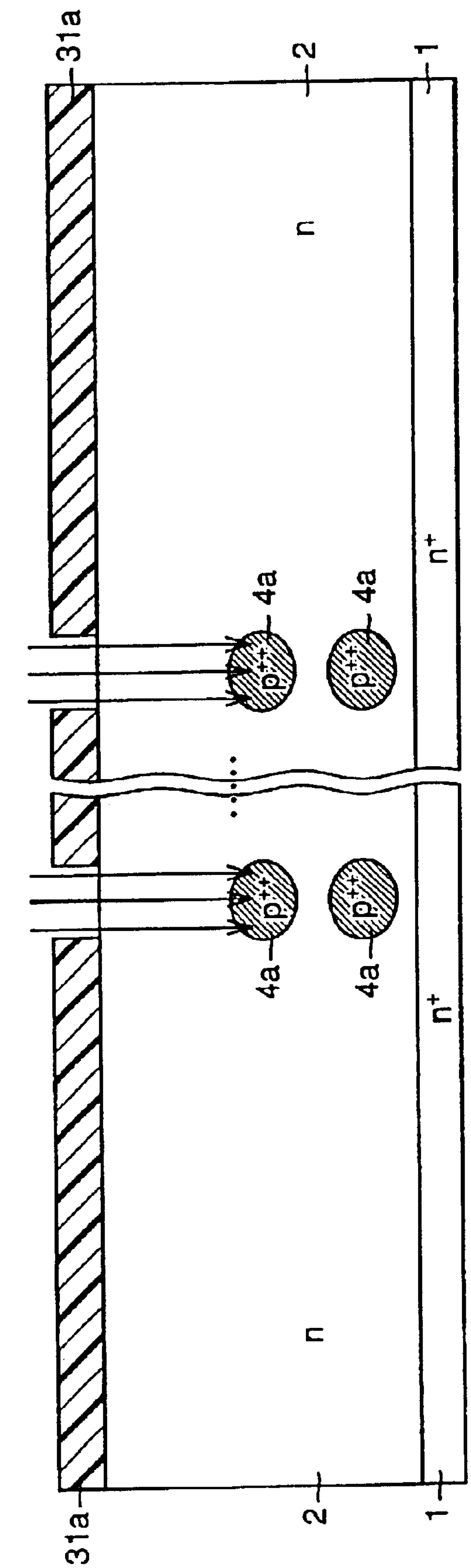

In reference to FIG. 19, ion implantation of boron ions is carried out at a middle energy level by using the above described resist pattern 31*a* as a mask and, thereby, a boron ion implanted region 4*a* is formed at a location at a depth of a middle level that becomes the center portion of the pn-repeating structure.

Figure 20:
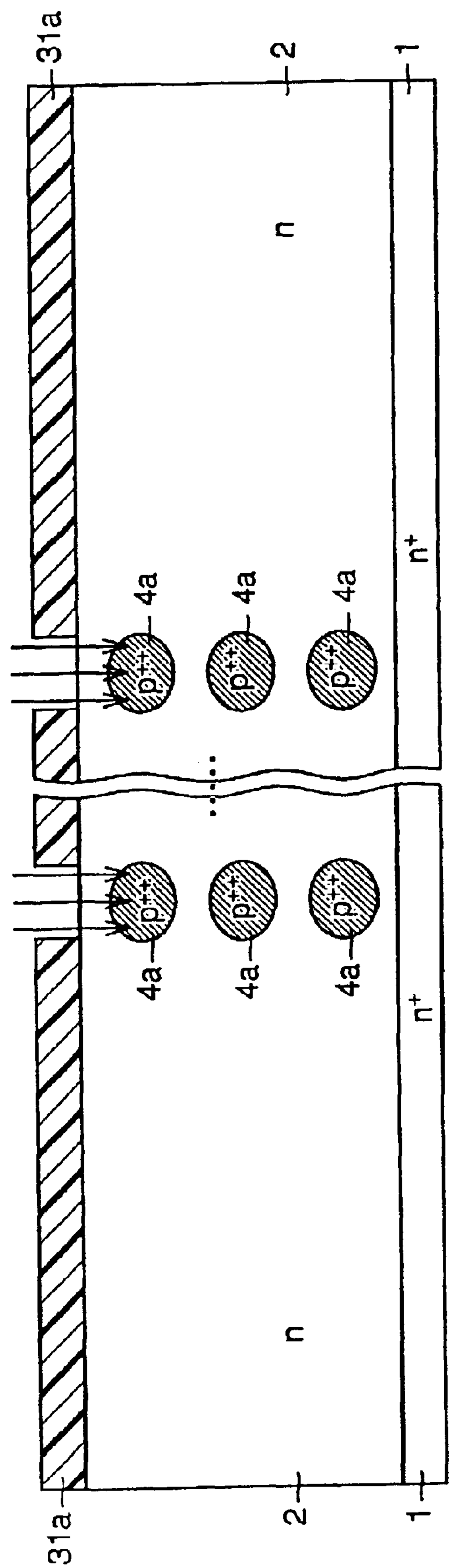

In reference to FIG. 20, ion implantation of boron ions is carried out at a low energy level by using the above described resist pattern 31*a* as a mask and, thereby, a boron ion implanted region 4*a* is formed at a shallow location of a region that becomes the center portion of the pn-repeating structure. After this, resist pattern 31*a* is removed by means of, for example, ashing.

Here, the order of the respective implantations of the above described implantation to the deep location (FIG. 18), implantation to the middle location (FIG. 19) and implantation to the shallow location (FIG. 20) can be switched.

Figure 21:
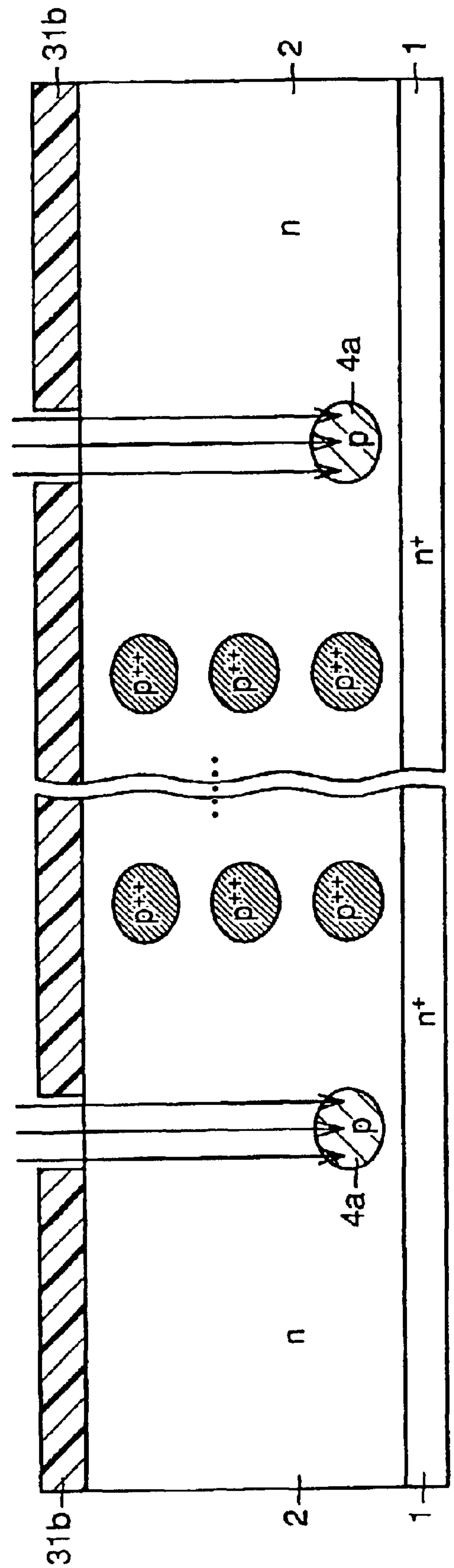

In reference to FIG. 21, a resist pattern 31*b* having a predetermined pattern is formed on $n^-$ epitaxial layer 2 using photomechanical technology. Ion implantation of boron ions is carried out at a high energy level by using this resist pattern 31*b* as a mask and, thereby, a boron ion implanted region 4*a* is formed at a deep location of a region that becomes the outermost portion of the pn-repeating structure.

Here, though FIG. 21 shows a case of direct photoresist application wherein a base silicon oxide film is not provided beneath resist pattern 31*a*, a base silicon oxide film may be provided if necessary.

Figure 22:
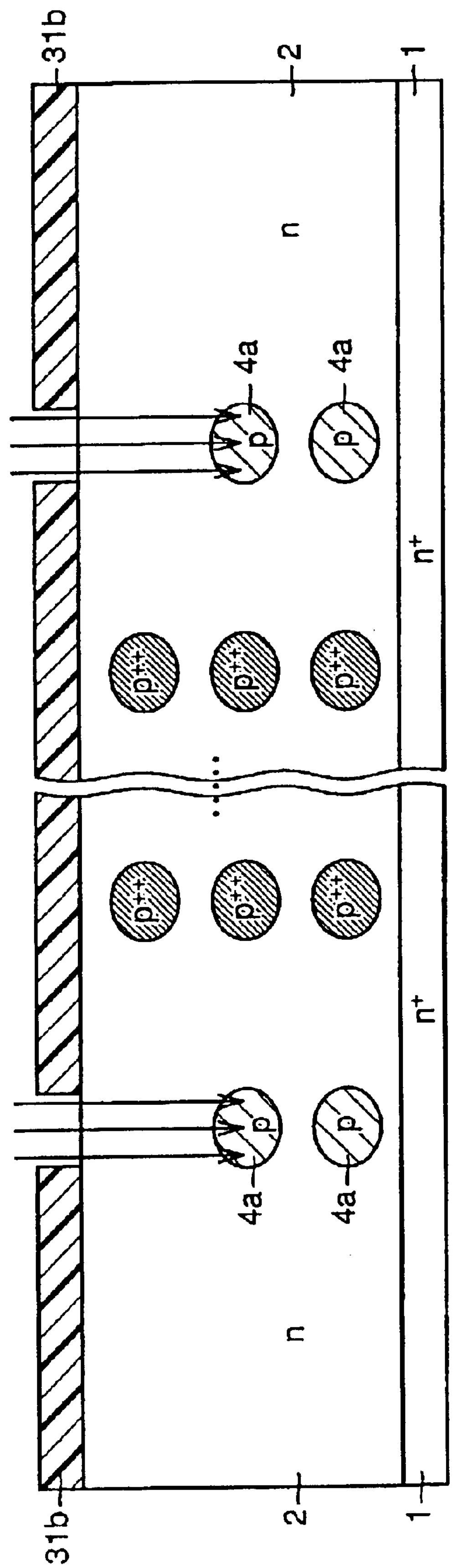

In reference to FIG. 22, ion implantation of boron ions is carried out at a middle energy level by using the above described resist pattern 31*b* as a mask and, thereby, a boron ion implanted region 4*a* is formed at a location of a middle depth in a region that becomes the outermost portion of the pn-repeating structure.

Figure 23:
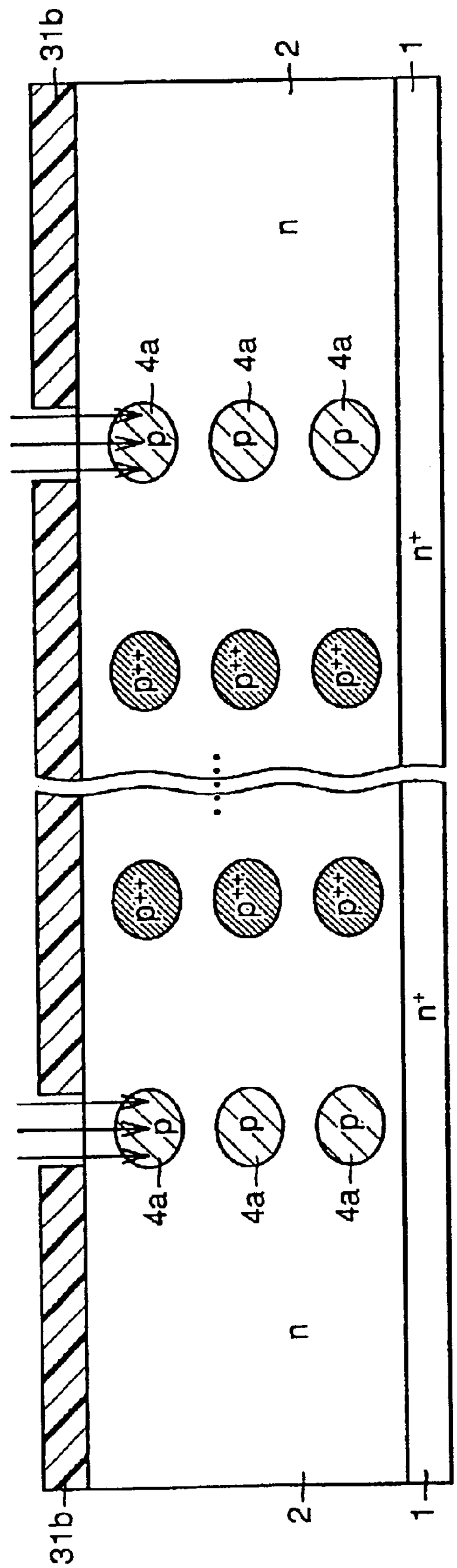

In reference to FIG. 23, ion implantation of boron ions is carried out at a low energy level by using the above described resist pattern 31*b* as a mask and, thereby, a boron ion implanted region 4*a* is formed at a shallow location of a region that becomes the outermost portion of the pn-repeating structure. After this, resist pattern 31*b* is removed by means of, for example, ashing.

The implantation concentration of boron ions implanted into the outermost portion of the pn-repeating structure in the steps of FIGS. 21 to 23 is set at approximately half of the implantation concentration of boron ions implanted into the center portion.

Here, the order of the respective implantations of the above described implantation to a deep location (FIG. 21), implantation to a middle location (FIG. 22) and implantation to a shallow location (FIG. 23) can be switched. Furthermore, the implantation process to give a low concentration to these outermost portions can be switched as a whole with the implantation process to give a high concentration to the above described center portion.

In the present embodiment, though a case wherein only column of a p layer of a low concentration is formed at the outermost portion of the pn-repeating structure is cited as an example for simplification, the present embodiment is not specifically limited to this case.

Figure 24:
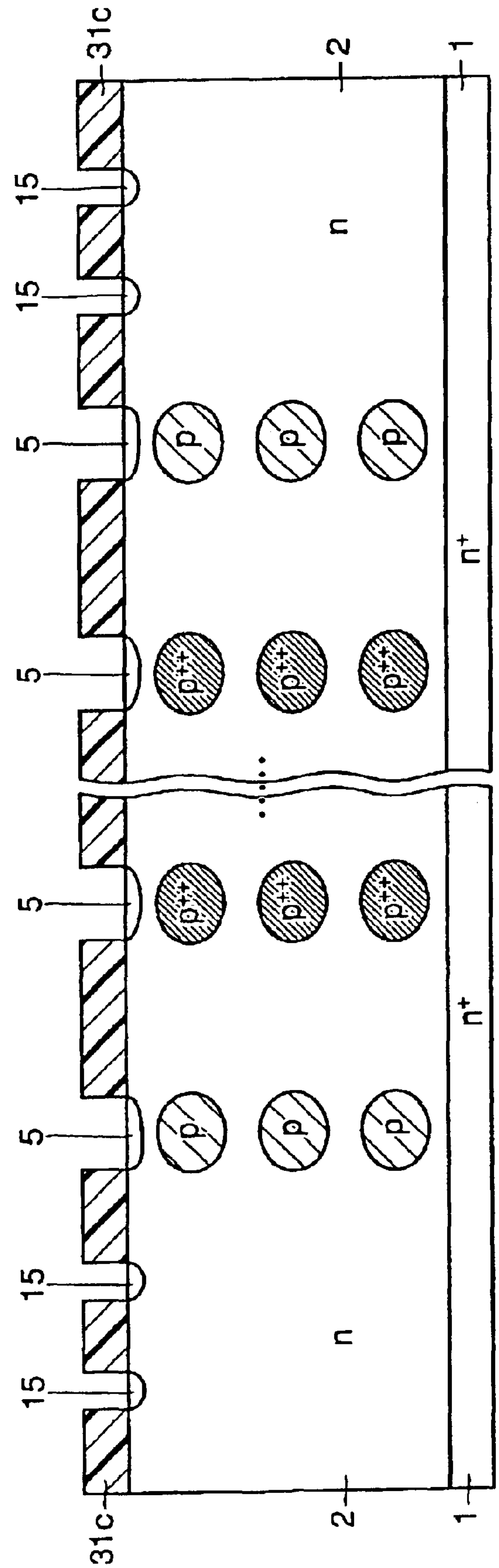

In reference to FIG. 24, a resist pattern 31*c* having a predetermined pattern is formed on an $n^-$ epitaxial layer 2 using photomechanical technology. Ion implantation of boron ions is carried out at an extremely low energy level by using this resist pattern 31*c* as a mask and, thereby, boron ion implanted regions 5 and 15 are formed at very shallow locations of respective regions that become the center portion, the outermost portion and the guard ring portion, which has the termination structure, in the pn-repeating structure. After this, resist pattern 31*c* is removed by means of, for example, ashing.

Figure 25:
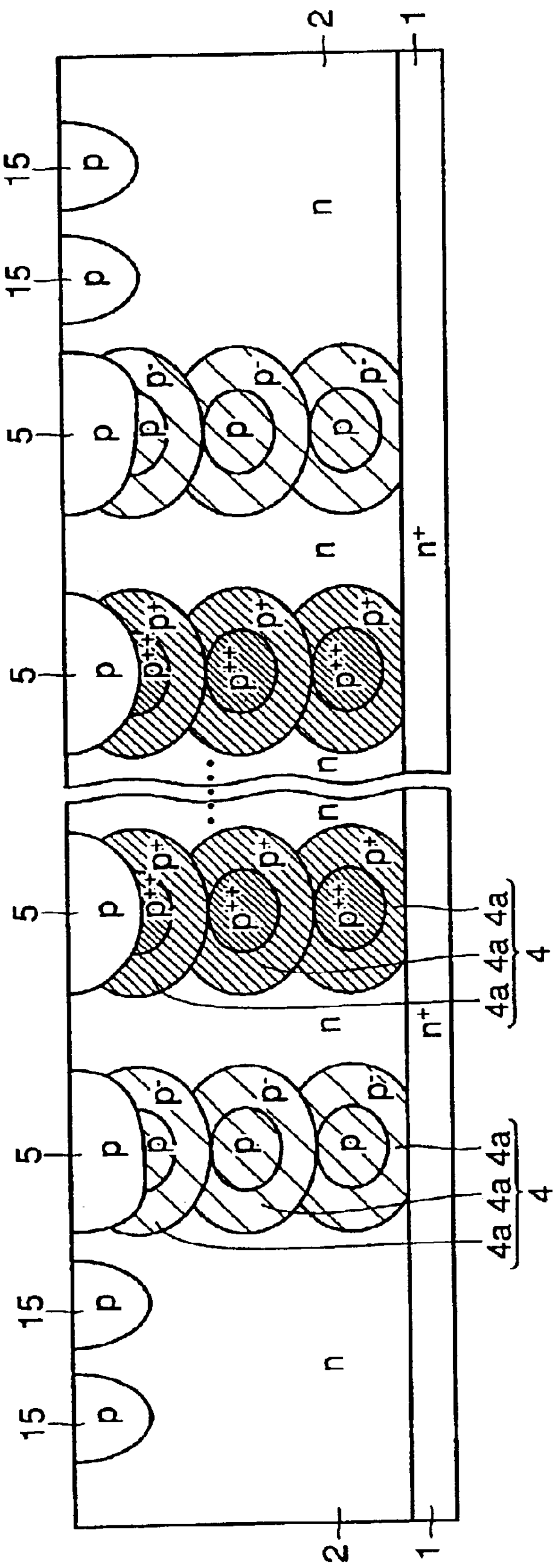

In reference to FIG. 25, heat treatment is carried out at a high temperature for a long period of time. Thereby, boron ion implanted regions 5 and 15 are diffused to have appropriate sizes so as to form a guard ring portion 15 and a p-type body region 5. At the same time as this, a plurality of boron ion implanted regions 4*a* aligned in the depth direction of the semiconductor substrate is diffused into the surroundings so as to be integrated and, thereby, a p-type impurity region 4 making up the pn-repeating structure is formed. After this, MOS-FET configuration portions, electrodes, or the like, are formed so that the semiconductor device shown in FIG. 6 is completed.

The maximum acceleration energy is approximately several Mev, even using current high energy ion implantation technology. Therefore, even boron, which is a light element, has a range in Si of 10 μm, or less, and cannot be implanted into a very deep location. Accordingly, the element structure that can be implemented according to a manufacturing method of the present embodiment is limited to having the comparatively low withstand voltage of approximately 200 V, or less.

However, there is an advantage wherein the process is simple in comparison with the below described buried multi-layer epitaxial system or trench system, even though an expensive manufacturing unit, that is to say a high energy ion implantation unit, and a photoresist for thick film and a photomechanical process accompanying this are used.

Eighteenth Embodiment

An example of a manufacturing method for the configuration shown in FIG. 8 is described in reference to FIGS. 26 to 32 in the present embodiment.

The manufacturing method for the present embodiment, at first, includes the same process as the process of the seventeenth embodiment shown in FIGS. 18 to 20. Here, $n^-$ epitaxial layer 2 is formed of only one layer having a low concentration and a uniform impurity concentration in comparison with the concentration of n-type drift layers utilized in a MOS-FET of the conventional structure wherein a multiple RESURF effect is not used.

Figure 26:
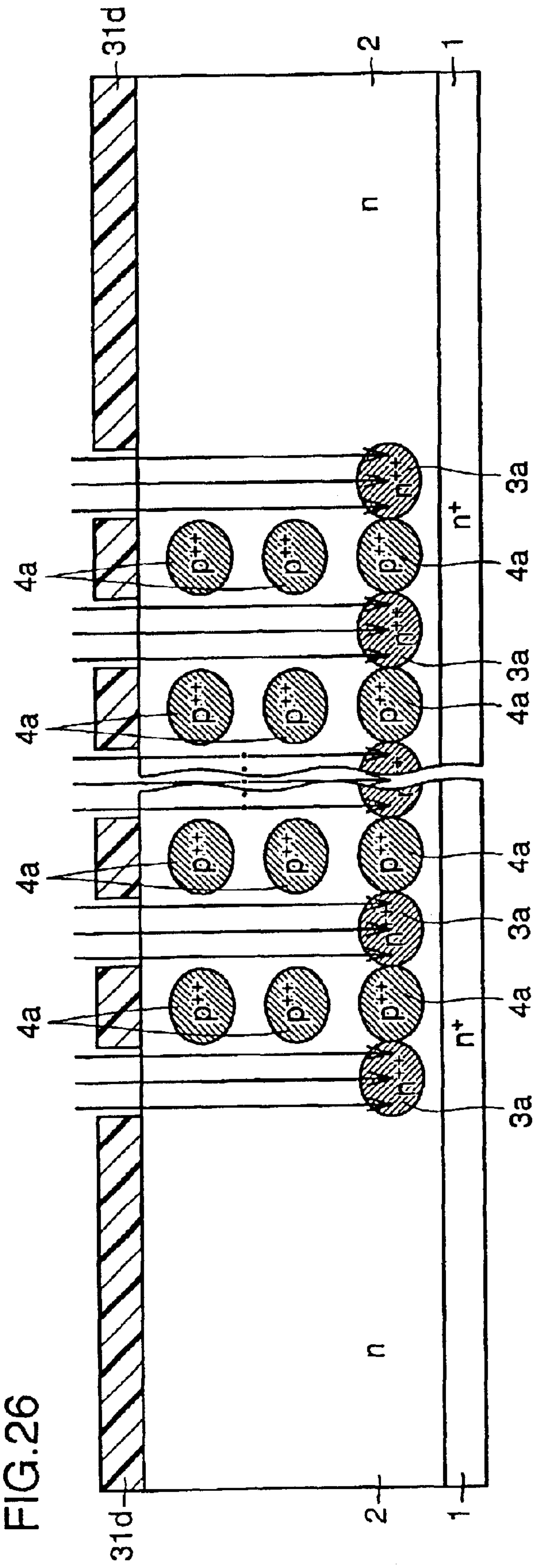
FIGS. 26 to 32 are schematic cross sectional views showing a manufacturing method for a semiconductor device in the order of the steps according to the eighteenth embodiment of the present invention.

After this, in reference to FIG. 26, a resist pattern 31*d* having a predetermined pattern is formed on $n^-$ epitaxial layer 2 using photomechanical technology. Ion implantation of phosphorus ions is carried out at a high energy level by using this resist pattern 31*d* as a mask and, thereby, an implantation region 3*a* of phosphorus ions is formed at a deep location in a region that becomes the center portion of the pn-repeating structure.

Here, though FIG. 26 shows a case of direct photoresist application wherein a base silicon oxide film is not provided beneath resist pattern 31*d*, a base silicon oxide film may be provided if necessary.

Figure 27:
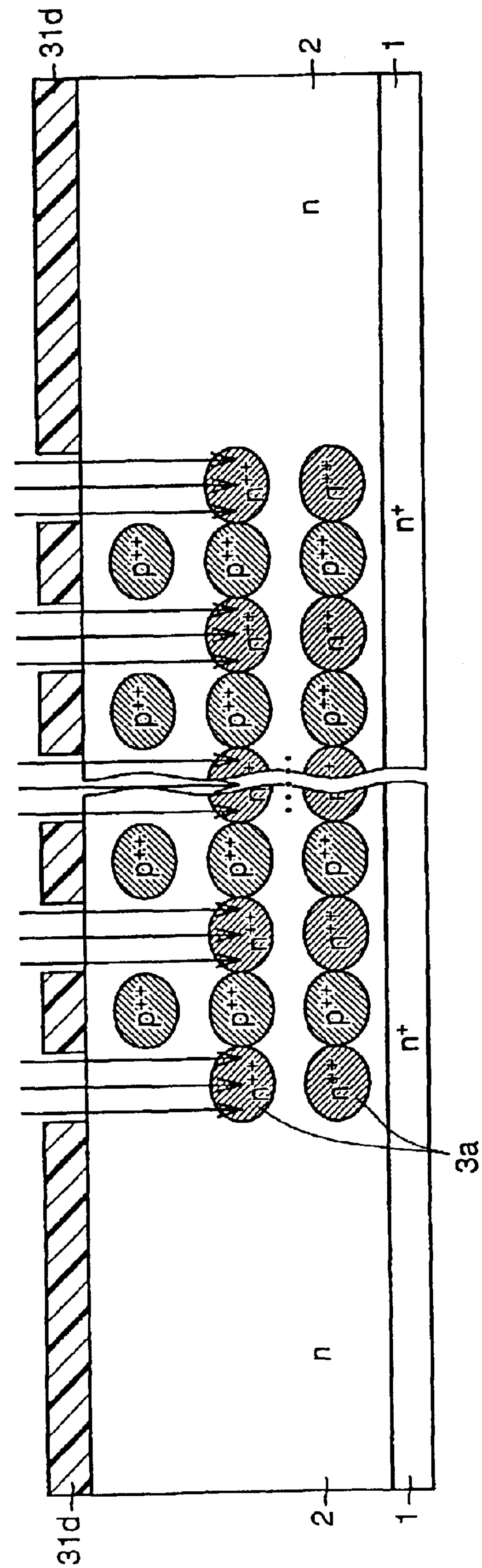

In reference to FIG. 27, ion implantation of phosphorus ions is carried out at a middle energy level by using the above described resist pattern 31*d* as a mask and, thereby, an implantation region 3*a* of phosphorus ions is formed at location of a middle depth in a region that becomes the center portion.

Figure 28:
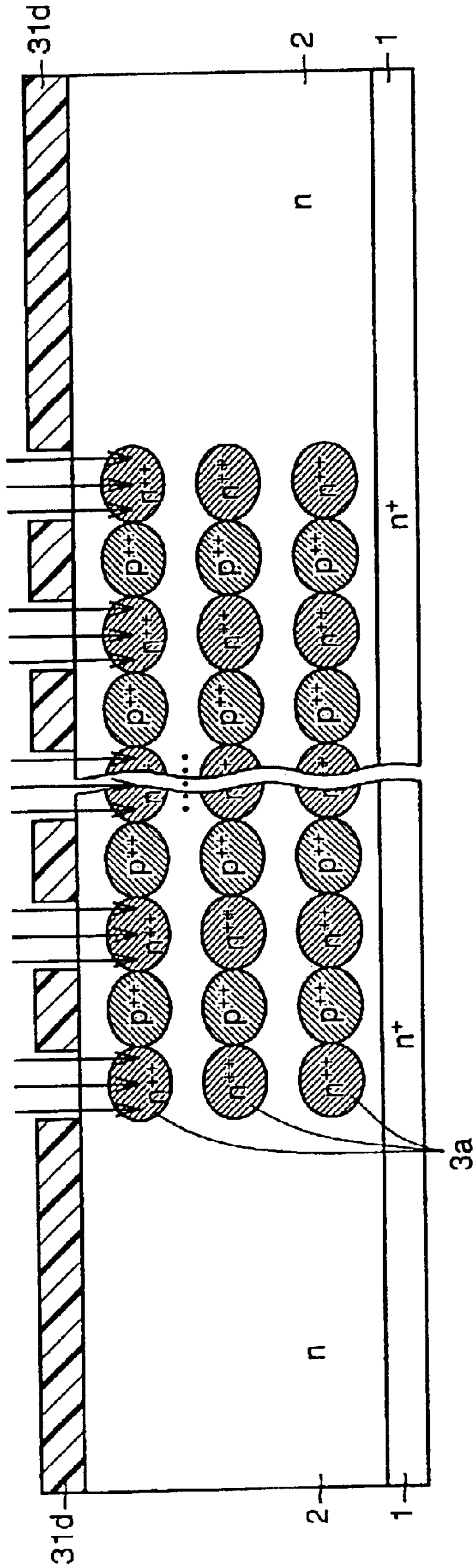

In reference to FIG. 28, ion implantation of phosphorus ions is carried out at a low energy level by using the above described resist pattern 31*d* as a mask and, thereby, an implantation region 3*a* of phosphorus ions is formed at a shallow location in a region that becomes the center portion. After this, resist pattern 31*d* is removed by means of, for example, ashing.

Here, the order of the respective implantations of the above described implantation to a deep location (FIG. 26), implantation to a location of a middle depth (FIG. 27) and implantation to a shallow location (FIG. 28) can be switched. Furthermore, these implantation processes of phosphorus ions to the center portion can be switched as a whole with the above described implantation processes of boron ions to the center portion.

Figure 29:
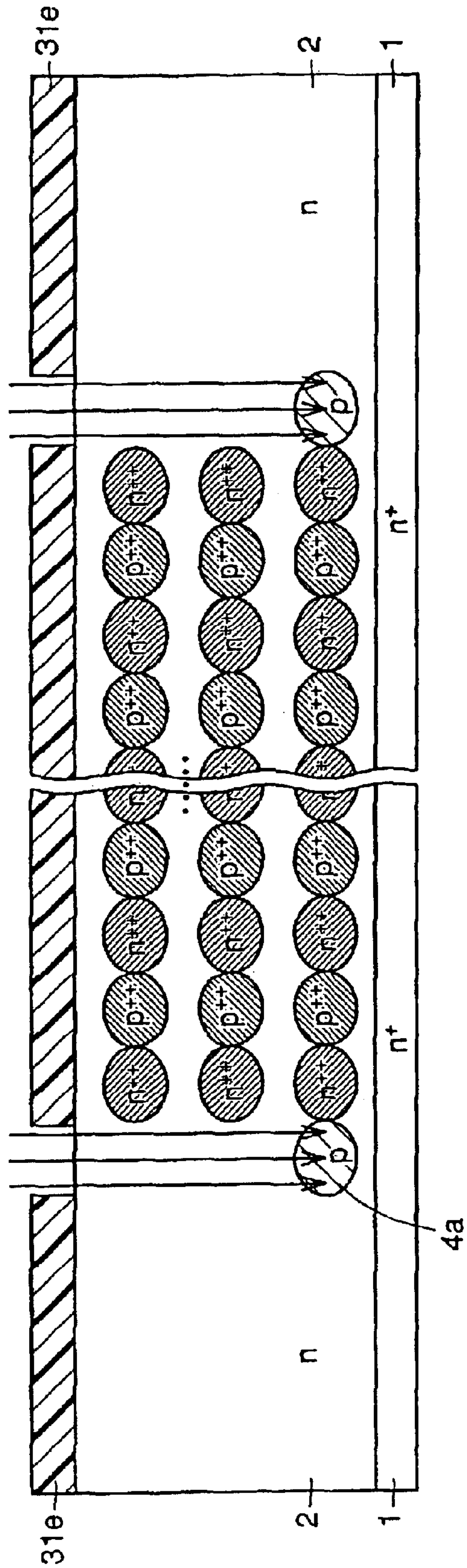

In reference to FIG. 29, a resist pattern 31*e* having a predetermined pattern is formed on $n^-$ epitaxial layer 2 using photomechanical technology. Ion implantation of boron ions is carried out at a high energy level by using this resist pattern 31*e* as a mask and, thereby, an implantation region 4*a* of boron ions is formed at a deep location in a region that becomes the outermost portion of the pn-repeating structure.

Here, though FIG. 29 shows a case of direct photoresist application wherein a base silicon oxide film is not provided beneath resist pattern 31*a*, a base silicon oxide film may be provided if necessary.

Figure 30:
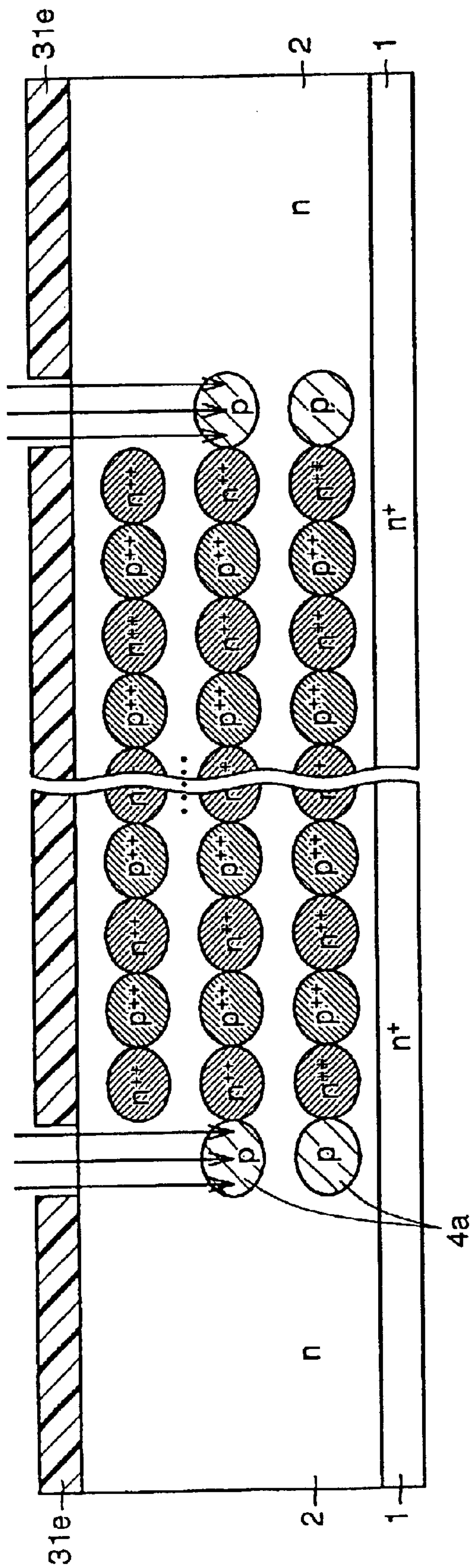

In reference to FIG. 30, ion implantation of boron ions is carried out at a middle energy level by using the above described resist pattern 31*e* as a mask and, thereby, an implantation region 4*a* of boron ions is formed at a location of a middle depth in a region that becomes the outermost portion of the pn-repeating structure.

Figure 31:
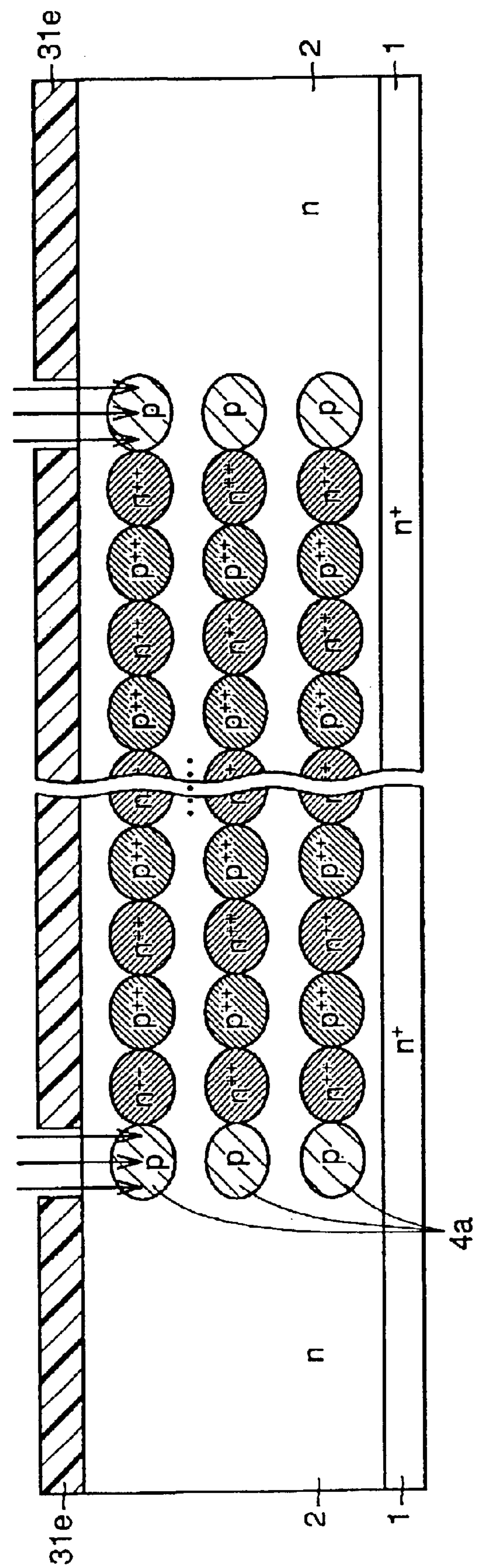

In reference to FIG. 31, ion implantation of boron ions is carried out at a low energy level by using the above described resist pattern 31*e* as a mask and, thereby, an implantation region 4*a* of boron ions is formed at a shallow location in a region that becomes the outermost portion of the pn-repeating structure. After this, resist pattern 31*e* is removed by means of, for example, ashing.

The implantation concentration of boron ions implanted into the outermost portion of the pn-repeating structure in the steps of FIGS. 29 to 31 is set at approximately half of the implantation concentration of boron ions implanted into the center portion.

Here, the order of the respective implantations of the above described implantation to a deep location (FIG. 29), implantation to a location of a middle depth (FIG. 30) and implantation to a shallow location (FIG. 31) can be switched. Furthermore, these implantation processes of low concentration into the outermost portion of the pn-repeating structure can be switched as a whole with the above described implantation processes of boron ions or phosphorus ions of a high concentration into the center portion.

Though in the present embodiment a case of the formation only one column of a p layer of a low concentration at the outermost portion of the pn-repeating structure is cited as an example for simplification, the present embodiment is not specifically limited to this case.

Figure 32:
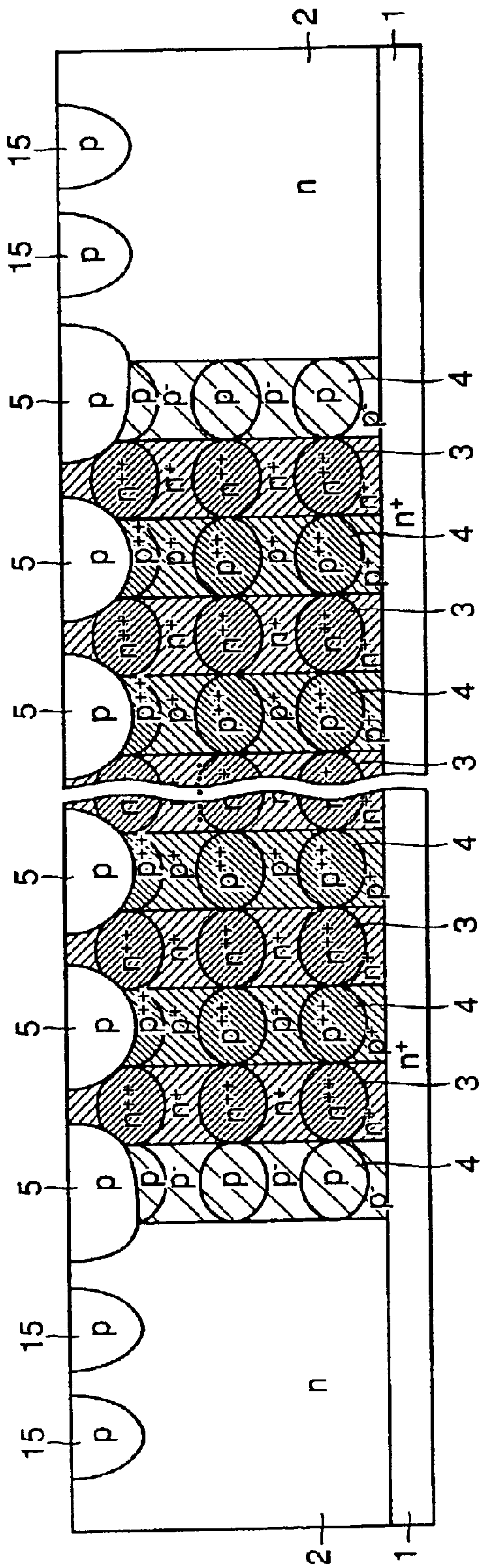

In reference to FIG. 32, guard ring portions 15 and p-type body regions 5 are formed by carrying out the same process as that of the seventeenth embodiment, shown in FIG. 24. At the same time as this, a plurality of implantation regions 4*a* of boron ions and a plurality of implantation regions 3*a* of phosphorus ions aligned in the depth direction of the semiconductor substrate are diffused into the surrounding areas so as to be integrated and p-type impurity regions 4 and n-type drift regions 3 making up the pn-repeating structure are formed. After this, MOS-FET configuration portions, electrodes, and the like, are formed so that the semiconductor device shown in FIG. 8 is completed.

Here, though FIG. 32 represents connected n-type drift regions 3 and connected p-type impurity regions 4 in two stages, of low concentration and high concentration, for the purpose of simplification, these impurity concentrations in actuality change without discrete stages and in a continuous manner and change in an alternating manner in the depth direction of the substrate. In addition, though p-type impurity region 4 of a low concentration at the outermost portion of the pn-repeating structure has a wavy cross sectional form that spreads somewhat to the outer periphery in a portion having a high impurity concentration, this detail is omitted for the purpose of simplification.

In the seventeenth embodiment, p-type impurity regions 4 are formed in n-type epitaxial layer 2 of a comparatively high concentration through boron ion implantation. In contrast to this, in the present embodiment, n-type epitaxial layer 2 of a low concentration is used so that respective buried diffusion regions 3*a* and 4*a* in n-type drift regions 3 and p-type impurity regions 4 are independently formed. Therefore, the concentration of n-type epitaxial layer 2 in the outer peripheral portion of the pn-repeating structure becomes low so as to form a pin diode.

In addition, since n-type drift regions 3 and p-type impurity regions 4 are formed by means of ion implantations, it is easy to balance the concentrations of n-type drift regions 3 and p-type impurity regions 4 in comparison with the seventeenth embodiment. Therefore, the manufacturing method according to the present embodiment is a method suitable for an element of a comparatively high withstand voltage, even among elements having a low withstand voltage.

However, ion implantation processes for n-type drift regions 3 and p-type impurity regions 4 are independently carried out and, therefore, there is a disadvantage wherein the number of steps increases in comparison with the seventeenth embodiment. Therefore, it is preferable to choose a method from among these that is appropriate for the element from the point of view of performance or of cost.

Nineteenth Embodiment

An example of a manufacturing method for the configuration shown in FIG. 9 is described in reference to FIGS. 33 to 42 in the present embodiment. Here, according to the following method, it is possible to form the structure shown in FIGS. 1 to 5.

The manufacturing method of the present embodiment includes, at first, the same process as that of the seventeenth embodiment shown in FIGS. 18 to 20. Here, $n^-$ epitaxial layer 2 is formed of only one layer having a low concentration and a uniform impurity concentration in comparison with the concentration of n-type drift layers utilized in a MOS-FET of the conventional structure wherein a multiple RESURF effect is not used.

Figure 33:
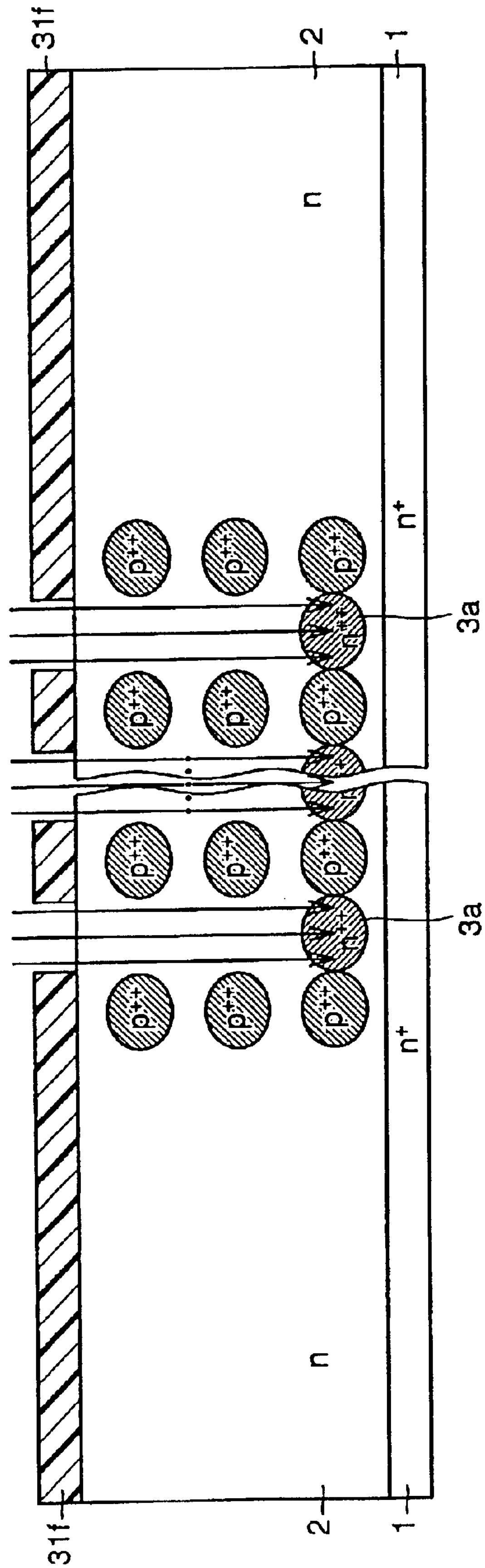
FIGS. 33 to 42 are schematic cross sectional views showing a manufacturing method for a semiconductor device in the order of the steps according to the nineteenth embodiment of the present invention.

After this, in reference to FIG. 33, a resist pattern 31*f* having a predetermined pattern is formed on $n^-$ epitaxial layer 2 according to photomechanical technology. Ion implantation of phosphorus ions is carried out at a high energy level by using this resist pattern 31*f* as a mask and, thereby, an implantation region 3*a* of phosphorus ions is formed at a deep location in a region that becomes the center portion of the pn-repeating structure.

Here, though FIG. 33 shows a case of direct photoresist application wherein a base silicon oxide film is not provided beneath resist pattern 31*f*, a base silicon oxide film may be provided if necessary.

Figure 34:
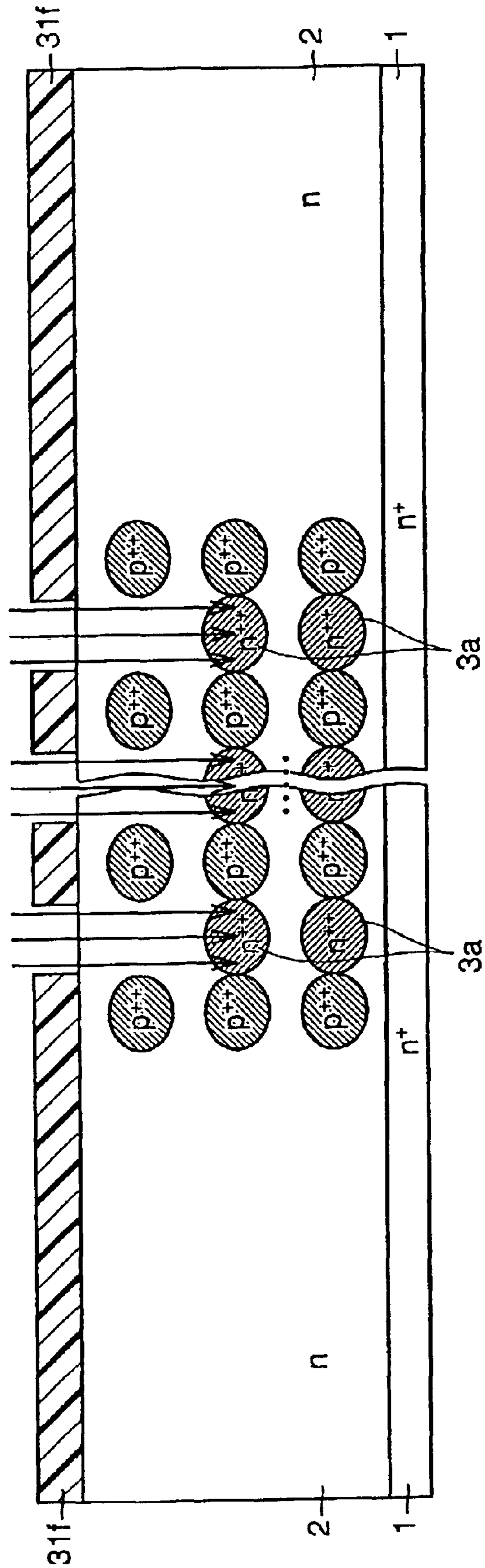

In reference to FIG. 34, ion implantation of phosphorus ions is carried out at a middle energy level by using the above described resist pattern 31*f* as a mask and, thereby, an implantation region 3*a* of phosphorus ions is formed at a location of middle depth in a region that becomes the center portion.

Figure 35:
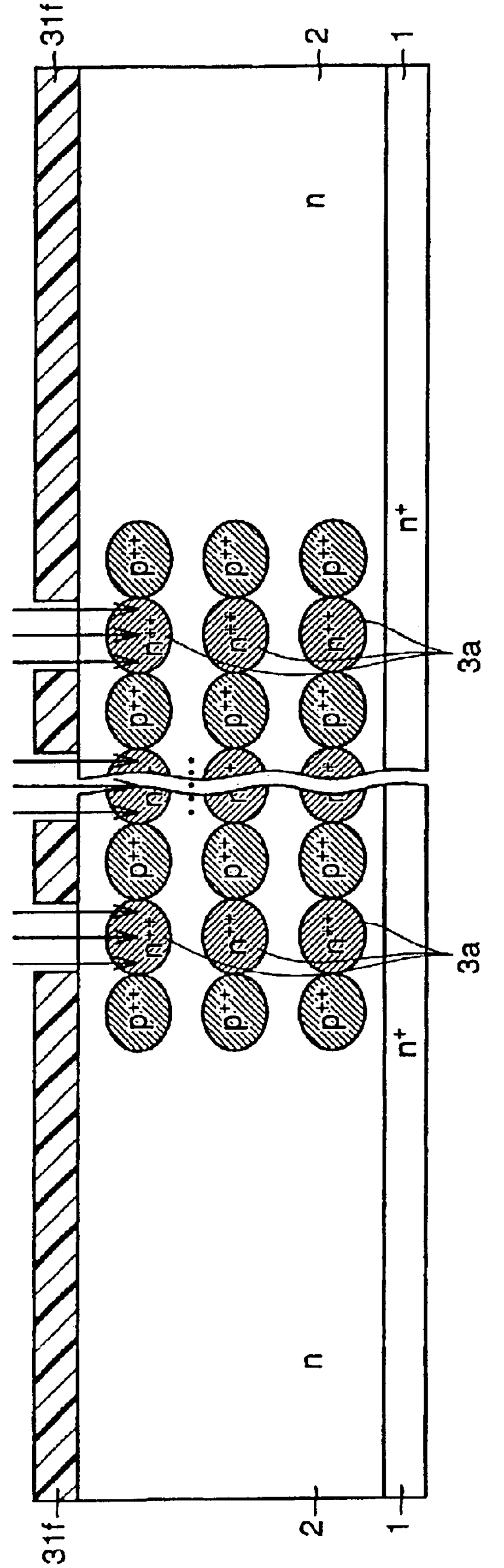

In reference to FIG. 35, ion implantation of phosphorus ions is carried out at a low energy level by using the above described resist pattern 31*f* as a mask and, thereby, an implantation region 3*a* of phosphorus ions is formed at a shallow location in a region that becomes the center portion. After this, resist pattern 31*f* is removed by means of, for example, ashing.

Here, the order of the respective implantations of the above described implantation to a deep location (FIG. 33), implantation to a middle location (FIG. 34) and implantation to a shallow location (FIG. 35) can be switched. Furthermore, these implantation processes of phosphorus ions to the center portion can be switched as a whole with the above described implantation processes of boron ions to the center portion.

Figure 36:
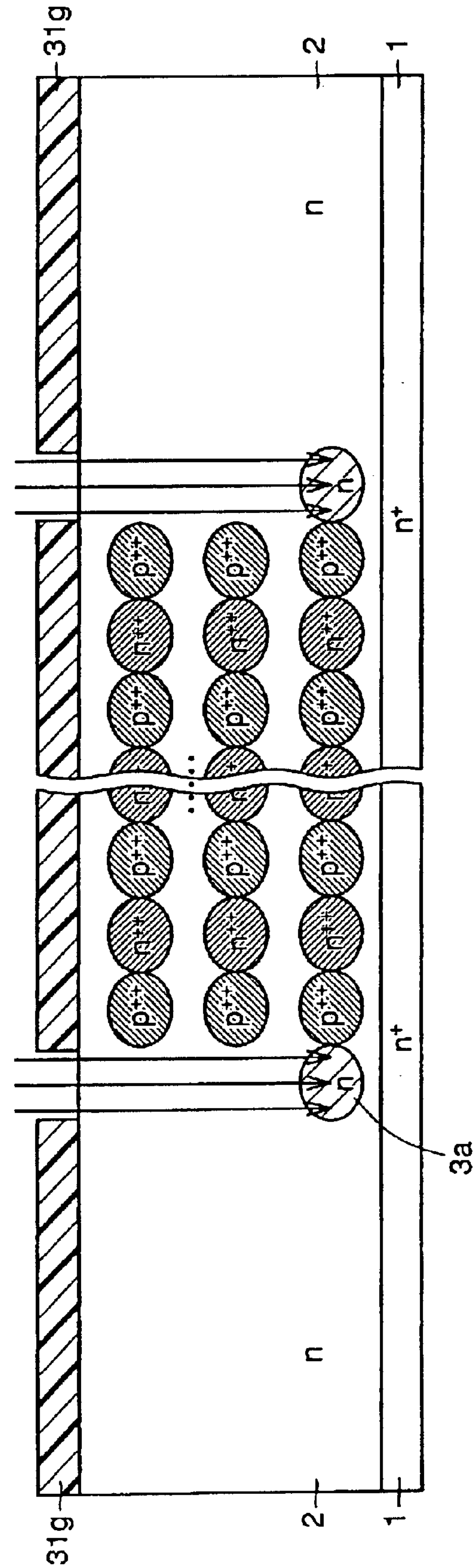

In reference to FIG. 36, this is the start of a manufacturing process of a configuration wherein the concentration is required to be lowered. A resist pattern 31*g* having a predetermined pattern is formed on $n^-$ epitaxial layer 2 according to photomechanical technology. Ion implantation of phosphorus ions is carried out at a high energy level using this resist pattern 31*g* as a mask and, thereby, an implantation region 3*a* of phosphorus ions is formed at a deep location in a region that is closer to the center portion (front) by one stage from the outermost portion of the pn-repeating structure.

Here, though FIG. 36 shows a case of direct photoresist application wherein a base silicon oxide film is not provided beneath resist pattern 31*g*, a base silicon oxide film may be provided if necessary.

Figure 37:
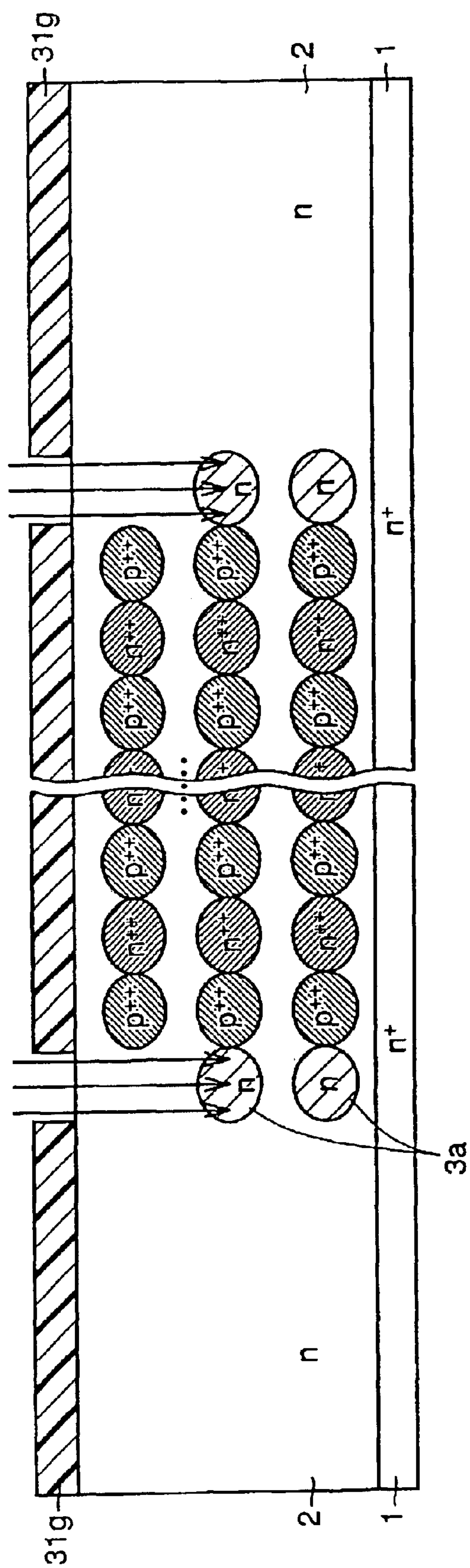

In reference to FIG. 37, ion implantation of phosphorus ions is carried out at a middle energy level using the above described resist pattern 31*g* as a mask and, thereby, an implantation region 3*a* of phosphorus ions is formed at a location of a middle depth in a region that is closer to the center portion by one stage from the outermost portion of the pn-repeating structure.

Figure 38:
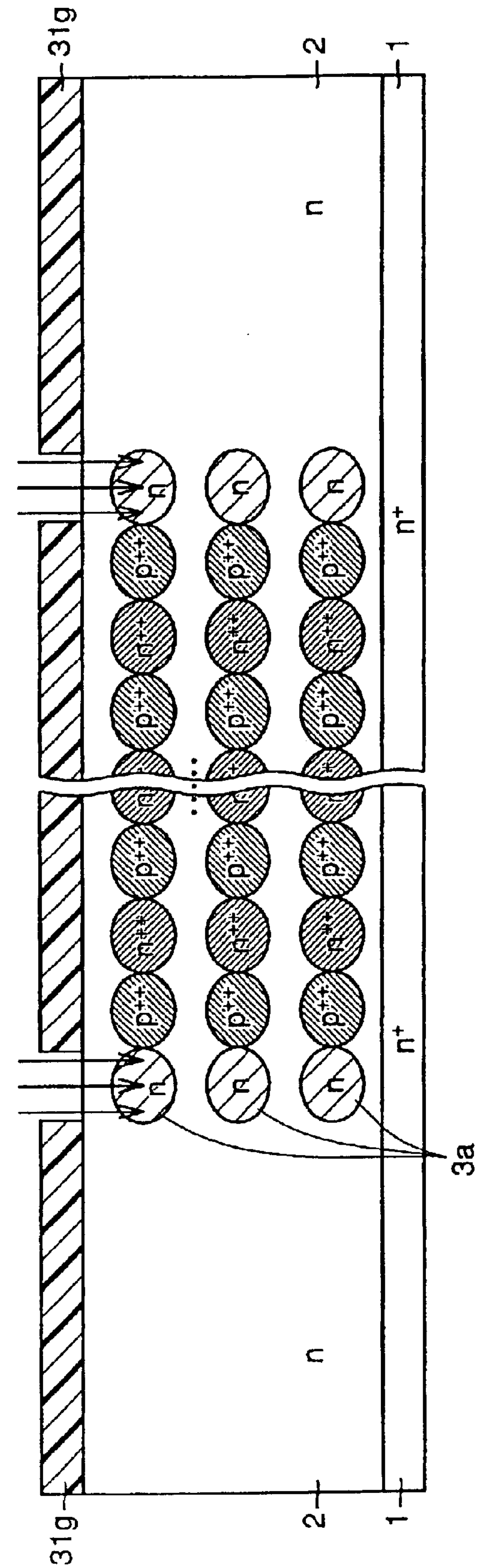

In reference to FIG. 38, ion implantation of phosphorus ions is carried out at a low energy level using the above described resist pattern 31*g* as a mask and, thereby, an implantation region 3*a* of phosphorus ions is formed at a shallow location in a region that is closer to the center portion by one stage from the outermost portion of the pn-repeating structure. After this, resist pattern 31*g* is removed by means of, for example, ashing.

The implantation concentration of phosphorus ions implanted to the outermost portion of the pn-repeating structure in the process of FIGS. 36 to 38 is set at approximately half of the implantation concentration of phosphorus ions implanted to the center portion.

Here, the order of the respective implantations of the above described implantation to a deep location (FIG. 36), implantation to a middle location (FIG. 37) and implantation to a shallow location (FIG. 38) can be switched. Furthermore, these implantation processes of phosphorus ions to a region closer to the center portion by one stage from the outermost portion of the pn-repeating structure can be switched as a whole with the above described implantation processes of boron ions or phosphorus ions to the center portion.

Figure 39:
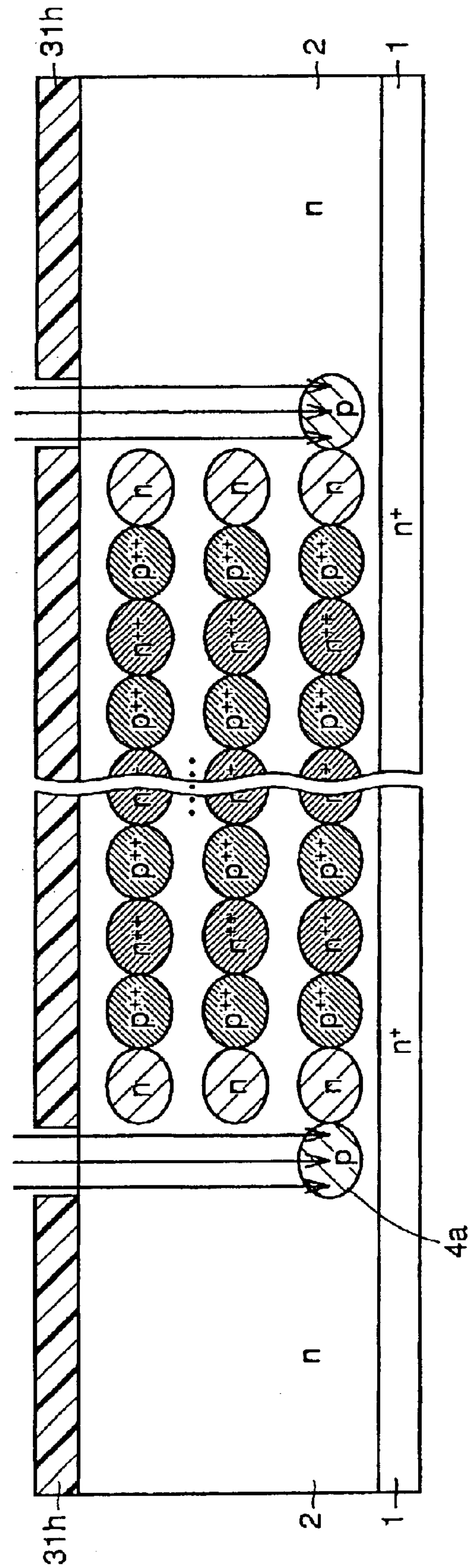

In reference to FIG. 39, a resist pattern 31*h* having a predetermined pattern is formed on $n^-$ epitaxial layer 2 using photomechanical technology. Ion implantation of boron ions is carried out at a high energy level using this resist pattern 31*h* as a mask and, thereby, an implantation region 4*a* of boron ions is formed at a deep location in a region that becomes the outermost portion of the pn-repeating structure.

Here, though FIG. 39 shows a case of direct photoresist application wherein a base silicon oxide film is not provided beneath resist pattern 31*h*, a base silicon oxide film may be provided if necessary.

Figure 40:
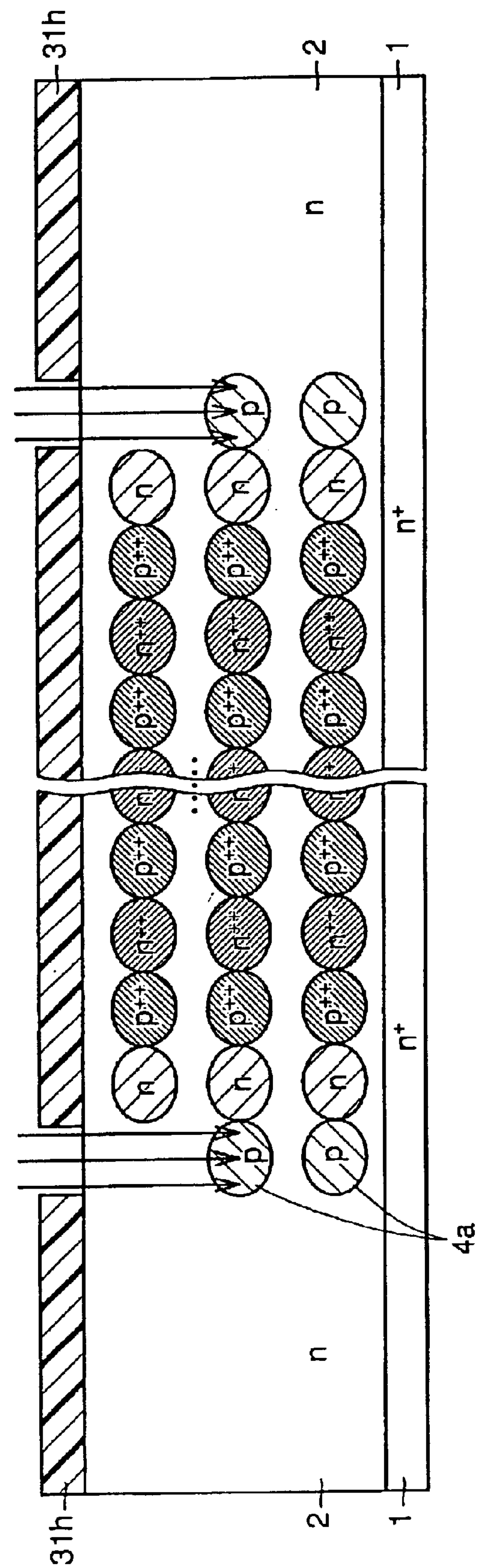

In reference to FIG. 40, ion implantation of boron ions is carried out at a middle energy level using the above described resist pattern 31*h* as a mask and, thereby, an implantation region 4*a* of boron ions is formed at a location of a middle depth in a region that becomes the outermost portion of the pn-repeating structure.

Figure 41:
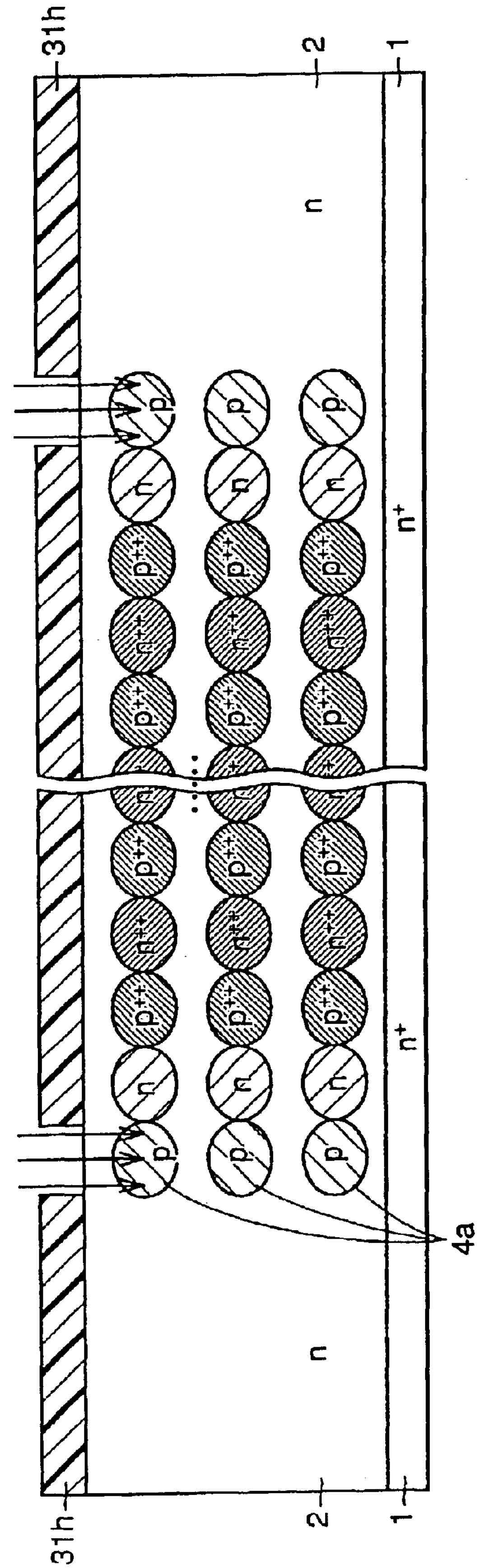

In reference to FIG. 41, ion implantation of boron ions is carried out at a low energy level using the above described resist pattern 31*h* as a mask and, thereby, an implantation region 4*a* of boron ions is formed at a shallow location in a region that becomes the outermost portion of the pn-repeating structure. After this, resist pattern 31*h* is removed by means of, for example, ashing.

The implantation concentration of boron ions implanted to the outermost portion of the pn-repeating structure in the process of FIGS. 39 to 41 is set at approximately half of the implantation concentration of boron ions implanted into the center portion.

Here, the order of the respective implantations of the above described implantation to a deep location (FIG. 39), implantation to a middle location (FIG. 40) and implantation to a shallow location (FIG. 41) can be switched. Furthermore, these implantation processes of a low concentration of boron ions to the outermost portion can be switched as a whole with the above described implantation processes of a high concentration of boron ions or phosphorus ions to the center portion or the implantation process of a low concentration of phosphorus ions to a region closer to the center portion by one stage from the outermost portion of the pn-repeating structure.

Though in the present embodiment, a case wherein only one column of pn combinations made up of p layers and n layers of a low concentration is formed at the outermost portion of the pn-repeating structure is cited as an example for the purpose of simplification, the present invention is not specifically limited to this.

Figure 42:
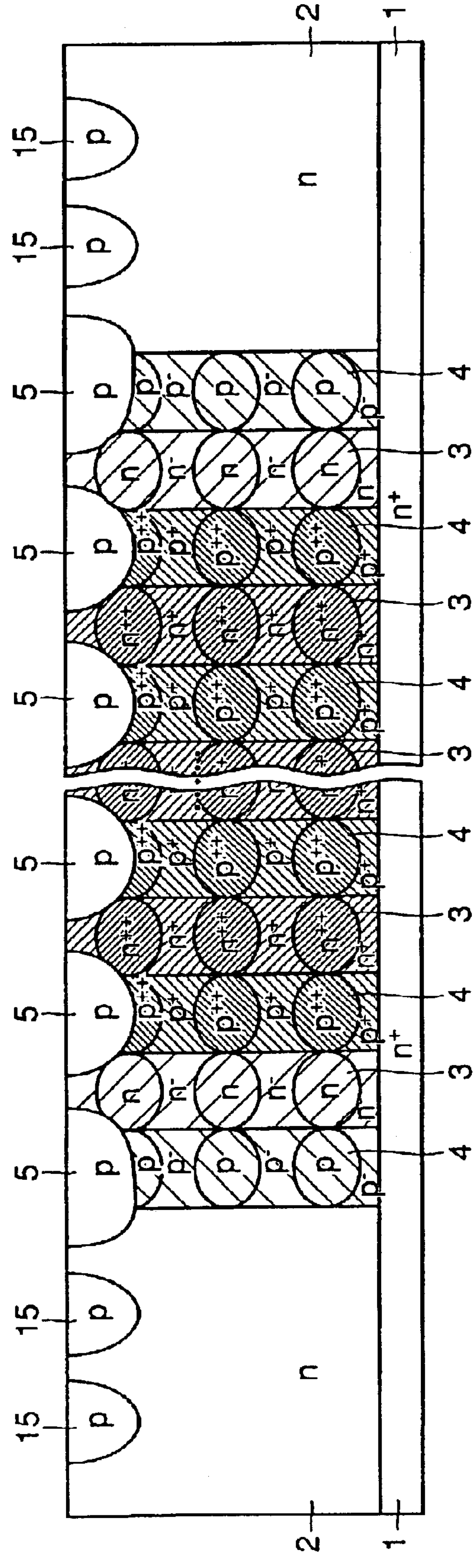

In reference to FIG. 42, guard ring portions 15 and p-type body regions 5 are formed by carrying out the same process as in the seventeenth embodiment, shown in FIG. 24. At the same time as this, a plurality of implantation regions 4*a* of boron ions and a plurality of implantation regions 3*a* of phosphorus ions aligned in the depth direction of the semiconductor substrate are diffused into the surrounding areas so as to be integrated and p-type impurity regions 4 and n-type drift regions 3 making up the pn-repeating structure are formed. After this, MOS-FET configuration portions, electrodes, and the like, are formed so that the semiconductor device shown in FIG. 9 is completed.

Here, though FIG. 42 represents connected n-type drift regions 3 and connected p-type impurity regions 4 in two stages, of low concentration and high concentration, for the purpose of simplification, these impurity concentrations in actuality change without discrete stages and in a continuous manner and change in an alternating manner in the depth direction of the substrate. In addition, though p-type impurity region 4 of a low concentration at the outermost portion of the pn-repeating structure has a wavy cross sectional form that spreads somewhat to the outer periphery in a portion having a high impurity concentration, this detail is omitted for the purpose of simplification.

Twentieth Embodiment

A process flow for manufacturing the configuration of FIG. 6 by using multiple epitaxial layers for the formation of the buried regions is described in detail in the twentieth embodiment, in reference to FIGS. 43 to 53.

Figure 43:
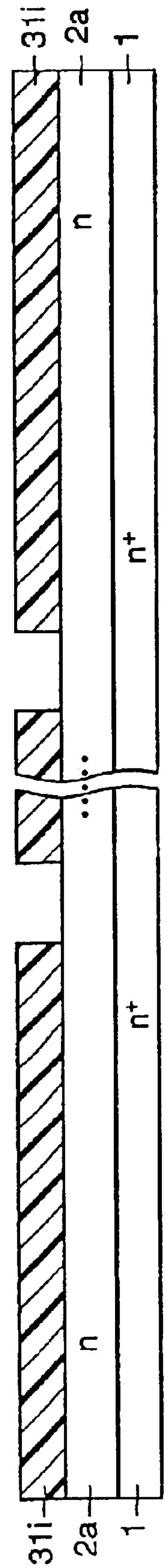
FIGS. 43 to 53 are schematic cross sectional views showing a manufacturing method for a semiconductor device in the order of the steps according to the twentieth embodiment of the present invention.

In reference to FIG. 43, a first stage of $n^-$ epitaxial layer 2*a* is formed on an $n^+$ substrate 1 of high concentration including arsenic or antimony by means of a conventional epitaxial method. This $n^-$ epitaxial layer 21 is formed of only one layer having a low concentration and a uniform impurity concentration in comparison with the concentration of n-type drift layers utilized in a MOS-FET of the conventional structure wherein a multiple RESURF effect is not used. A resist pattern 31*i* having a predetermined pattern is formed on $n^-$ epitaxial layer 2*a* using photomechanical technology.

Here, though FIG. 43 shows a case of direct photoresist application wherein a base silicon oxide film is not provided beneath resist pattern 31*i*, a base silicon oxide film may be provided if necessary.

Figure 44:
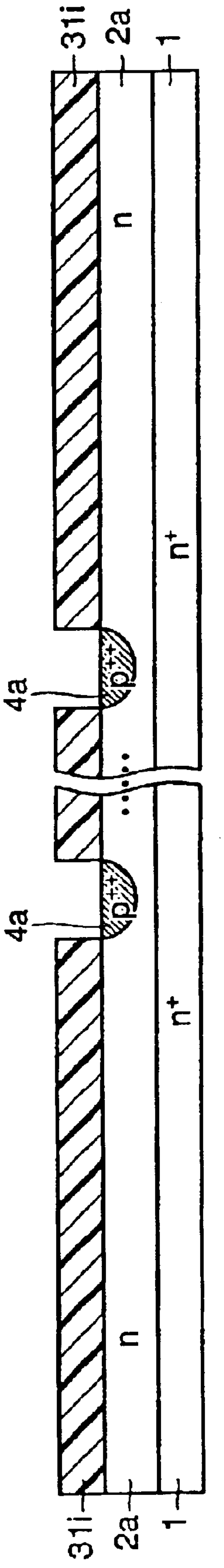

In reference to FIG. 44, ion implantation of boron ions is carried out at a conventional energy level by using this resist pattern 31*i* as a mask and, thereby, an implantation region 4*a* of a high concentration of boron ions is formed at a comparatively shallow location (though the location may be deep, in general it is difficult to obtain a high energy level) in a region that becomes the center portion. After this, resist pattern 31*i* is removed by means of, for example, ashing.

Figure 45:
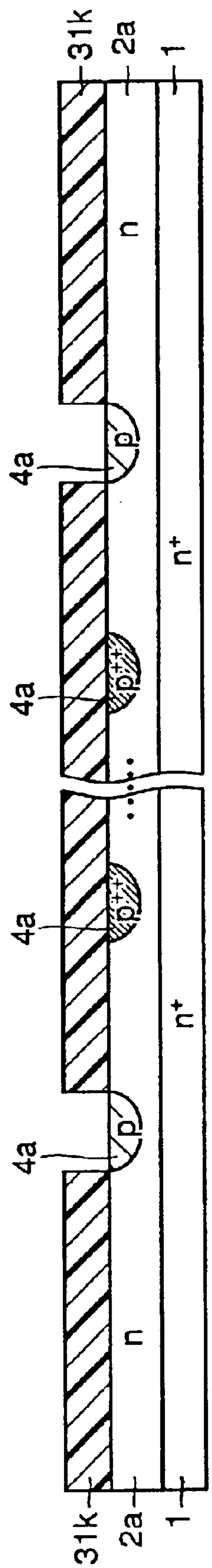

In reference to FIG. 45, a resist pattern 31*k* having a predetermined pattern is formed on $n^-$ epitaxial layer 2*a* using photomechanical technology. Ion implantation of boron ions is carried out at a conventional energy level by using this resist pattern 31*k* as a mask and, thereby, an implantation region 4*a* of a low concentration of boron ions is formed at a comparatively shallow location in a region that becomes the outermost portion of the pn-repeating structure. After this, resist pattern 31*k* is removed by means of, for example, ashing.

Here, though FIG. 45 shows a case of direct photoresist application wherein a base silicon oxide film is not provided beneath resist pattern 31*k*, a base silicon oxide film may be provided if necessary.

Figure 46:
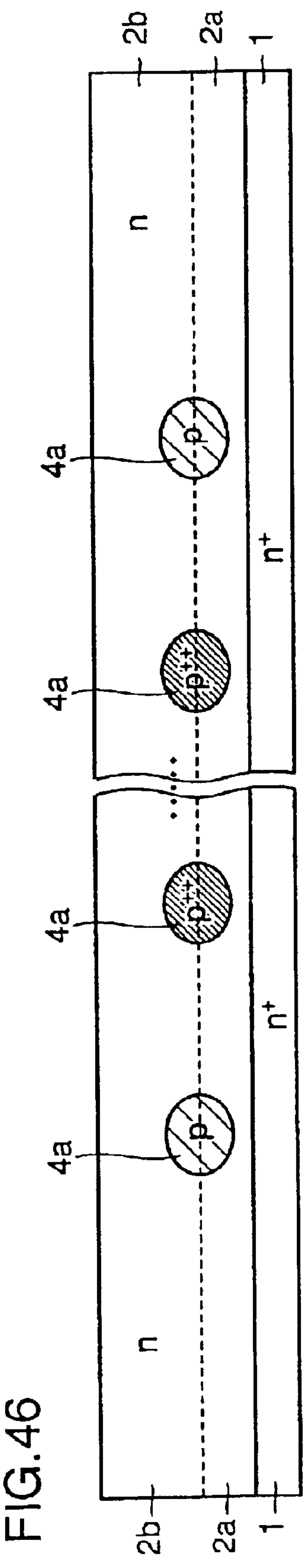

In reference to FIG. 46, an $n^-$ epitaxial layer 2*b* of a low concentration is formed by means of epitaxial growth in the same manner as the process described in FIG. 43 in order to bury implantation regions 4*a* of boron ions of both the above described high concentration and low concentration in the substrate. Strictly speaking, each implantation region 4*a* slightly diffuses into the surrounding area so that the cross sectional form thereof becomes circular as a result of a heat treatment in this epitaxial growth process. The diffused state is illustrated in a form of spreading (rising) into the above portion of the epitaxial growth interface shown by the dotted line and this rise, itself, is not positively utilized and the rise is not harmful.

In the following steps, each of the processes, starting from the formation of the above described first stage of $n^-$ epitaxial layer 2$a$, of the formation of a high concentration boron ion implanted region 4$a$, of the formation of a low concentration boron ion implanted region 4$a$ and of the formation of a second stage of $n^-$ epitaxial layer 2$b$ is essentially repeated a desired number of times.

Figure 47:
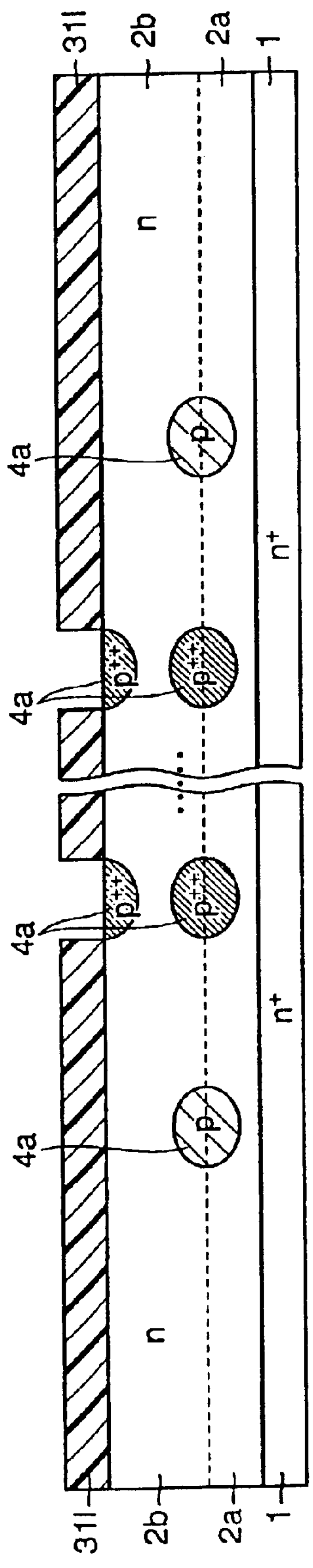

In reference to FIG. 47, a resist pattern 31$l$ having a predetermined pattern is formed on $n^-$ epitaxial layer 2$b$ using photomechanical technology. Ion implantation of boron ions is carried out at a conventional energy level by using this resist pattern 31$l$ as a mask and, thereby, an implantation region 4$a$ of a high concentration of boron ions is formed at a comparatively shallow location of a region that becomes the center portion of the pn-repeating structure. After this, resist pattern 31$l$ is removed by means of, for example, ashing.

Here, though FIG. 47 shows a case of direct photoresist application wherein a base silicon oxide film is not provided beneath resist pattern 31$l$, a base silicon oxide film may be provided if necessary.

Figure 48:
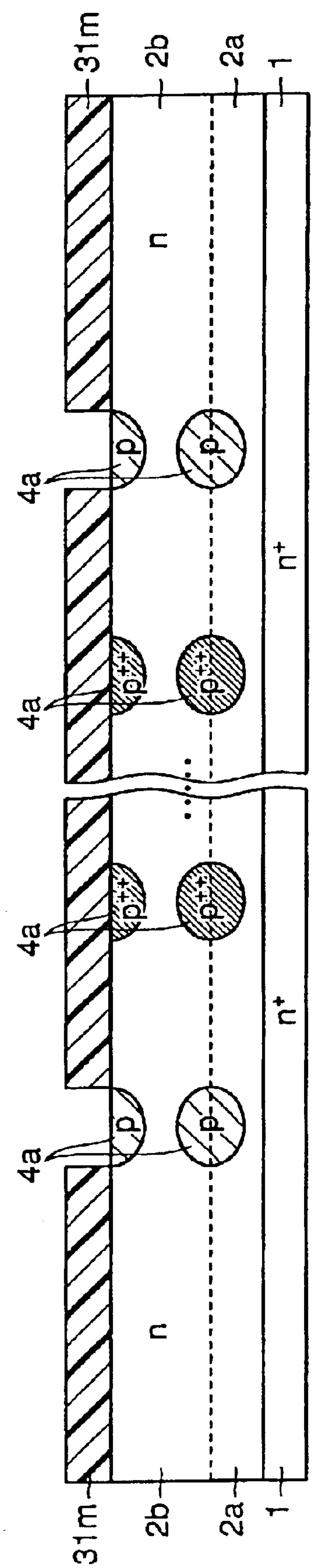

In reference to FIG. 48, a resist pattern 31$m$ having a predetermined pattern is formed on $n^-$ epitaxial layer 2$b$ using photomechanical technology. Ion implantation of boron ions is carried out at a conventional energy level by using this resist pattern 31$m$ as a mask and, thereby, an implantation region 4$a$ of a low concentration of boron ions is formed at a comparatively shallow location of a region that becomes the outermost portion of the pn-repeating structure. After this, resist pattern 31$m$ is removed by means of, for example, ashing.

Here, though FIG. 48 shows a case of direct photoresist application wherein a base silicon oxide film is not provided beneath resist pattern 31$m$, a base silicon oxide film may be provided if necessary.

After this, a low concentration of $n^-$ epitaxial layer 2$c$ is formed by means of epitaxial growth in the same manner as described in the process of FIG. 43 in order to bury implantation regions 4$a$ of boron ions of both the above described high concentration and low concentration in the substrate. Strictly speaking, each implantation region 4$a$ slightly diffuses into the surrounding area so that the cross sectional form thereof becomes circular as a result of a heat treatment in this epitaxial growth process. The diffused state is illustrated in a form of spreading (rising) into the above portion of the epitaxial growth interface shown by the dotted line and this rise, itself, is not positively utilized and the rise is not harmful.

Figure 49:
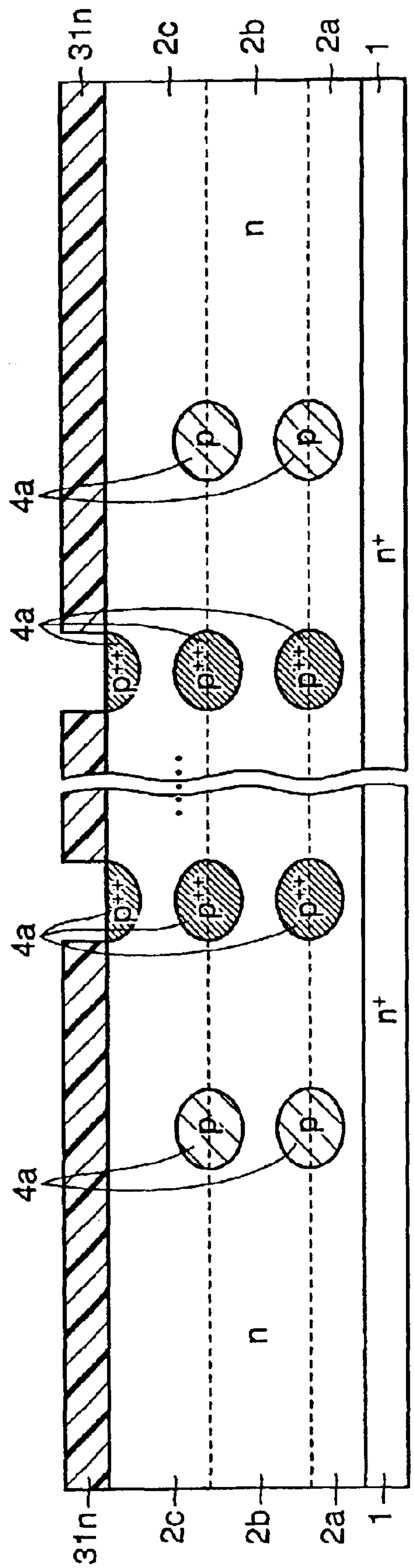

In reference to FIG. 49, a resist pattern 3 in having a predetermined pattern is formed on $n^-$ epitaxial layer 2$c$ using photomechanical technology. Ion implantation of boron ions is carried out at a conventional energy level by using this resist pattern 31$n$ as a mask and, thereby, an implantation region 4$a$ of a high concentration of boron ions is formed at a comparatively shallow location of a region that becomes the center portion of the pn-repeating structure. After this, resist pattern 31$n$ is removed by means of, for example, ashing.

Here, though FIG. 49 shows a case of direct photoresist application wherein a base silicon oxide film is not provided beneath resist pattern 31$n$, a base silicon oxide film may be provided if necessary.

Figure 50:
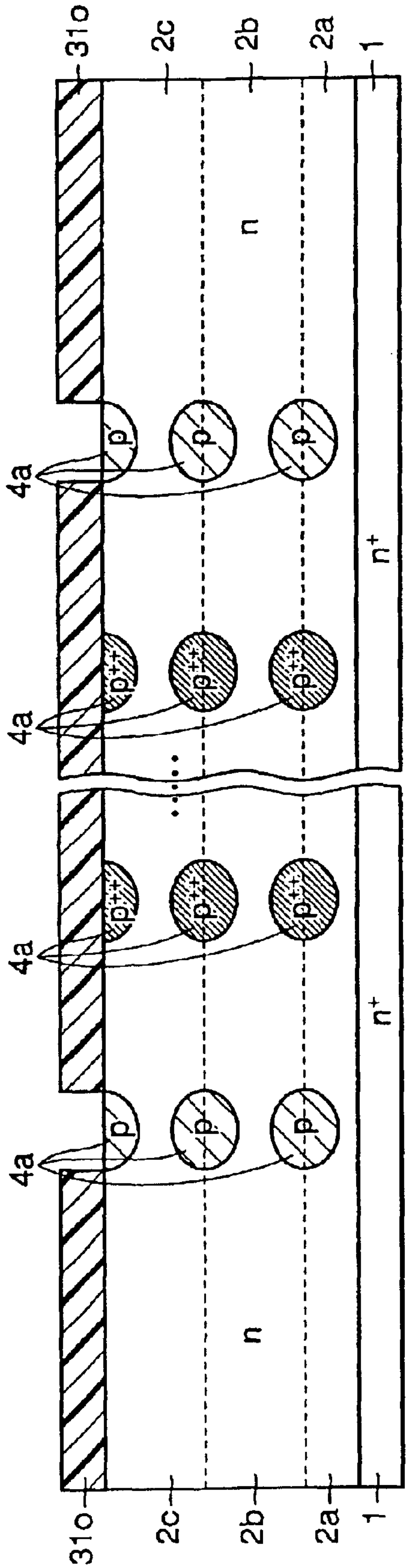

In reference to FIG. 50, a resist pattern 31$o$ having a predetermined pattern is formed on $n^-$ epitaxial layer 2$c$ using photomechanical technology. Ion implantation of boron ions is carried out at a conventional energy level by using this resist pattern 31$o$ as a mask and, thereby, an implantation region 4$a$ of a low concentration of boron ions is formed at a comparatively shallow location of a region that becomes the outermost portion of the pn-repeating structure. After this, resist pattern 31$o$ is removed by means of, for example, ashing.

Here, though FIG. 50 shows a case of direct photoresist application wherein a base silicon oxide film is not provided beneath resist pattern 31$o$, a base silicon oxide film may be provided if necessary.

Figure 51:
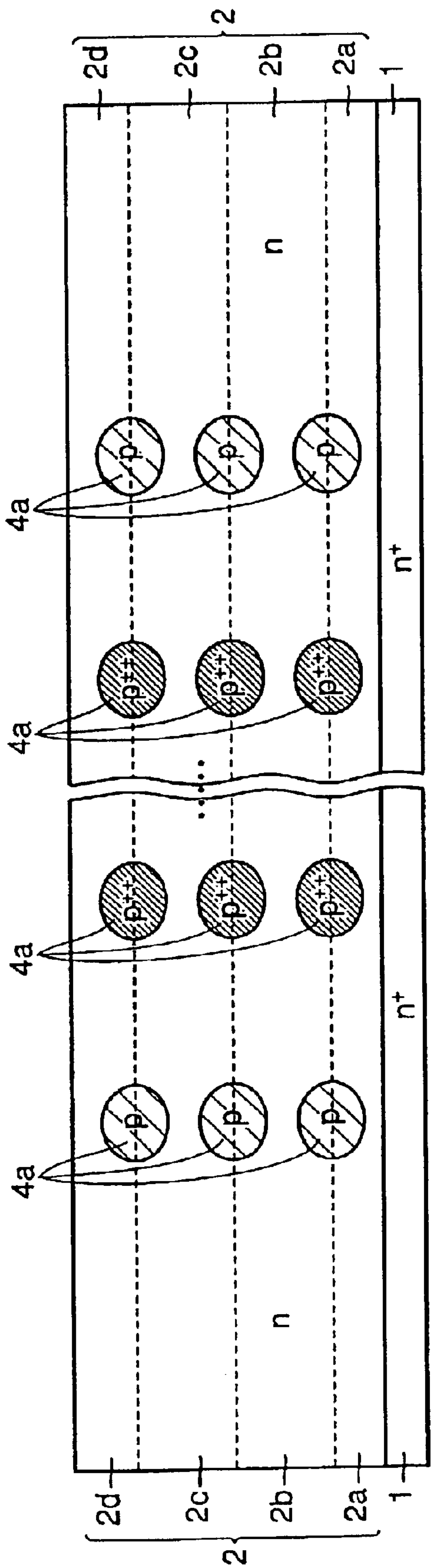

In reference to FIG. 51, the final stage of $n^-$ epitaxial layer 2$d$ of a low concentration is formed by means of epitaxial growth in the same manner as described in the process of FIG. 43 in order to bury implantation regions 4$a$ of boron ions of both the above described high concentration and low concentration in the substrate. Thereby, a multi-layer epitaxial layer 2 is formed of $n^-$ epitaxial layers 2$a$ to 2$d$.

Strictly speaking, each implantation region 4$a$ slightly diffuses into the surrounding area so that the cross sectional form thereof becomes circular as a result of a heat treatment in this epitaxial growth process. The diffused state is illustrated in a form of spreading (rising) into the above portion of the epitaxial growth interface shown by the dotted line and this rise, itself, is not positively utilized and the rise is not harmful.

Figure 52:
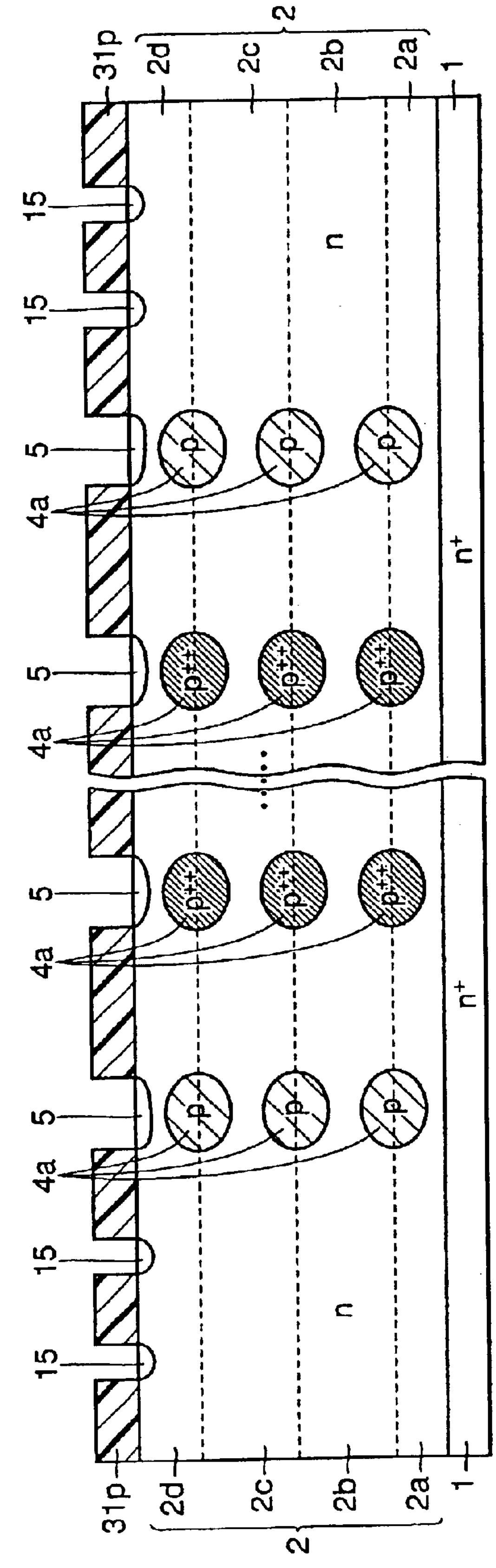

In reference to FIG. 52, a resist pattern 31$p$ having a predetermined pattern is formed on an $n^-$ epitaxial layer 2$d$ using photomechanical technology. Ion implantation of boron ions is carried out at an extremely low energy level by using this resist pattern 31$p$ as a mask and, thereby, implantation regions 5 and 15 of boron ions are formed at very shallow locations of the respective regions that become the center portion and the outermost portion of the pn-repeating structure as well as the guard ring portion that has the termination structure. After this, resist pattern 31$p$ is removed by means of, for example, ashing.

Figure 53:
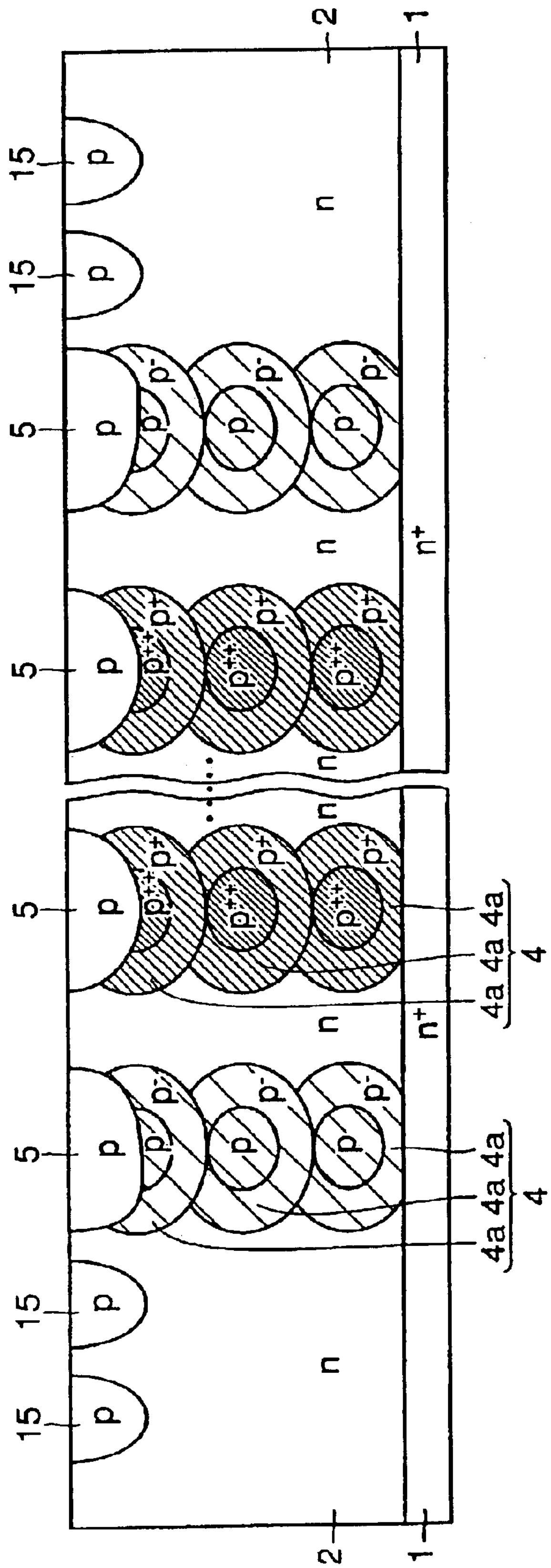

In reference to FIG. 53, a heat treatment at a high temperature is carried out for a long period of time. Thereby, the implantation regions 5 and 15 of boron ions are diffused so as to have appropriate sizes so that guard ring portions 15 and p-type body regions 5 are formed. At the same time as this, a plurality of boron ion implanted regions 4$a$ aligned in the depth direction of the semiconductor substrate is diffused into the surroundings so as to be integrated and, thereby, a p-type impurity region 4 making up the pn-repeating structure is formed. After this, MOS-FET configuration portions, electrodes, or the like, are formed so that the semiconductor device shown in FIG. 6 is completed.

Here, the implantation concentration of boron ions implanted into the outermost portion of the pn-repeating structure in the steps of FIG. 45, FIG. 48 and FIG. 50 is set at approximately half of the implantation concentration of boron ions implanted into the center portion.

In addition, though in the present embodiment a case wherein the concentration of the outermost portion of the pn-repeating structure is lowered by only one stage is cited as an example and described, it is possible to lower the concentration in a plurality of stages as in the other above described examples. Thereby, even though there is a drawback wherein the process becomes more complex and the manufacturing cost increases, there is a great advantage that the withstand voltage performance of an element is improved. Accordingly, the concentration may be lowered in multiple stages in accordance with the relationship between the price and performance of the required products and the present embodiment is definitely not limited to the structure wherein the concentration is lowered in one stage or to the manufacturing method for such a structure.

According to a manufacturing method of the present embodiment, epitaxial layers can, in principle, be infinitely stacked by increasing the number of layers. Therefore, a semiconductor device obtained according to this manufacturing method can deal with withstand voltages in a range of from a middle withstand voltage of several hundreds V to a high withstand voltage of several thousands V. Contrarily, as described below, a heat treatment process at a relatively high temperature is always required in order to connect buried diffusion regions 4*a* in the depth direction. Not only diffusion in the depth direction (upward and downward direction), but also diffusion in the lateral direction, occur simultaneously as a result of this high temperature heat treatment and, therefore, the length of the repeating pn unit cannot be shortened so that there is a drawback wherein it is difficult to obtain full performance in the low withstand voltage region beneath approximately 300 V.

Twenty-First Embodiment

A process flow for manufacturing the configuration of FIG. 6 by using multi-layered epitaxial layer for the formation of a buried region and by using a strip pattern for diffusion at the outermost portion of the pn-repeating structure is described in detail as the twenty-first embodiment in reference to FIGS. 54 to 63.

Figure 54:
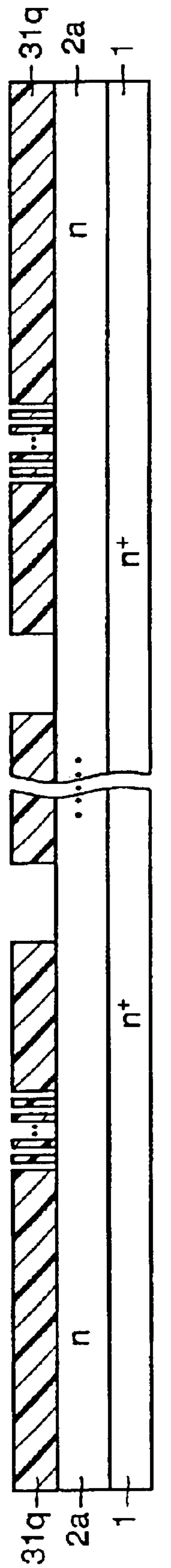
FIGS. 54 to 62 are schematic cross sectional views showing a manufacturing method for a semiconductor device in the order of the steps according to the twenty-first embodiment of the present invention.

In reference to FIG. 54, a first stage of $n^-$ epitaxial layer 2*a* is formed on an $n^+$ substrate 1 of a high concentration including arsenic or antimony by means of a conventional epitaxial method. This $n^-$ epitaxial layer 2*a* is formed of only one layer having a low concentration and a uniform impurity concentration in comparison with the concentration of the n-type drift layer utilized in a MOS-FET of the conventional structure wherein a multiple RESURF effect is not used. A resist pattern 31*q* having a predetermined pattern is formed on $n^-$ epitaxial layer 2*a* by means of photomechanical technology.

A first opening pattern including a single hole is formed in a region that becomes the center portion of the pn-repeating structure of this resist pattern 31*q* while a second opening pattern including a plurality of microscopic holes is formed in a region that becomes the outermost portion of the pn-repeating structure. The sum of the areas of the openings of all of the microscopic holes in the second opening pattern is set to be smaller than the area of the opening of the first opening pattern.

Here, though FIG. 54 shows a case of direct photoresist application wherein a base silicon oxide film is not provided beneath resist pattern 31*q*, a base silicon oxide film may be provided if necessary.

Figure 55:
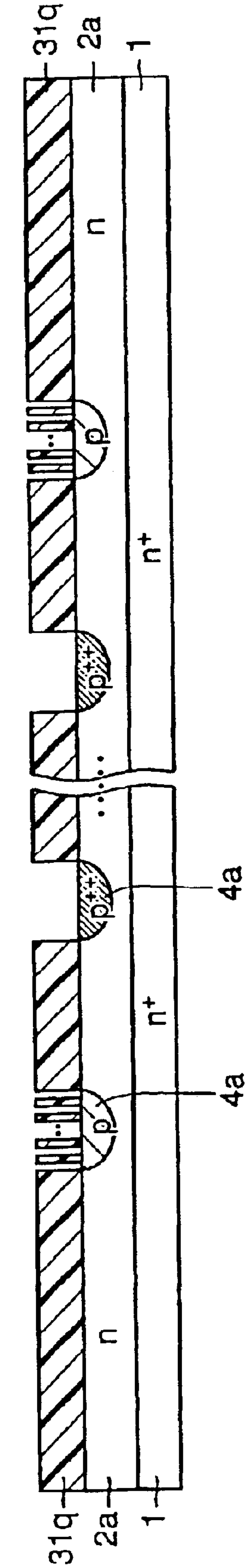

In reference to FIG. 55, ion implantation of boron ions is carried out at a conventional energy level by using this resist pattern 31*q* as a mask. Thereby, an implantation region 4*a* of a high concentration of boron ions is formed at a comparatively shallow location in a region that becomes the center portion of the pn-repeating structure and an implantation region 4*a* of a low concentration of boron ions is formed at a comparatively shallow location in a region that becomes the outermost portion of the pn-repeating structure, respectively.

Figure 63:
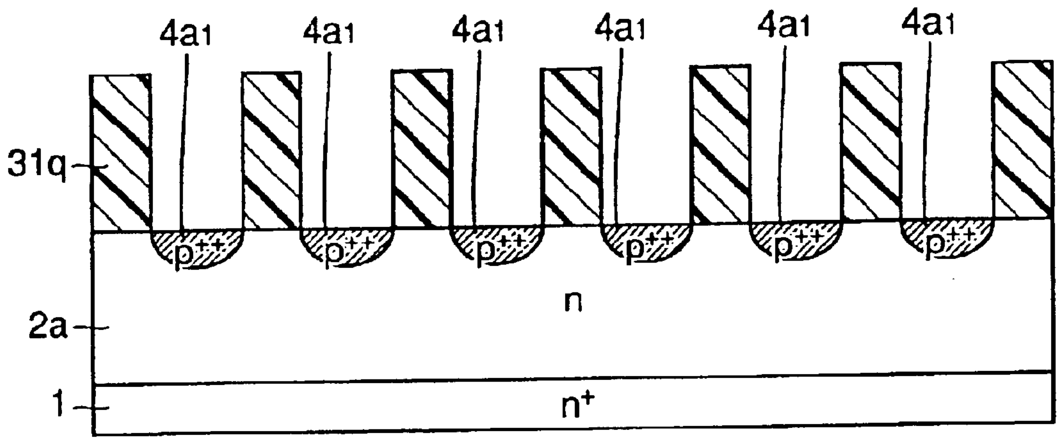
FIGS. 63 and 64 are enlarged cross sectional views of a portion showing a portion of FIG. 55 that is shown enlarged.

FIG. 63 shows the state of impurity implantation at the outermost portion of the pn-repeating structure immediately after the above described ion implantation. In reference to FIG. 63, the second opening pattern above the outermost portion of the pn-repeating structure is formed of a plurality of microscopic holes and, therefore, implantation regions 4$a_1$ of boron ions are formed directly beneath the respective microscopic holes. A heat treatment for impurity diffusion is carried out on the substrate in this condition.

Figure 64:
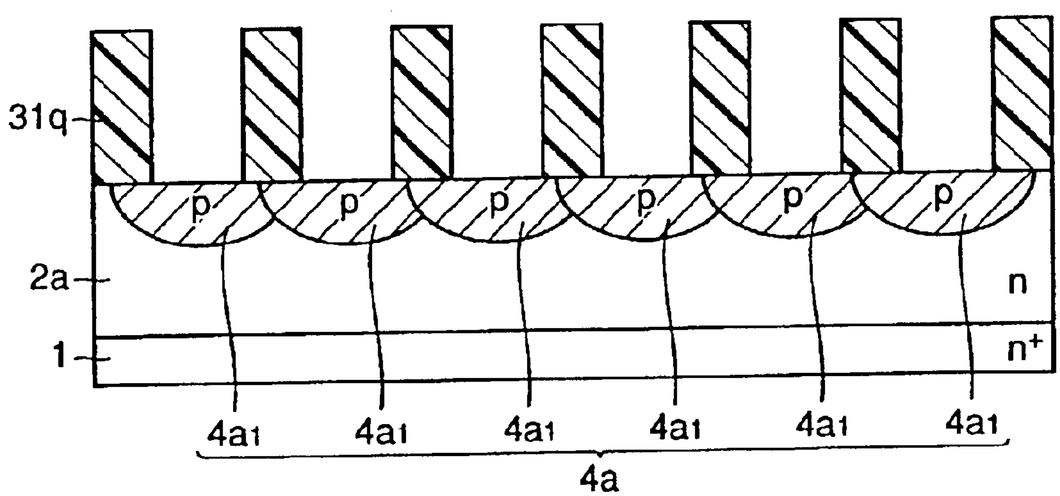

In the case that the plurality of microscopic holes created are very fine, a slight heat treatment makes the plurality of implantation regions 4$a_i$ of boron ions spread and diffuse into the surrounding areas, as shown in FIG. 64, so as to overlap each other and so as to become integrated to form an implantation region 4*a* of a low concentration. In addition, a slight heat treatment enables the respective implantation regions 4$a_i$ to easily overlap through lateral diffusion so that the concentration becomes uniform as a whole. Though this implantation region 4*a* of a low concentration has unevenness in form and concentration, it can macroscopically be regarded as a uniform diffusion region 4*a* of a comparatively low concentration. In addition, the above described heat treatment itself can be carried out as a part of an epitaxial growth process in the following steps or can be independently carried out before the epitaxial growth.

Here, the sum of the areas of the openings of all of the microscopic holes in the second opening pattern is set to become smaller than the area of the opening of the first opening pattern. Therefore, even though ion implantation to both of these opening patterns is carried out at the same time, implantation region 4*a* of a high concentration can be formed in a region that becomes the center portion and implantation region 4*a* of a low concentration can be formed in a region that becomes the outermost portion of the pn-repeating structure, respectively.

After this, resist pattern 31*q* is removed by means of, for example, ashing.

Figure 56:
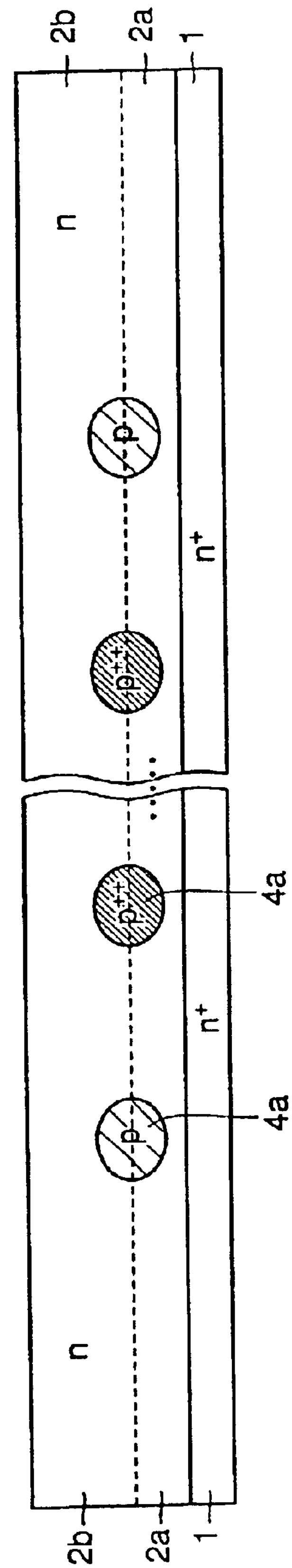

In reference to FIG. 56, an $n^-$ epitaxial layer 2*b* of a low concentration is formed through epitaxial growth in the same manner as described in the process of FIG. 54 in order to bury both of the above described implantation regions 4*a* of boron ions of a high concentration and of a low concentration in the substrate. Strictly speaking, each implantation region 4*a* slightly diffuses into the surrounding area so that the cross sectional form thereof becomes circular as a result of a heat treatment in this epitaxial growth process. The diffused state is illustrated in a form of spreading (rising) into the above portion of the epitaxial growth interface shown by the dotted line and this rise, itself, is not positively utilized and the rise is not harmful.

In the following process, the respective steps, starting from the formation of the above described first stage $n^-$ epitaxial layer 2*a*, of the formation of implantation region 4*a* of a high concentration of boron ions, of the formation of implantation region 4*a* of a low concentration of boron ions and of the formation of a second stage $n^-$ epitaxial layer 2*b* are essentially repeated a desired number of times.

Figure 57:
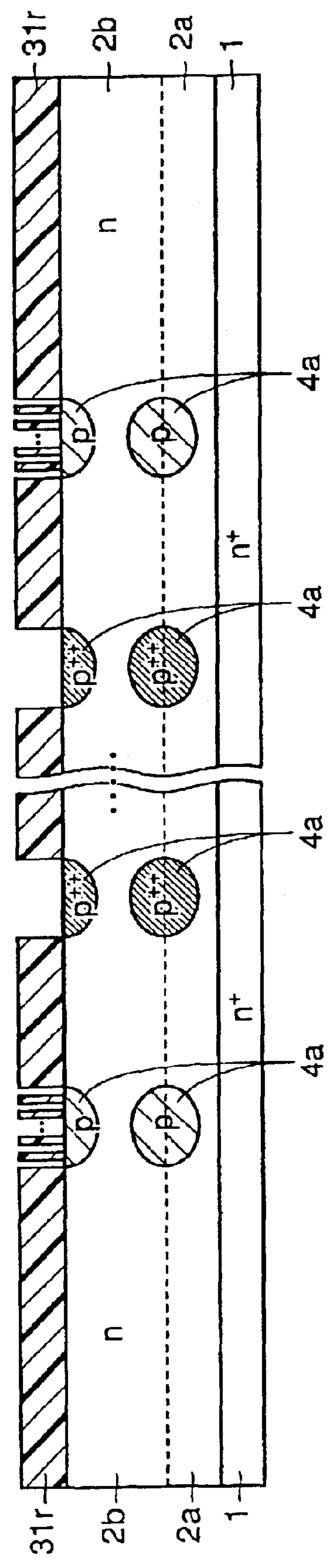

In reference to FIG. 57, a resist pattern 31*r* having a predetermined pattern is formed on $n^-$ epitaxial layer 2*a* by means of photomechanical technology in the same manner as in FIG. 54. A first opening pattern made of a single hole in this resist pattern 31*r* is formed above a region that becomes the center portion of the pn-repeating structure and a second opening pattern made of a plurality of microscopic holes is formed above a region that becomes the outermost portion of the pn-repeating structure. The sum of the areas of the openings of all of the microscopic holes in the second opening pattern is set to be smaller than the area of the opening of the first opening pattern.

Here, though FIG. 57 shows a case of direct photoresist application wherein a base silicon oxide film is not provided beneath resist pattern 31*r*, a base silicon oxide film may be provided if necessary.

After this, ion implantation of boron ions is carried out at a conventional energy level by using this resist pattern 31*r* as a mask. Thereby, an implantation region 4*a* of a high concentration of boron ions is formed at a comparatively shallow location in a region that becomes the center portion of the pn-repeating structure and an implantation region 4*a* of a low concentration of boron ions is formed at a comparatively shallow location in a region that becomes the outermost portion of the pn-repeating structure, respectively. After this, resist pattern 31*r* is removed by means of, for example, ashing.

Figure 58:
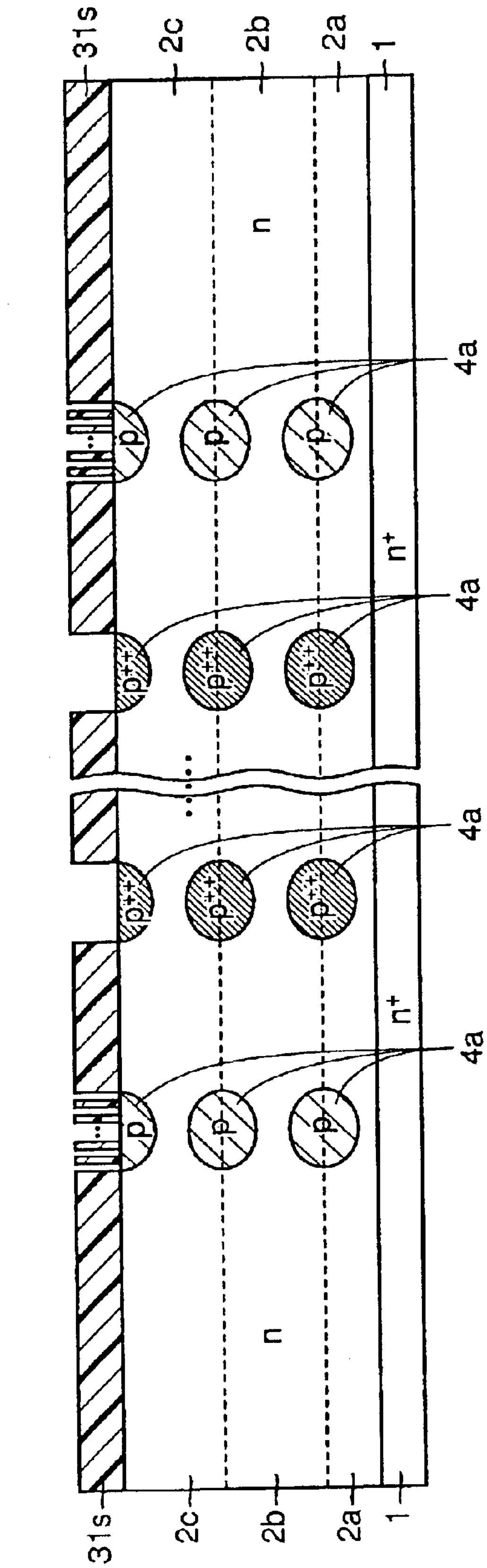

In reference to FIG. 58, epitaxial growth is carried out in the same manner as in the above and, thereby, an $n^-$ epitaxial layer 2*c* of a low concentration is formed. Strictly speaking, each implantation region 4*a* slightly diffuses into the surrounding area so that the cross sectional form thereof becomes circular as a result of a heat treatment in this epitaxial growth process.

After this, additionally, an implantation region 4*a* of a high concentration of boron ions is formed at a comparatively shallow location in a region that becomes the center portion of the pn-repeating structure and an implantation region 4*a* of a low concentration of boron ions is formed at a comparatively shallow location in a region that becomes the outermost portion of the pn-repeating structure, respectively, by means of a single photomechanical process and a single ion implantation in the same manner as described above. After this, resist pattern 31*s* is removed by means of, for example, ashing.

Figure 59:
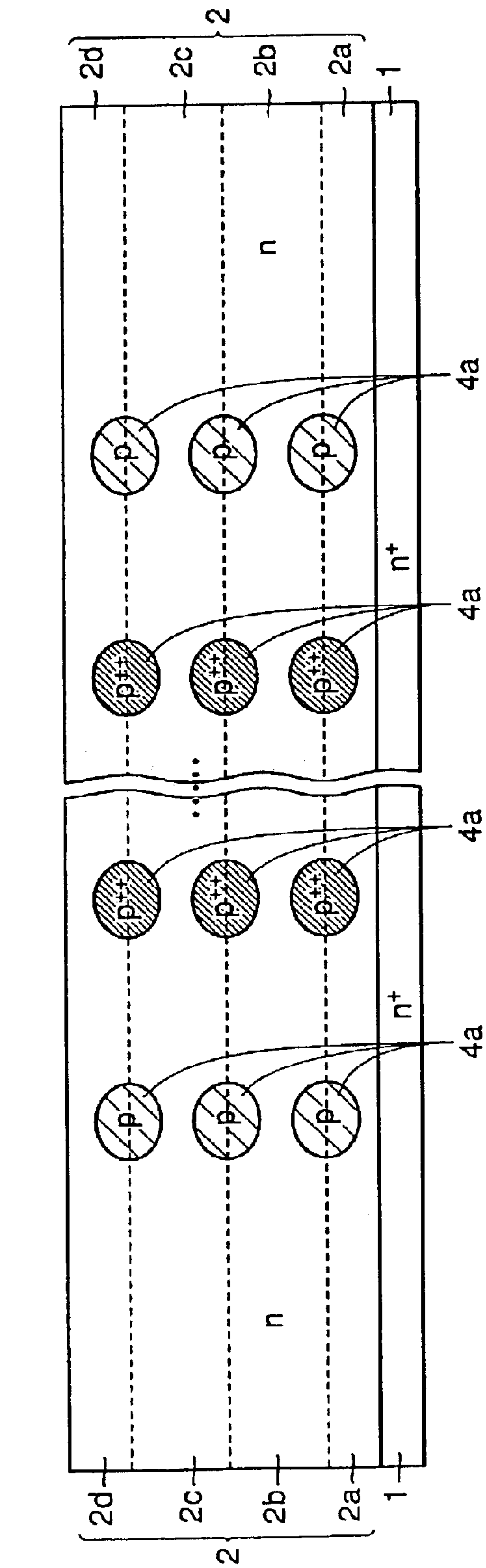

In reference to FIG. 59, epitaxial growth is carried out in the same manner as above and, thereby, an $n^-$ epitaxial layer 2*d* of a low concentration is formed. Strictly speaking, each implantation region 4*a* slightly diffuses into the surrounding area so that the cross sectional form thereof becomes circular as a result of a heat treatment in this epitaxial growth process.

Figure 60:
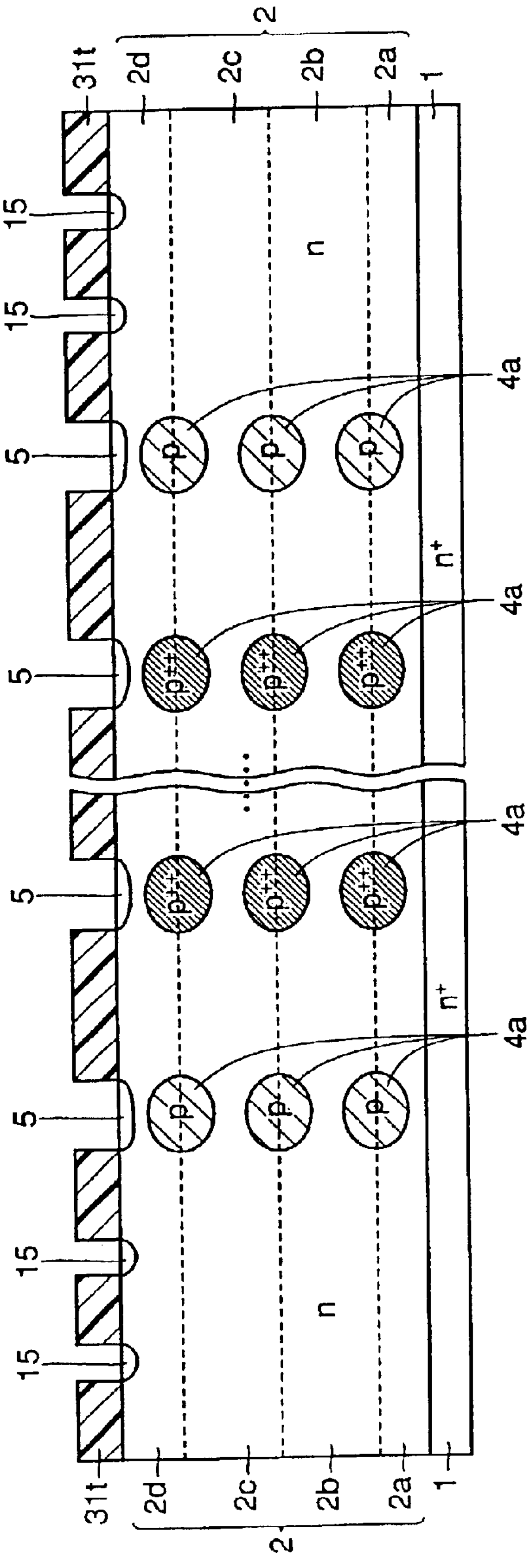

In reference to FIG. 60, a resist pattern 31*t* having a predetermined pattern is formed on $n^-$ epitaxial layer 2*d* by means of photomechanical technology. Ion implantation of boron ions is carried out at an extremely low energy level by using this resist pattern 31*t* as a mask and, thereby, implantation regions 5 and 15 of boron ions are formed at very shallow locations in the respective regions that become the center portion and the outermost portion of the pn-repeating structure as well as a guard ring portion that is the termination structure. After this, resist pattern 31*t* is removed by means of, for example, ashing.

Here, though it is desirable from a practical point of view to provide a base silicon oxide film at the time of the photomechanical process, the embodiment is not specifically limited to this and, therefore, the base silicon oxide film is omitted in the drawings for the purpose of simplification.

Figure 61:
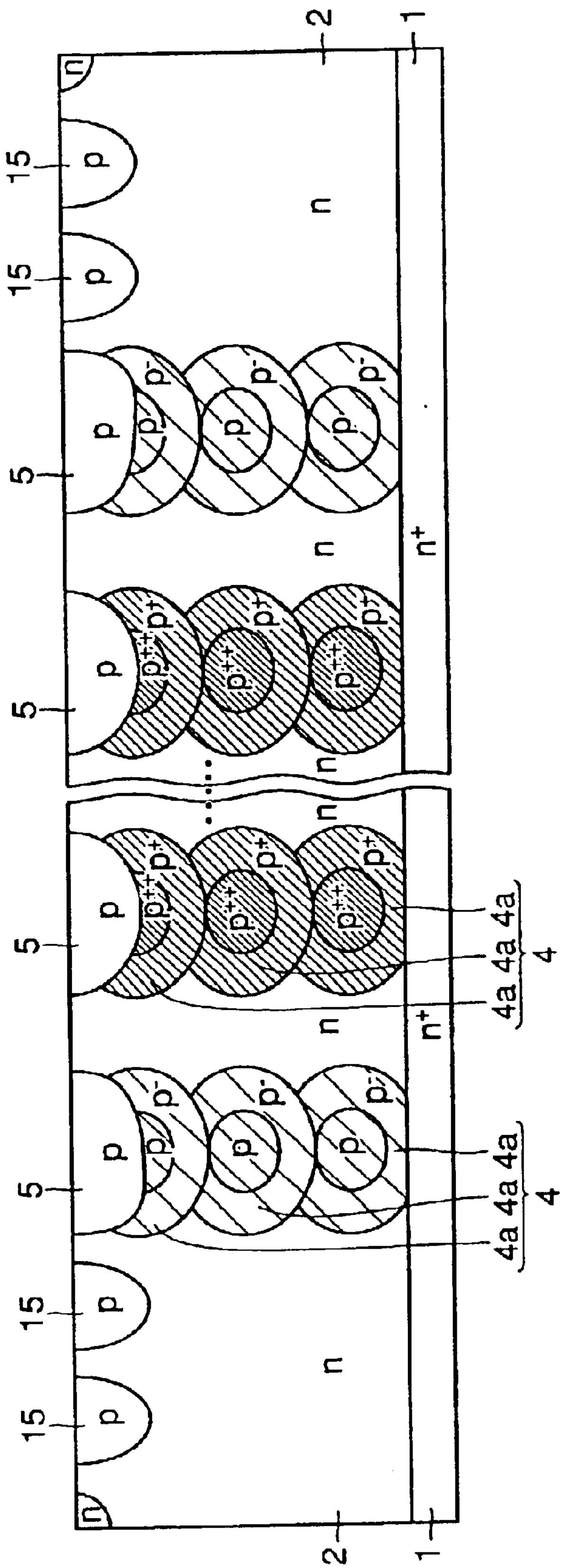

In reference to FIG. 61, a heat treatment at high temperature for a long period of time is carried out. Thereby, implantation regions 5 and 15 of boron ions are diffused to appropriate sizes so that guard ring portion 15 and p-type body region 5 are formed. At the same time as this, a plurality of implantation regions 4*a* of boron ions aligned in the depth direction of the semiconductor substrate is diffused to the surrounding areas so as to be integrated and, thereby, a p-type impurity region 4, forming the pn-repeating structure, is formed.

Figure 62:
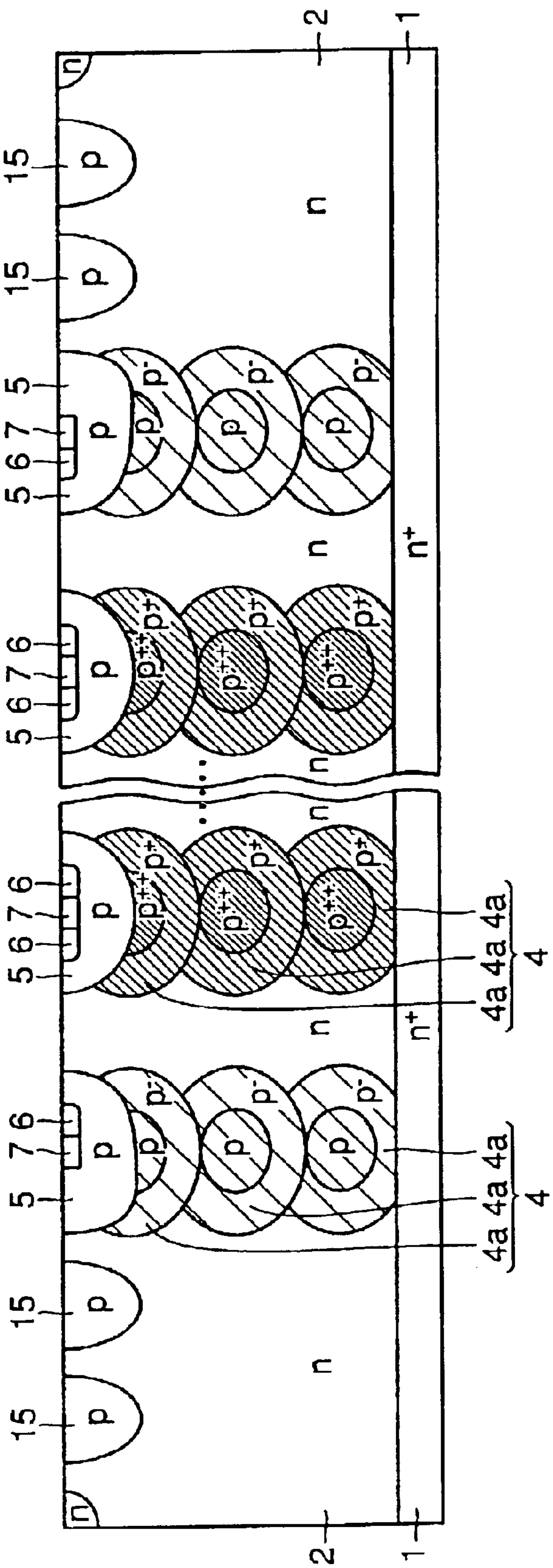

In reference to FIG. 62, an $n^+$ source region 6 and a $p^+$ contact region 7 for making a low resistance contact with a p-type body region 5 are formed within the p-type body region 5 by means of conventional photomechanical technology and by means of ion implantation technology.

Here, $n^+$ source region 6 is formed of arsenic or phosphorus and $p^+$ contact region 7 is formed of boron, respectively, and, therefore, it is necessary to independently carry out a photomechanical process and an ion implantation process for forming $n^+$ source region 6 and $p^+$ contact region 7. In addition, the order of these processes relative to the below described formation of a gate region is not specifically defined and the order can be switched according to the performance or application.

Finally, the semiconductor device shown in FIG. 6 is completed by completing the MOS-FET structures. Here in FIG. 6, contact holes via the interlayer insulating film are omitted and Al wires, and the like, are simplified so as to be shown as simple straight line wires.

In addition, though in the present embodiment a case wherein the concentration of the outermost portion of the pn-repeating structure is lowered in only one stage is cited as an example and is described, it is possible to lower the concentration in a plurality of stages as in the other above described examples. Thereby, though there is a drawback that the process becomes more complicated and the manufacturing cost rises, there is a great advantage wherein the withstand voltage performance of an element is improved. Therefore, the concentration may be lowered in multiple stages according to the relationship between the price and performance of the required products and the present embodiment is definitely not limited to the structure having one stage or to a manufacturing method for such a structure.

According to a manufacturing method for a device of a multi-layered system used in the present embodiment, the manufactured device can cope with a high withstand voltage in a range from a middle withstand voltage of approximately several hundreds V to a high withstand voltage of several thousands V while having the drawback of poor performance in the low withstand voltage region beneath approximately 300 V. On the other hand, the outermost portion of the pn-repeating structure can be formed at the same time as the center portion through modification of the manufacturing method of the present embodiment, in contrast to the twentieth embodiment, and, therefore, there is an advantage wherein the manufacturing steps can be halved.

Description of the Case of Embodiment Having Trenches

A process flow for manufacturing a pn-repeating structure in the center portion in the case that there are trenches in the structure is briefly described in the following, though this is not a direct embodiment, and, after that, an embodiment of the present invention wherein the structure having these trenches and a manufacturing method for such a structure are applied is described.

In addition, there is an advantage to this structure STM (Super Trench power MOS-FET) having trenches wherein not only the number of steps is fewer but, also, wherein the tradeoff relationship between the main withstanding voltage and the ON resistance of an element is very good since the length of repetition can easily be shortened to the limit in comparison with the above described buried multi-layer epitaxial structure and manufacturing method for the same and, therefore, there is also an advantage wherein the element is, in principle, effective in a broad range from a low withstand voltage to a high withstand voltage, from the point of view of manufacturing technology.

A process flow for creating diffusion layers in the trench sidewalls through diagonal ion implantation is described sequentially in reference to FIGS. 65 to 69.

Figure 65:
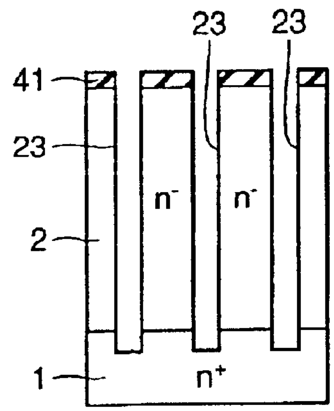
FIGS. 65 to 69 are schematic cross sectional views showing a manufacturing method for a semiconductor device in the order of the steps in the case that an embodiment of the present invention has a trench.

In reference to FIG. 65, first, anisotropic etching is carried out by using a silicon oxide film, or the like, formed by means of a CVD method as a mask material 41 according to a conventional method and, thereby, a plurality of trenches 23 are created in the first main surface of the semiconductor substrate.

Figure 66:
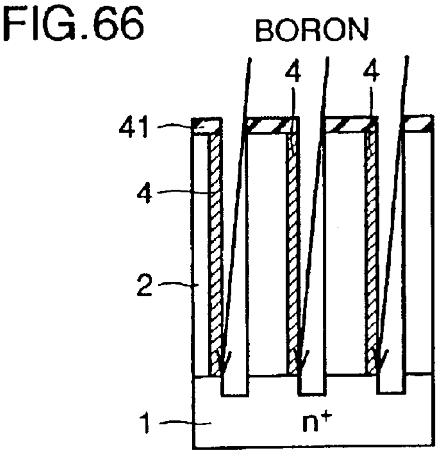

In reference to FIG. 66, boron ions are implanted into the sidewalls on only one side of trenches 23 created in a stripe form and, thereby, boron ion implantation regions 4 are formed.

Figure 67:
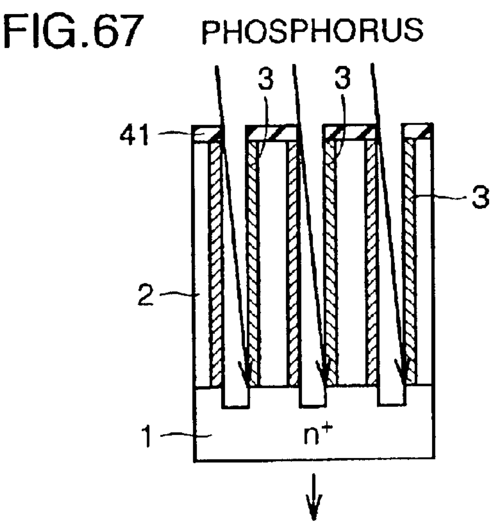

In reference to FIG. 67, phosphorus ions are implanted into the sidewalls only on the opposite side of trenches 23 created in a stripe form and, thereby, phosphorus ion implantation regions 3 are formed. Here, the steps of these FIGS. 66 and 67 may be switched.

Figure 68:
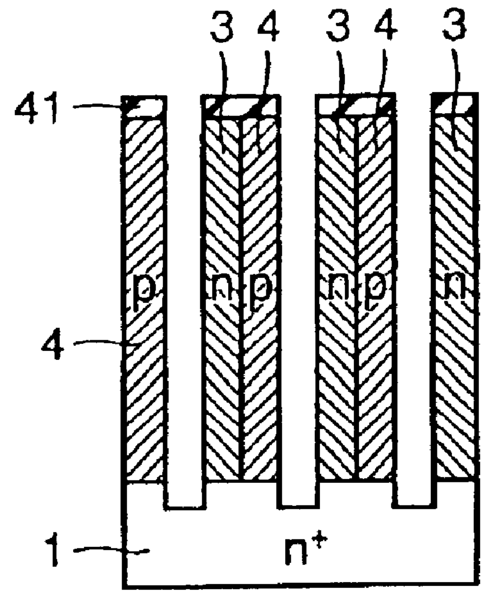

In reference to FIG. 68, p-type impurity regions 4 and n-type drift regions 3 having desired impurity concentration profiled are formed by carrying out simultaneous diffusion of boron ion implanted regions 4 and phosphorus ion implantation regions 3 by means of a heat treatment.

Figure 69:
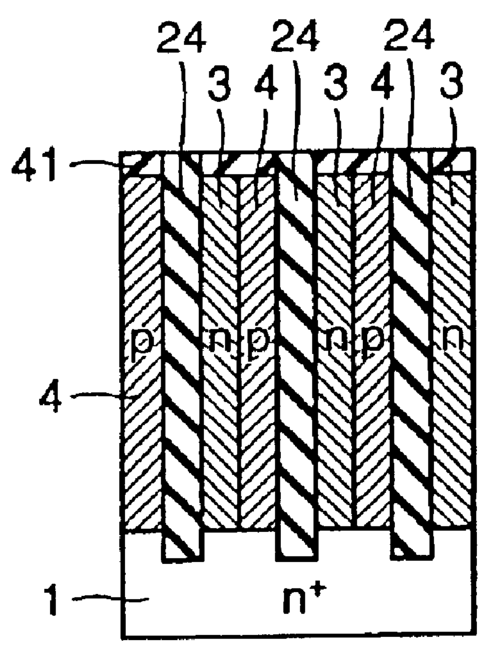

In reference to FIG. 69, trenches 23 are filled in with an insulator 24, such as a silicon oxide film, formed by means of a CVD method.

As described above, the STM structure is excellent in performance and from the point of view of manufacturing cost in comparison with the buried multi-layer epitaxial structure. However, the technique of diagonal ion implantation into the sidewalls on only one side of trenches 23, which is seldom used for manufacturing LSIs (Large Scale Integrated circuits), is used. Therefore, there is a drawback wherein the process becomes complicated and the difficulty in setting the conditions of manufacture increases at the time when the concentration of the outermost portion in the pn-repeating structure is lowered, in comparison with the case of the above described buried multi-layer epitaxial process. Accordingly, it is preferable to manufacture a semiconductor device of the present invention by selecting a suitable manufacturing method from among several types, including of this embodiment, according to the index listing cost and performance required for the product.

Twenty-Second Embodiment

A manufacturing method for an STM structure in the case wherein the trenches in the outermost portion where the concentration of the diffusion layers is lowered are again excavated, separately from the trenches in the center portion, is described in detail in reference to FIGS. 70 to 78.

Figure 70:
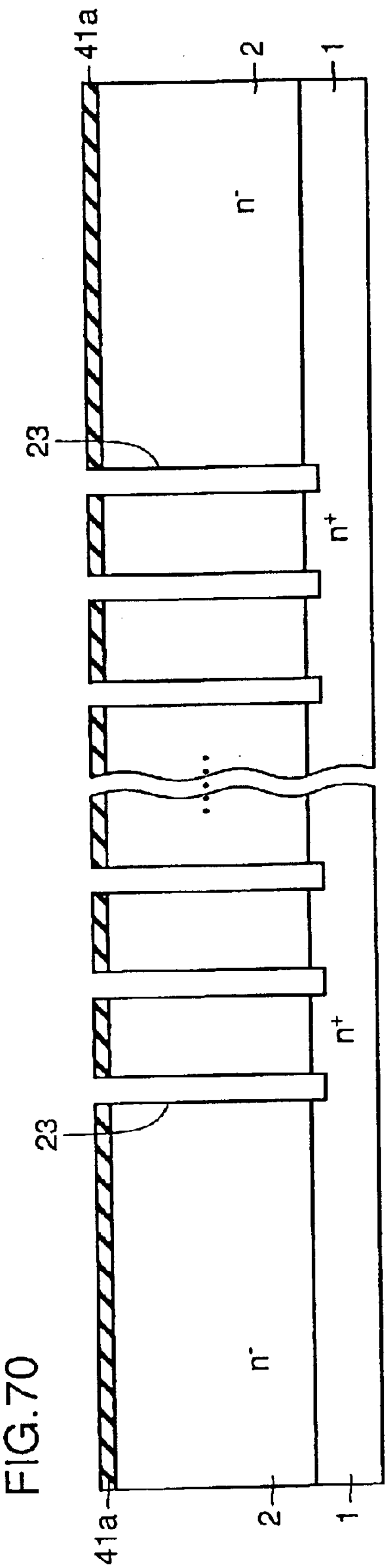
FIGS. 70 to 78 are schematic cross sectional views showing a manufacturing method for a semiconductor device in the order of the steps according to the twenty-second embodiment of the present invention.
Figure 71:
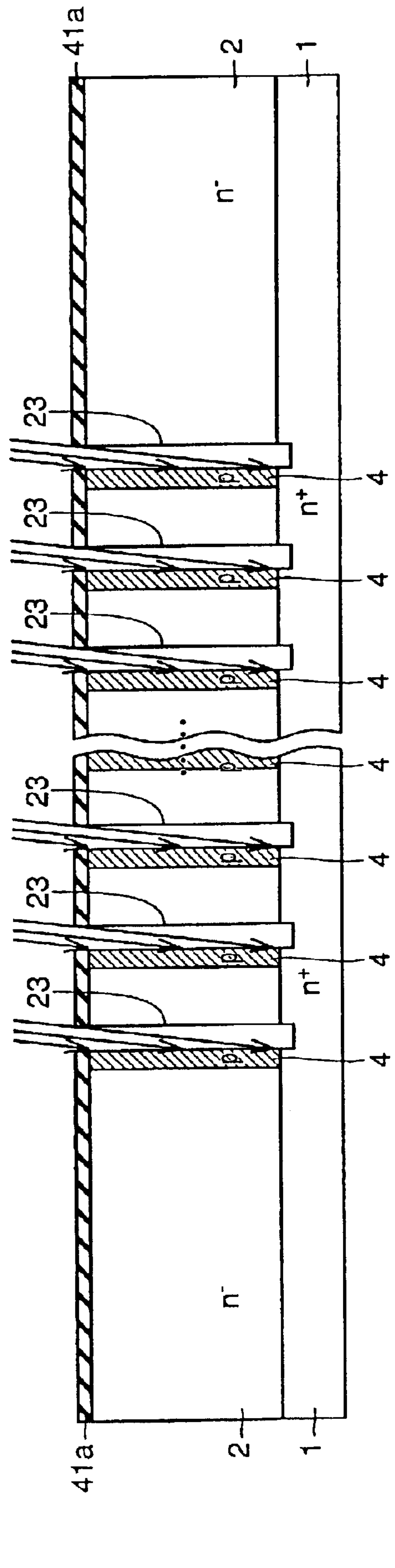
Figure 72:
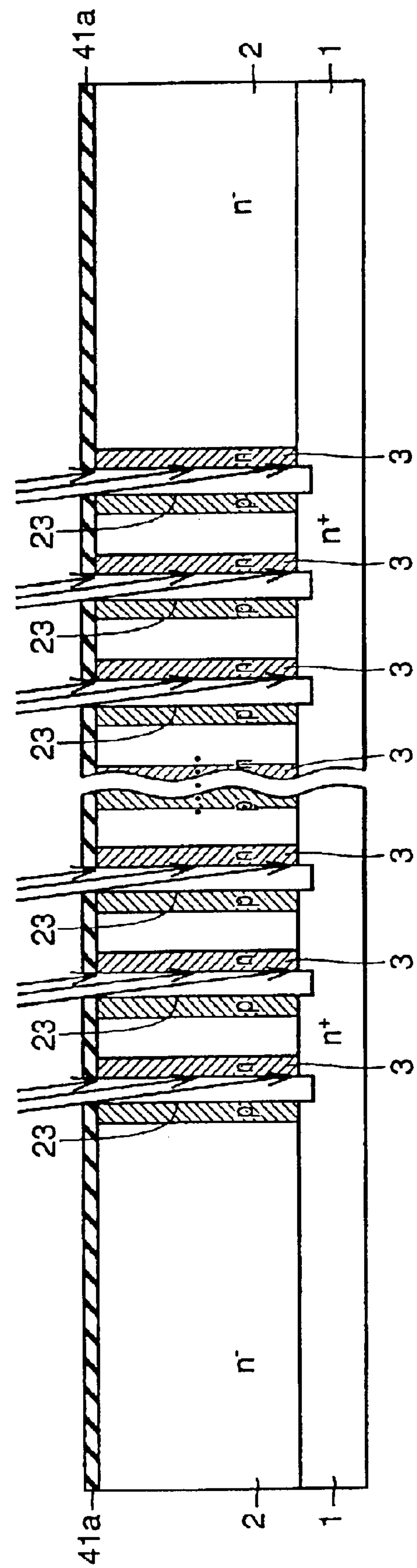

The following steps shown in FIGS. 70 to 72 are extremely the same as those of the above described process flow of FIGS. 65 to 67.

In reference to FIG. 70, first, anisotropic etching is carried out by using a silicon oxide film, or the like, formed by means of a CVD method as a mask material 41*a* according to a conventional method and, thereby, a plurality of trenches 23 is created in the first main surface of a semiconductor substrate. A trench located at the outermost portion in the finished condition is not included in these trenches 23.

In reference to FIG. 71, boron ions are implanted into all of the sidewalls on one side of the plurality of trenches 23 created in a striped form and, thereby, boron ion implanted regions 4 are formed.

In reference to FIG. 72, phosphorus ions are implanted into all of the sidewalls on only the opposite side of the plurality of trenches 23 formed in a striped form and, thereby, phosphorus ion implanted regions 3 are formed. Here, these processes of FIGS. 71 and 72 may be switched and, essentially, the order is not important.

Figure 73:
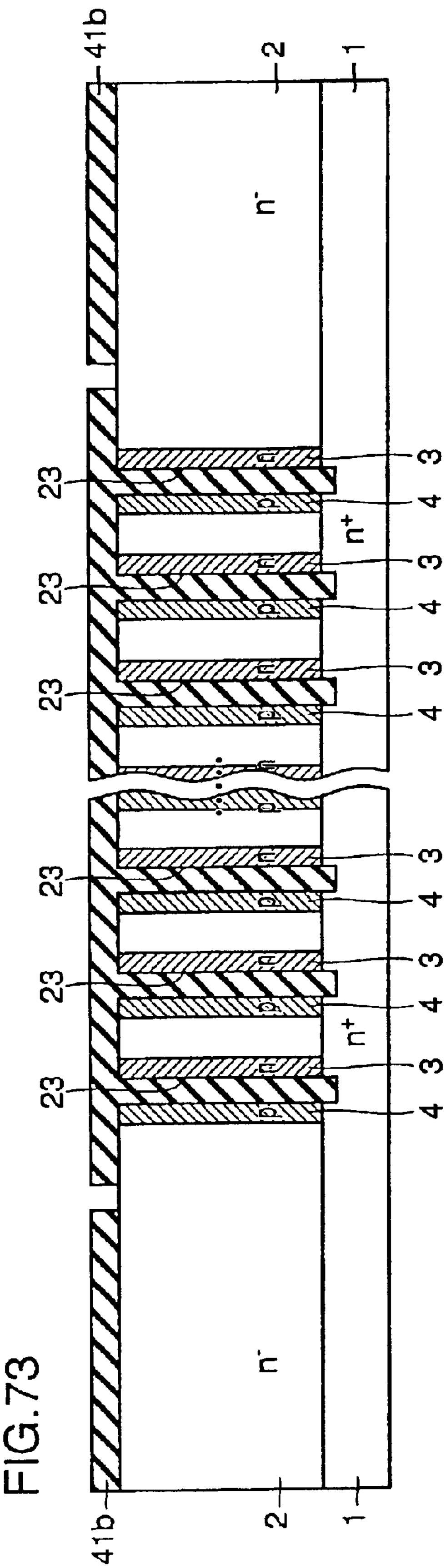

In reference to FIG. 73, all trenches 23 are once filled in with a film 41*b*, such as a silicon oxide film, formed by means of a CVD method and the surface is flattened. The process up to this point is the part of the process corresponding to a manufacturing method for a conventional STM structure and the following is the process with respect to the present embodiment.

A window is opened at a desired location of film 41*b* that is utilized for filling in trenches 23 by means of a conventional photomechanical process and by means of anisotropic etching in order to create a trench at the outermost portion.

Figure 74:
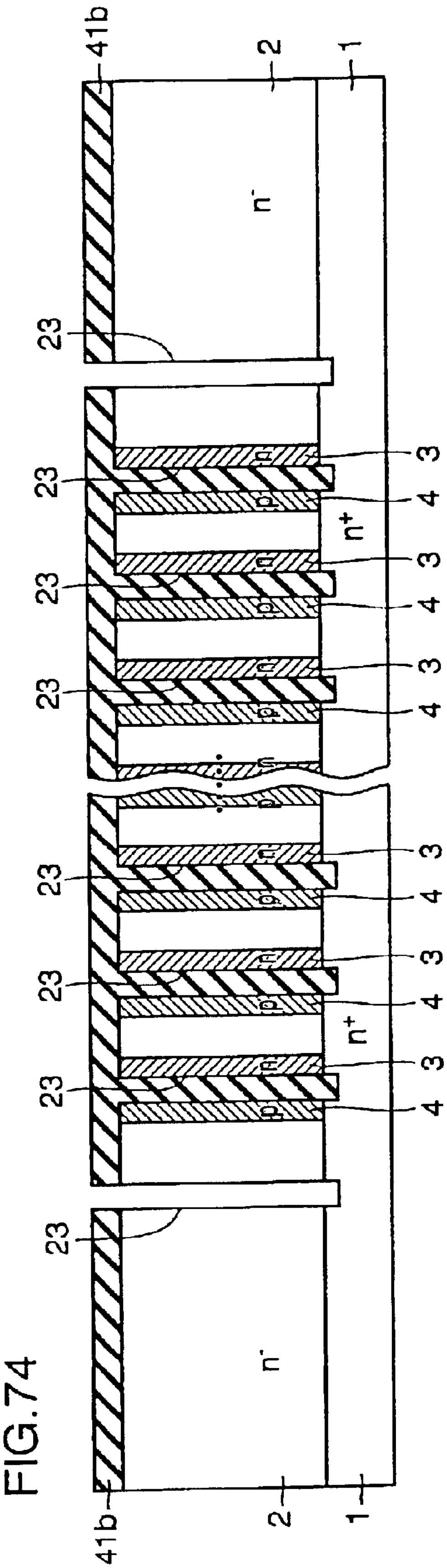

In reference to FIG. 74, trench 23 at the outermost portion is created by carrying out anisotropic etching on the semiconductor substrate through the window opened in film 41*b*.

Figure 75:
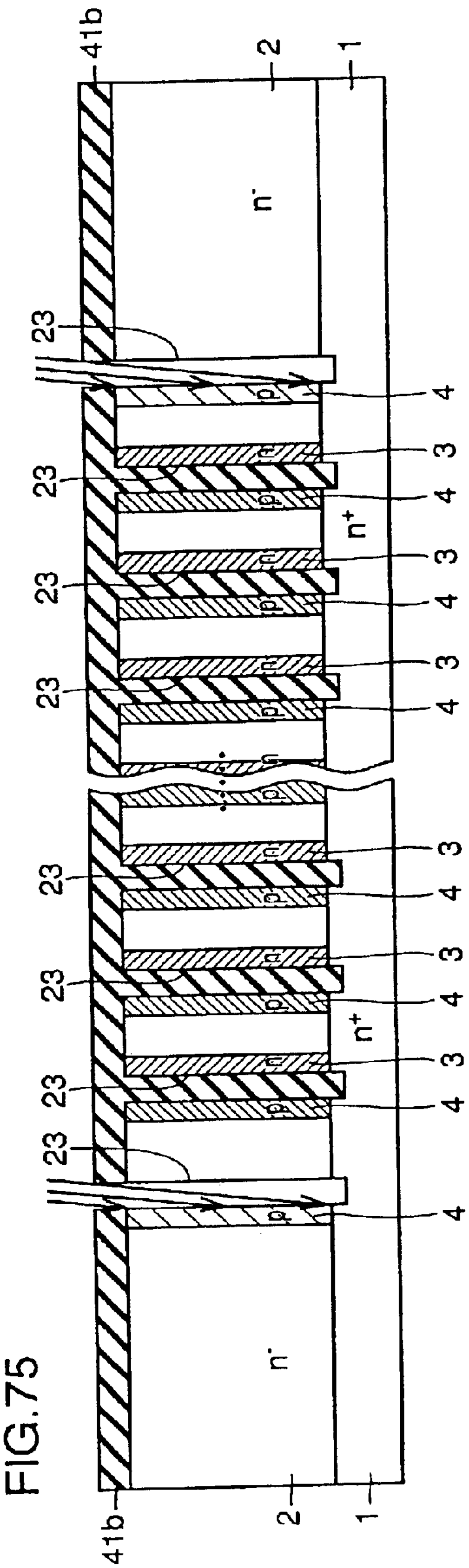

In reference to FIG. 75, boron ions are implanted into the sidewall on only one side of trench 23 at the outermost portion so that a boron ion implanted region 4 is formed. At this time, boron ions are implanted having a concentration of approximately half that of the implantation concentration of boron ions that have been implanted in the center portion.

Figure 76:
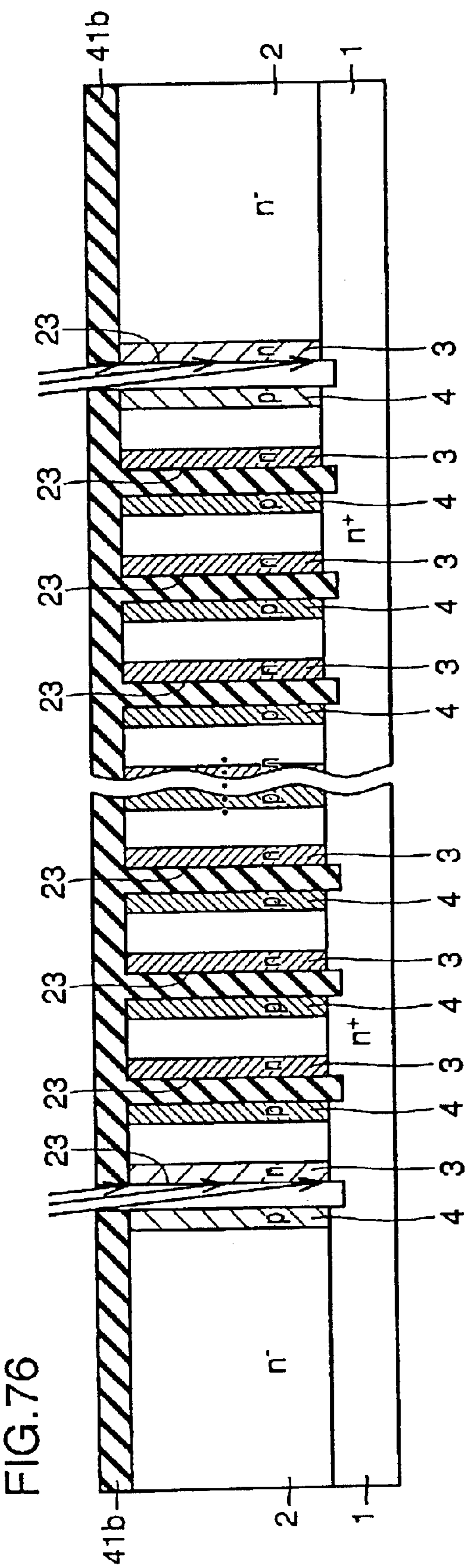

In reference to FIG. 76, phosphorus ions are implanted to the sidewall on the opposite side of trench 23 at the outermost portion so that a phosphorus ion implanted region 3 is formed. At this time, phosphorus ions are implanted having a concentration of approximately half that of the implantation concentration of phosphorus ions that have been implanted in the center portion. Here, the step of phosphorus implantation may be switched with the above step of boron implantation and the order thereof is not important.

Figure 77:
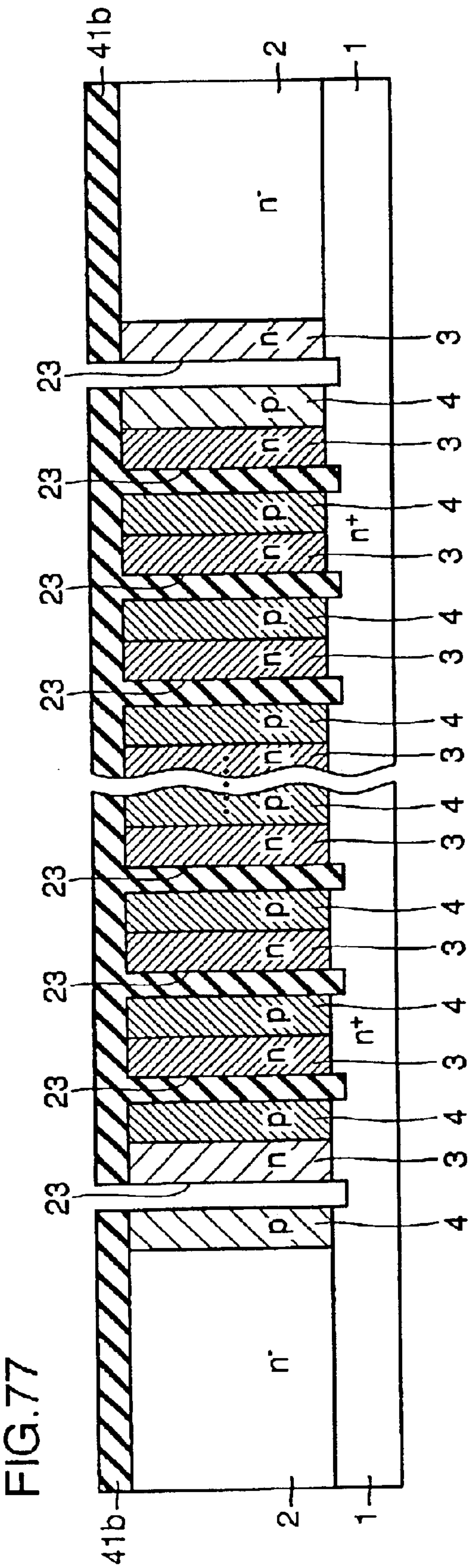

In reference to FIG. 77, a heat treatment is carried out on the entirety of the element so that mesa regions located between trenches 23 have desired concentration distributions. Thereby, boron ion implanted regions 4 and phosphorus ion implanted regions 3 diffuse into the surrounding areas so that p-type impurity regions 4 and n-type drift regions 3 are formed. p-type impurity region 4 and n-type drift region 3 diffused from the sidewalls of trench 23 at the outermost portion are set to have lower impurity concentrations than those in the center portion, as described above, and, therefore, the concentrations thereof become lower than the impurity concentrations in the center portion in the finished condition. The part of the process up to this point concerns the present embodiment.

Figure 78:
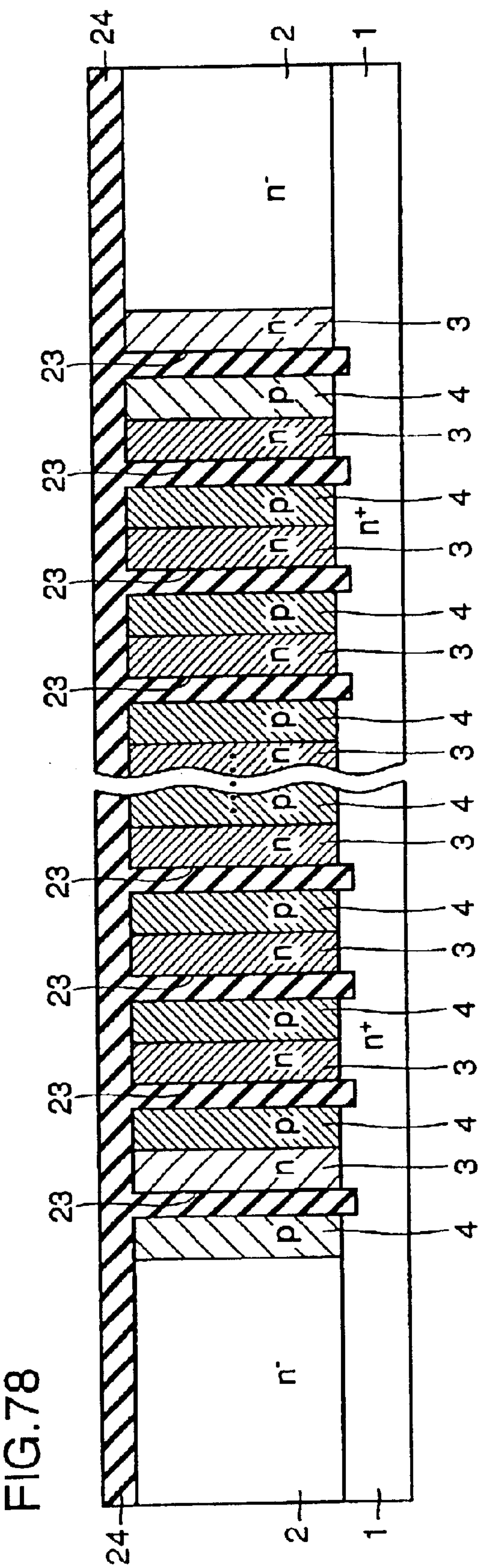

As for the back-end process, as shown in FIG. 78, an insulating film 24 is filled in within trenches 23. Here, this step of the filling in of the insulating film and the previous heat treatment process may be switched. In addition, though the step of forming comparatively deep diffusion regions, such as a guard ring portion that is the termination structure and p-type body regions of the MOS-FETs, is not illustrated, they can be appropriately inserted somewhere in the above described process or somewhere in the back-end process.

Here, though in the present embodiment, a case wherein the concentration of only one trench 23 at the outermost portion is lowered is cited as an example and is described, it is possible to lower the concentration in a plurality of stages, as shown in the other above described examples or in the below described example of an STM structure in FIG. 88. Thereby, there is a great advantage wherein the withstand voltage performance of an element is improved even though there is the drawback wherein the process becomes more complicated and the manufacturing cost increases. Therefore, the concentration may be lowered in multiple stages according to the relationship between price and performance of the required products and the present embodiment is definitely not limited to the structure having one stage or to a manufacturing method for such a structure.

Twenty-Third Embodiment

A manufacturing method in the case that ion implantation of the opposite conductive type, that is to say counter ion implantation, is carried out to the sidewalls of the trench at the outermost portion wherein the concentrations of the diffusion layers are lowered in an STM structure is described in detail as the twenty-third embodiment in reference to FIGS. 79 to 86.

Figure 79:
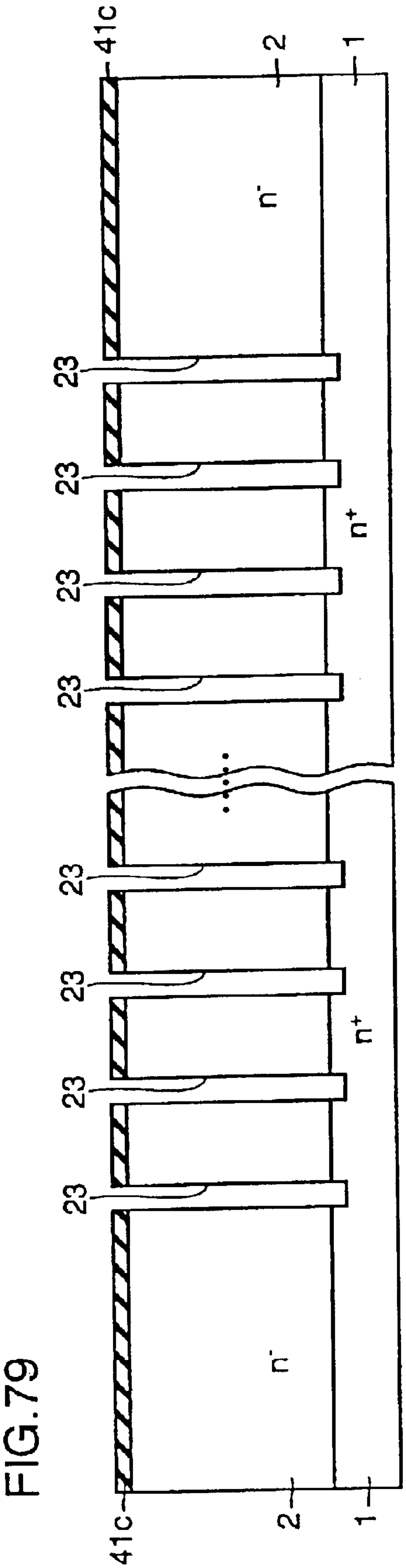
FIGS. 79 to 86 are schematic cross sectional views showing a manufacturing method for a semiconductor device in the order of the steps according to the twenty-third embodiment of the present invention.

In reference to FIG. 79, anisotropic etching is carried out by using a silicon oxide film that is formed by means of a CVD method, or the like, as a mask material 41*c* according to a conventional method and, thereby, a plurality of trenches 23 is simultaneously created in the first main surface of a semiconductor substrate. The trench located at the outermost portion in the repeating structure in the finished condition is included in these trenches 23.

Figure 80:
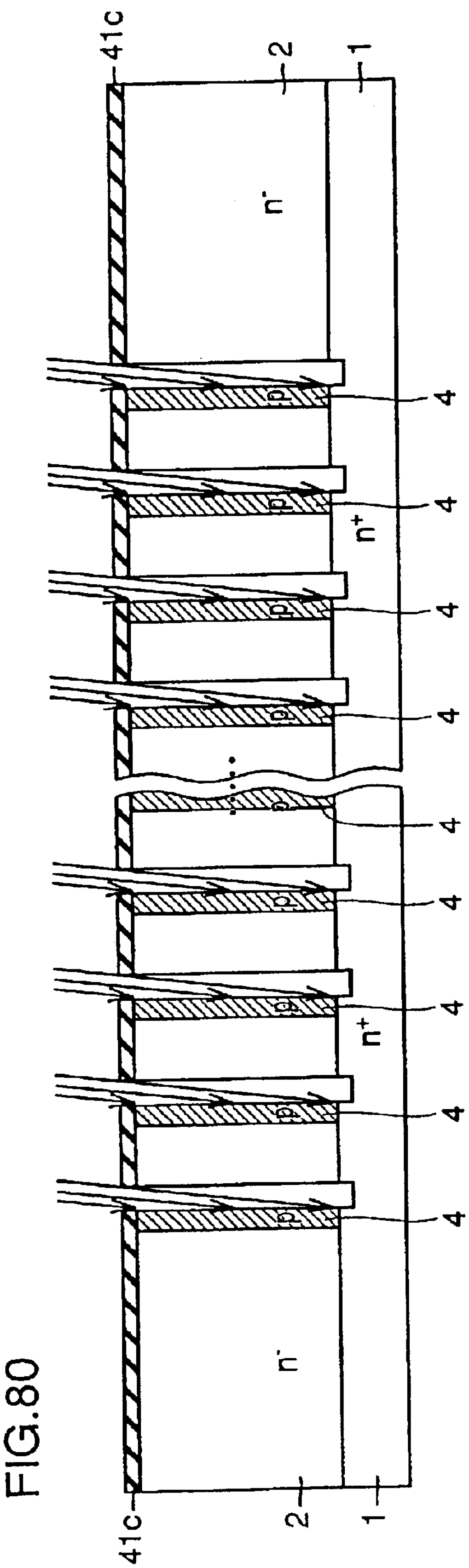

In reference to FIG. 80, boron ions of the same implantation concentration are implanted into all of the sidewalls on one side of the plurality of trenches 23 created in a striped form and, thereby, boron ion implanted regions 4 are formed.

Figure 81:
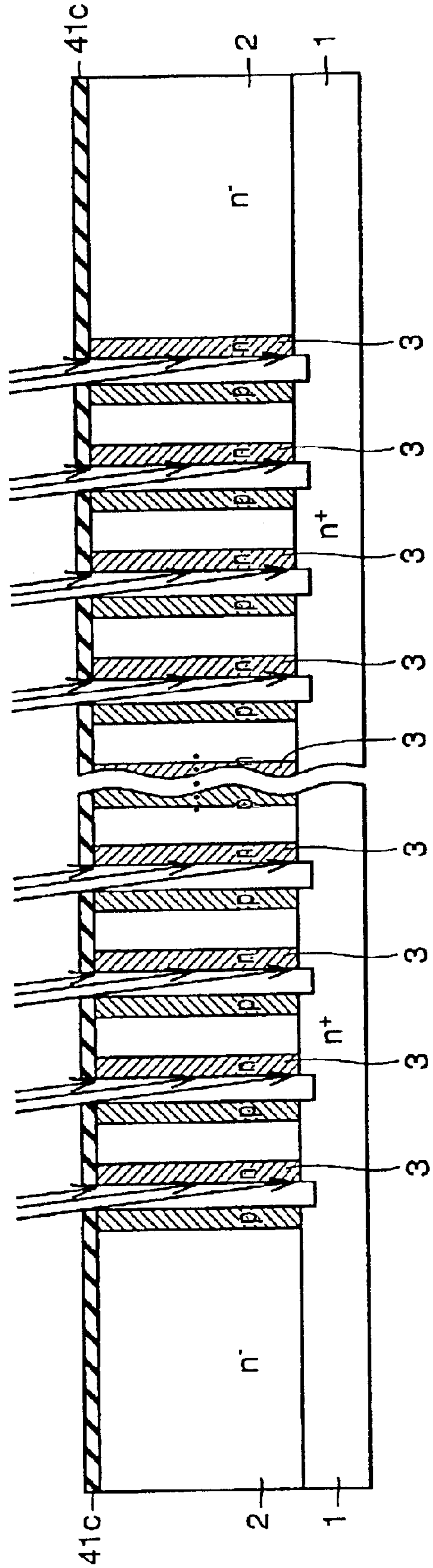

In reference to FIG. 81, phosphorus ions of the same implantation concentration are implanted into all of the sidewalls only on the opposite side of the plurality of trenches 23 created in a striped form and, thereby, phosphorus ion implanted regions 3 are formed. Here, the steps of these FIGS. 80 and 81 may be switched and the order is not essentially important.

Figure 82:
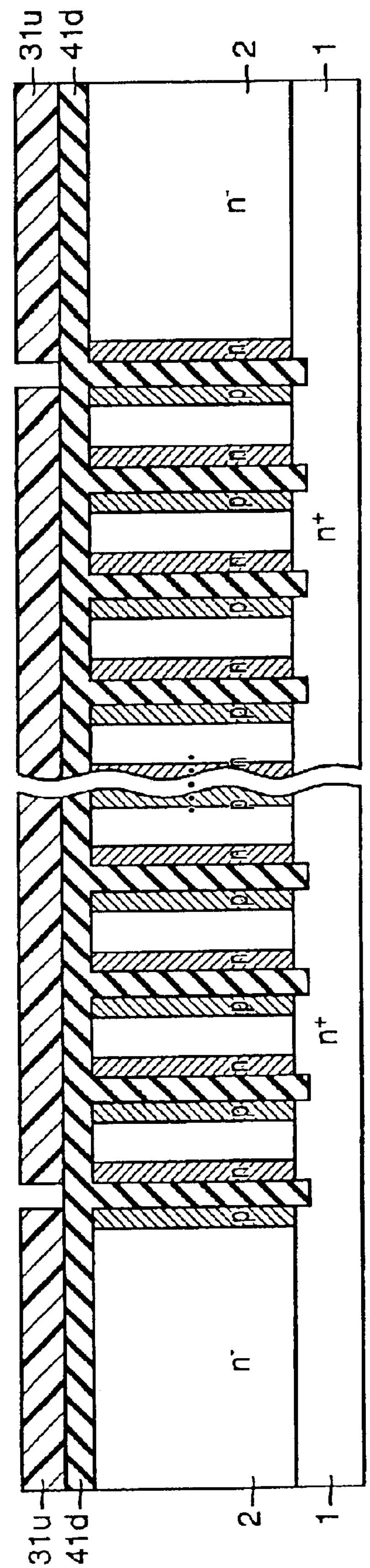

In reference to FIG. 82, all trenches 23 are once filled in with a film 41*d*, such as a silicon oxide film, formed by means of a CVD method. The part of the process up to this point corresponds to a manufacturing method for the conventional STM structure and the following is a process concerning the present embodiment.

After this, a photoresist pattern 31*u* having a window above trench 23 located at the outermost portion is formed by means of photomechanical technology. Etching is carried out by using this resist pattern 31*u* as a mask. In this etching process, wet-type, dry-type etching or a combination of both is appropriately selected according to the absolute depth, the aspect ratio, and the like, of trenches 23 that are to be formed.

After this, resist pattern 31*u* is removed by means of, for example, ashing.

Figure 83:
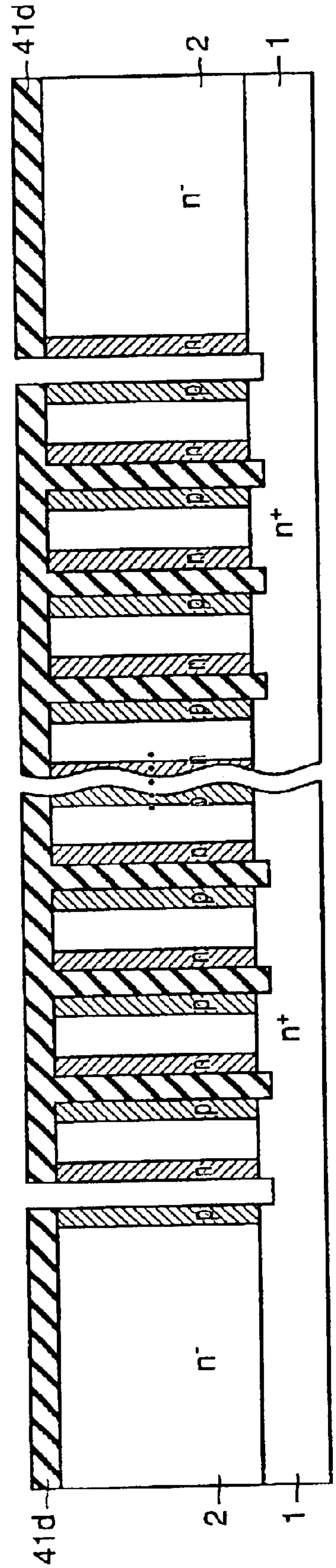

In reference to FIG. 83, the filling within trench 23 located at the outermost portion is removed through the above described etching.

Figure 84:
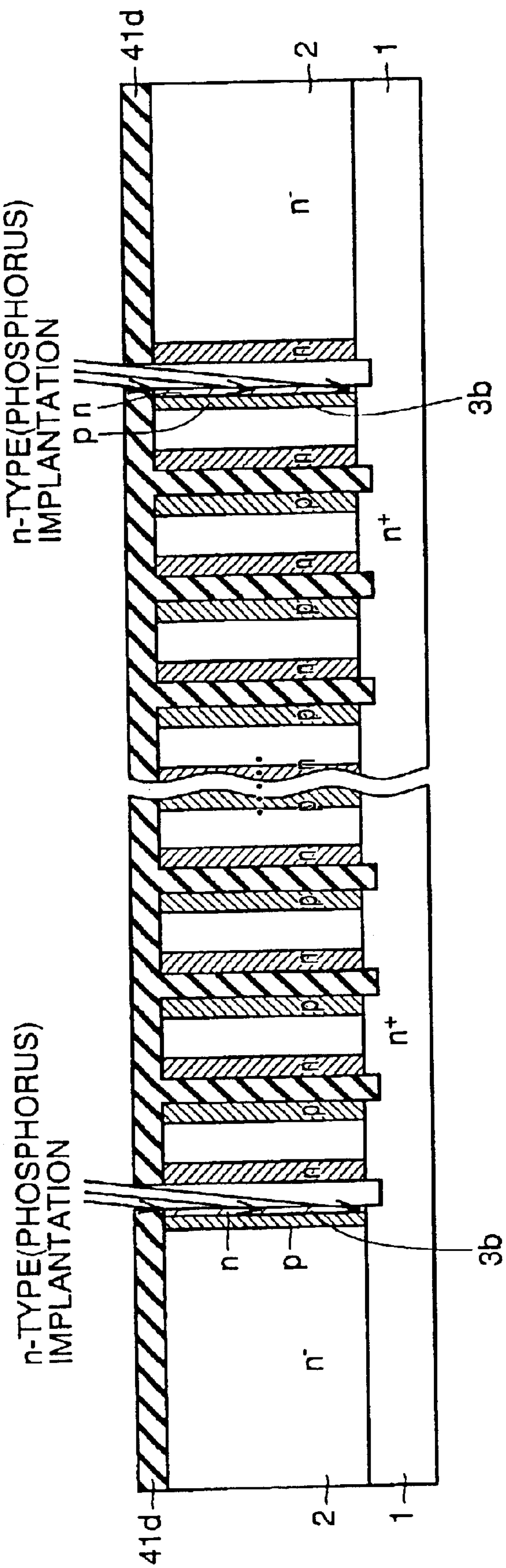

In reference to FIG. 84, phosphorus ions (n-type) of a conductive type opposite to that of boron (p-type) that was implanted in the previous step is implanted into the sidewall on only one side of trench 23 at the outermost portion and, thereby, a phosphorus ion implanted region 3*b* is formed. This implantation of phosphorus ions controls the finished condition of p-type impurity region 4 formed on the sidewall of trench 23 at the outermost portion to have an impurity concentration of approximately half of the concentration of the impurities that have been implanted in the center portion.

Figure 85:
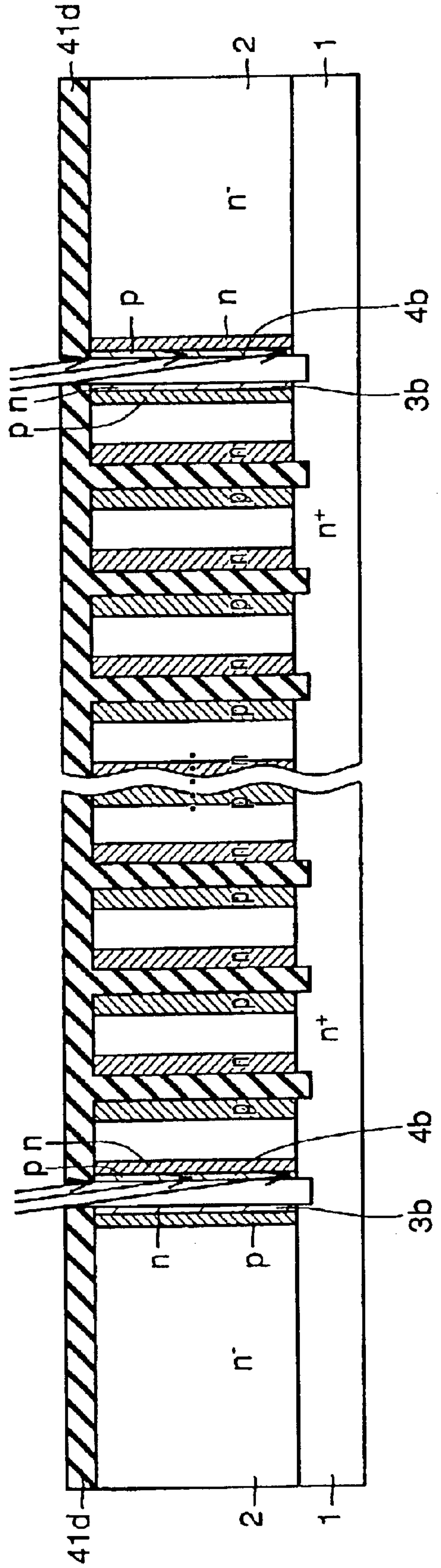

In reference to FIG. 85, boron (p-type) of a conductive type opposite to that of phosphorus ions (n-type) that was implanted in the previous step is implanted into the sidewall on only the opposite side of trench 23 at the outermost portion and, thereby, a boron ion implanted region 4*b* is formed. This implantation of boron ions controls the finished condition of n-type impurity region 3 formed on the sidewall of trench 23 at the outermost portion to have an impurity concentration of approximately half of the concentration of the impurities that have been implanted in the center portion.

Here, the step of boron implantation may be switched with the previous step of phosphorous implantation and the order thereof is not important. The part of the process up to this point is characteristic of the present embodiment. The same flow of a process of another embodiment is briefly described in the following.

Figure 86:
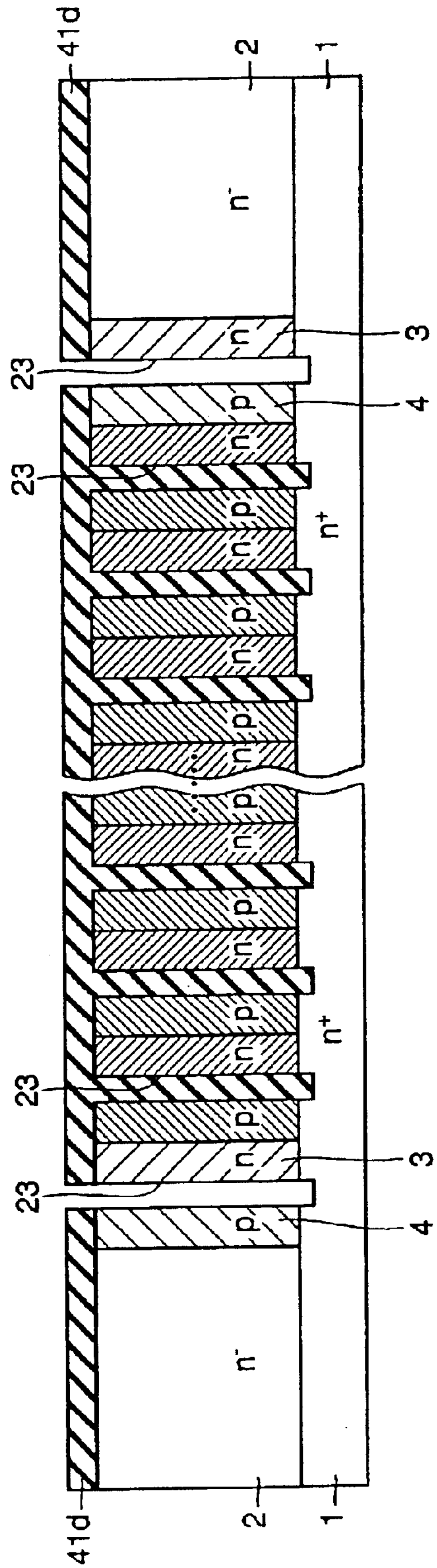

In reference to FIG. 86, a heat treatment is carried out on the entirety of the element so that mesa regions placed between trenches 23 have desired concentration distributions. Thereby, boron ion implanted regions 4 and phosphorous ion implanted regions 3 diffuse to the surrounding areas so as to form p-type impurity regions 4 and n-type drift regions 3. The impurity concentrations of p-type impurity region 4 and n-type drift region 3 diffused from the sidewalls of trench 23 at the outermost portion are set lower than those of the center portion as described above and, therefore, become lower than those of the center portion in the finished condition.

As for the back-end process, as shown in FIG. 78, an insulating film 24 is filled into trenches 23. Here, this process of the filling in of insulating film 24 and the previous heat treatment process may be switched. In addition, though the process of forming comparatively deep diffusion regions such as a guard ring portion that is the termination structure and p-type body regions of MOS-FETs are not illustrated, they can be appropriately inserted somewhere in the above described process or somewhere in the back-end process.

Here, though in the present embodiment a case wherein the concentration of one trench 23 at the outermost portion is lowered is sited as an example and is described, it is possible to lower the concentration in a plurality of stages as shown in the above described other examples or in the below described example of an STM structure in FIG. 88. Thereby, there is a great advantage that the withstand voltage performance of an element is improved though there is the drawback wherein the process becomes more complicated and the manufacturing cost increases. Accordingly, the concentration may be lowered in multiple stages in accordance with the relationship between price and performance of the required products and the present embodiment is definitely not limited to the structure having one stage or to a manufacturing method for such a structure.

An advantage of the method of the present embodiment is that the process becomes simple in comparison with the case of the twenty-second embodiment wherein trenches 23 are excavated twice. Though trench etching is an established technology, the depth required for this element is in many cases much deeper than that of the trenches utilized in the isolation process of a conventional LSI so that a problem arises that the processing period of time becomes long. With respect to this point, an advantage is obtained wherein only the buried oxide film is removed in the portion where the counter doping is carried out so that the processing period of time becomes short and the process becomes simple in the case that the process shown in the present embodiment is used. On the other hand, there is a drawback that the setting of the conditions for either wet-type or dry-type etching is difficult in order to remove the silicon oxide film filled in within a trench of a high aspect ratio.

Twenty-Fourth Embodiment

A configuration and a manufacturing method are described in detail as the twenty-fourth embodiment in reference to FIGS. 87 to 91 in the case that the dotted line trench (hereinafter referred to as DLT) structure of the trench at the outermost portion in the repeating structure is applied in an STM having a structure wherein the gates are parallel to the trenches and in the case that the concentration of only one of the p layer or the n layer of the outermost portion in the pn-repeating structure is lowered. Here, FIG. 88 is a three-dimensional bird's-eye view showing a configuration wherein a DLT structure is applied in the trench at the outermost portion in an STM having the structure where the gates are parallel to the trenches shown in FIG. 87.

Figure 87:
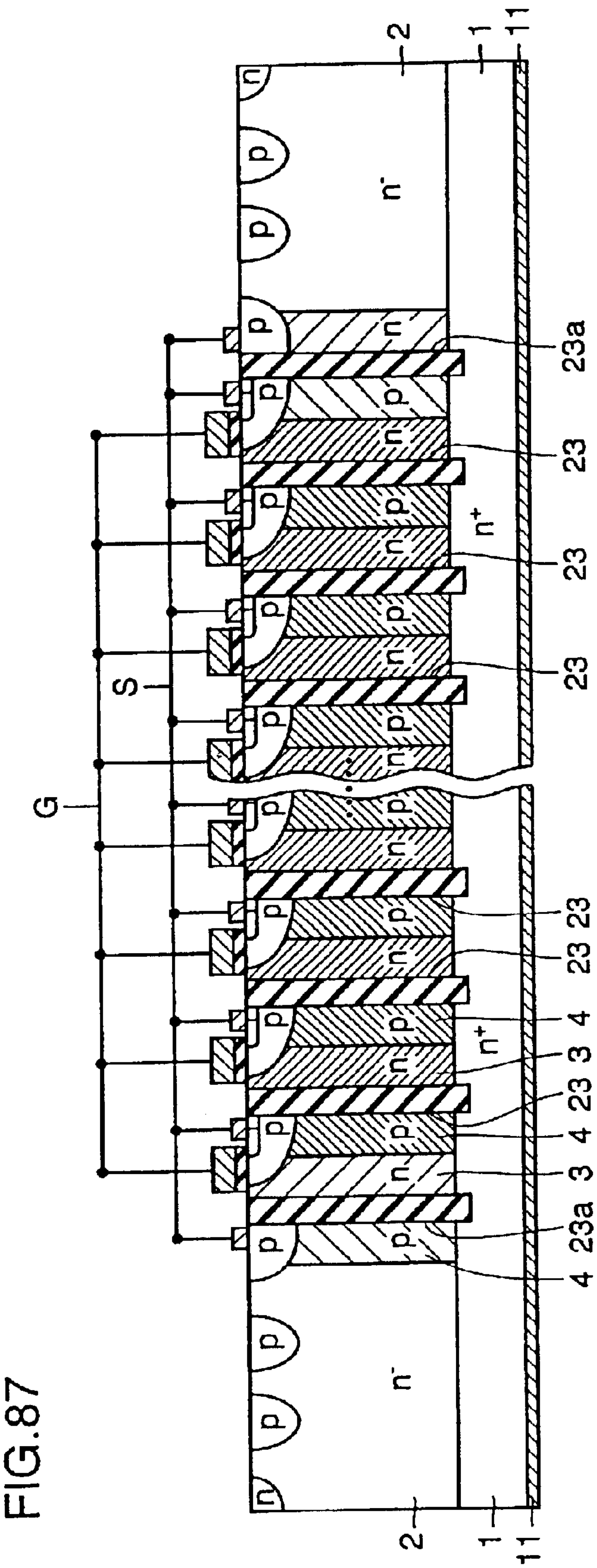
FIGS. 87 and 88 are a cross sectional view and a perspective view schematically showing the configuration of a semiconductor device according to the twenty-fourth embodiment of the present invention.
Figure 88:
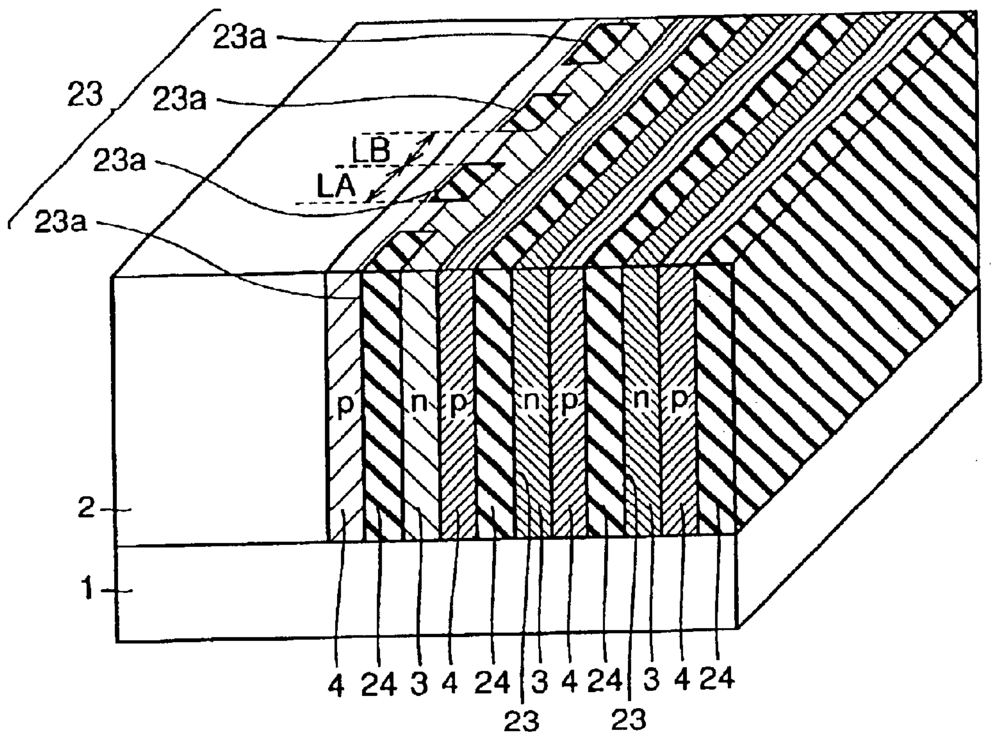

In reference to FIGS. 87 and 88, the configuration of the present embodiment differs from the configuration shown in FIG. 5 in the point that a trench 23 is provided between a pair made of a p-type impurity region 4 and an n-type drift region 3 in a pn combination in the present embodiment, in the point that the concentration of the pn combination is lowered only in one stage at the outermost portion of the pn-repeating structure of the present embodiment and in the point that trench 23 located at the outermost portion of the plurality of trenches 23 has a DLT structure in the present embodiment.

In reference to primarily FIG. 88, here the trenches of the DLT structure are trenches wherein a plurality of holes 23*a* are arranged at intervals in a predetermined direction and, thereby, the trenches have a surface pattern of a dotted line form in the first main surface. Here, each trench 23 is filled in with an insulating film 24 made of, for example, a silicon oxide film.

The other parts of the configuration are approximately the same as the configuration shown in FIG. 5 and, therefore, the same symbols are attached to the same members, of which the descriptions are omitted.

The present embodiment is characterized by a structure closely related to its manufacturing method wherein the number of the steps is not increased and wherein an element having a high main withstand voltage can be implemented according to the same manufacturing process for an STM having the conventional structure. In addition, though there is a drawback that the manufacturing steps increase and become complicated in the case that the concentration gradient in multiple stages is formed in the outermost portion of the pn-repeating structure according to the above described other embodiments, there is a great advantage wherein the DLT structures shown in the present embodiment and in the following embodiments can be implemented very easily and wherein its manufacturing steps do not generally increase, though the pattern dimensions are restricted, even in the case the concentration is lowered in multiple stages.

At the time when the configuration of FIGS. 87 and 88 is manufactured, the finished concentration of the low concentration region at the outermost portion of the pn-repeating structure is determined by the relationship (effective sidewall area) between length LA, of the sidewalls of each hole 23*a*, and length LB, of the intervals between holes 23*a*. Concretely, concentration lowering ratio Rlc can be approximately defined by the following equation using the ratio of length LA to length LB shown in the figure.

$$Rlc=LA/(LA+LB)$$

When LA=2 $\mu$m and LB=2 $\mu$m, for example, Rlc=50% wherein approximately the same effect as that of lowering the impurity concentration of the low concentration region at the outermost portion in the pn-repeating structure by 50% is obtained. Strictly speaking, this impurity concentration changes due to the total amount, temperature and period of time of the heat treatment after the ion implantation. However, in the case that the conditions are adjusted so that the impurities diffuse by roughly the same distance as the width LB=2 $\mu$m of the regions into which impurities are not implanted, impurity atoms located at the center of a straight line portion (region wherein hole 23*a* is created) into which impurities are implanted reach to the center portion of a region into which impurities are not implemented. The impurity atoms located at an edge (edge of hole 23*a*) of a straight line portion reach to the edge of the adjoining straight line portion into which impurities are simultaneously implanted. Therefore, the concentration of the straight line portions LA into which impurities are not implanted and the concentration of the regions LB into which impurities are implanted are averaged so as to be lowered to approximately 50% of the concentration immediately after the implantation. In the case that the concentration is lowered in one stage as shown in FIGS. 87 and 88, it is preferable for this Rlc to be no less than 30% and no greater than 70%.

In general, the impurity concentration profile in silicon has a form defined by Gaussian distribution or by error function and can almost be regarded as a primary function, that is to say a triangular distribution, in the case that these distributions are seen on a linear scale. Accordingly, a large gap does not, in fact, occur in the above described approximation and, therefore, the concentration can be very simply adjusted according to the ratio of length LA of the dotted line to interval LB.

Here, the dimensions in the direction perpendicular to length LA and LB, that is to say the width of trenches 23, does not related to this calculation of ratio.

Figure 89:
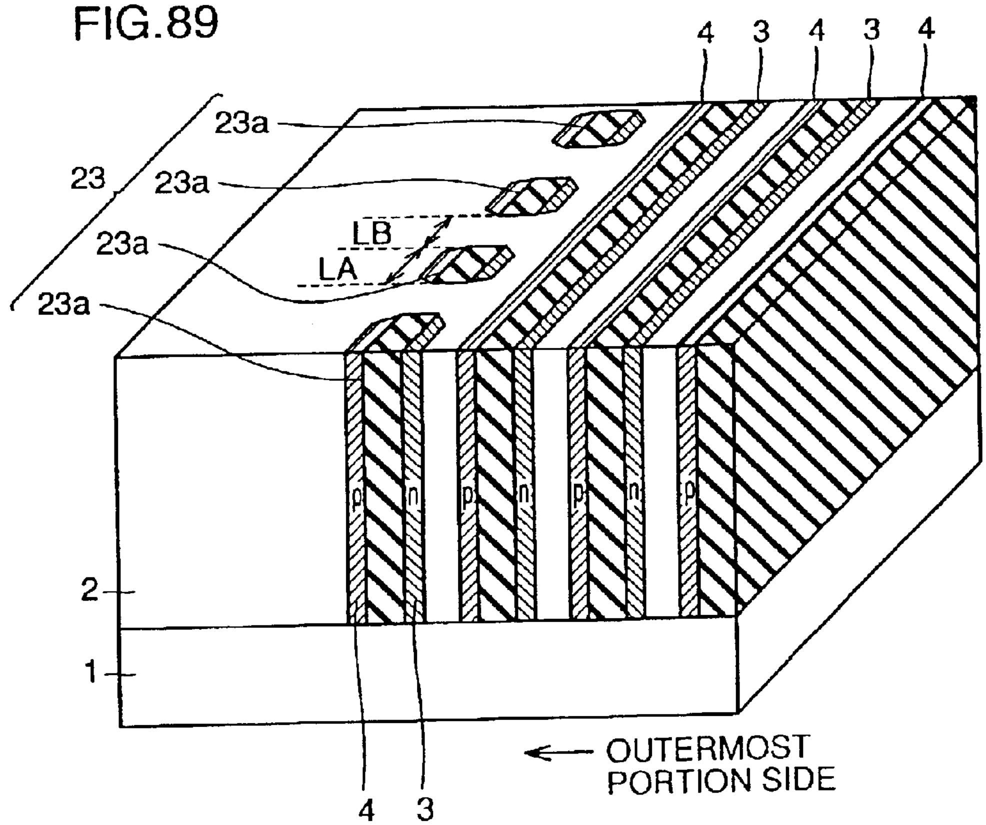
FIGS. 89 to 91 are schematic perspective views showing a manufacturing method for a semiconductor device in the order of the steps according to the twenty-fourth embodiment of the present invention.

The contents of the above description are represented so that they can be intuitively understood in the following FIGS. 89 to 91. FIG. 89 shows the condition immediately after implantation or of insufficient heat treatment wherein high concentration regions 3 and 4 still remain in the sidewalls of trenches 23 in the DLT structure and shows the condition wherein diffusion regions 3 and 4 of the dotted line form are not connected.

Figure 90:
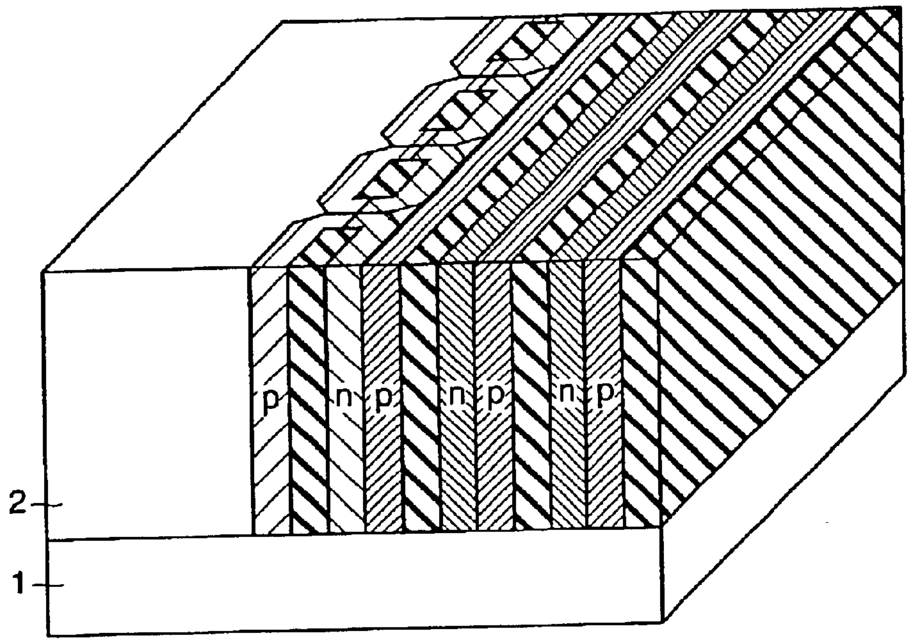

Next, FIG. 90 shows the condition wherein impurity regions 3 and 4 have diffused through diffusion in the lateral direction by carrying out a slight heat treatment after implantation. High concentration regions diffuse from the sidewalls of trenches 23 in the DLT structure so as to be connected to other high concentration regions 3 and 4 as a result of this heat processing. However, high concentration regions still remain in portions close to the sidewalls of trenches 23 in the DLT structure. Though there is no major problem in such a state, diffusion by means of a heat treatment is desirable until the entirety has been made uniform, as shown in the below described FIG. 91.

Figure 91:
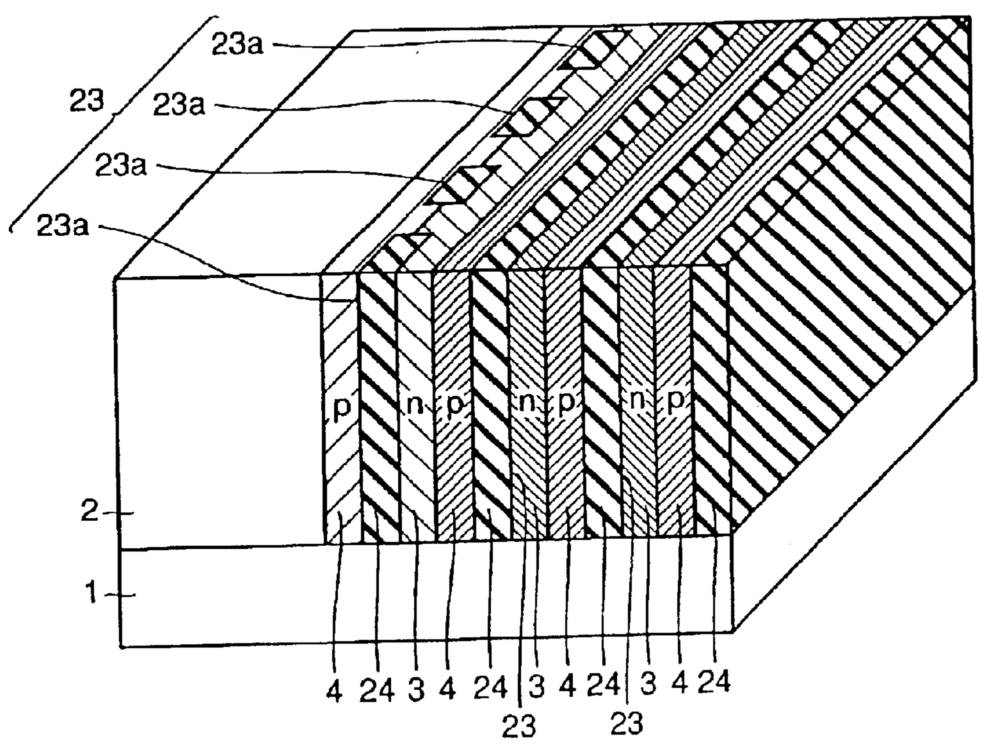

Then, FIG. 91 shows the state wherein high concentration regions 3 and 4 are sufficiently diffused from the sidewalls of trenches 23 in the DLT structure through lateral direction diffusion by applying a sufficient heat treatment after implantation so as to be connected to other high concentration regions and so that the concentration of the sidewalls of trenches 23 in the DLT structure becomes approximately uniform.

In addition, Table 1 shows an improved effect in the case that the DLT structure is applied to an STM of the 300 V class.

Comparison of embodiments and prior art regarding withstand voltage in the dotted line trench structure

TABLE 1

| structure | main withstanding voltage (V) | ratio (%) |
|---|---|---|
| simulation in center cell portion only | 325 | 100 |
| measurement of the embodiment wherein 60% is converted to dotted line | 301 | 92.6 |
| measurement of uniform concentration in a prior art | 275 | 84.6 |

Since an infinitely repeating structure without a termination portion cannot be manufactured in an actual element, "simulation in the center cell portion only" in Table 1 shows, as the ideal case, values in the case that the main withstanding voltage of the cell portion is calculated using a numerical value simulation. In this case, the main withstanding voltage of 325 V is obtained and this withstand voltage value is assumed to be 100% so as to be compared with other measured values.

On the other hand, "measurement of uniform concentration in prior art" is the case wherein a DLT structure, shown in the present embodiment, is not used and the obtained withstand voltage is 275 V, which is low, so that it is seen that only 84.6% of the withstand voltage value is obtained in comparison with the case of ideal cells only as described above. Then, a DLT structure, shown in the present embodiment, is used so as to obtain a prototype of the structure wherein the ratio of the dotted line portion is 60%, which is approximately half, and then 301 V is obtained. This is 92.6% of the main withstanding voltage in the case of the ideal cell portion only and, therefore, it is seen that the main withstanding voltage is increased to a great extent.

In addition, though the details are omitted, it is seen from experiment that a value closer to an ideal value can be obtained by increasing the number of dotted lines, that is to say, by increasing the number of stages in the concentration gradient.

Twenty-Fifth Embodiment

Figure 92:
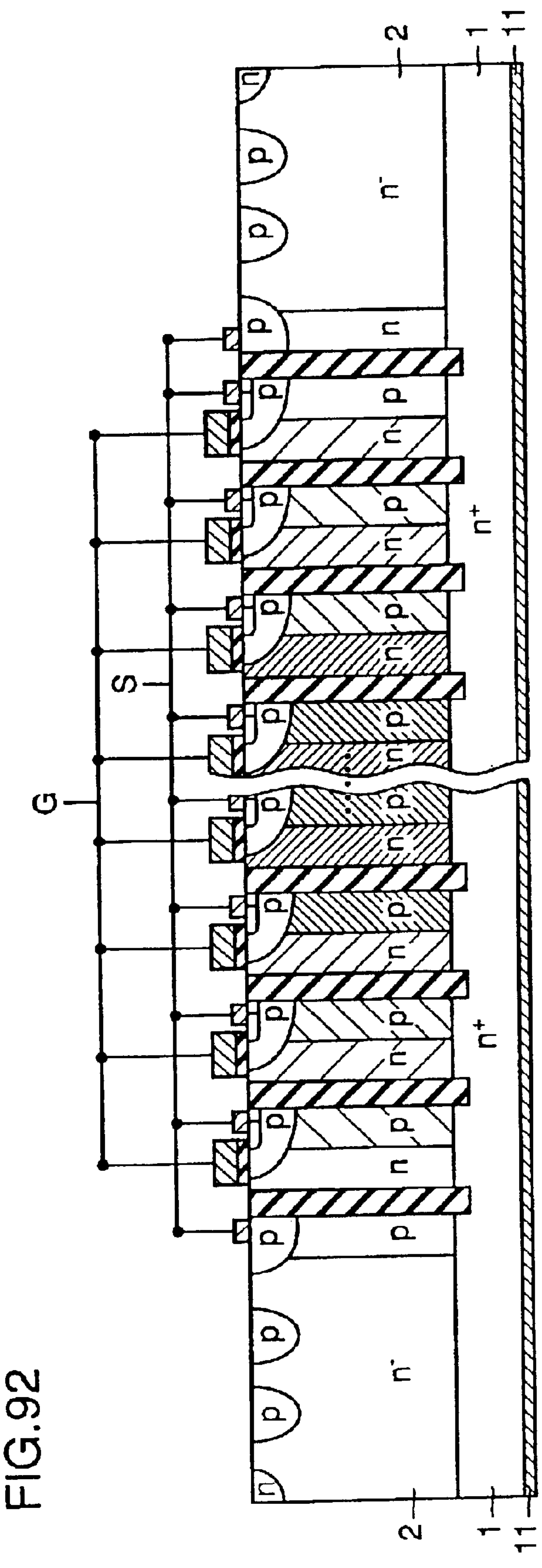
FIGS. 92 and 93 are a cross sectional view and a perspective view schematically showing the configuration of a semiconductor device according to the twenty-fifth embodiment of the present invention.
Figure 93:
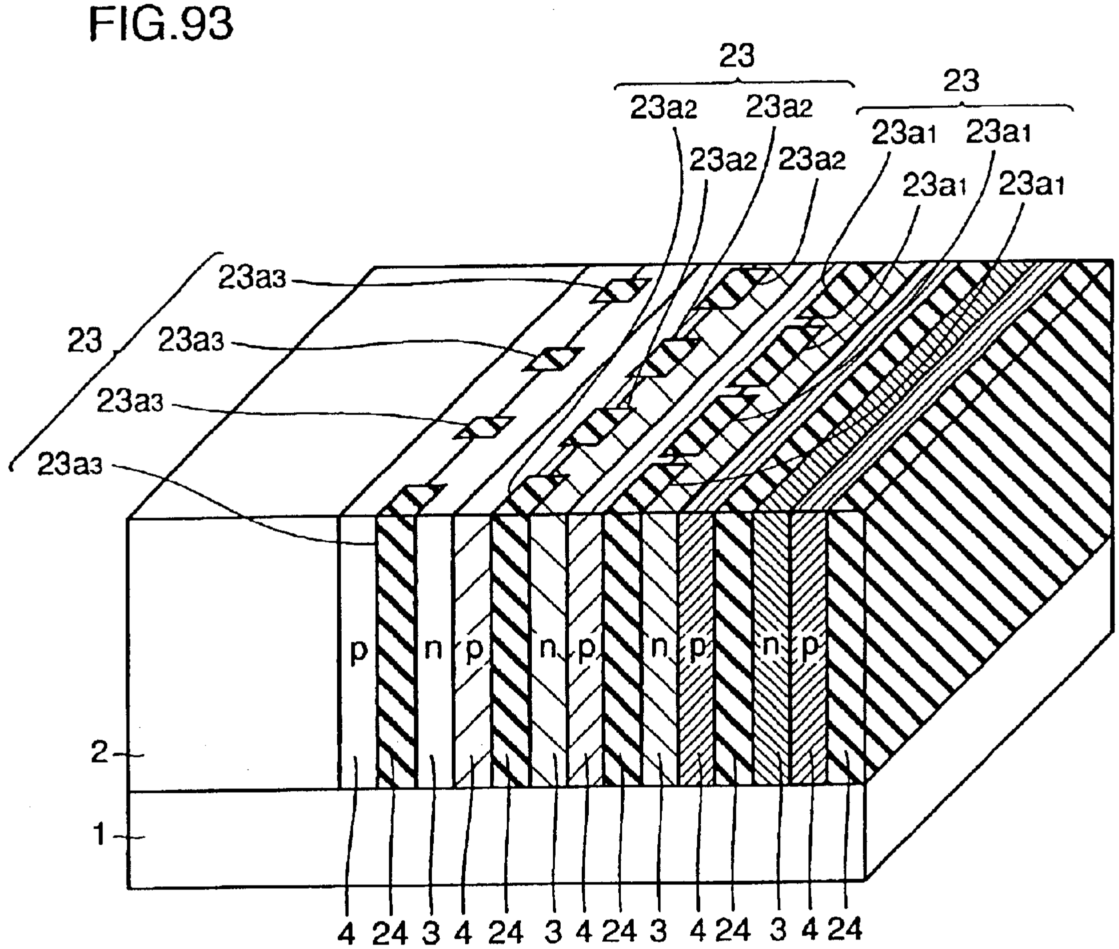

A case wherein trenches having a DLT structure are used in an STM having a structure where gates are parallel to trenches in the same manner as in the twenty-fourth embodiment and wherein the concentration of the pn combinations at the outermost portions on both the left and right sides in the pn-repeating structure is lowered in three stages is described in detail as the twenty-fifth embodiment in reference to FIGS. 92 and 93. Here, FIG. 93 is a three-dimensional bird's-eye view showing a configuration wherein a DLT structure is used for three trenches at an outermost portion of the repeating structure in FIG. 92.

In reference to FIGS. 92 and 93, the configuration of the present embodiment differs from the configuration shown in FIGS. 87 and 88 in the point that the pn combination of an outermost portion of the pn-repeating structure is lowered in three stages in the present embodiment and in the point the DLT structure is used for three trenches at the outermost portion of the repeating structure in the present embodiment.

In the present embodiment, the length and intervals of the dotted lines three trenches 23 at the outermost portion having the DLT structure are adjusted in order to lower the concentration of the pn combination at the outermost portion of the pn-repeating structure in three stages based on the concentration lowering ratio described in the twenty-fourth embodiment. That is to say, the concentration lowering ratio Rlc of trenches 23 of a DLT structure made of a plurality of holes $\mathbf{23}a_3$ is smaller than the concentration lowering ratio Rlc of trenches 23 of a DLT structure made of a plurality of holes $\mathbf{23}a_2$ and the concentration lowering ratio Rlc of trenches 23 of a DLT structure made of a plurality of holes $\mathbf{23}a_2$ is smaller than the concentration lowering ratio Rlc of trenches 23 of a DLT structure made of a plurality of holes $\mathbf{23}a_1$.

Here, the other parts of the configuration are approximately the same as in the configuration shown in FIG. 5 and, therefore, the same symbols are attached to the same members, of which the descriptions are omitted.

In the present embodiment, the length and intervals of the dotted lines of trenches 23 are adjusted and, thereby, the concentration gradient in multiple stages can easily be formed.

Twenty-Sixth Embodiment

Figure 94:
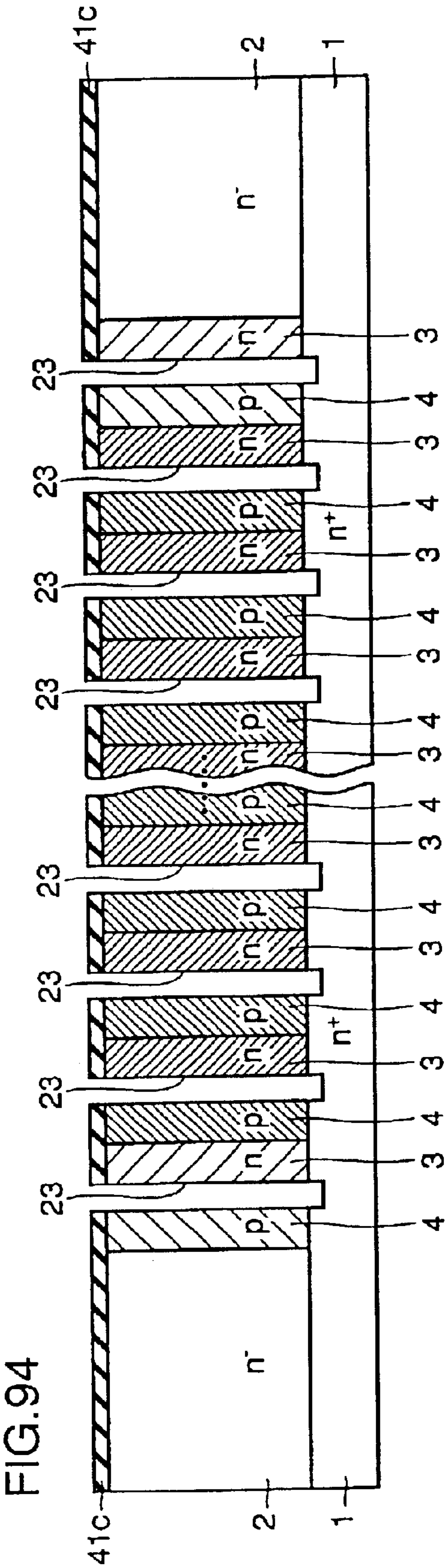
FIGS. 94 and 95 are schematic perspective views showing a manufacturing method for a semiconductor device in the order of the steps according to the twenty-sixth embodiment of the present invention.
Figure 95:
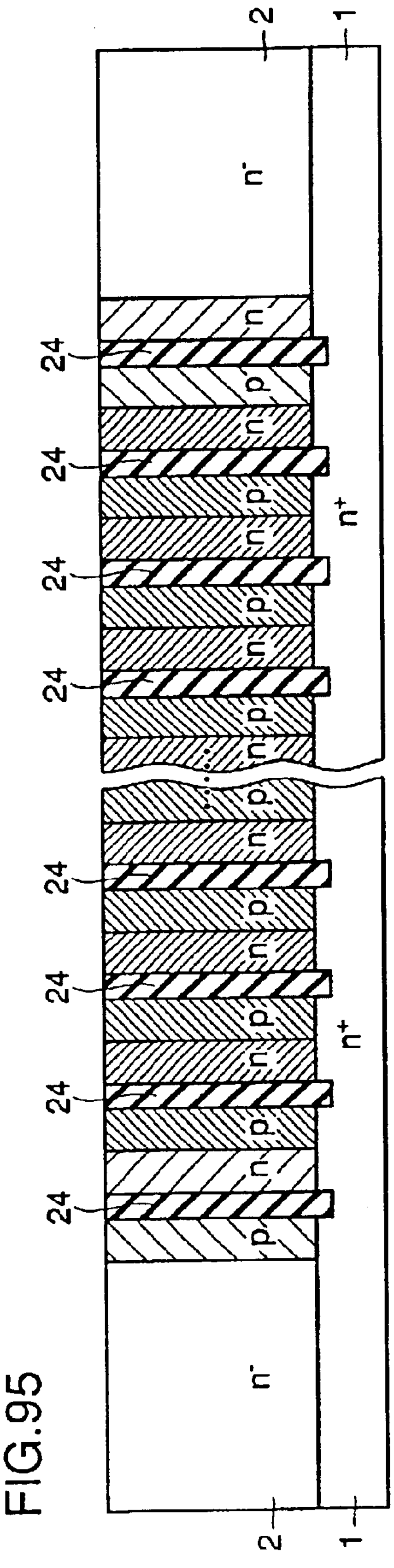

A process flow in the case that trenches of a DLT structure are used for an STM of a structure where gates are parallel to trenches is described in detail as the twenty-sixth embodiment in reference to FIGS. 94 and 95.

A manufacturing method of the present embodiment follows the same steps as the steps shown in FIGS. 79 to 81. Thereby, a plurality of trenches 23 is created in the first main surface and a boron ion implanted region 4 is formed in the sidewall on one side of each trench 23 while a phosphorus ion implanted region 3 is formed in the sidewall on the other side, respectively. Here, in the step of FIG. 79, trenches 23 at the outermost portions on both the left and right sides of the repeating structure are created so as to have a DLT structure.

After this, in reference to FIG. 94, a heat treatment is carried out on the entirety of the device so that mesa regions located between trenches 23 have desired concentration distributions. As a result of this heat treatment, boron ion implanted region 4 and phosphorus ion implanted region 3 in the sidewalls of the trench of the DLT structure at an outermost portion of the repeating structure are diffused so that the concentrations thereof are lowered and made uniform and, then, become lower than the impurity concentration of the mesa regions in the center portion.

In reference to FIG. 95, an insulator 24 is filled in within each trench 23. Here, the step of filling in an insulator and the previous heat treatment step may be switched.

In addition, though the step of forming comparatively deep diffusion regions, such as a guard ring or p-type body regions of the MOS-FETs, is not illustrated, it can be appropriately inserted somewhere in the above described steps or somewhere after these steps.

In addition, though in the present embodiment a case wherein the concentration of only one pair made of a pn combination is lowered in each of the outermost portions on both the left and right sides of the pn-repeating structure is cited as an example, the process flow may be exactly the same as the above description in the case that the concentration gradient is formed in multiple stages by using this manufacturing process. Thereby, an element of a high withstand voltage having a concentration gradient of multiple stages can be manufactured without increasing the number of manufacturing steps.

Twenty-Seventh Embodiment

A configuration having a twin trench structure in the center portion and having a MOS-FET structure in the active element portion is described in detail in reference to FIG. 9 and, in addition, a manufacturing method for creating a trench at the outermost portion of a repeating structure through excavation carried out two times is described in detail in reference to FIGS. 97 to 105 as the twenty-seventh embodiment.

Figure 96:
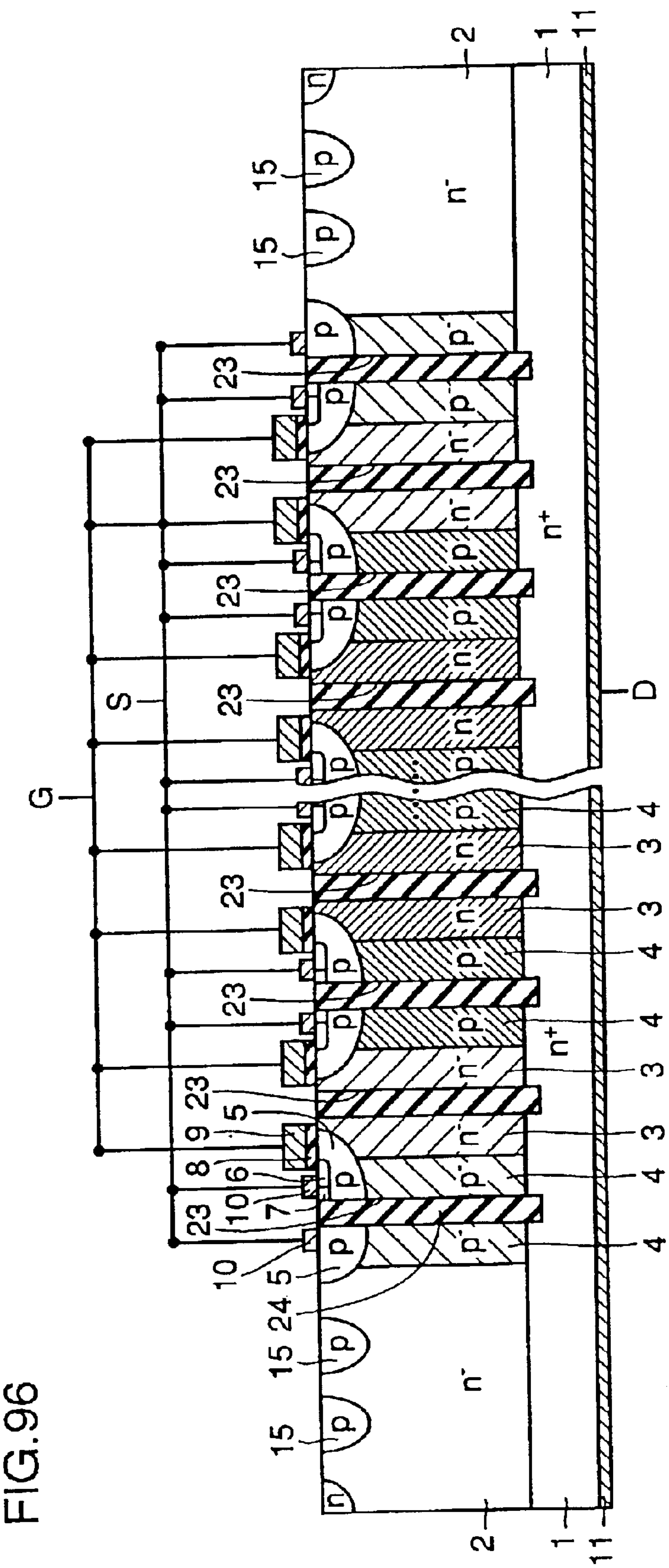
FIG. 96 is a cross sectional view schematically showing the configuration of a semiconductor device according to the twenty-seventh embodiment of the present invention.

In reference to FIG. 96, the structure of the present embodiment differs from the configuration of FIG. 87 in the point that a mesa portion has a twin trench structure and in the point that the outermost portions of both the left and right sides of the pn-repeating structure are formed of one pair of p-type impurity regions 4 and one pair of n-type impurity regions 3 in order to lower the concentrations.

Here, the twin trench structure is a configuration wherein impurity regions of the same conductive type, respectively, exist in each of the two sidewalls of a trench 23.

In addition, a pair of p-type impurity regions 4 and one pair of n-type impurity regions 3 having impurity concentrations lower than those in the center portion (impurity concentrations of approximately half of those in the center portion) are formed at the outermost portions on both the left and right sides in the pn-repeating structure.

Here, the other parts of the configuration are approximately the same as in the configuration shown in FIG. 87 and, therefore, the same symbols are attached to the same members, of which the descriptions are omitted.

Next, a manufacturing method of the present embodiment is described.

Figure 97:
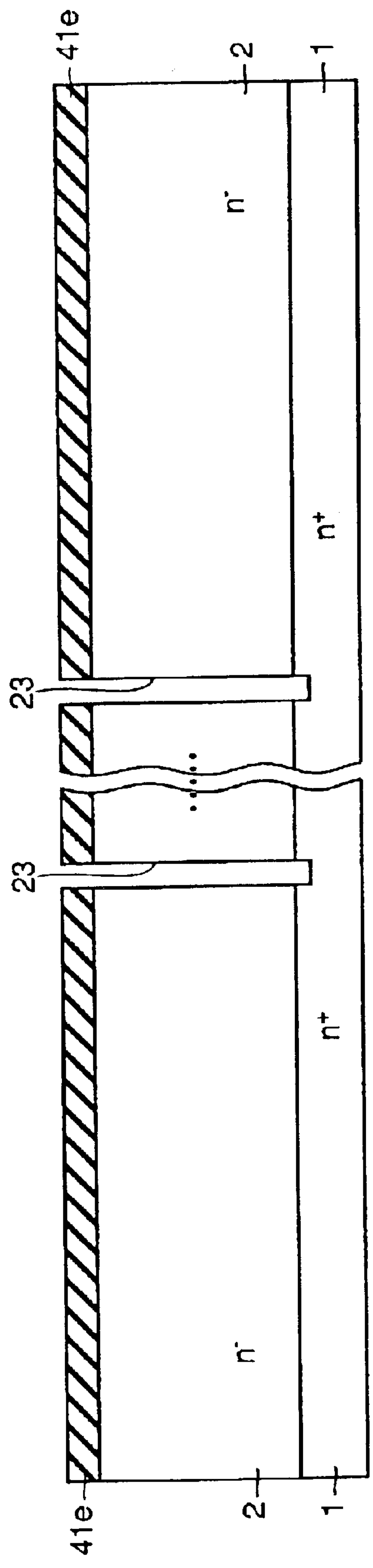
FIGS. 97 to 105 are schematic perspective views showing a manufacturing method for a semiconductor device in the order of the steps according to the twenty-seventh embodiment of the present invention.

In reference to FIG. 97, first, anisotropic etching is carried out by using a silicon oxide film, or the like, formed by means of a CVD method as a mask material 41*e* according to a conventional method and, thereby, a first group of trenches made up of a plurality of trenches 23 is created in the first main surface of a semiconductor substrate. This first group of trenches does not include trenches located at the outermost portions of the repeating structure in the finished condition.

Figure 98:
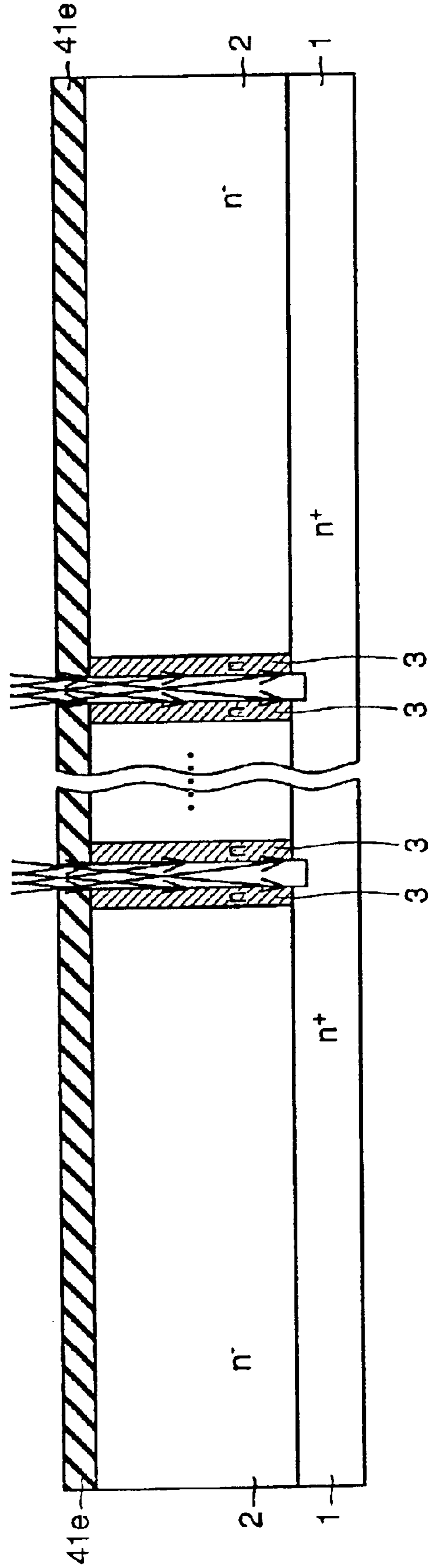

In reference to FIG. 98, phosphorus ions are implanted in the sidewalls on both sides of the entirety of a plurality of trenches 23 forming the first group of trenches so as to have a comparatively high concentration and, then, phosphorous ion implanted regions 3 are formed. After this, film 41*e* is removed through etching, or the like.

Figure 99:
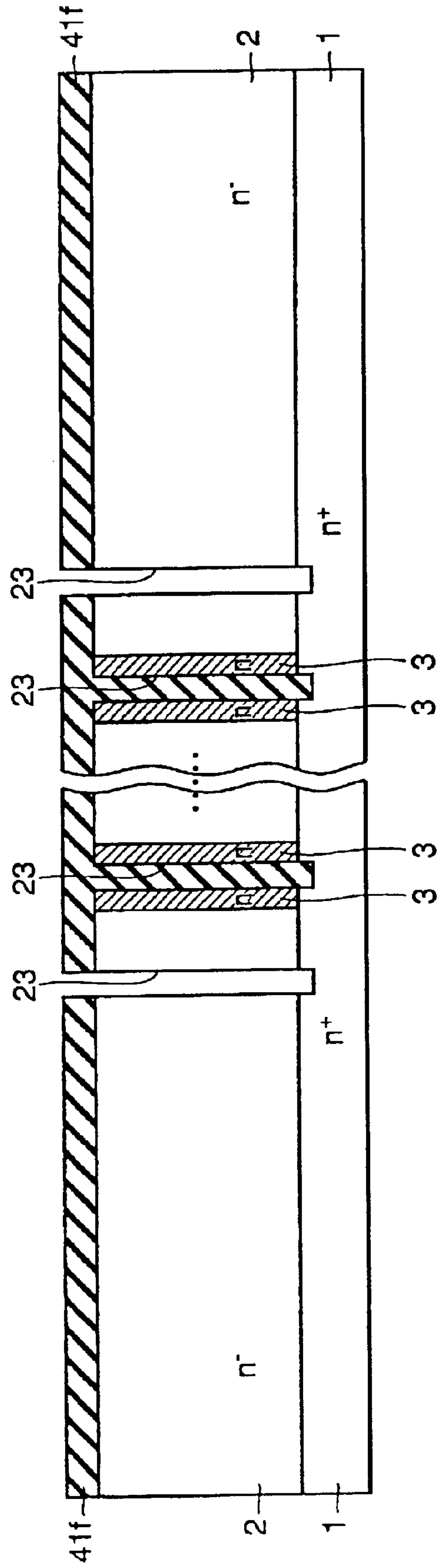

In reference to FIG. 99, a film 41*f*, such as a silicon oxide film, is formed by means of a CVD method so as to fill in the entirety of the plurality of trenches 23 of the first group of trenches according to a conventional method. This film 41*f* is patterned by means of photomechanical technology and etching technology. Anisotropic etching is carried out by using the patterned film 41*f* as a mask material. Thereby, a plurality of trenches 23 forming a second group of trenches is created so that the respective trenches thereof are located in alternation with the respective trenches 23 of the first group of trenches. This second group of trenches does not include trenches located at the outermost portions of the repeating structure in the finished condition.

Figure 100:
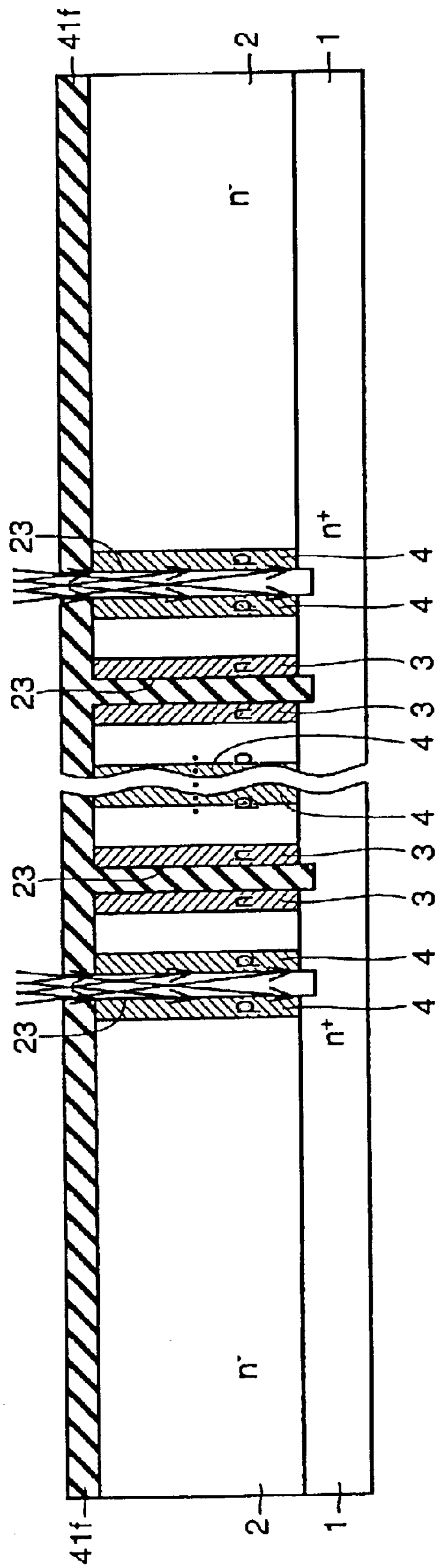

In reference to FIG. 100, boron ions are implanted in the sidewalls on both sides of the entirety of a plurality of trenches 23 forming the second group of trenches so as to have a comparatively high concentration and, then, boron ion implanted regions 4 are formed. After this, film 41*f* is removed through etching, or the like. Here, these steps in FIGS. 98 and 100 may be switched and the order thereof is not essentially important. The process up to this point is a manufacturing method for a conventional type twin trench structure. The following process is a process by which the present embodiment is characterized.

Figure 101:
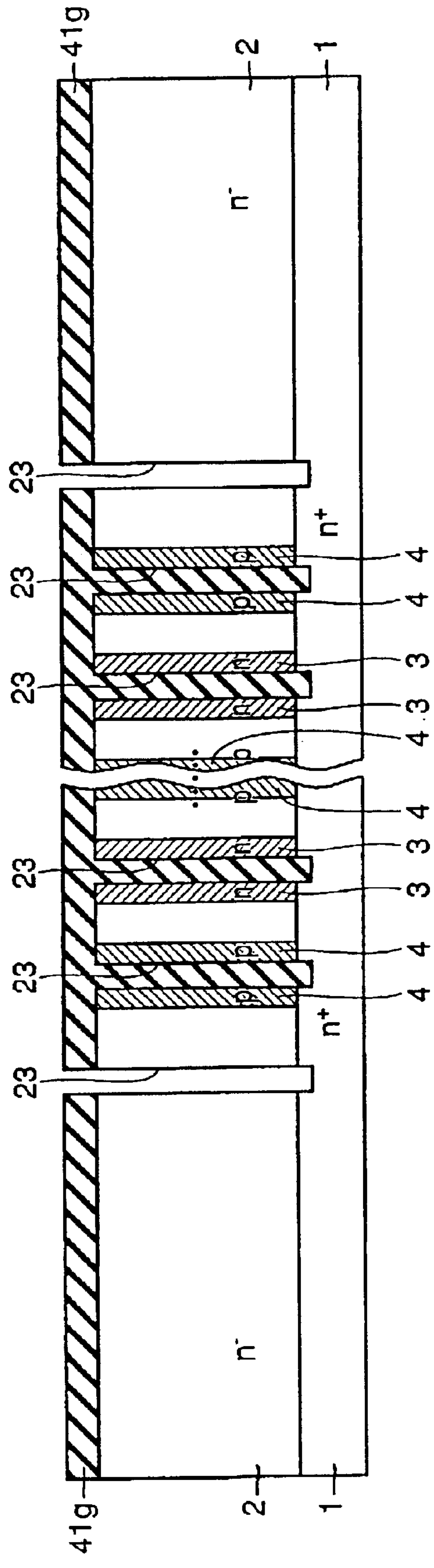

In reference to FIG. 101, a film 41*g*, such as a silicon oxide film, is formed by means of a CVD method so as to fill in the entirety of the plurality of trenches 23 of the first and second groups of trenches according to a conventional method. This film 41*g* is patterned by means of photomechanical technology and etching technology so that a portion above an area that is located one stage before the outermost portion in the pn-repeating structure is opened. Anisotropic etching is carried out by using the patterned film 41*g* as a mask material. Thereby, a first outermost trench 23 is created in a region one stage before the outermost portion of the repeating structure.

Figure 102:
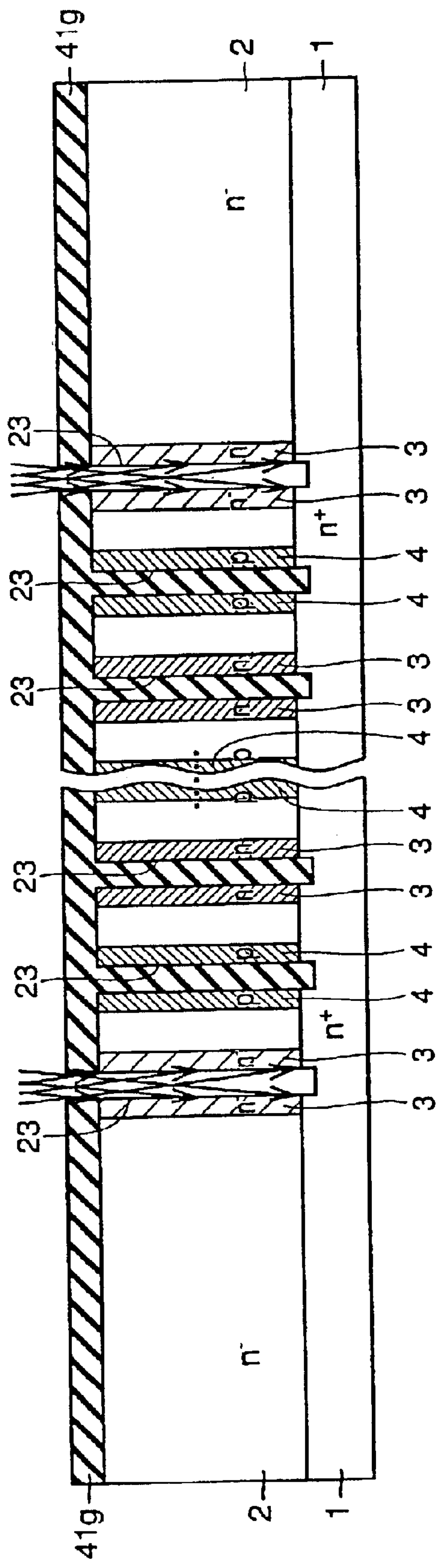

In reference to FIG. 102, phosphorus ions are implanted into the sidewalls on both sides of the first outermost trench 23 so as to have a comparatively low concentration and, then, phosphorous ion implanted regions 3 are formed. After this, film 41*g* is removed by means of etching, or the like.

Figure 103:
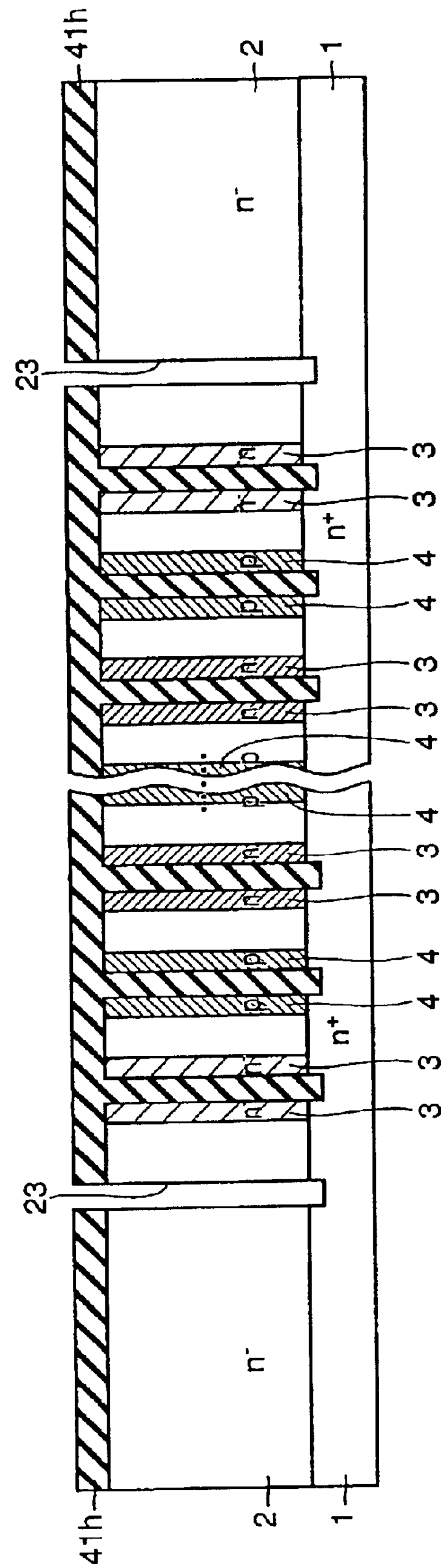

In reference to FIG. 103, a film 41*h*, such as a silicon oxide film, is formed by means of a CVD method so as to fill in the entirety of the plurality of trenches 23 of the first and second groups of trenches and the first outermost trench 23 according to a conventional method. This film 41*h* is patterned by means of photomechanical technology and etching technology so that a portion above an area that becomes the outermost portion in the pn-repeating structure is opened. Anisotropic etching is carried out by using the patterned film 41*h* as a mask material. Thereby, a second outermost trench 23 is created in a region that becomes the outermost portion of the repeating structure.

Figure 104:
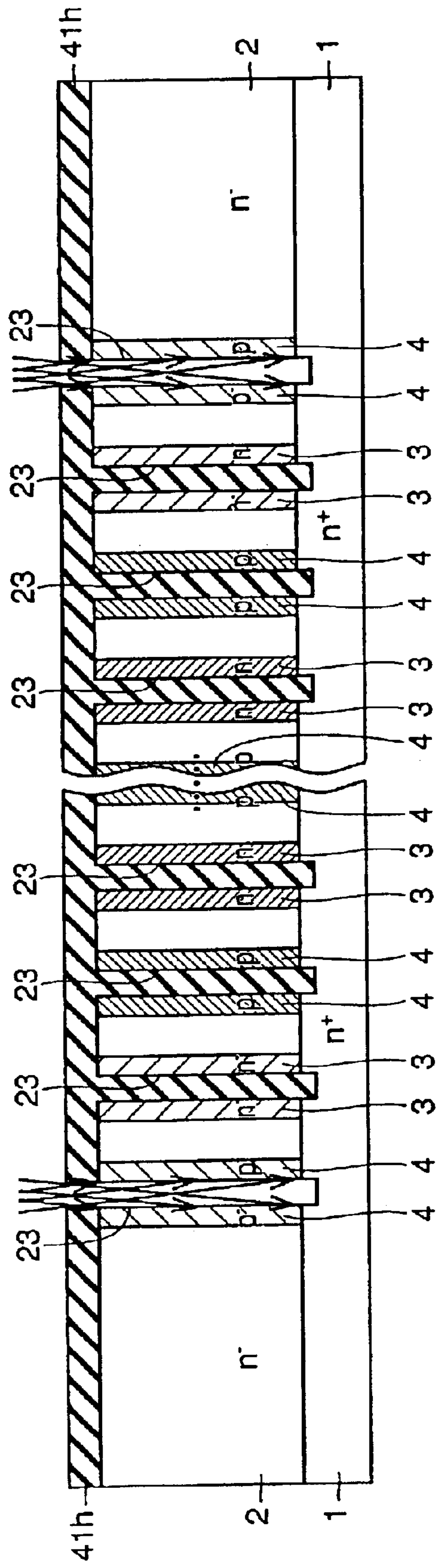

In reference to FIG. 104, boron ions are implanted into the sidewalls on both sides of the second outermost trench 23 so as to have a comparatively low concentration and, then, boron ion implanted regions 4 are formed. After this, film 41*h* is removed by means of etching, or the like. Here, these steps in FIGS. 102 and 104 may be switched and the order thereof is not essentially important.

Figure 105:
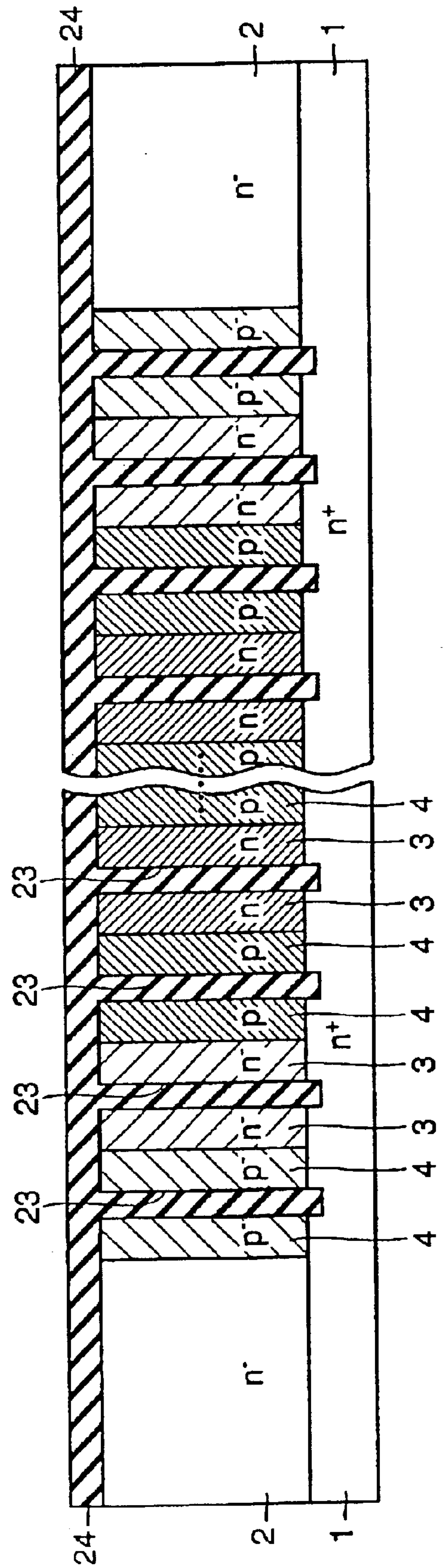

In reference to FIG. 105, a film 24, such as a silicon oxide film, is formed by means of a CVD method so as to fill in all of trenches 23 according to a conventional method. After this, a heat treatment is carried out on the entirety of the element so that mesa regions placed between trenches 23 have desired concentration distributions. Thereby, boron ion implanted regions 4 and phosphorous ion implanted regions 3 are diffused into the surrounding areas so that p-type impurity regions 4 and n-type drift regions 3 are formed. The concentrations of p-type impurity regions 4 and n-type drift regions 3 that have been diffused from the sidewalls of the first and second outermost trenches 23 are set to be lower than the impurity concentrations in the center portion, as described above, and, therefore, they become lower than the impurity concentrations in the center portion in the finished condition. Here, this heat treatment process and the previous step of the filling in of insulating film 24 may be switched.

After this, a guard ring portion, which is the termination structure, and a MOS-FET portion are formed so that the semiconductor device shown in FIG. 96 is completed.

In the twin trench structure according to the present embodiment, the length of the repeating pn unit in the pn-repeating structure becomes twice as long as that of the STM structure making it difficult for a three-dimensional multiple RESURF effect to be implemented and, therefore, the main withstanding voltage tends to become lower in the high concentration region even in the ideal case. In addition, manufacture includes a complex process such that deep trenches are created twice.

On the other hand, in the twin trench structure, it is not necessary to take into consideration the complex physically phenomenon wherein the effective concentration is lowered due to the diffusion of recoil ions to the opposite side because the same ion species are implanted into both sidewalls of a trench. Therefore, there is an advantage such that the manufacturing margin (process window) is great with respect to the trench form wherein, even in the case of the occurrence of a slight bend or slope, there is no major influence therefrom.

Twenty-Eighth Embodiment

A manufacturing method for creating a trench at an outermost portion of the repeating structure in the configuration (FIG. 96) having a twin trench structure in the center portion and having a MOS-FET structure in the active element portion by lowering the concentration through a counter doping method, that is to say, a method wherein two implantations of ion species of opposite conductive types are carried out, is described in detail as the twenty-eighth embodiment, in reference to FIGS. 106 to 115.

Figure 106:
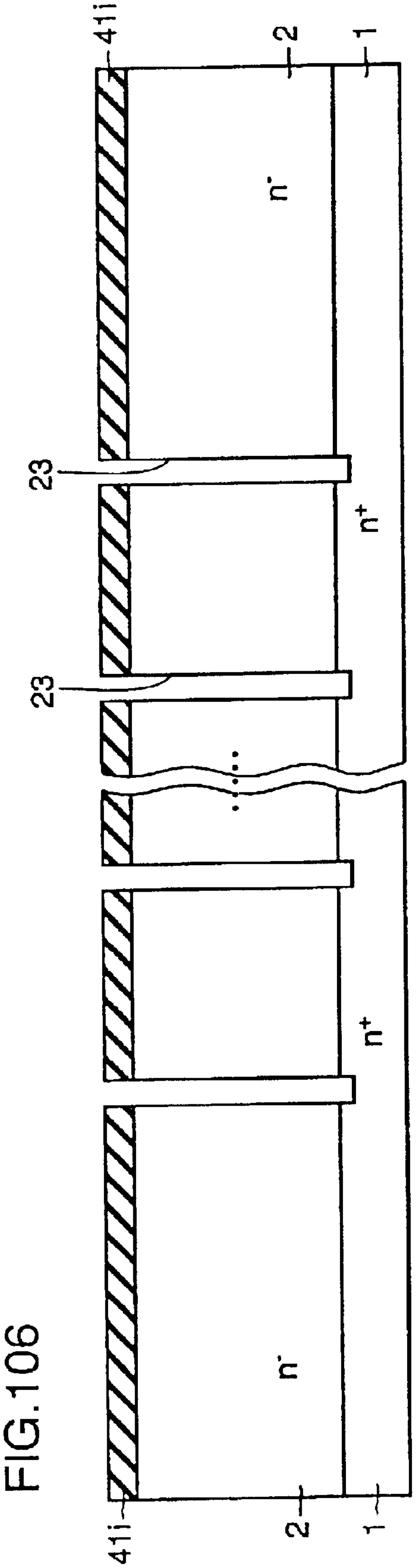
FIGS. 106 to 115 are schematic perspective views showing a manufacturing method for a semiconductor device in the order of the steps according to twenty-eighth embodiment of the present invention.

In reference to FIG. 106, first, anisotropic etching is carried out by using a silicon oxide film, or the like, formed by means of a CVD method as a mask material 41*i* according to a conventional method and, thereby, a first group of trenches made of a plurality of trenches 23 is created in the main surface of a semiconductor substrate. This first group of trenches includes a trench located at an outermost portion of the repeating structure in the finished condition.

Figure 107:
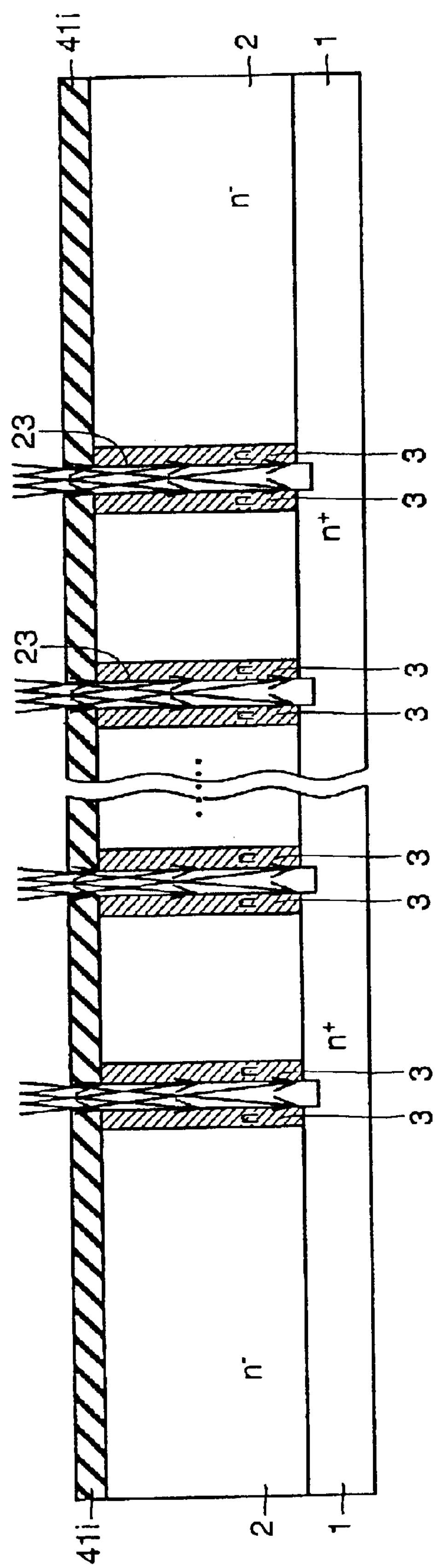

In reference to FIG. 107, phosphorus ions are implanted in the sidewalls on both sides of the entirety of the plurality of trenches 23 forming the first group of trenches so as to have a comparatively high concentration and, then, phosphorous ion implanted regions 3 are formed. After this, film 41*i* is removed through etching, or the like.

Figure 108:
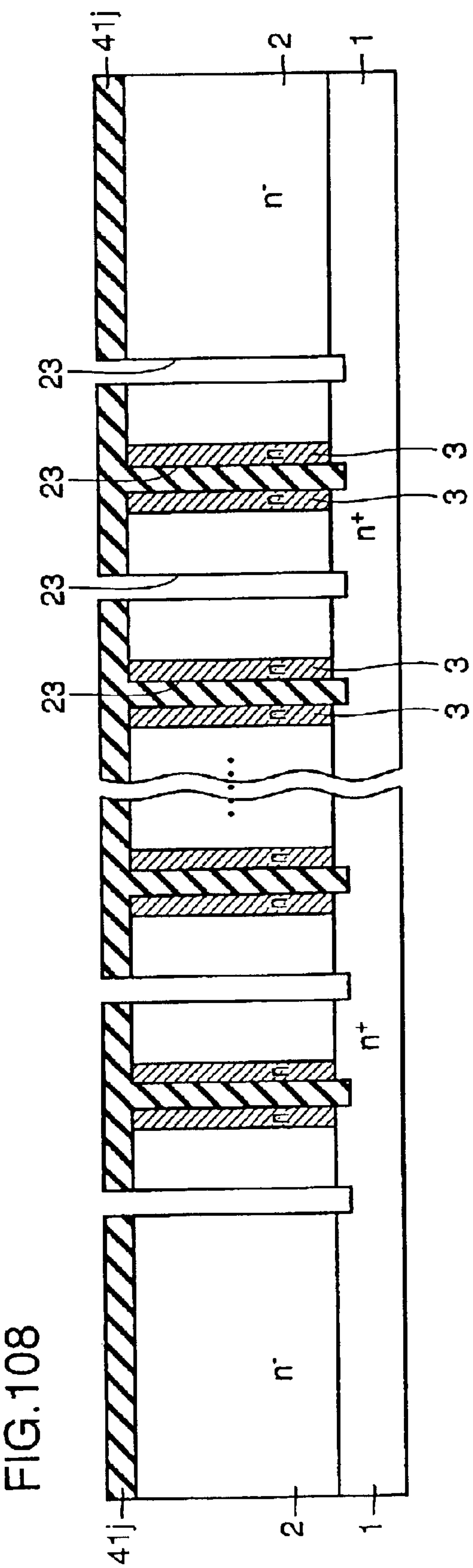

In reference to FIG. 108, a film 41*j*, such as a silicon oxide film, is formed by means of a CVD method so as to fill in the entirety of the plurality of trenches 23 of the first group of trenches according to a conventional method. This film 41*j* is patterned by means of photomechanical technology and etching technology. Anisotropic etching is carried out by using the patterned film 41*j* as a mask material. Thereby, a plurality of trenches 23 forming a second group of trenches is created so that the respective trenches thereof are located in alternation with the respective trenches 23 of the first group of trenches. This second group of trenches includes a trench located at an outermost portion of the repeating structure in the finished condition.

Figure 109:
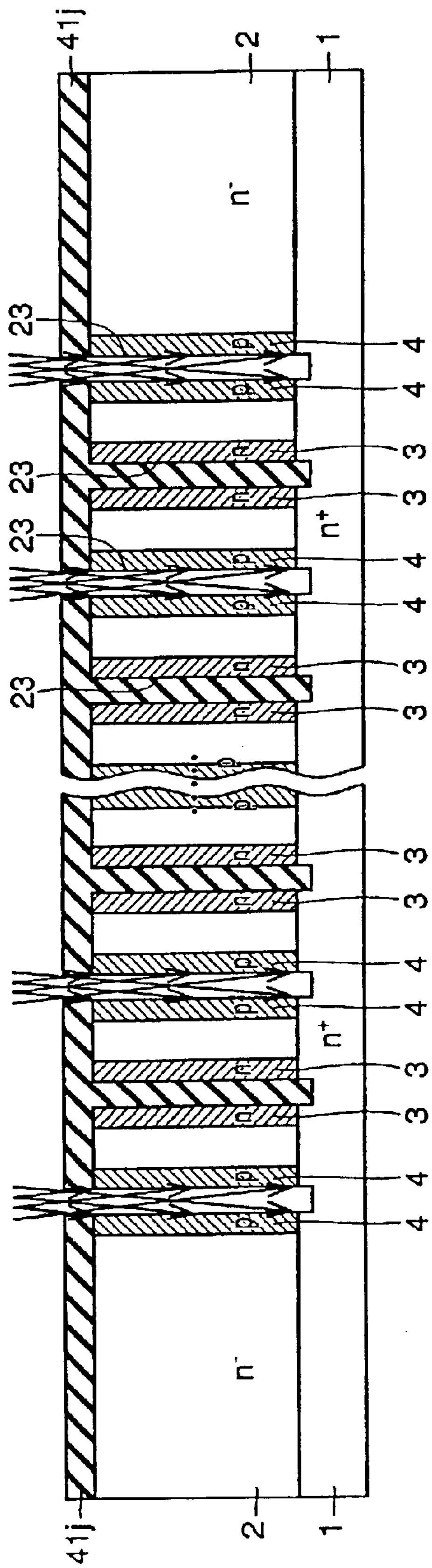

In reference to FIG. 109, boron ions are implanted into the sidewalls on both sides of the entirety of the plurality of trenches 23 forming the second group of trenches so as to have a comparatively high concentration and, then, boron ion implanted regions 4 are formed. After this, film 41*j* is removed through etching, or the like. Here, these steps in FIGS. 107 and 109 may be switched and the order thereof is not essentially important. The process up to this point is a manufacturing method for a conventional type twin trench structure. The following process is a process by which the present embodiment is characterized.

Figure 110:
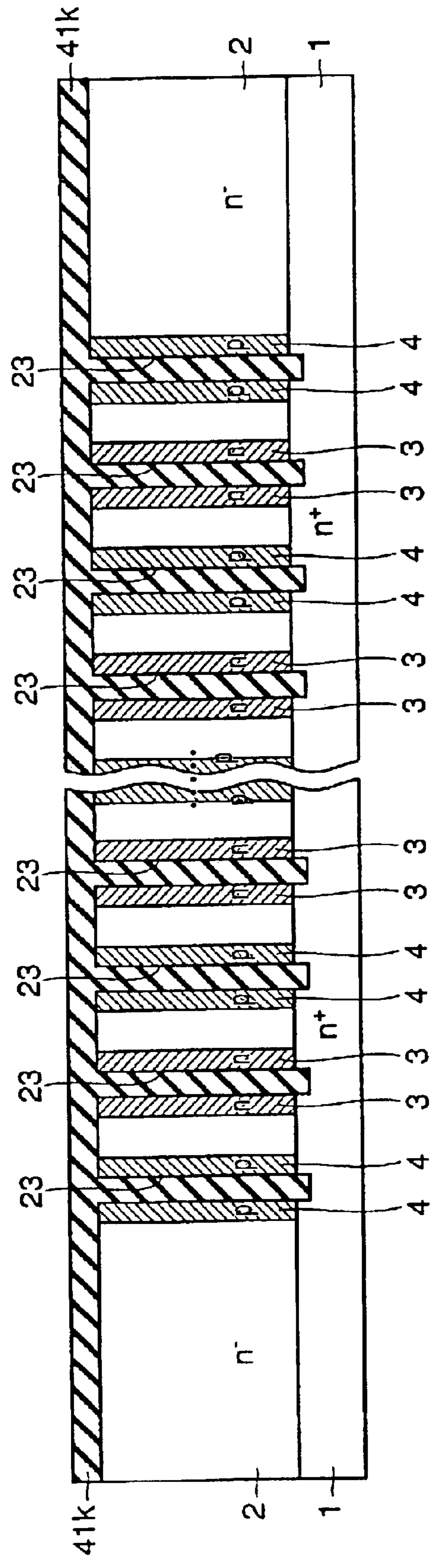

In reference to FIG. 110, film 41*k*, such as a silicon oxide film, is formed by means of a CVD method so as to fill in the entirety of the plurality of trenches 23 according to a conventional method.

Figure 111:
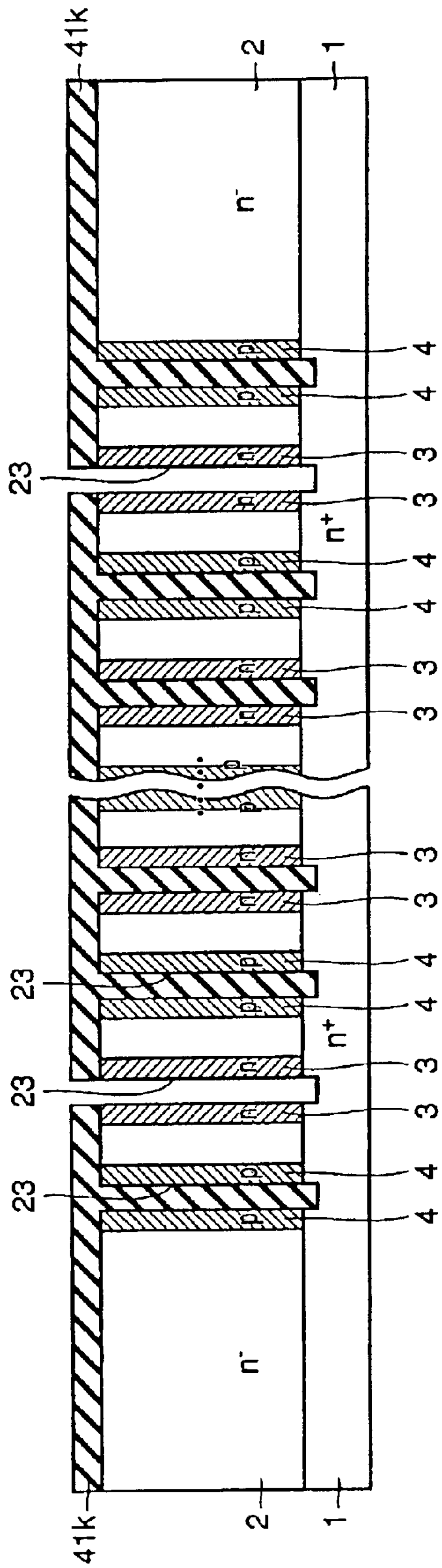

In reference to FIG. 111, this film 41*k* is patterned by means of photomechanical technology and etching technology and, thereby, a portion above a first outermost trench located one stage before the outermost portion of the repeating structure is opened. Anisotropic etching is carried out by using the patterned film 41*k* as a mask material. Thereby, the filling within first outermost trench 23 is removed.

Figure 112:
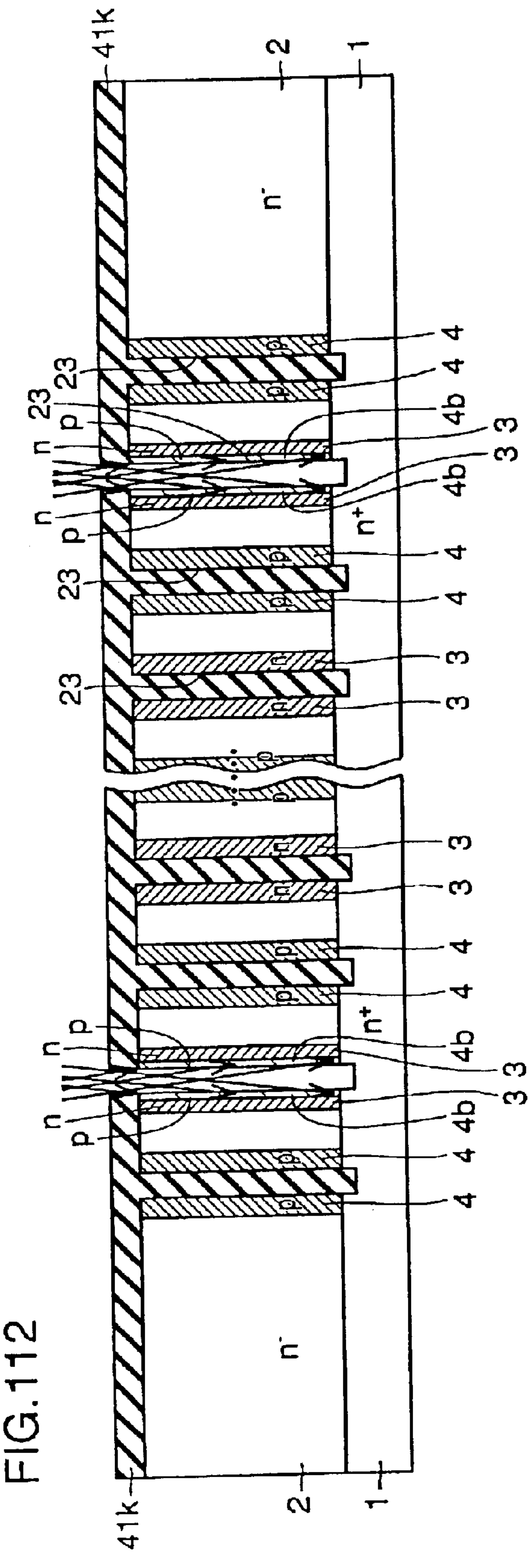

In reference to FIG. 112, boron ions are implanted into the sidewalls on both sides of first outermost trench 23 so as to have a comparatively low concentration and, then, boron ion implanted regions 4*b* are formed. After this, film 41*k* is removed by means of etching, or the like.

Figure 113:
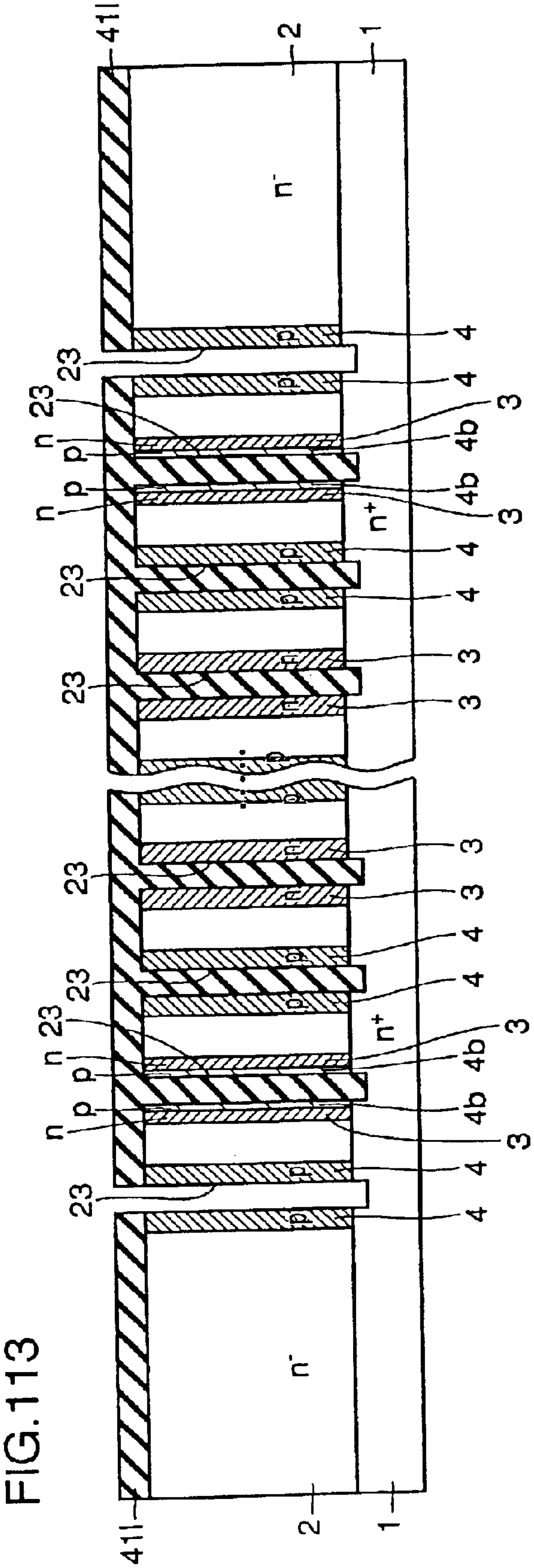

In reference to FIG. 113, a film 41*l*, such as a silicon oxide film, is formed by means of a CVD method so as to fill in all trenches 23 according to a conventional method. This film 41*l* is patterned by means of photomechanical technology and etching technology so that a portion above a second outermost trench 23 located at the outermost portion of the repeating structure is opened. Anisotropic etching is carried out by using the patterned film 41*l* as a mask material. Thereby, the filling within second outermost trench 23 is removed.

Figure 114:
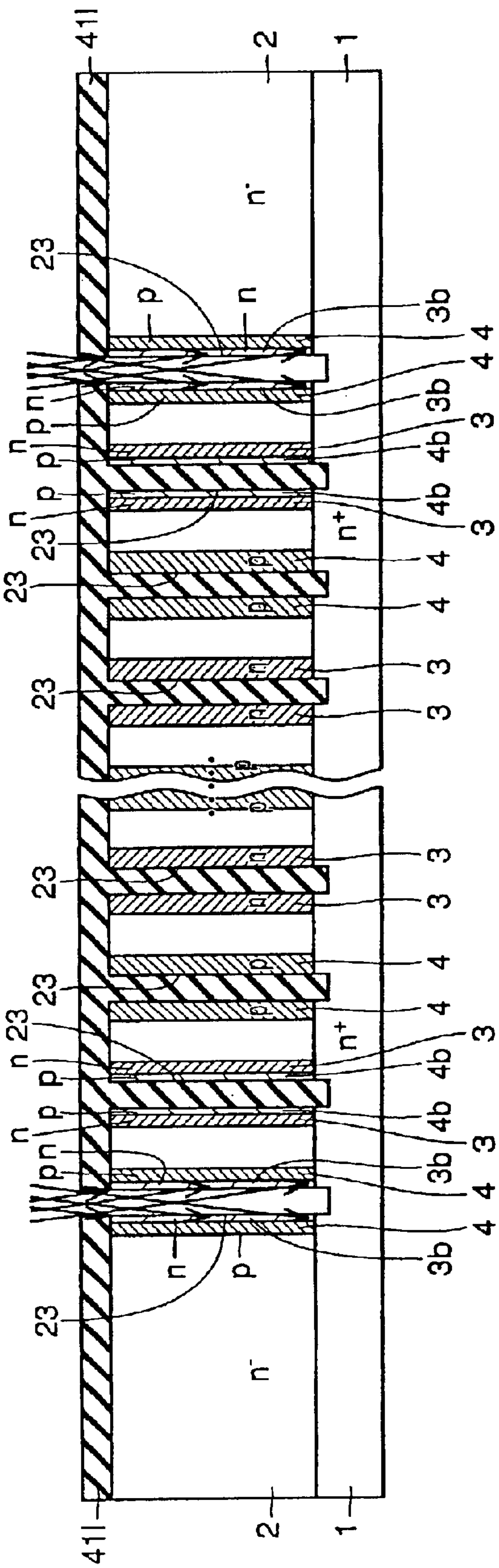

In reference to FIG. 114, phosphorus ions are implanted into the sidewalls on both sides of second outermost trench 23 so as to have a comparatively low concentration and, then, phosphorous ion implanted regions 3*b* are formed. After this, film 41*l* is removed by means of etching, or the like. Here, these steps in FIGS. 112 and 114 may be switched and the order thereof is not essentially important.

Figure 115:
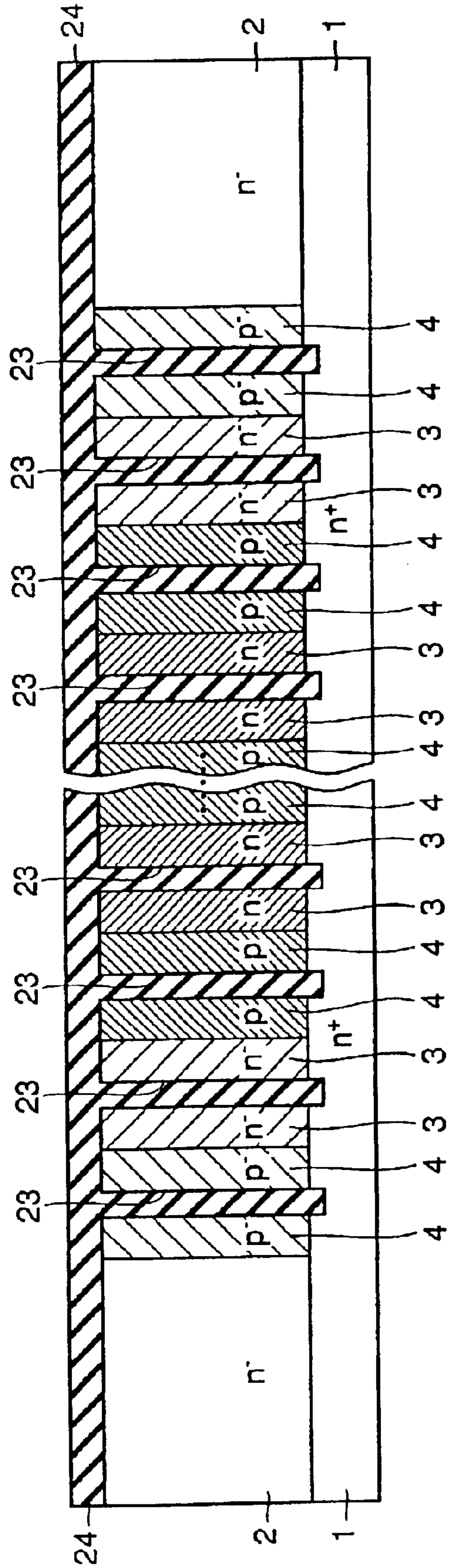

In reference to FIG. 115, a film 24, such as a silicon oxide film, is formed according to a CVD method so as to fill in all trenches 23 according to a conventional method. After this, a heat treatment is carried out on the entirety of the element so that mesa regions placed between trenches 23 have desired concentration distributions. Thereby, boron ion implanted regions 4 and phosphorous ion implanted regions 3 are diffused into the surrounding areas so that p-type impurity regions 4 and n-type drift regions 3 are formed. In the sidewalls of first and second outermost trenches 23, impurities of opposite conductive types cancel each other through counter doping. Therefore, the impurity concentrations of impurity regions 3 and 4 located in the sidewalls of first and second outermost trenches 23 becomes lower than the impurity concentrations in the center portion. Here, this heat processing step and the previous step of filling in of insulating film 24 may be switched.

After this, a guard ring portion, which is the termination structure, and the MOS-FET portions are formed so that the semiconductor device shown in FIG. 96 is completed.

In the twin trench structure according to the present embodiment, the length of the repeating pn unit in the pn-repeating structure becomes twice as long as that of the STM structure making it difficult for a three-dimensional multiple RESURF effect to be implemented and, therefore, the main withstanding voltage tends to become lower in the high concentration region even in the ideal case. In addition, manufacture includes a complex process such that deep trenches are created twice.

On the other hand, in the twin trench structure, it is not necessary to take into consideration the complex physically phenomenon wherein the effective concentration is lowered due to the diffusion of recoil ions to the opposite side and a uniform concentration profile from the top to the bottom of the trenches can be obtained because the same ion species are implanted into both sidewalls of a trench. Therefore, there is an advantage such that the manufacturing margin (process window) is great with respect to the trench form wherein, even in the case of the occurrence of a slight bend or slope, there is no major influence therefrom.

Twenty-Ninth Embodiment

Figure 116:
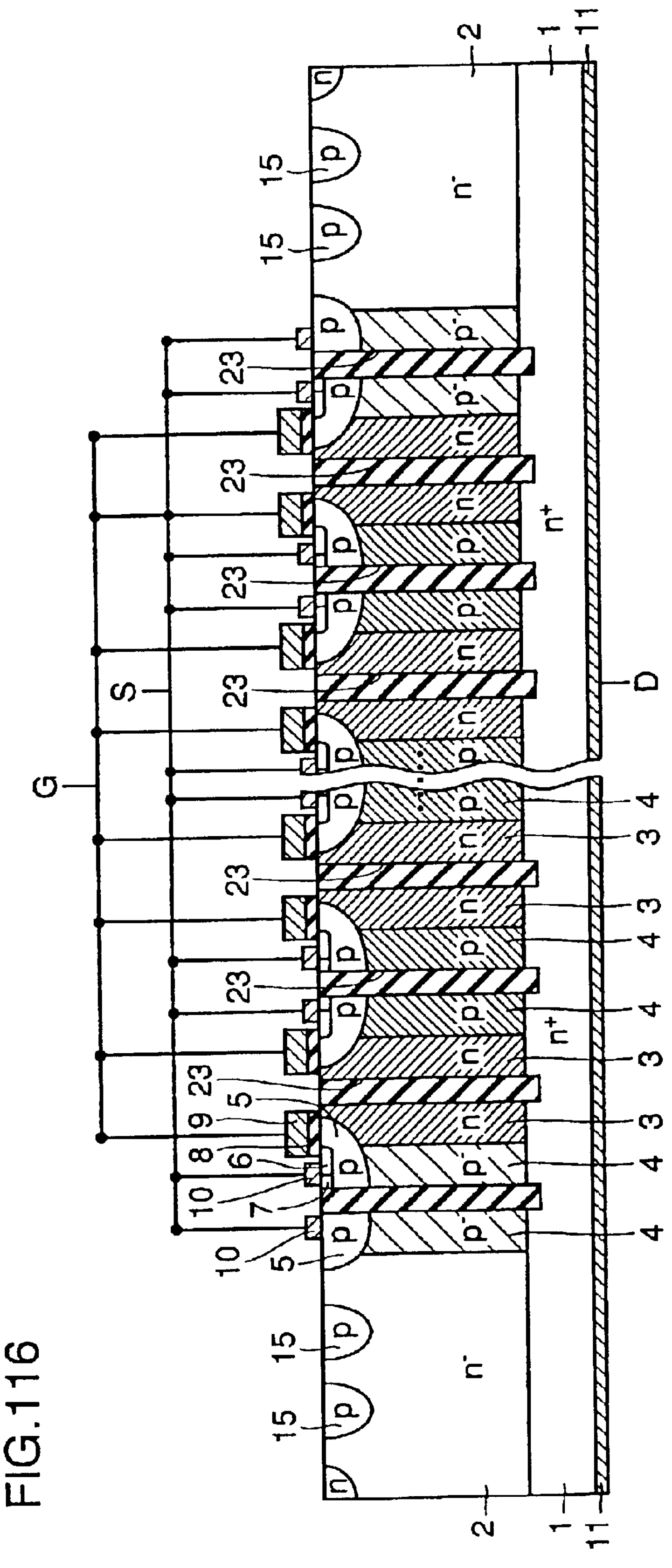
FIG. 116 is a cross sectional view schematically showing the configuration of a semiconductor device according to the twenty-ninth embodiment of the present invention.

In reference to FIG. 116, the configuration of the present embodiment shares with the configuration shown in FIG. 96 the point that the center portion has a twin trench structure and the active element portion has a MOS-FET structure and differs from the configuration shown in FIG. 96 in the point that the concentration of only a pair of p-type impurity regions 4 at the outermost portion in the pn-repeating structure is lowered in the present embodiment.

Here, the other parts of the configuration are approximately the same as the configuration shown in FIG. 96 and, therefore, the same symbols are attached to the same members, of which the descriptions are omitted.

The configuration of the present embodiment is a configuration wherein the concentration of only the p-type impurity regions at the outermost portion of the pn-repeating structure is lowered in only one stage and, therefore, has an advantage that the manufacture thereof is easy. The configuration of the present embodiment can be implemented according to the above described twenty-seventh embodiment or the twenty-eighth embodiment and can also be implemented according to the below described thirty-third embodiment.

Thirtieth Embodiment

Figure 117:
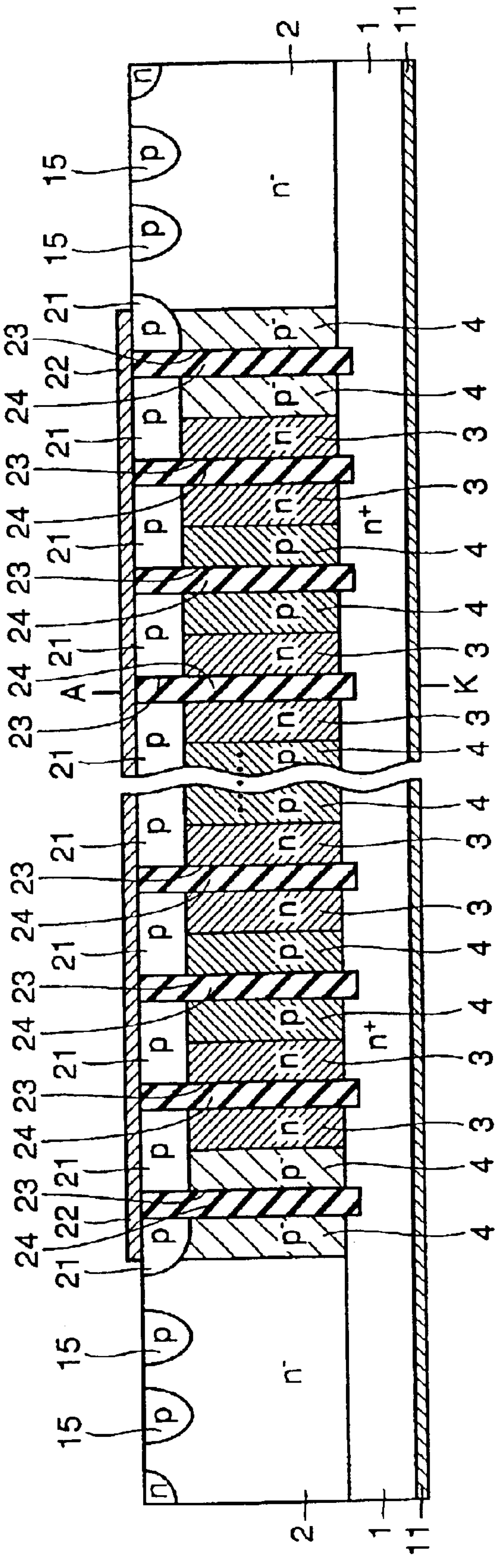
FIG. 117 is a cross sectional view schematically showing the configuration of a semiconductor device according to the thirtieth embodiment of the present invention.

In reference to FIG. 117, the configuration of the present embodiment shares the point that the center portion has a twin trench structure with the configuration shown in FIG. 96 and differs from the configuration shown in FIG. 96 in the point that the active element portion has a pin diode structure in stead of a MOS-FET structure and in the point that the concentration of only a pair of p-type impurity regions 4 at the outermost portion of the repeating structure is lowered.

The pin diode is formed of a p-type impurity region 21 that is formed on the first main surface side of the entirety of the pn-repeating structure and that is electrically connected to an anode electrode 22.

Here, the other parts of the configuration are approximately the same as the configuration shown in FIG. 96 and, therefore, the same symbols are attached to the same members, of which the descriptions are omitted.

The configuration of the present embodiment can be implemented according to the above described twenty-seventh embodiment or the twenty-eighth embodiment and can also be implemented according to the below described thirty-third embodiment.

Thirty-First Embodiment

Figure 118:
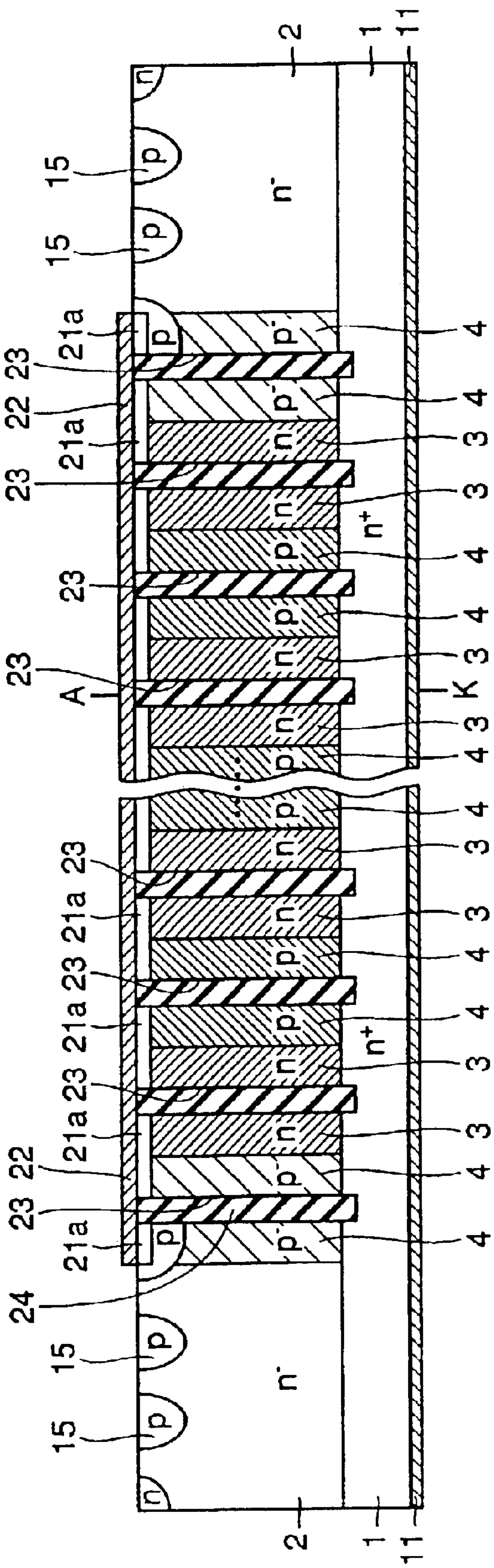
FIG. 118 is a cross sectional view schematically showing the configuration of a semiconductor device according to the thirty-first embodiment of the present invention.

In reference to FIG. 118, the configuration of the present embodiment shares the point that the center portion has a twin trench structure with the configuration shown in FIG. 96 and differs from the configuration shown in FIG. 96 in the point that the active element portion has a Schottky barrier diode structure instead of a MOS-FET structure and in the point that the concentration of only a pair of p-type impurity regions 4 at the outermost portion of the pn-repeating structure in the present embodiment.

The Schottky barrier diode is formed of the entirety of the pn-repeating structure on the first main surface side that is electrically connected to an anode electrode 22 via a metal silicide layer 21*a*.

Here, the other parts of the configuration are approximately the same as the configuration shown in FIG. 96 and, therefore, the same symbols are attached to the same members, of which the descriptions are omitted.

The configuration of the present embodiment can be implemented according to the above described twenty-seventh embodiment or the twenty-eighth embodiment and can also be implemented according to the below described thirty-third embodiment.

Thirty-Second Embodiment

Figure 119:
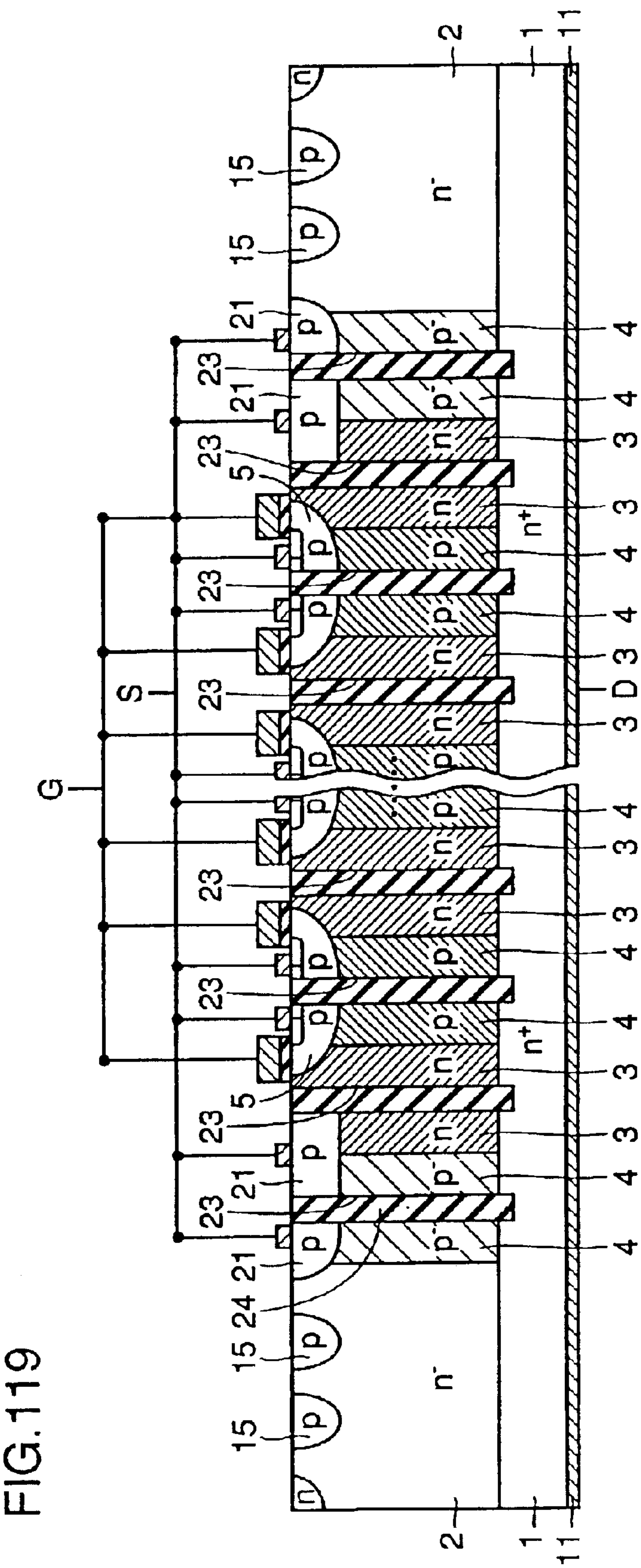
FIG. 119 is a cross sectional view schematically showing the configuration of a semiconductor device according to the thirty-second embodiment of the present invention.

In reference to FIG. 119, the configuration of the present embodiment shares with the configuration shown in FIG. 96 the point that the center portion has a twin trench structure and the active element portion has a MOS-FET structure and differs from the configuration shown in FIG. 96 in the point that an active element is not provided above a pair of p-type impurity regions 4 at the outermost portion in the pn-repeating structure in the present embodiment.

p-type impurity regions 21 are formed above the pair of p-type impurity regions 4 at the outermost portion of the pn-repeating structure and are electrically connected to a source electrode 10.

Here, the other parts of the configuration are approximately the same as the configuration shown in FIG. 96 and, therefore, the same symbols are attached to the same members, of which the descriptions are omitted.

Thirty-Third Embodiment

A manufacturing method of simultaneously forming high concentration regions in the center portion and low concentration regions at the outermost portion of the pn-repeating structure through one ion implantation by using a DLT structure for the twin trench structure is described in detail as the thirty-third embodiment in reference to FIGS. 106 to 110.

In reference to FIG. 106, first, anisotropic etching is carried out by using a silicon oxide film, or the like, formed by means of a CVD method as a mask material 41*i* according to a conventional method and, thereby, a first group of trenches including a plurality of trenches 23 in the center portion and trenches 23 of a DLT structure placed outside thereof is simultaneously created in the first main surface of a semiconductor substrate. Here, the number of trenches 23 of a DLT structure may be any number that is no less than one.

In reference to FIG. 107, phosphorous ions are implanted into the sidewalls on both sides of the entirety of the plurality of trenches 23 forming the first group of trenches so that phosphorous ion implanted regions 3 are formed. After this, film 41*i* is removed by means of etching, or the like.

In reference to FIG. 108, a film 41*j* such as a silicon oxide film is formed by means of a CVD method so as to fill in the entirety of the plurality of trenches 23 of the first group of trenches. This film 41*j* is patterned by means of photomechanical technology and etching technology. Anisotropic etching is carried out by using the patterned film 41*j* as a mask material. Thereby, a plural number of trenches 23 in the center portion and trenches 23 of a DLT structure placed outside thereof are created forming a second group of trenches so as to located in alternation with the respective trenches 23 of the first group of trenches. Here, the number of trenches 23 of a DLT structure may be any number that is no less than one.

In reference to FIG. 109, boron ions are implanted into the sidewalls on both sides of the entirety of the plurality of trenches 23 forming the second group of trenches so that boron ion implanted regions 4 are formed. After this, film 41*j* is removed by means of etching, or the like. Here, these steps in FIGS. 107 and 109 may be switched and the order thereof is not essentially important.

In reference to FIG. 110, a film 41*k* such as a silicon oxide film is formed by means of a CVD method so as to fill in the entirety of the plurality of trenches 23 according to a conventional method.

After this, a heat treatment is carried out on the entirety of the element so that mesa regions placed between trenches 23 have desired concentration distributions. As a result of this heat treatment, the concentrations of boron ion implanted regions 4 and phosphorous ion implanted regions 3 in the sidewalls of trenches 23 of a DLT structure at the outermost portion of the repeating structure are diffused so as to be lowered and uniformed and so as to be lower than the impurity concentration of the mesa regions in the center portion.

Here, the step of the filling in of an insulator and the previous heat treatment step may be switched.

In addition, though the process of forming comparatively deep diffusion regions such as a guard ring and p-type body regions of the MOS-FETs is not illustrated, it can properly be inserted somewhere in the above described steps or somewhere after these steps.

Thirty-Fourth Embodiment

A manufacturing method for a pn-repeating structure having bi-pitch units wherein p-type impurity regions and n-type drift regions are formed through separate ion implantations is described in detail in reference to FIGS. 120 to 128.

First, a manufacturing method of the present embodiment follows the step shown in FIG. 79. Thereby, a plurality of trenches 23 is created in the main surface of a semiconductor substrate.

Figure 120:
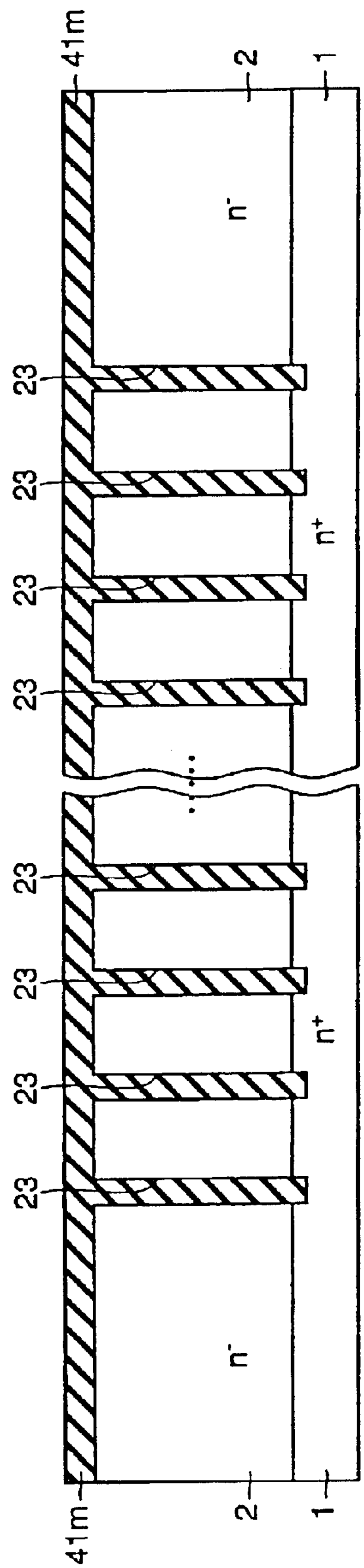
FIGS. 120 to 128 are schematic perspective views showing a manufacturing method for a semiconductor device in the order of the steps according to the thirty-fourth embodiment of the present invention.

After this, in reference to FIG. 120, a film 41*m* such as a silicon oxide film is formed by means of a CVD method so as to fill in all trenches 23 according to a conventional method.

Figure 121:
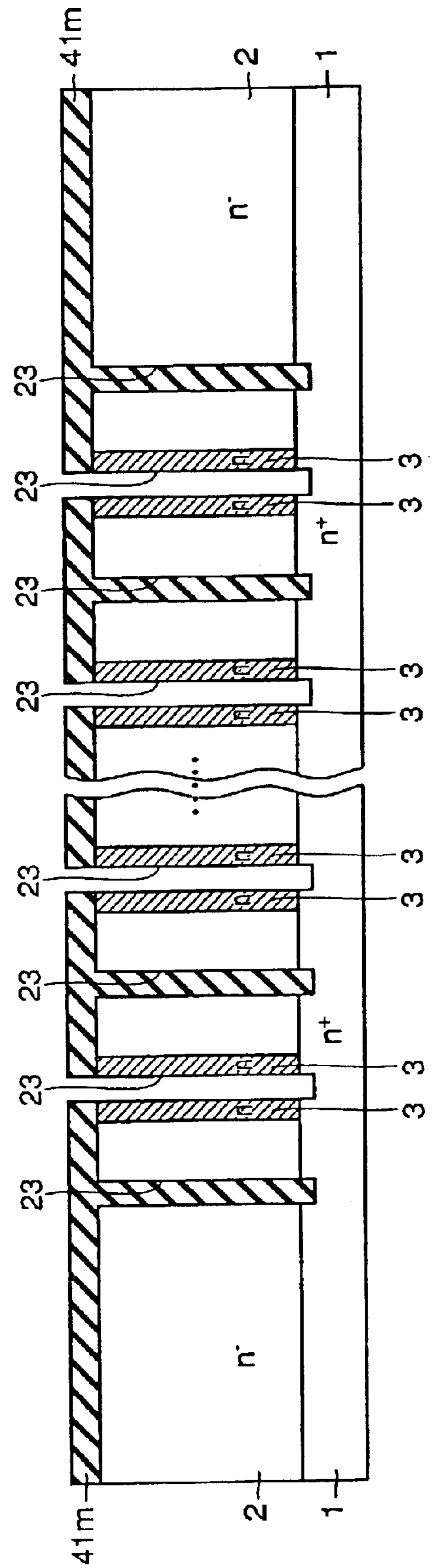

In reference to FIG. 121, this film 41*m* is patterned by means of photomechanical technology and etching technology so that a portion above every other trench 23 from among the plurality of trenches 23 is opened. Anisotropic etching is carried out by using the patterned film 41*m* as a mask material. Thereby, the filling within every other trench 23 is removed. Phosphorous ions are implanted into the sidewalls on both sides of every other trench 23 from which the filling has been removed so as to have a comparatively high concentration and, then, phosphorous ion implanted regions 3 are formed. After this, film 41*m* is removed by means of etching, or the like.

Figure 122:
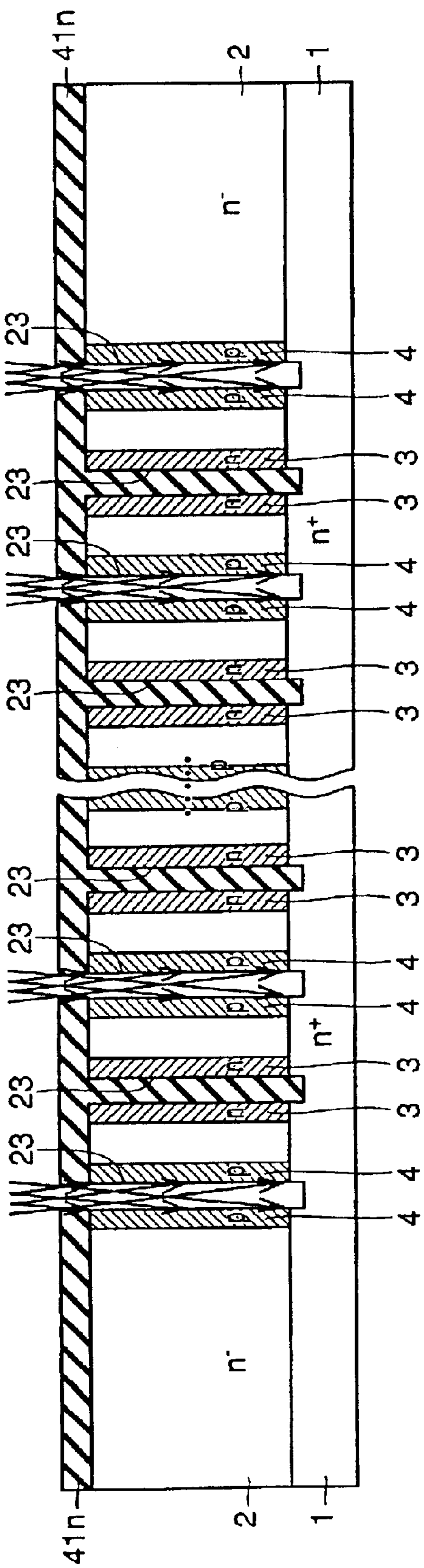

In reference to FIG. 122, a film 41*n* such as a silicon oxide film is formed by means of a CVD method so as to fill in all trenches 23 according to a conventional method. This film 41*n* is patterned by means of photomechanical technology and etching technology so that respective portions above the other set of every other trench 23 are opened. Anisotropic etching is carried out by using the patterned film 41*n* as a mask material. Thereby, the filling within the other set of every other trench 23 is removed.

Boron ions are implanted into the sidewalls on both sides of the other set of every other trench 23 from which the filling has been removed so as to have a comparatively high concentration and, then, boron ion implanted regions 4 are formed. After this, film 41*n* is removed by means of etching, or the like. Here, these steps in FIGS. 121 and 122 may be switched and the order thereof is not essentially important.

Figure 123:
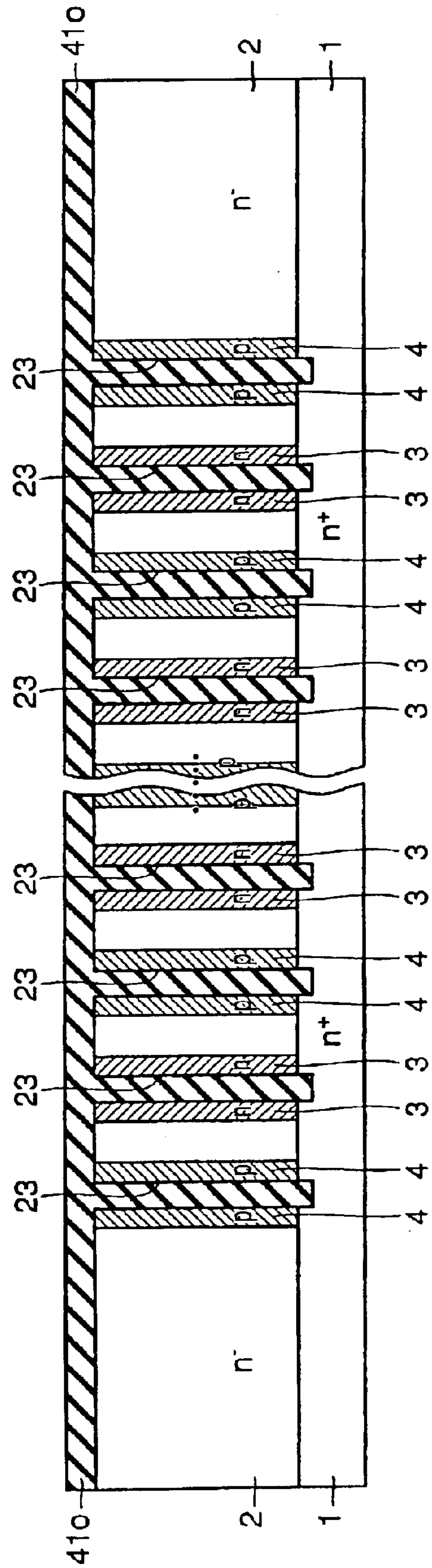

In reference to FIG. 123, a film 41*o* such as a silicon oxide film is formed by means of a CVD method so as to fill in all trenches 23 according to a conventional method. The process up to this point is a process for forming a structure having the repetition of the same bi-pitch units as in a twin trench structure of a conventional structure and the following process is a process for forming a concentration lowering structure at the outermost portion of the pn-repeating structure according to the present embodiment.

Figure 124:
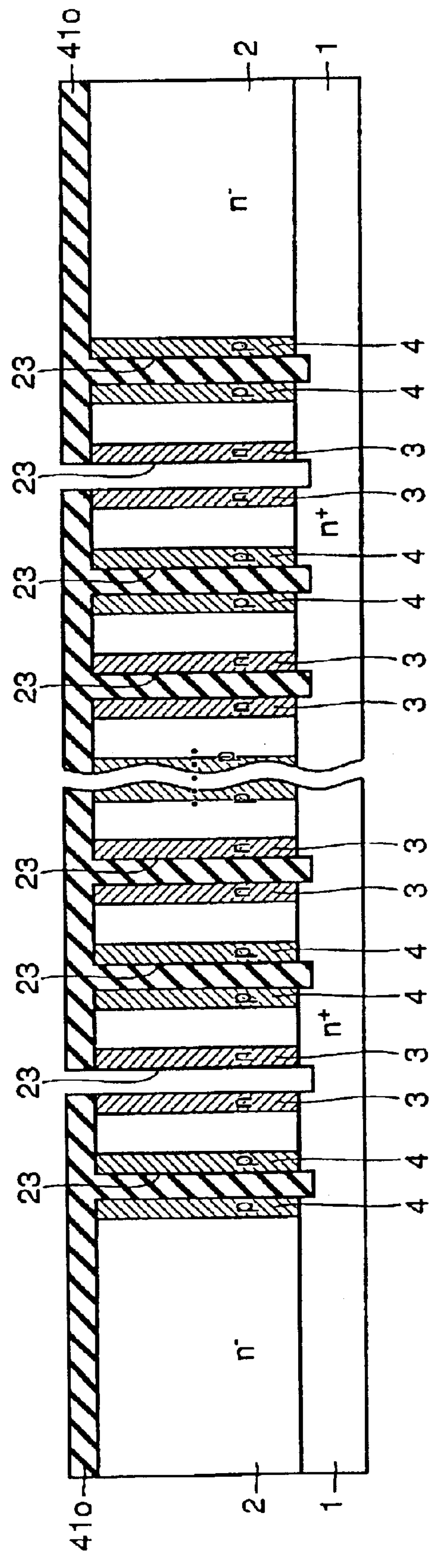

In reference to FIG. 124, this film 41*o* is patterned by means of photomechanical technology and etching technology so that a portion above a first outermost trench 23 located one stage before the outermost portion of the repeating structure is opened. Anisotropic etching is carried out by using the patterned film 41*o* as a mask material. Thereby, the filling within first outermost trench 23 is removed.

Figure 125:
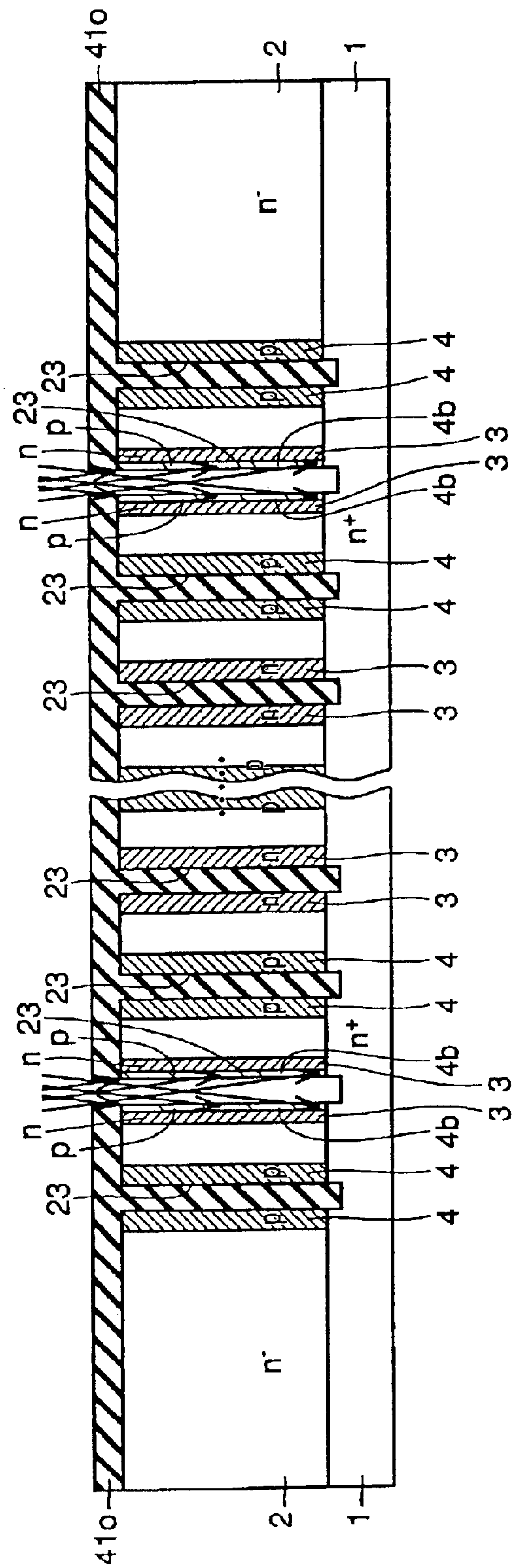

In reference to FIG. 125, boron ions are implanted into the sidewalls on both side of first outermost trench 23 so as to have a comparatively low concentration (concentration of approximately half of the impurity concentration of phosphorous ion implanted regions 3) so that boron ion implanted regions 4*b* are formed. After this, film 41*o* is removed by means of etching, or the like.

Figure 126:
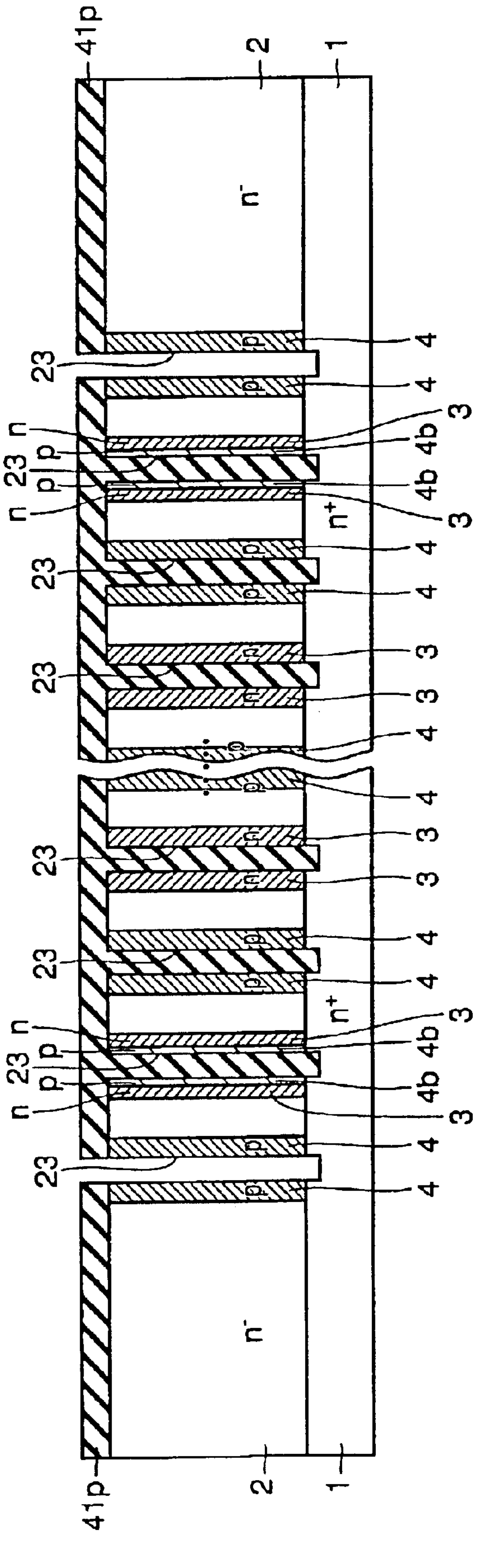

In reference to FIG. 126, a film 41*p* such as a silicon oxide film is formed by means of a CVD method so as to fill in all trenches 23 according to a conventional method. This film 41*p* is patterned by means of photomechanical technology and etching technology so that a portion above a second outermost trench 23 located at the outermost portion of the repeating structure is opened. Anisotropic etching is carried out by using the patterned film 41*p* as a mask material. Thereby, the filling within second outermost trench 23 is removed.

Figure 127:
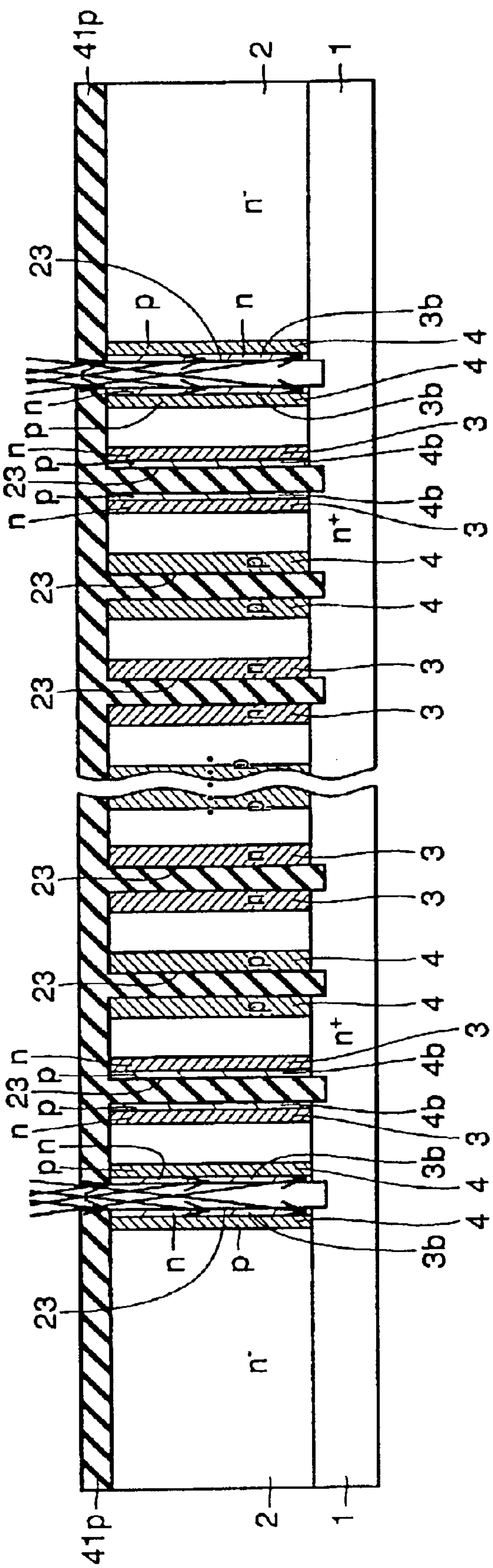

In reference to FIG. 127, phosphorous ions are implanted into the sidewalls on both side of second outermost trench 23 so as to have a comparatively low concentration (concentration of approximately half of the impurity concentration of boron ion implanted regions 4) so that phosphorous ion implanted regions 3*b* are formed. After this, film 41*p* is removed by means of etching, or the like. Here, these steps in FIGS. 125 and 127 may be switched and the order thereof is not essentially important.

Figure 128:
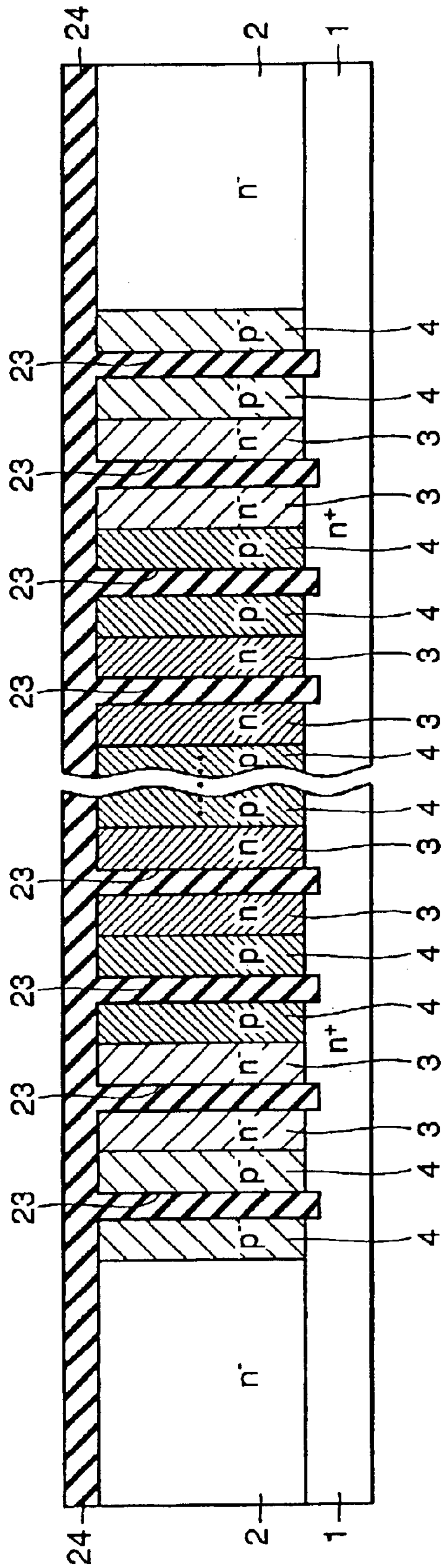

In reference to FIG. 128, a film 24 such as a silicon oxide film is formed by means of a CVD method so as to fill in all trenches 23 according to a conventional method. After this, a heat treatment is carried out on the entirety of the element so that mesa regions placed between trenches 23 have desired concentration distributions. Thereby, the impurities of boron ion implanted regions 4 and phosphorous ion implanted regions 3 are diffused into the surrounding areas so that p-type impurity regions 4 and n-type drift regions 3 are formed. The impurities of opposite conductive types cancel each other because of counter doping in the sidewalls of first and second outermost trenches 23. Therefore, the impurity concentrations of impurity regions 3 and 4 located in the sidewalls of first and second outermost trenches 23 become lower than the impurity concentration in the center portion. Here, this heat treatment process and the previous process of the filling in of insulating film 24 may be switched.

After this, a guard ring portion that is the termination structure and MOS-FET portions are formed so that the semiconductor device shown in FIG. 96 is completed.

Here, in the case that the region wherein the concentration is lowered is set in multiple stages, the above described step of counter doping may be repeated a plurality of times.

Thirty-Fifth Embodiment

A manufacturing method, wherein a method of one-time excavation for the creation of a trench and of separately implanting ions for p-type impurity regions and n-type drain regions only through bi-pitch implantations is used for a trench of a DLT structure at the outermost portion of the repeating structure, is described in detail in reference to FIGS. 120 to 123.

In reference to FIG. 120, first, a first group of trenches made of a plurality of trenches 23 in the center portion and trenches 23 of a DLT structure placed outside thereof and a second group of trenches made of a plurality of trenches 23 in the center portion and trenches 23 of a DLT structure placed outside thereof are created in the first main surface of a semiconductor substrate. The respective trenches 23 of the first group of trenches and the respective trenches 23 of the second group of trenches are created so as to be positioned in alternation. Here, the respective numbers of trenches 23 of a DLT structure of the first and second groups of trenches may be any number that is no less than one After this, a film 41*m* such as a silicon oxide film is formed by means of a CVD method so as to fill in all trenches 23 according to a conventional method.

In reference to FIG. 121, this film 41*m* is patterned by means of photomechanical technology and etching technology so that a portion above every other trench 23 from among the plurality of trenches 23 is opened. Anisotropic etching is carried out by using the patterned film 41*m* as a mask material. Thereby, the filling within every other trench 23 is removed. Phosphorous ions are implanted into the sidewalls on both sides of every other trench 23 from which the filling has been removed so that phosphorous ion implanted regions 3 are formed. After this, film 41*m* is removed by means of etching, or the like.

In reference to FIG. 122, a film 41*n* such as a silicon oxide film is formed by means of a CVD method so as to fill in all trenches 23 according to a conventional method. This film 41*n* is patterned by means of photomechanical technology and etching technology so that respective portions above the other set of every other trench 23 from among the plurality of trenches 23 are opened. Anisotropic etching is carried out by using the patterned film 41*n* as a mask material. Thereby, the filling within the other set of every other trench 23 is removed.

Boron ions are implanted into the sidewalls on both sides of the other set of every other trench 23 from which the filling has been removed so that boron ion implanted regions 4 are formed. After this, film 41*n* is removed by means of etching, or the like. Here, these steps in FIGS. 121 and 122 may be switched and the order thereof is not essentially important.

In reference to FIG. 123, a film 41*o* such as a silicon oxide film is formed by means of a CVD method so as to fill in all trenches 23 according to a conventional method.

After this, a heat treatment is carried out on the entirety of the element so that mesa regions placed between trenches 23 have desired concentration distributions. As a result of this heat treatment, the concentrations of boron ion implanted regions 4 and phosphorous ion implanted regions 3 in the sidewalls of trenches 23 of a DLT structure at the outermost portion of the repeating structure are diffused so as to be lowered and uniformed and so as to be lower than the impurity concentration of the mesa regions in the center portion.

Here, the step of the filling in of an insulator and the previous heat treatment step may be switched.

In addition, though the process of forming comparatively deep diffusion regions such as a guard ring and p-type body regions of the MOS-FETs is not illustrated, it can properly be inserted somewhere in the above described steps or somewhere after these steps.

Thirty-Sixth Embodiment

A manufacturing method for forming a low concentration region at the outermost portion of the repeating structure through high energy ion implantations of multiple stages in an STM structure is described in detail as the thirty-sixth embodiment in reference to FIGS. 129 to 136.

The manufacturing method of the present embodiment first follows the process shown in FIGS. 70 to 72. Thereby, a plurality of trenches 23 is created and phosphorous ion implanted regions 3 and boron ion implanted regions 4 are formed in the sidewalls of the respective trenches 23.

Figure 129:
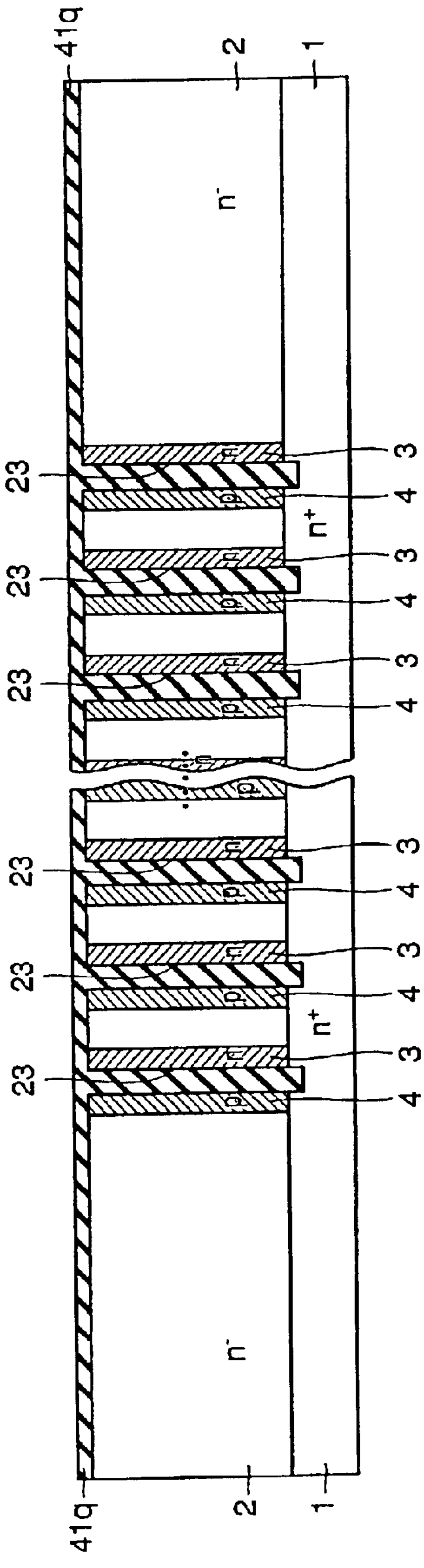
FIGS. 129 to 136 are schematic perspective views showing a manufacturing method for a semiconductor device in the order of the steps according to the thirty-sixth embodiment of the present invention.

After this, in reference to FIG. 129, a film 41*q*, such as a silicon oxide film, is formed by means of a CVD method so as to fill in all trenches 23 according to a conventional method. The process up to this point is the same as a method shown in the other above described embodiments. After this, though the respective implanted regions 3 and 4 may be diffused from the sidewalls of trenches 23 by carrying out a heat treatment, a heat treatment is not carried out on this example.

Figure 130:
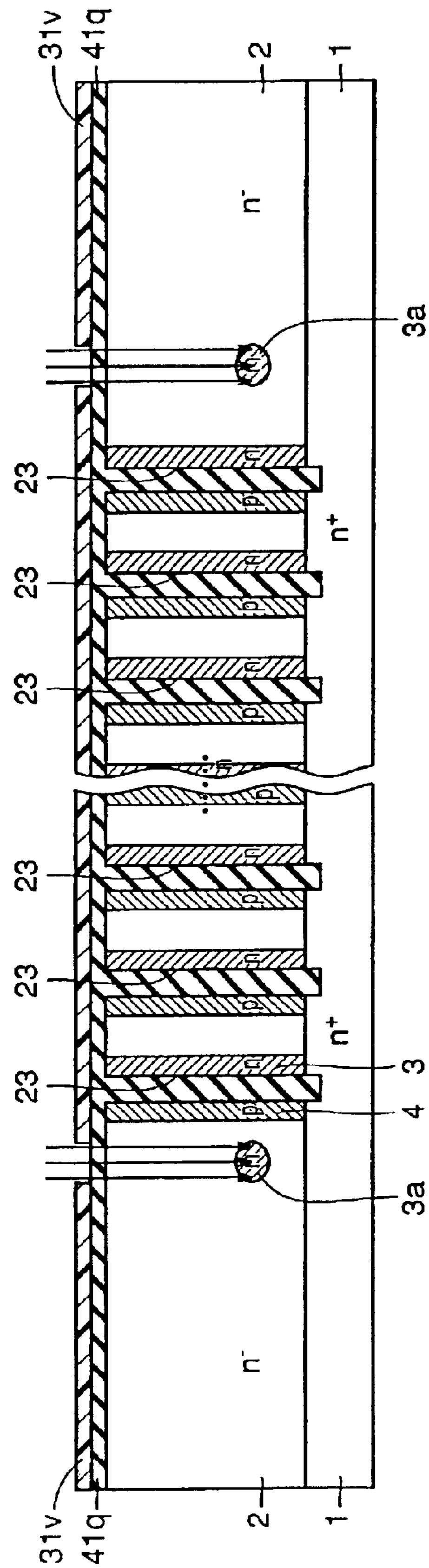

In reference to FIG. 130, a resist pattern 31*v* having a predetermined pattern is formed on film 41*q* by means of photomechanical technology. Ion implantation of phosphorus ions is carried out at a high energy level by using this resist pattern 31*v* as a mask and, thereby, phosphorous ion implanted regions 3*a* are formed at deep locations of the outermost portion of the pn-repeating structure or of a region one stage before the outermost portion.

Here, though in FIG. 130, a case is described wherein ions are implanted through thick buried film 41*q* by using resist pattern 31*v* as a mask, ions can, if necessary, be implanted after film 41*q* is etched or resist pattern 31*v* can also be removed so that ions are implanted by using only the pattern of film 41*q* as a mask.

Figure 131:
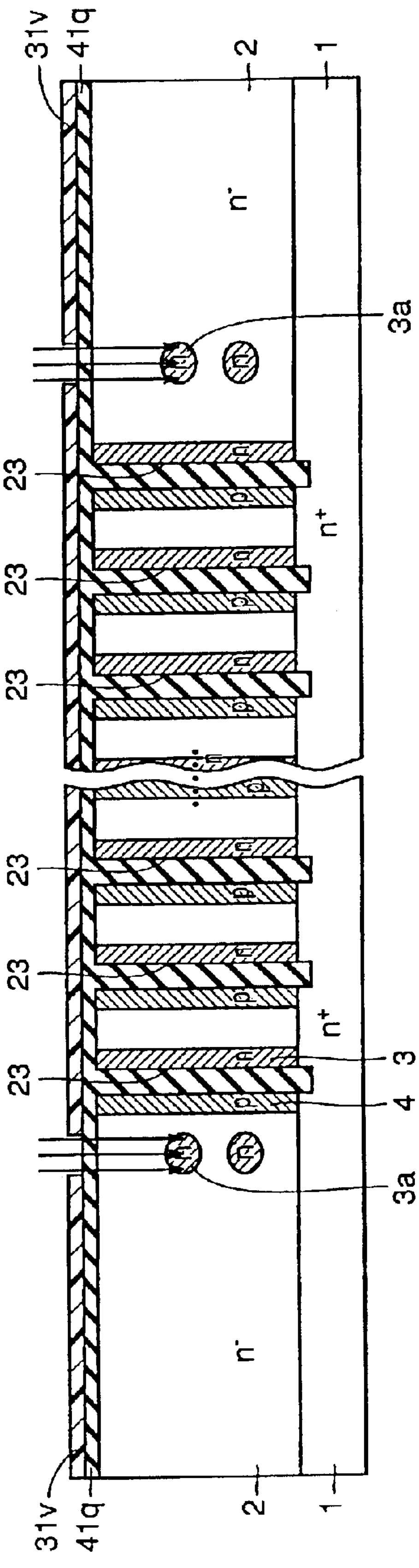

In reference to FIG. 131, ion implantation of phosphorus ions is carried out at a middle energy level by using the above described resist pattern 31*v* as a mask and, thereby, phosphorous ion implanted regions 3*a* are formed at locations of a middle depth of the outermost portion of the pn-repeating structure or of a region one stage before the outermost portion.

Figure 132:
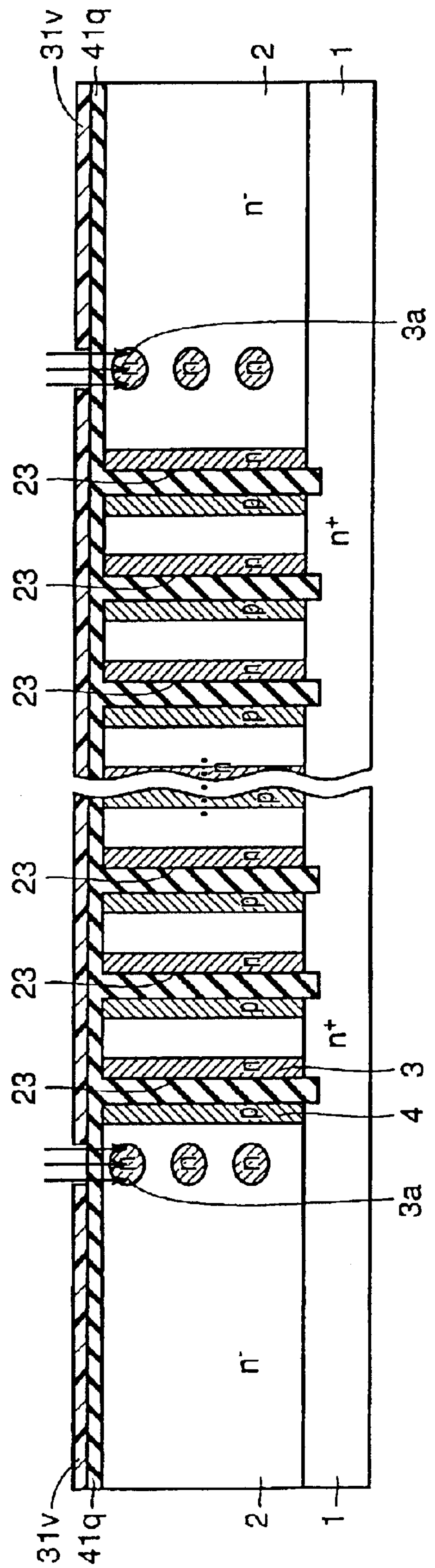

In reference to FIG. 132, ion implantation of phosphorus ions is carried out at a low energy level by using the above described resist pattern 31*v* as a mask and, thereby, phosphorous ion implanted regions 3*a* are formed at shallow locations of the outermost portion of the pn-repeating structure or of a region one stage before the outermost portion.

After this, resist pattern 31*v* is removed by means of, for example, ashing.

The implantation concentration of phosphorus ions that are implanted in the outermost portion of the pn-repeating structure or in a region one stage before the outermost portion in the steps of FIGS. 130 to 132 is approximately half of the implantation concentration of phosphorus ions that have been implanted in the center portion.

Here, the order of the respective implantations, which are the above described implantation to a deep location (FIG. 130), the implantation to a location of a middle depth (FIG. 131) and the implantation to a shallow location (FIG. 132), can be switched. Furthermore, the process of phosphorus ion implantation into the outermost portion of the pn-repeating structure or into a region one stage before the outermost portion can be switched as a whole with the above described implantation process of boron ions or phosphorus ions into the center portion.

Here, though in this example implantations at energy levels of three stages are described, ion may be implanted in two stages or in one stage in the case that an element of a class wherein withstand voltage is low has a thin epitaxial layer and, contrarily, in some cases ions are implanted in four, or more, stages in the case that an element of a class wherein withstand voltage is high has a thick epitaxial layer. Therefore, the present embodiment is not limited to having three stages.

Figure 133:
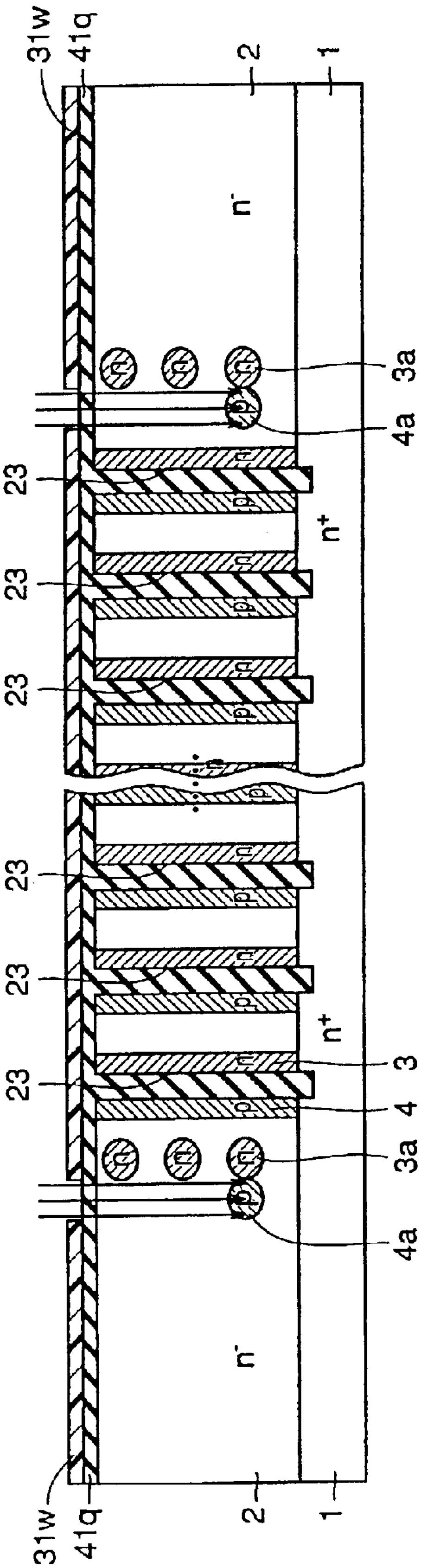

In reference to FIG. 133, resist pattern 31*w*, having a predetermined pattern, is formed on film 41*q* by means of photomechanical technology. Ion implantation of boron ions is carried out at a high energy level using this resist pattern 31*w* as a mask and, thereby, boron ion implanted regions 4*a* are formed at deep locations of the outermost portion in the pn-repeating structure or a region one stage before the outermost portion.

Here, though a case wherein ions are implanted through thick buried film 41*q* by using resist pattern 31*w* as a mask is described in reference to FIG. 133, ions can be implanted after film 41*q* is etched or ions can be implanted after resist pattern 31*w* is also removed so that only the pattern of film 41*q* is used as a mask, if necessary.

Figure 134:
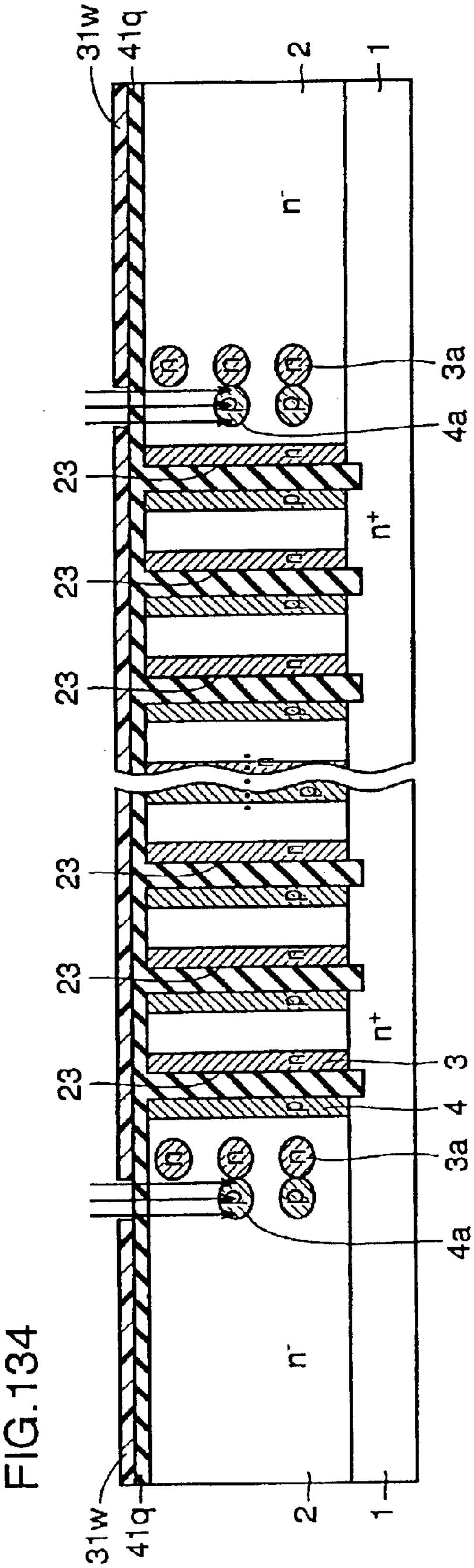

In reference to FIG. 134, ion implantation of boron ions is carried out at a middle energy level by using the above described resist pattern 31*w* as a mask and, thereby, boron ion implanted regions 4*a* are formed at locations of a middle depth of the outermost portion of the pn-repeating structure or of a region one stage before the outermost portion.

Figure 135:
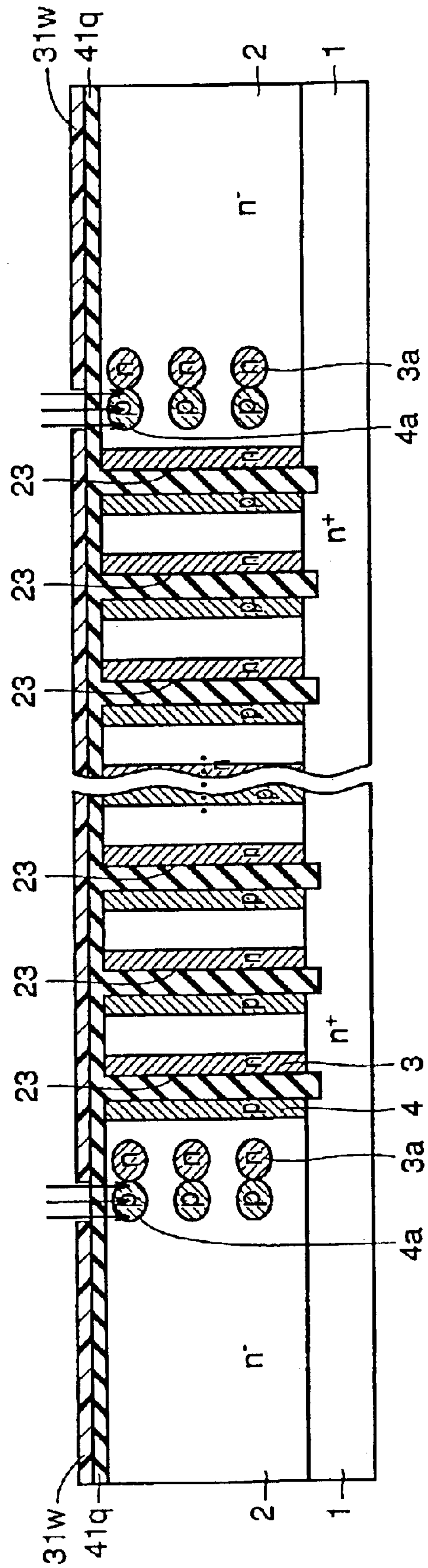

In reference to FIG. 135, ion implantation of boron ions is carried out at a low energy level by using the above described resist pattern 31*w* as a mask and, thereby, boron ion implanted regions 3*a* are formed at shallow locations of the outermost portion of the pn-repeating structure or of a region one stage before the outermost portion. After this, resist pattern 31*w* is removed by means of, for example, ashing.

The implantation concentration of boron ions that are implanted in the outermost portion of the pn-repeating structure or in a region one stage before the outermost portion in the steps of FIGS. 133 to 135 is approximately half of the implantation concentration of boron ions that have been implanted in the center portion.

Here, the order of the respective implantations, which are the above described implantation to a deep location (FIG. 133), the implantation to a location of a middle depth (FIG. 134) and the implantation to a shallow location (FIG. 135), can be switched. Furthermore, the process of boron ion implantation for giving a low concentration into the outermost portion of the pn-repeating structure or into a region one stage before the outermost portion can be switched as a whole with the above described implantation process of boron ions or phosphorus ions for giving a high concentration into the center portion or implantation process of phosphorus ions for giving a low concentration into the outermost portion of the pn-repeating structure or into a region one stage before the outermost portion.

Here, these processes are not limited to the ion implantations for lowering the concentration in three stages and the number of stages may be greater or smaller than this in the same manner in the above described phosphorous ion implanted regions 3*a*.

Though in the present embodiment a case wherein only one column of a pn combination made of a p layer and an n layer of a low concentration is formed at the outermost portion of the pn-repeating structure is cited as an example for the purpose of simplification, the number of columns is not limited to this.

Figure 136:
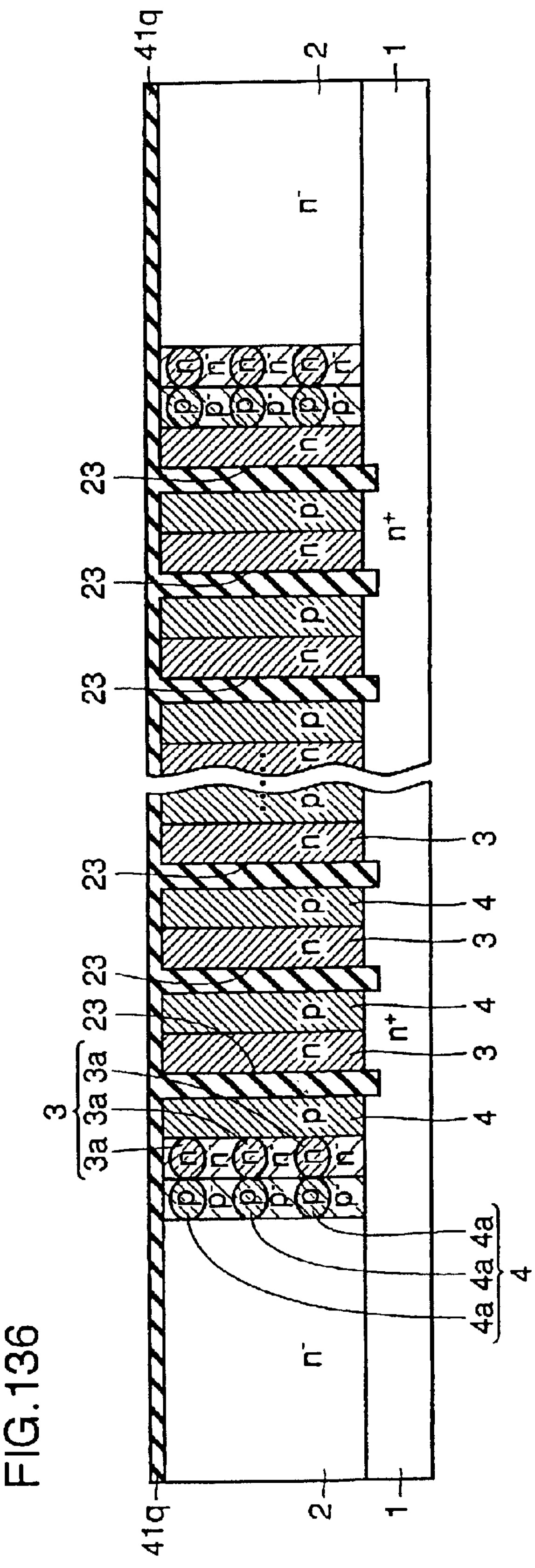

In reference to FIG. 136, a heat treatment is carried out and, thereby, the respective impurities of a plurality of boron ion implanted regions 4*a* and a plurality of phosphorous ion implanted regions 3*a* aligned in the depth direction of the semiconductor substrate are diffused into the surrounding areas so as to be integrated and, then, p-type impurity regions 4 and n-type drift regions 3 forming the pn-repeating structure are formed. After this, MOS-FET formation portions, electrodes, and the like, are formed.

Here, though in FIG. 136, the connected n-type drift regions 3 and p-type impurity regions 4 are represented in two stages of a low concentration and of a high concentration for the purpose of simplification, in actuality, the concentration changes without discrete stages and in a continuous manner. In addition, though the p-type impurity region 4 of a low concentration at the outermost portion of the pn-repeating structure has a wavy cross sectional form that spreads somewhat to the outer periphery in a portion having a high impurity concentration, this detail is omitted for the purpose of simplification.

Thirty-Seventh Embodiment

A manufacturing method in the case that high energy ion implantation is carried out in multiple stages at the time when the concentration is lowered at the outermost portion of the pn repeating structure in an STM structure and in the case that a p-type impurity region is located at the outermost portion of the pn-repeating structure is described in detail as the thirty-seventh embodiment in reference to FIGS. 137 to 140.

The manufacturing method of the present embodiment, first, follows the steps shown in FIGS. 70 to 72 and, after that, follows the additional steps of FIGS. 129 to 132. Thereby, a plurality of trenches 23, phosphorous ion implanted regions 3 and boron ion implanted regions 4 formed in the sidewalls on both sides of respective trenches 23, a film 41*q* filling in respective trenches 23 and a phosphorus ion implanted region 3*a* located one stage before the outermost portion of the pn-repeating structure are formed.

Figure 137:
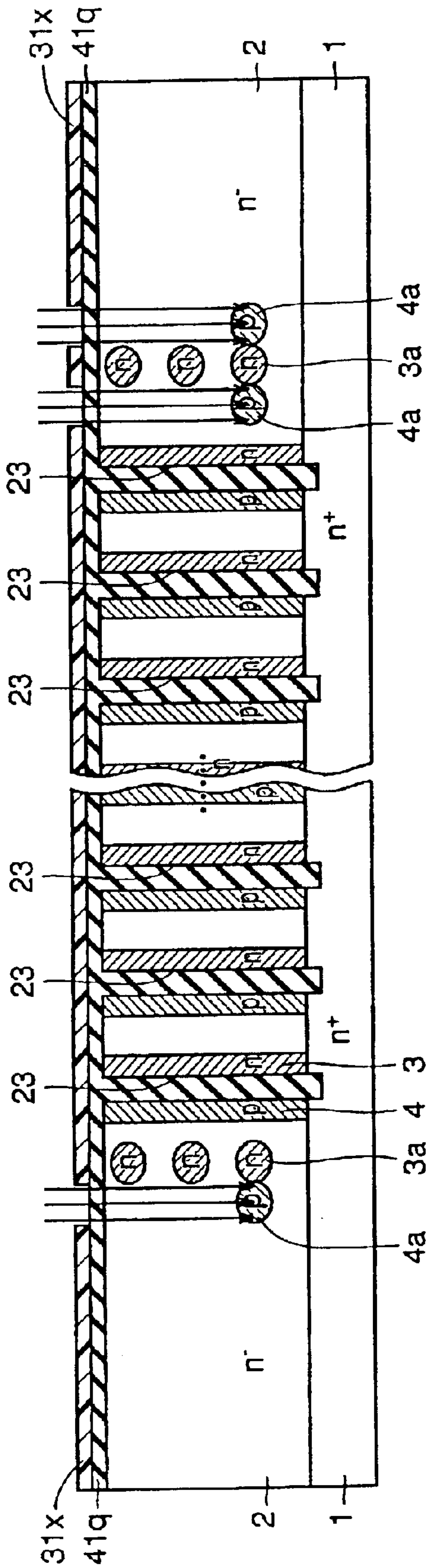
FIGS. 137 to 140 are schematic perspective views showing a manufacturing method for a semiconductor device in the order of the steps according to the thirty-seventh embodiment, of the present invention.

In reference to FIG. 137, a resist pattern 31*x* having a predetermined pattern is formed on film 41*q* by means of photomechanical technology. Ion implantation of boron ions is carried out at a high energy level using this resist pattern 31*x* as a mask and, thereby, a boron ion implanted region 4*a* is formed at a deep location in a region that becomes the outermost portion of the pn-repeating structure.

Here, though a case is described in reference to FIG. 137 wherein ions are implanted through thick buried film 41*q* using resist pattern 31*x* as a mask, ions can be implanted after film 41*q* is etched or ions can be implanted after removing resist pattern 31*x* so that only the pattern of film 41*q* is used as a mask.

Figure 138:
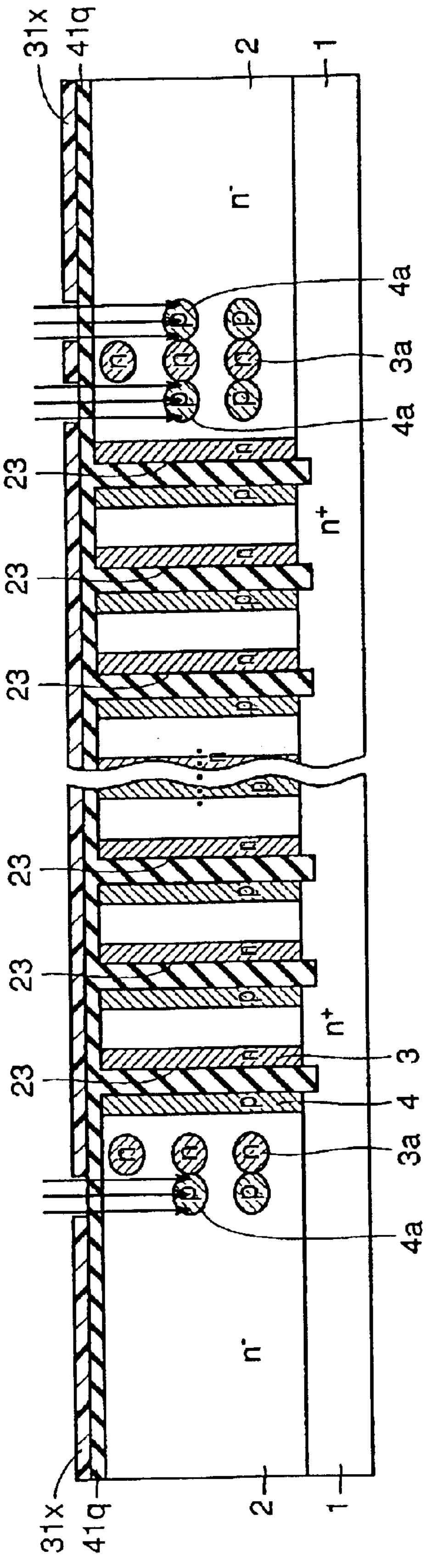

In reference to FIG. 138, ion implantation of boron ions is carried out at a middle energy level using the above described resist pattern 31*x* as a mask and, thereby, a boron ion implanted region 4*a* is formed at a location of a middle depth in a region that becomes the outermost portion of the pn-repeating structure.

Figure 139:
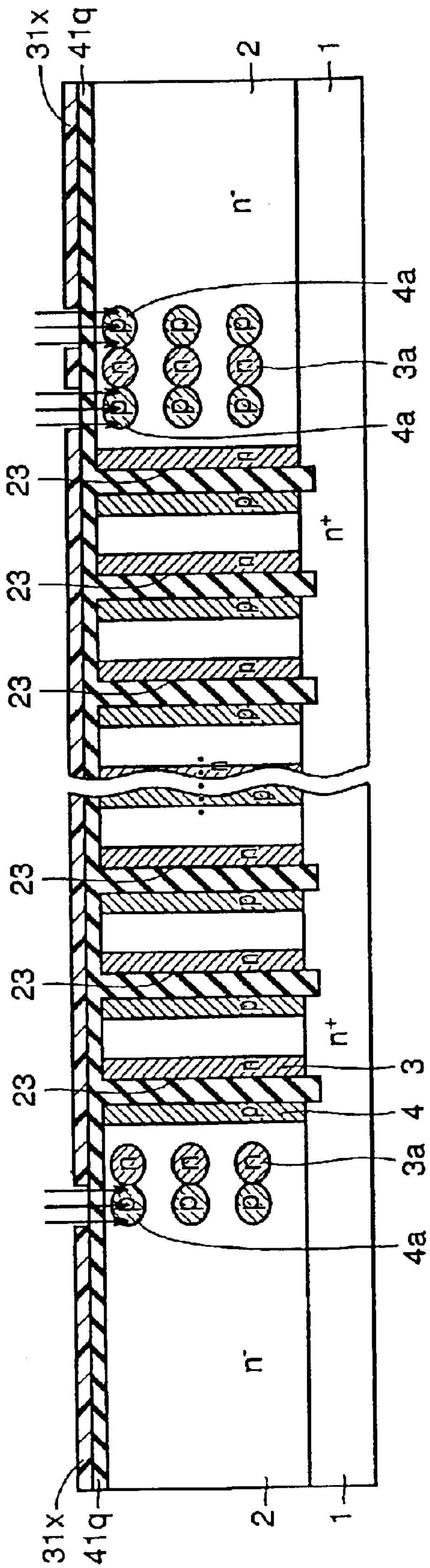

In reference to FIG. 139, ion implantation of boron ions is carried out at a low energy level using the above described resist pattern 31*x* as a mask and, thereby, a boron ion implanted region 4*a* is formed at a shallow location in a region that becomes the outermost portion of the pn-repeating structure. After this, resist pattern 31*x* is removed by means of, for example, ashing.

The implantation concentration of boron ions implanted in the outermost portion of the pn-repeating structure in the steps of FIGS. 137 to 139 is set at approximately half the implantation concentration of boron ions implanted into the center portion.

Here, the order of the respective implantations, which are the above described implantation into a deep location (FIG. 137), implantation into a middle location (FIG. 138) and implantation into a shallow location (FIG. 139), can be switched. Furthermore, these implantation steps of boron ions of a low concentration into the outermost portion can be switched as a whole with the above described implantation steps of boron ions or phosphorus ions of a high concentration into the center portion or with the implantation steps of phosphorus ions of a low concentration into a region one stage closer to the center portion from the outermost portion of the pn-repeating structure.

Here, these steps are not limited to the ion implantations in three stages but, rather, the number of ion implantations may be greater than, or fewer than, this in the same manner as in the above described ion implantations into phosphorus ion implanted region 3*a*.

Though in the present embodiment, a case wherein only one column of a pn combination made of a p layer and an n layer of a low concentration is formed at the outermost portion of the pn-repeating structure is cited as an example for the purpose of simplification, the invention is not specifically limited to this.

Figure 140:
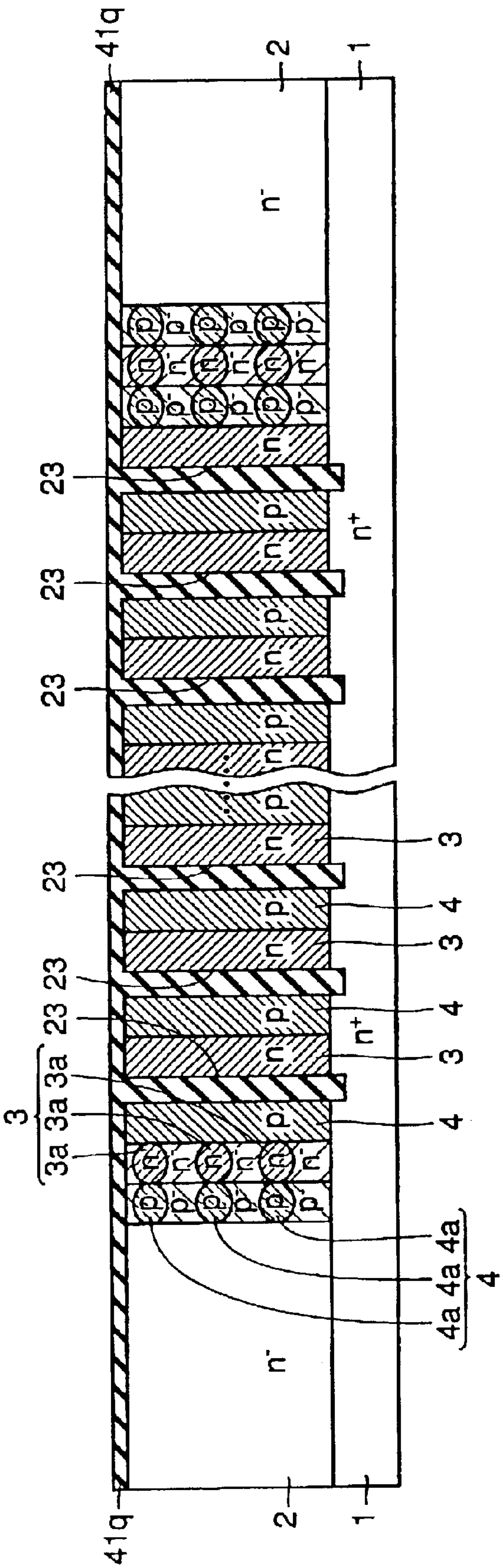

In reference to FIG. 140, a heat treatment is carried out and, thereby, the plurality of boron ion implanted regions 4*a* and the plurality of phosphorous ion implanted regions 3*a* aligned in the depth direction of the semiconductor substrate, respectively, are diffused into the surrounding areas so as to be integrated and, thereby, p-type impurity region 4 and n-type drift region 3 forming the pn-repeating structure are formed. After this, MOS-FET configuration portions, electrodes, and the like, are formed.

Here, though the connected n-type drift regions 3 and p-type impurity regions 4 are represented in FIG. 140 as having two stages, of a low concentration and a high concentration for the purpose of simplification, in actuality the concentration changes without discrete stages and in a continuous manner. In addition, though p-type impurity region 4 of a low concentration at the outermost portion of the pn-repeating structure has a wavy cross sectional form that spreads somewhat to the outer periphery in a portion having a high impurity concentration, the detailed description of this is omitted for the purpose of simplification.

Thirty-Eighth to Fortieth Embodiments

Figure 141:
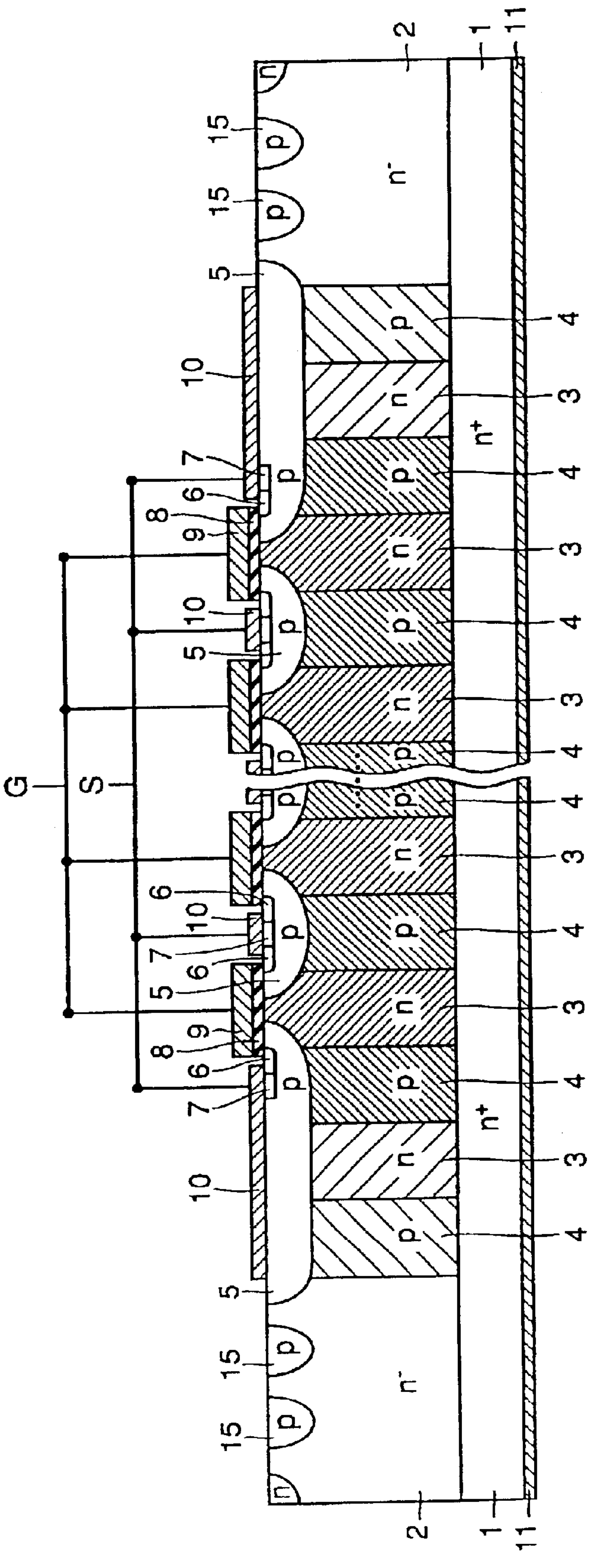
FIG. 141 is a cross sectional view schematically showing the configuration of a semiconductor device according to the thirty-eighth embodiment of the present invention.
Figure 142:
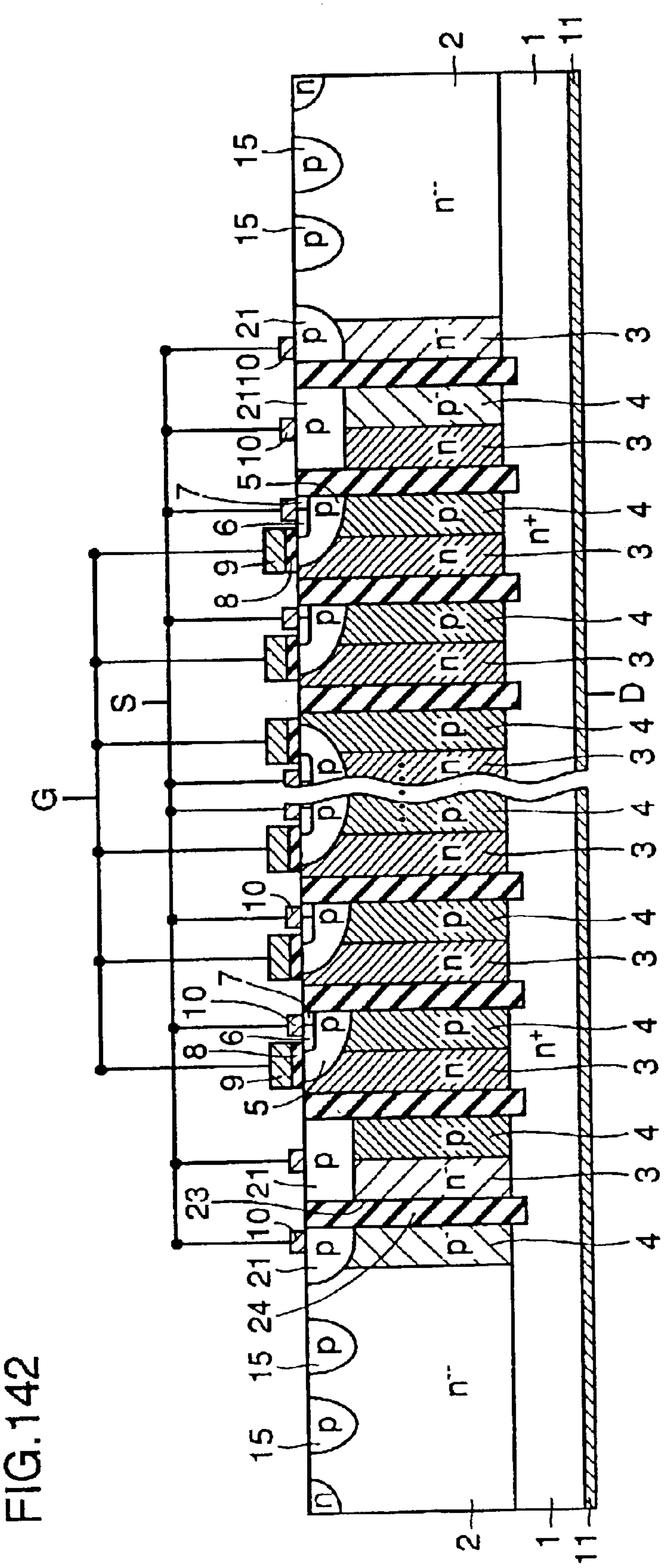
FIG. 142 is a cross sectional view schematically showing the configuration of a semiconductor device according to the thirty-ninth embodiment of the present invention.
Figure 143:
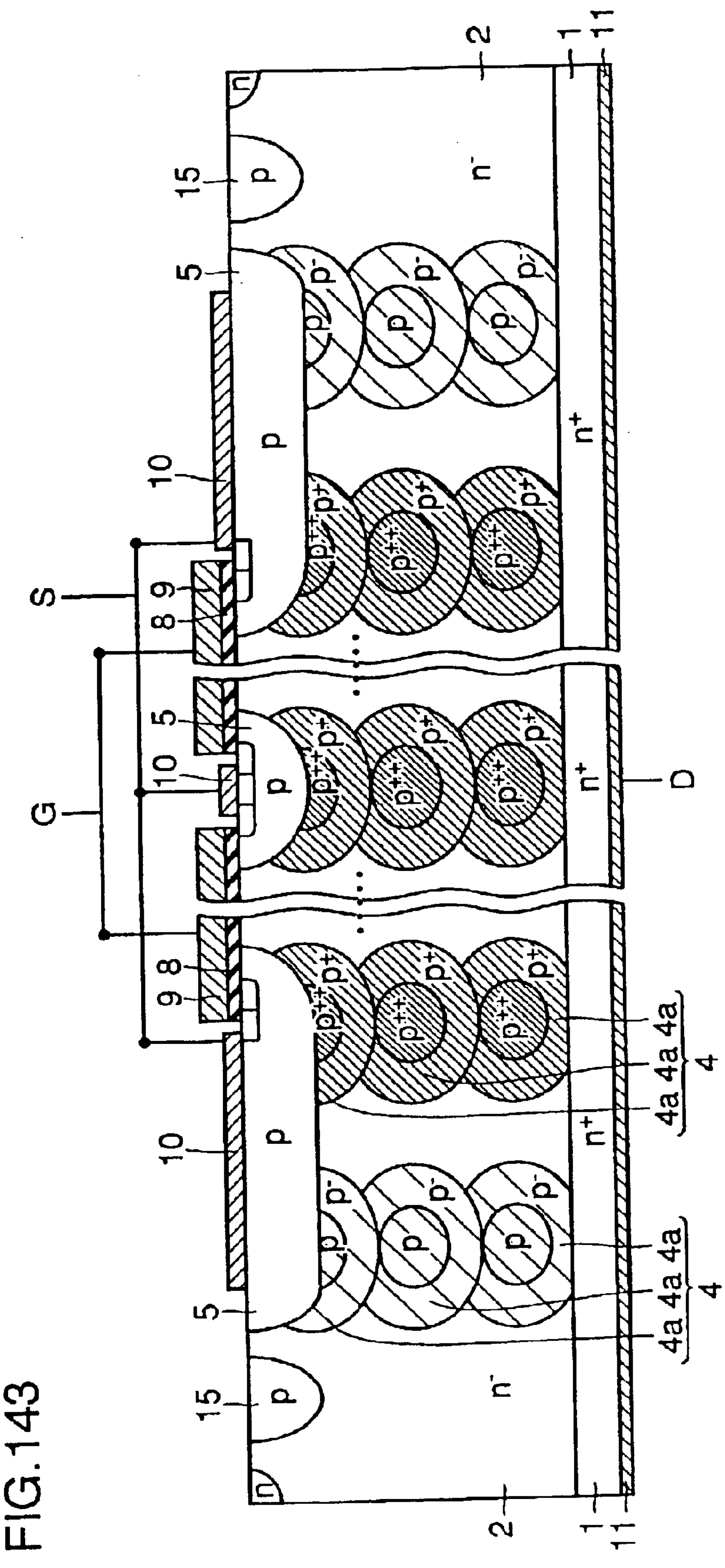
FIG. 143 is a cross sectional view schematically showing the configuration of a semiconductor device according to the fortieth embodiment of the present invention.

Configurations wherein an active element is not formed at the outermost portion of the pn-repeating structure are shown as the thirty-eighth to fortieth embodiments in FIGS. 141 to 143.

In reference to FIG. 141, the configuration of the thirty-eighth embodiment shares with the configuration of FIG. 3 the point that the concentration is lowered in only one pair (one stage) made up of p-type impurity region 4 and n-type drift region 3 at the outermost portion, on both the left and right sides, of the pn-repeating structure and differs from the configuration of FIG. 3 in the point that a MOS-FET, which is an active element, is not formed above the regions wherein the concentration is lowered in the present embodiment.

p-type impurity regions 5 are formed above p-type impurity regions 4 and n-type drift regions 3 of a low concentration at the outermost portions of the pn-repeating structure and are electrically connected to source electrodes 10 while $n^+$ source regions 6 and gate electrodes 9, which are components of MOS-FETs, are not formed in the present embodiment.

Here, the other parts of the configuration are approximately the same as the configuration shown in FIG. 3 and, therefore, the same symbols are attached to the same members, of which the descriptions are omitted.

In reference to FIG. 142, the configuration of the thirty-ninth embodiment shares with the configuration of FIG. 87 the point that the concentration is lowered in only one pair (one stage) made of p-type impurity region 4 and n-type drift region 3 at the outermost portion of the pn-repeating structure in the STM having a structure wherein gates are parallel to trenches and differs from the configuration of FIG. 87 in the point that a MOS-FET, which is an active element, is not formed above the region wherein the concentration is lowered in the present embodiment.

p-type impurity regions 21 are formed above p-type impurity regions 4 and n-type drift regions 3 of a low concentration at the outermost portions of the pn-repeating structure and are electrically connected to source electrodes 10 while $n^+$ source regions 6 and gate electrodes 9, which are components of MOS-FETs, are not formed in the present embodiment.

Here, the other parts of the configuration are approximately the same as the configuration shown in FIG. 87 and, therefore, the same symbols are attached to the same members, of which the descriptions are omitted.

In reference to FIG. 143, the configuration of the fortieth embodiment shares with the configuration of FIG. 6 the point that the concentration is lowered in only p-type impurity region 4 at outermost portion of the pn-repeating structure in the buried multi-layer epitaxial structure and differs from the configuration of FIG. 6 in the point that a MOS-FET, which is an active element, is not formed above the region wherein the concentration is lowered.

p-type impurity regions 5 are formed above p-type impurity regions 4 of a low concentration at the outermost portions of the pn-repeating structure and are electrically connected to source electrodes 10 while $n^+$ source regions 6 and gate electrodes 9, which are components of MOS-FETs, are not formed in the present embodiment.

Here, the other parts of the configuration are approximately the same as the configuration shown in FIG. 6 and, therefore, the same symbols are attached to the same members, of which the descriptions are omitted.

Forty-First Embodiment

Figure 144:
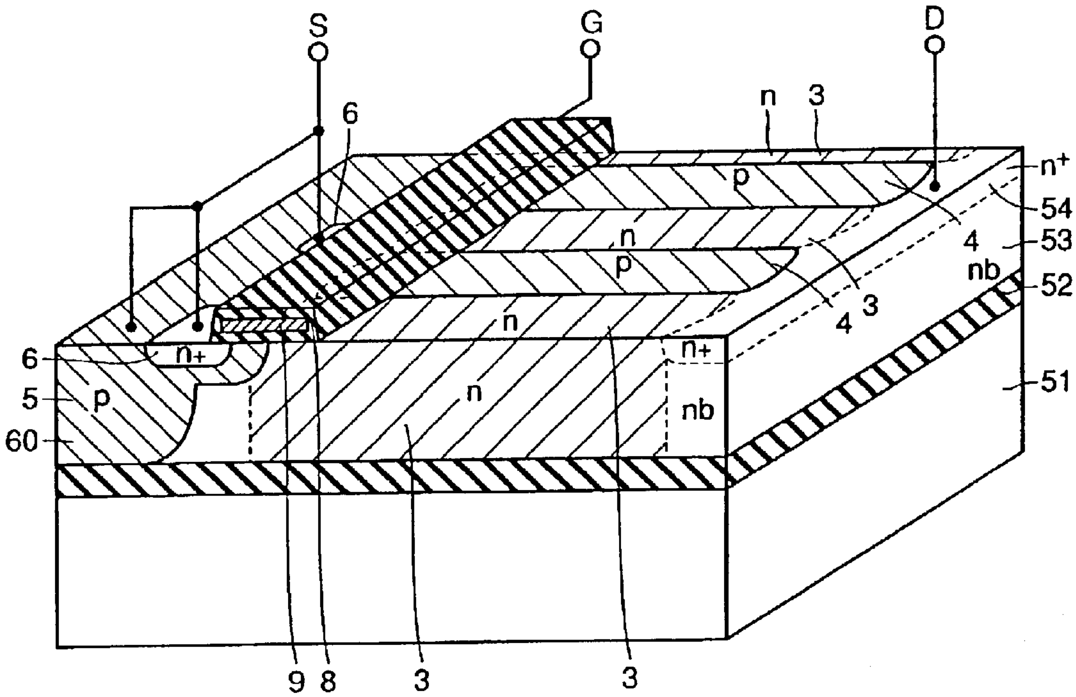
FIG. 144 is a cross sectional view schematically showing the configuration of a semiconductor device according to the forty-first embodiment of the present invention.
Figure 145:
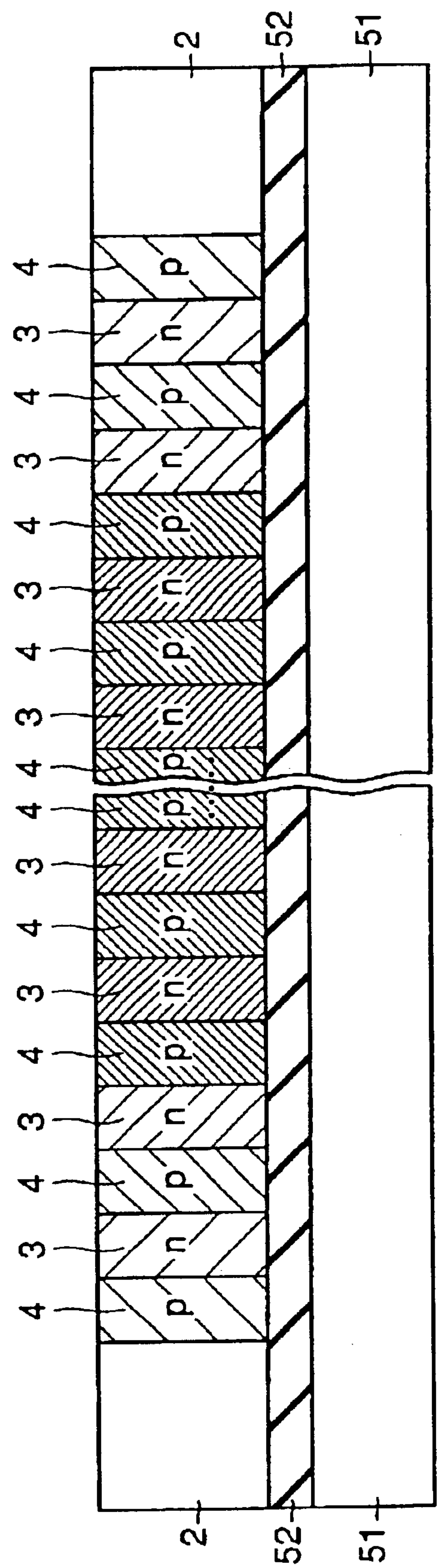
FIG. 145 is a view showing a cross section of the pn-repeating structure in the configuration of FIG. 144.

A configuration wherein the concentration is lowered at the outermost portion of the pn-repeating structure of a horizontal power MOS-FET mounted on an SOI (Silicon On Insulator) substrate is described in detail as the forty-first embodiment in reference to FIGS. 144 and 145.

In reference to FIGS. 144 and 145, a semiconductor layer 60 is formed above a silicon substrate 51 via an insulating film 52, such as a silicon oxide film. Then, a horizontal power MOS-FET having a pn-repeating structure, wherein the concentration is lowered at the outermost portion, is formed according to the present invention.

p-type impurity regions 4 and n-type impurity regions 3 are formed in alternation so as to form a pn-repeating structure in this semiconductor layer 60. Then, the concentration is lowered in two stages at the outermost portion of this pn-repeating structure having one pair made up of a pn combination as one unit, as shown in FIG. 145.

Here, p-type region 5 is formed so as to form a pn junction with n-type impurity regions 3 and so as to be electrically connected to p-type impurity regions 4. In addition, $n^+$ source regions 6 are formed so that portions of p-type region 5 are placed between $n^+$ source regions 6 and n-type impurity regions 3. A gate electrode layer 9 is formed so as to face p-type region 5 placed between n-type impurity regions 3 and $n^+$ source regions 6 via a gate insulating layer 8. This gate electrode layer 9 extends in the direction of pn repetition above the first main surface.

An $n^+$ region 54 and an nb region 53 are formed on the side opposite to p-type region 5 of the pn-repeating structure and $n^+$ region 54 is electrically connected to a drain electrode.

Figure 146:
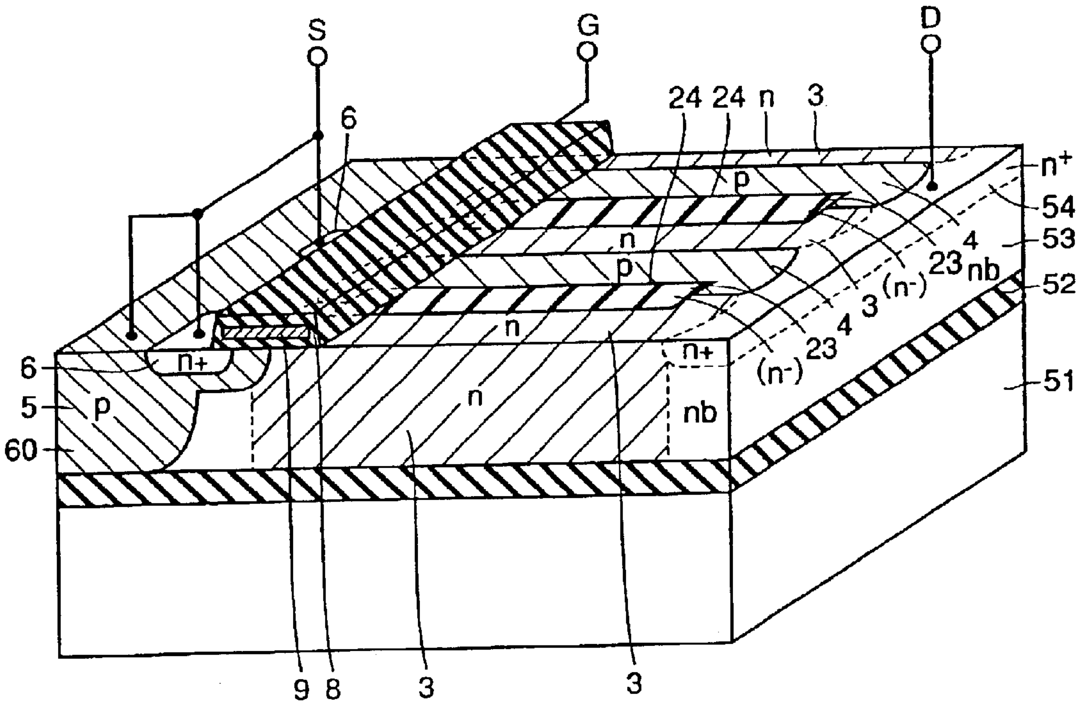
FIG. 146 is a perspective view schematically showing the configuration wherein trenches are provided in the pn-repeating structure in the configuration of FIG. 144.
Figure 147:
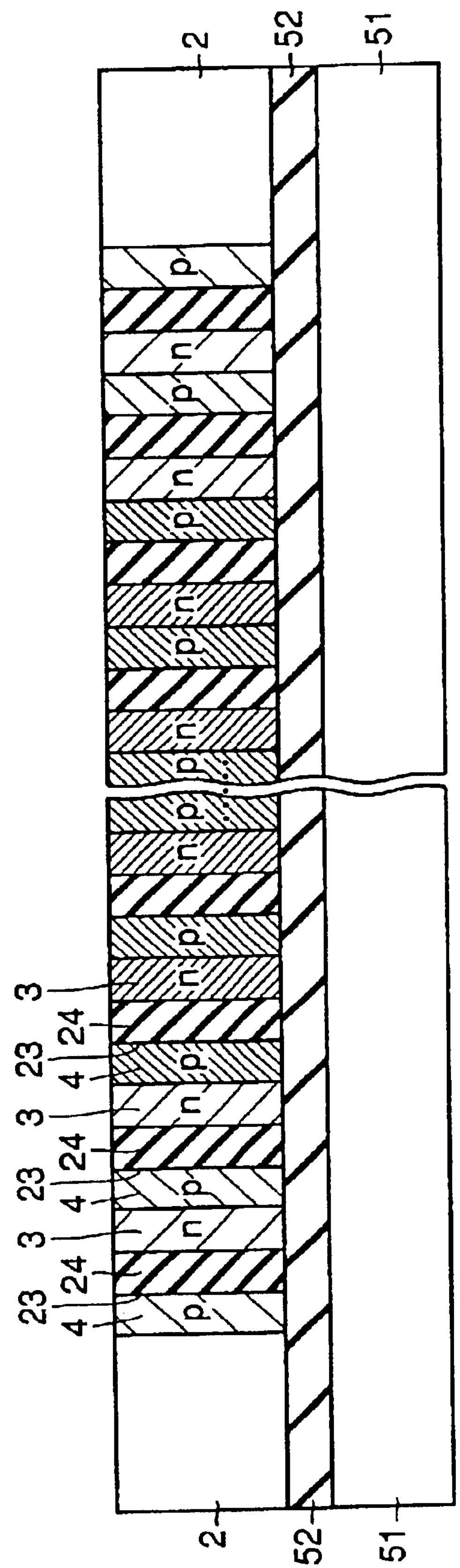
FIG. 147 is a view showing a cross section of the pn-repeating structure in the configuration of FIG. 146.

Here, trenches may be provided between p-type impurity regions 4 and n-type impurity regions 3 in the above described pn-repeating structure and, in this case, trenches 23 filled in with insulators 24, or the like, are located between p-type impurity regions 4 and n-type impurity regions 3, as shown in FIGS. 146 and 147.

Forty-Second Embodiment

In the above described twenty-third, twenty-eighth and thirty-fourth embodiments, the region wherein the concentration is lowered at the outermost portion of the pn-repeating structure is formed by carrying out a counter ion implantation (counter doping) in the sidewalls of the trench located at the edge portion of the repeating structure. In contrast to this, impurities of the same conductive type as the impurities that have already been implanted into the sidewalls of the trenches located in the center portion of the pn-repeating structure are additionally implanted and, thereby, the concentrations of p layers 4 and n layers 3 of the pn-repeating structure in the center portion are enhanced so that the concentration of the impurity region in the sidewall of the trench at the outermost portion of the repeating structure may become relatively low. In the following, this is concretely described.

In the twenty-third embodiment, first, p-type impurity regions 4 and n-type impurity regions 3 of a comparatively low concentration are formed in the sidewalls of trenches 23 by following the steps of FIGS. 79 to 81. After this, the filling within trenches 23 in the center portion of pn-repeating structure is removed. Then, additional p-type impurities are implanted into p-type impurity regions 4 in the sidewalls on one side of these trenches 23 in the center portion and additional n-type impurities are implanted into n-type impurity regions 3 in the sidewalls on the other side. Thereby, the concentrations of p-type impurity regions 4 and n-type impurity regions 3 in the sidewalls of trenches 23 in the center portion of the repeating structure are enhanced so that impurity regions 3 and 4 in the sidewalls of trench 23 at the outermost portion of the repeating structure become relatively low concentration regions.

In addition, in the twenty-eighth embodiment, first, p-type impurity regions 4 and n-type impurity regions 3 of a comparatively low concentration are formed in the sidewalls of trenches 23 by following the steps of FIGS. 106 to 110. After this, the filling within trenches 23 in the center portion of pn-repeating structure is removed. Then, additional p-type impurities are implanted in p-type impurity regions 4 in the sidewalls on both sides of trenches 23 in this center portion and additional n-type impurities are implanted into n-type impurity regions 3 in the sidewalls on both sides of other trenches 23 in the center portion. Thereby, the concentrations of p-type impurity regions 4 and n-type impurity regions 3 in the sidewalls of trenches 23 in the center portion of the repeating structure are enhanced so that impurity regions 3 and 4 in the sidewalls of trench 23 at the outermost portion of the repeating structure become relatively low concentration regions.

In addition, in the thirty-fourth embodiment, first, p-type impurity regions and n-type impurity regions 3 of a comparatively low concentration are formed in the sidewalls of trenches 23 by following the steps of FIGS. 120 to 123. After this, the filling within trenches 23 in the center portion of pn-repeating structure is removed. Then, additional p-type impurities are implanted in p-type impurity regions 4 in the sidewalls on both sides of trenches 23 in this center portion and additional n-type impurities are implanted into n-type impurity regions 3 in the sidewalls on both sides of other trenches 23 in the center portion. Thereby, the concentrations of p-type impurity regions 4 and n-type impurity regions 3 in the sidewalls of trenches 23 in the center portion of the repeating structure are enhanced so that impurity regions 3 and 4 in the sidewalls of trench 23 at the outermost portion of the repeating structure become relatively low concentration regions.

Here, though in the above described second to forty-second embodiments, a case is described wherein the concentration of the impurity region located at the outermost portion of the pn-repeating structure is lower than that in the center portion, the same effect can be obtained by setting the general effective charge amount of the impurity region located at the outermost portion of the-pn-repeating structure to be smaller than that in the center portion, as described in the first embodiment.

Effects of the Invention

By using the present invention the main withstanding voltage of a power semiconductor device wherein a three-dimensional multiple RESURF principle with an element withstand voltage in a broad range of 20 V to 6000 V is specifically applied can be improved and the tradeoff relationship between the main withstanding voltage and the ON resistance can also be improved so that an inexpensive semiconductor device having a low power loss and having a small chip size can be obtained.

In addition, by using trenches of a DLT structure and manufacturing method corresponding to these, a semiconductor device having a good yield can be obtained at a lower cost.

Here, the embodiments disclosed herein should be considered to be illustrative from all points of view and are not limitative. The scope of the present invention is not defined by the above description but, rather, is defined by the claims and is intended to include meanings equivalent to the claims and all modifications within the scope.

Industrial Applicability

The present invention can be advantageously applied to a power semiconductor device and a manufacturing method for the same wherein a three-dimensional multiple RESURF principle with a element withstand voltage in a broad range of 20 V to 6000 V is specifically applied.

What is claimed is:

1. A semiconductor device having a repeating structure wherein a structure where a first impurity region of a first conductive type and a second impurity region of a second conductive type are aligned side by side is repeated twice, or more, in a semiconductor substrate of the first conductive type, wherein the semiconductor device is characterized in that a low concentration region that is either said first or second impurity region located at the outermost portion of said repeating structure has the lowest impurity concentration or has the least generally effective charge amount from among all of said first and second impurity regions forming said repeating structure, and characterized in that the impurity concentration of said low concentration region is no lower than 30% and no higher than 70% of the impurity concentration of a high concentration region that is either said first or second impurity region located closer to the center portion of said repeating structure than is said lower concentration region.

2. The semiconductor device according to claim 1, characterized in that said semiconductor substrate has a first main surface and a second main surface facing each other, a third impurity region of the second conductive type is formed at least at a portion on said first main surface side in at least one of said plurality of first impurity regions forming said repeating structure so as to form a main pn junction with said first impurity regions (a), and a fourth impurity region of the first conductive type is formed on said second main surface side of said repeating structure.

3. The semiconductor device according to claim 1, characterized in that said third impurity region forming a main pn junction with said first impurity region is a body region of an insulating gate type field effect transistor portion, said semiconductor substrate has a first main surface and a second main surface facing each other, and a third impurity region of the second conductive type is formed at least at a portion on said first main surface side in at least one of said plurality of first impurity regions forming said repeating structure so as to form a main pn junction with said first impurity regions.

4. The semiconductor device according to claim 1, characterized in that said semiconductor substrate has a first main surface and a second main surface facing each other and has a plurality of trenches in said first main surface, and said repeating structure has a structure wherein a structure where said first and second impurity regions is aligned with said trench located in between is repeated twice or more.

5. The semiconductor device according to claim 1, characterized in that said semiconductor substrate has a first main surface and a second main surface facing each other and has a plurality of trenches including first and second trenches adjoining each other in said first main surface, and a structure where said first impurity region is formed on each of the two sidewalls of said first trench and said second impurity region is formed on each of the two sidewalls of said second trench is repeated twice or more.

6. A manufacturing method for a semiconductor device having a structure wherein a structure where a first impurity region of a first conductive type and a second impurity region of a second conductive type are aligned side by side is repeated twice or more in a semiconductor substrate of the first conductive type, characterized in that a low concentration region that is either said first or second impurity region located at the outermost portion of said repeating structure and said first and second impurity regions, other than the low concentration region, are formed so as to have independently changed concentrations so that said low concentration region has the lowest impurity concentration or has the least generally effective charge amount among all of said first and second impurity regions forming said repeating structure, and characterized in that said low concentration region and said other first and second impurity regions are formed by means of ion implantation and heat treatment wherein the concentrations have been independently changed in order to form said low concentration region and said other first and second impurity regions of which the concentrations have been independently changed.

7. The manufacturing method for a semiconductor device according to claim 6, characterized in that said other first and second impurity regions are formed of impurity ions implanted through first openings of a mask for ion implantation and said low concentration region is formed of impurity ions implanted through second openings of which the total opening area is smaller than that of said first openings in order to form said low concentration region and said other first and second impurity regions of which the concentrations have been independently changed.

8. A manufacturing method for a semiconductor device having a structure wherein a structure where a first impurity region of a first conductive type and a second impurity region of a second conductive type are aligned side by side is repeated twice or more in a semiconductor substrate of the first conductive type, characterized in that a low concentration region that is either said first or second impurity region located at the outermost portion of said repeating structure and said first and second impurity regions, other than the low concentration region, are formed so as to have independently changed concentrations so that said low concentration region has the lowest impurity concentration or has the least generally effective charge amount among all of said first and second impurity regions forming said repeating structure, and characterized by further comprising the steps of:

simultaneously forming one, or more, trench(es) and a trench of a dotted line form that is located along the outside of said one, or more, trench(es) wherein a plurality of first holes is arranged at intervals in a predetermined direction and that, thereby, has a surface pattern of a dotted line form in said first main surface; and simultaneously forming said low concentration region in the sidewall on one side of said trench of a dotted line form and said other first and second impurity regions in the sidewalls on one side of said one, or more, trenches by simultaneously carrying out an ion implantation in the sidewalls on one side of the respective trenches of said one, or more, trench and said trench of a dotted line form.

9. A manufacturing method for a semiconductor device having a structure wherein a structure where a first impurity region of a first conductive type and a second impurity region of a second conductive type are aligned side by side is repeated twice or more in a semiconductor substrate of the first conductive type, characterized in that a low concentration region that is either said first or second impurity region located at the outermost portion of said repeating structure and said first and second impurity regions, other than the low concentration region, are formed so as to have independently changed concentrations so that said low concentration region has the lowest impurity concentration or has the least generally effective charge amount among all of said first and second impurity regions forming said repeating structure, and characterized by further comprising the steps of:

creating two, or more, trenches in the first main surface of said semiconductor substrate;

ion implantation of impurities into the sidewalls on one side of said two, or more, trenches in order to form said first or second impurity regions; and forming said low concentration region by carrying out an ion implantation of impurities of a conductive type opposite to that of the already implanted impurities in the sidewall on one side of said trench located at the outermost portion under the condition wherein said two, or more, trenches except the trench located at the outermost portion are filled in with a filling layer so that the concentration of the already implanted impurities is substantially lowered.

10. A manufacturing method for a semiconductor device having a structure wherein a structure where a first impurity region of a first conductive type and a second impurity region of a second conductive type are aligned side by side is repeated twice or more in a semiconductor substrate of the first conductive type, characterized in that a low concentration region that is either said first or second impurity region located at the outermost portion of said repeating structure and said first and second impurity regions, other than the low concentration region, are formed so as to have independently changed concentrations so that said low concentration region has the lowest impurity concentration or has the least generally effective charge amount among all of said first and second impurity regions forming said repeating structure, and characterized by further comprising the steps of:

creating one, or more, trench(es) in a first main surface of said semiconductor substrate;

ion implantation of a first implantation amount for forming said first of second impurity region in the sidewalls on one side of said one, or more, trenches;

creating a new trench at the outermost portion outside of said one, or more, trench(es) under the condition wherein each of said one, or more, trench(es) is filled in with a filling layer; and ion implantation of a second implantation amount that is smaller than said first implantation amount for forming said low concentration region in the sidewall on one side of said trench at the outermost portion.

11. A manufacturing method for a semiconductor device having a structure wherein a structure where a first impurity region of a first conductive type and a second impurity region of a second conductive type are aligned side by side is repeated twice or more in a semiconductor substrate of the first conductive type, characterized in that a low concentration region that is either said first or second impurity region located at the outermost portion of said repeating structure and said first and second impurity regions, other than the low concentration region, are formed so as to have independently changed concentrations so that said low concentration region has the lowest impurity concentration or has the least generally effective charge amount among all of said first and second impurity regions forming said repeating structure, and characterized by further comprising the steps of:

simultaneously creating two, or more, trenches including first and second trenches adjoining each other in a first main surface of said semiconductor substrate and a trench of a dotted line form having a surface pattern of a dotted line form in said first main surface by arranging a plurality of first holes at intervals in a predetermined direction so as to be located along the outside of said two, or more, trenches;

ion implantation of first impurities for forming said first impurity region in each of the sidewalls on both sides of said first trench; and ion implantation of second impurities for forming said second impurity region in each of the sidewalls on both sides of said second trench, wherein said low concentration regions are created in the sidewalls on both sides of said trench of a dotted line through implantation at the same time of the ion implantation of said first or second impurities.

12. A manufacturing method for a semiconductor device having a structure wherein a structure where a first impurity region of a first conductive type and a second impurity region of a second conductive type are aligned side by side is repeated twice or more in a semiconductor substrate of the first conductive type, characterized in that a low concentration region that is either said first or second impurity region located at the outermost portion of said repeating structure and said first and second impurity regions, other than the low concentration region, are formed so as to have independently changed concentrations so that said low concentration region has the lowest impurity concentration or has the least generally effective charge amount among all of said first and second impurity regions forming said repeating structure, and characterized by further comprising the steps of:

creating a first group of trenches made of a plurality of first trenches in a first main surface of said semiconductor substrate;

ion implantation into each of the sidewalls on both sides of said first trenches for forming said first impurity regions;

creating a second group of trenches made of a plurality of second trenches in said first main surface so that said first trenches and said second trenches are positioned in an alternating manner;

ion implantation in each of the sidewalls on both sides of said second trenches for forming said second impurity regions;

implanting ions of a conductive type opposite to that of the already implanted impurities in the sidewalls on both sides of said trench located at the outermost portion under the condition wherein said first and second trenches arranged in an alternating manner except the trench located at the outermost portion are filled in with a filling layer so as to form said low concentration regions by substantially lowering the concentration of the already implanted impurities.

13. A manufacturing method for a semiconductor device having a structure wherein a structure where a first impurity region of a first conductive type and a second impurity region of a second conductive type are aligned side by side is repeated twice or more in a semiconductor substrate of the first conductive type, characterized in that a low concentration region that is either said first or second impurity region located at the outermost portion of said repeating structure and said first and second impurity regions, other than the low concentration region, are formed so as to have independently changed concentrations so that said low concentration region has the lowest impurity concentration or has the least generally effective charge amount among all of said first and second impurity regions forming said repeating structure, and characterized by further comprising the steps of:

creating a first group of trenches made of a plurality of first trenches in a first main surface of said semiconductor substrate;

ion implantation for forming said first impurity regions in the sidewalls on both sides of each of said first trenches;

creating a second group of trenches made of a plurality of second trenches in said first main surface in the condition that each of said first trenches is filled in with a filling layer so that said first trenches and said second trenches are alternately located;

ion implantation for forming said second impurity regions in the sidewalls on both sides of each of said second trenches;

creating a new trench at the outermost portion outside of the trench located at the outermost portion of said first and second trenches that are arranged in an alternating manner under the condition wherein each of said first and second trenches is filled in with a filling layer; and forming said low concentration region of which the impurity concentration is lower than that of said first or second impurity regions by implanting impurity ions of said first or second conductive type into the sidewalls on both sides of said trench at the outermost portion.

14. A manufacturing method for a semiconductor device having a structure wherein a structure where a first impurity region of a first conductive type and a second impurity region of a second conductive type are aligned side by side is repeated twice or more in a semiconductor substrate of the first conductive type, characterized in that a low concentration region that is either said first or second impurity region located at the outermost portion of said repeating structure and said first and second impurity regions, other than the low concentration region, are fanned so as to have independently changed concentrations so that said low concentration region has the lowest impurity concentration or has the least generally effective charge amount among all of said first and second impurity regions forming said repeating structure, and characterized by further comprising the steps of:

simultaneously creating a first group of trenches made of a plurality of first trenches and a second group of trenches made of a plurality of second trenches in a first main surface of said semiconductor substrate so that said first trenches and said second trenches are alternately located;

ion implantation for forming said first impurity regions into the sidewalls on both sides of each of said plurality of first trenches forming said first group of trenches under a condition wherein said second group of trenches is filled in with a first filling layer;

ion implantation for fanning said second impurity regions into the sidewalls on both sides of each of said plurality of second trenches forming said second group of trenches under a condition wherein said first group of trenches is filled in with a second filling layer;

forming said low concentration regions by implanting impurity ions of a conductive type opposite to that of the already implanted impurities into the sidewalls on both sides of said trench at the outermost portion so that the concentration of the already implanted impurities is lowered under the condition wherein all the trenches of said plurality of first trenches forming said first group of trenches and of said plurality of second trenches forming said second group of trenches except the trench at the outermost portion located in the outermost portion.

15. A manufacturing method for a semiconductor device having a structure wherein a structure where a first impurity region of a first conductive type and a second impurity region of a second conductive type are aligned side by side is repeated twice or more in a semiconductor substrate of the first conductive type, characterized in that a low concentration region that is either said first or second impurity region located at the outermost portion of said repeating structure and said first and second impurity regions, other than the low concentration region, are formed so as to have independently changed concentrations so that said low concentration region has the lowest impurity concentration or has the least generally effective charge amount among all of said first and second impurity regions forming said repeating structure, and characterized by further comprising the steps of:

simultaneously creating a first group of trenches made of a plurality of first trenches and a second group of trenches made of a plurality of second trenches in a first main surface of said semiconductor substrate so that said first trenches and said second trenches are alternately located;

ion implantation for forming said first impurity regions into the sidewalls on both sides of each of said plurality of first trenches forming said first group of trenches under a condition wherein said second group of trenches is filled in with a first filling layer; and ion implantation for forming said second impurity regions into the sidewalls on both sides of each of said plurality of second trenches forming said second group of trenches under a condition wherein said first group of trenches is filled in with a second filling layer, wherein the trench at the outermost portion located at the outermost portion from among said plurality of first trenches forming said first group of trenches and said plurality of second trenches forming said second group of trenches is a trench of a dotted line form having a surface pattern of a dotted line form wherein a plurality of holes is arranged at intervals in a predetermined direction in said first main surface.

16. A manufacturing method for a semiconductor device having a structure wherein a structure where a first impurity region of a first conductive type and a second impurity region of a second conductive type are aligned side by side is repeated twice or more in a semiconductor substrate of the first conductive type, characterized in that a low concentration region that is either said first or second impurity region located at the outermost portion of said repeating structure and said first and second impurity regions, other than the low concentration region, are formed so as to have independently changed concentrations so that said low concentration region has the lowest impurity concentration or has the least generally effective charge amount among all of said first and second impurity regions forming said repeating structure, and characterized by further comprising the steps of:

creating two, or more, trenches in a first main surface of said semiconductor substrate;

ion implantation of impurities into the sidewalls on one side of said two, or more, trenches for forming said first or second impurity regions; and ion implantation of impurities of the same conductive type as that of the already implanted impurities into the sidewalls on one side of the trenches other than said trench located at the outermost portion under the condition wherein the trench located at the outermost portion from among said two, or more, trenches is filled in with a filling layer and, thereby, the concentration of the already implanted impurities is substantially increased so that said first or second impurity region in the sidewall of said trench located at the outermost portion becomes a region of a comparatively low concentration.

17. A manufacturing method for a semiconductor device having a structure wherein a structure where a first impurity region of a first conductive type and a second impurity region of a second conductive type are aligned side by side is repeated twice or more in a semiconductor substrate of the first conductive type, characterized in that a low concentration region that is either said first or second impurity region located at the outermost portion of said repeating structure and said first and second impurity regions, other than the low concentration region, are formed so as to have independently changed concentrations so that said low concentration region has the lowest impurity concentration or has the least generally effective charge amount among all of said first and second impurity regions forming said repeating structure, and characterized by further comprising the steps of:

creating a first group of trenches made of a plurality of first trenches in a first main surface of said semiconductor substrate;

ion implantation for forming said first impurity regions in the sidewalls on both sides of each of said first trenches;

creating a second group of trenches made of a plurality of second trenches in said first main surface so that said first trenches and said second trenches are arranged in an alternating manner;

ion implantation for forming said second impurity regions in the sidewalls on both sides of each of said second trenches;

ion implantation of impurities of the same conductive type as that of the already implanted impurities into the sidewalls on both sides of the trenches other than said trench located at the outermost portion under the condition wherein the trench located at the outermost portion from among said first and second trenches arranged in an alternating manner is filled in with a filling layer and, thereby, the concentration of the already implanted impurities is substantially increased so that said first or second impurity region in the sidewall of said trench located at the outermost portion becomes a region of a comparatively low concentration.

18. A manufacturing method for a semiconductor device having a structure wherein a structure where a first impurity region of a first conductive type and a second impurity region of a second conductive type are aligned side by side is repeated twice or more in a semiconductor substrate of the first conductive type, characterized in that a low concentration region that is either said first or second impurity region located at the outermost portion of said repeating structure and said first and second impurity regions, other than the low concentration region, are formed so as to have independently chanted concentrations so that said low concentration region has the lowest impurity concentration or has the least generally effective charge amount among all of said first and second impurity regions forming said repeating structure, and characterized by further comprising the steps of:

simultaneously creating a first group of trenches made of a plurality of first trenches and a second group of trenches made of a plurality of second trenches in a first main surface of said semiconductor substrate so that said first trenches and said second trenches are alternately located;

ion implantation for forming said first impurity regions into the sidewalls on both sides of each of said plurality of first trenches forming said first group of trenches under a condition wherein said second group off trenches is filled in with a first filling layer;

ion implantation for forming said second impurity regions into the sidewalls on both sides of each of said plurality of second trenches forming said second group of trenches under a condition wherein said first group of trenches is filled in with a second filling layer;

implanting impurity ions of the seine conductive type as that of the already implanted impurities into the sidewalls on both sides of the trenches other than said trench at the outermost portion under the condition wherein the trench at the outermost portion, located at the outermost portion, from among said plurality of first trenches forming said first group of trenches and said plurality of second trenches forming said second group of trenches is filled in with a third filling layer so as to increase the concentration of the already implanted impurities so that said first or second impurity regions of the sidewalls of the trench at the outermost portion become regions of a comparatively low concentration.

19. A semiconductor device having a repeating structure wherein a structure where a first impurity region of a first conductive type and a second impurity region of a second conductive type are aligned side by side is repeated twice, or more, in a semiconductor substrate of the first conductive type, wherein the semiconductor device is characterized in that a low concentration region that is either said first or second impurity region located at the outermost portion of said repeating structure has the lowest impurity concentration or has the least generally effective charge amount from among all of said first and second impurity regions forming said repeating structure and characterized in that said semiconductor substrate has a first main surface and a second main surface facing each other, a third impurity region of the second conductive type is formed at least at a portion on said first main surface side in at least one of said plurality of first impurity regions forming said repeating structure so as to form a main pn junction with said first impurity regions and a fourth impurity region of the first conductive type is formed on said second main surface side of said repeating structure.

20. The semiconductor device according to claim 19, characterized in that said third impurity region forming a main pn junction with said first impurity region is a body region of an insulating gate type field effect transistor portion, said semiconductor substrate has a first main surface and a second main surface facing each other, and a third impurity region of the second conductive type is formed at least at a portion on said first main surface side in at least one of said plurality of first impurity regions forming said repeating structure so as to form a main pn junction with said first impurity regions.

21. The semiconductor device according to claim 14, and characterized in that said semiconductor substrate has a first main surface and a second main surface facing each other and has a plurality of trenches in said first main surface, and said repeating structure has a structure wherein a structure where said first and second impurity regions is aligned with said trench located in between is repeated twice or more.

22. The semiconductor device according to claim 19, characterized in that said semiconductor substrate has a first main surface and a second main surface facing each other and has a plurality of trenches including first and second trenches adjoining each other in said first main surface, and a structure where said first impurity region is formed on each of the two sidewalls of said first trench and said second impurity region is formed on each of the two sidewalls of said second trench is repeated twice or more.

23. A semiconductor device having a repeating structure wherein a structure where a first impurity region of a first conductive type and a second impurity region of a second conductive type are aligned side by side is repeated twice, or more, in a semiconductor substrate of the first conductive type, wherein the semiconductor device is characterized in that a low concentration region that is either said first or second impurity region located at the outermost portion of said repeating structure has the lowest impurity concentration or has the least generally effective charge amount from among all of said first and second impurity regions forming said repeating structure and characterized in that said third impurity region forming a main pn junction with said first impurity region is a body region of an insulating gate type field effect transistor portion, said semiconductor substrate has a first main surface and a second main surface facing each other, and a third impurity region of the second conductive type is formed at least at a portion on said first main surface side in at least one of said plurality of first impurity regions forming said repeating structure so as to form a main pn junction with said first impurity regions.

24. The semiconductor device according to claim 23, and characterized in that said semiconductor substrate has a first main surface and a second main surface facing each other and has a plurality of trenches in said first main surface, and said repeating structure has a structure wherein a structure where said first and second impurity regions is aligned with said trench located in between is repeated twice or more.

25. The semiconductor device according to claim 23, characterized in that said semiconductor substrate has a first main surface and a second main surface facing each other and has a plurality of trenches including first and second trenches adjoining each other in said first main surface, and a structure where said first impurity region is formed on each of the two sidewalls of said first trench and said second impurity region is formed on each of the two sidewalls of said second trench is repeated twice or more.

26. A semiconductor device having a repeating structure wherein a structure where a first impurity region of a first conductive type and a second impurity region of a second conductive type are aligned side by side is repeated twice, or more, in a semiconductor substrate of the first conductive type, wherein the semiconductor device is characterized in that a low concentration region that is either said first or second impurity region located at the outermost portion of said repeating structure has the lowest impurity concentration or has the least generally effective charge amount from among all of said first and second impurity regions forming said repeating structure and characterized in that said third impurity region forming a main pn junction with said first impurity region is a body region of an insulating gate type field effect transistor portion, said semiconductor substrate has a first main surface and a second main surface facing each other, and a third impurity region of the second conductive type is formed at least at a portion on said first main surface side in at least one of said plurality of first impurity regions forming said repeating structure so as to form a main pn junction with said first impurity regions.

27. The semiconductor device according to claim 26, and characterized in that said semiconductor substrate has a first main surface and a second main surface facing each other and has a plurality of trenches in said first main surface, and said repeating structure has a structure wherein a structure where said first and second impurity regions is aligned with said trench located in between is repeated twice or more.

28. A semiconductor device having a repeating structure wherein a structure where a first impurity region of a first conductive type and a second impurity region of a second conductive type are aligned side by side is repeated twice, or more, in a semiconductor substrate of the first conductive type, wherein the semiconductor device is characterized in that a low concentration region that is either said first or second impurity region located at the outermost portion of said repeating structure has the lowest impurity concentration or has the least generally effective charge amount from among all of said first and second impurity regions forming said repeating structure and characterized in that said semiconductor substrate has a first main surface and a second main surface facing each other and has a plurality of trenches including first and second trenches adjoining each other in said first main surface, and a structure where said first impurity region is formed on each of the two sidewalls of said first trench and said second impurity region is formed on each of the two sidewalls of said second trench is repeated twice or more.

* * * * *

UNITED STATES PATENT AND TRADEMARK OFFICE
CERTIFICATE OF CORRECTION

PATENT NO. : 6,821,824 B2
DATED : November 23, 2004
INVENTOR(S) : Tadaharu Minato et al.

It is certified that error appears in the above-identified patent and that said Letters Patent is hereby corrected as shown below:

Column 75,
Line 29, change "according to claim 14" to -- according to claim 19 --.

Signed and Sealed this

Seventh Day of June, 2005

JON W. DUDAS
*Director of the United States Patent and Trademark Office*